(12) United States Patent
Bae et al.

(10) Patent No.: US 11,489,145 B2
(45) Date of Patent: Nov. 1, 2022

(54) DISPLAY DEVICE INCLUDING A LIGHT CONTROL PATTERN

(71) Applicant: SAMSUNG DISPLAY CO., LTD., Yongin-si (KR)

(72) Inventors: Kwangsoo Bae, Yongin-si (KR); Beomsoo Park, Yongin-si (KR); Minjeong Oh, Yongin-si (KR); Youngje Cho, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 205 days.

(21) Appl. No.: 16/838,109

(22) Filed: Apr. 2, 2020

(65) Prior Publication Data
US 2021/0013455 A1    Jan. 14, 2021

(30) Foreign Application Priority Data
Jul. 12, 2019 (KR) .................. 10-2019-0084548

(51) Int. Cl.
*H01L 51/52* (2006.01)
*H01L 27/32* (2006.01)

(52) U.S. Cl.
CPC ........ *H01L 51/5284* (2013.01); *H01L 27/322* (2013.01); *H01L 27/3246* (2013.01); *H01L 51/5253* (2013.01); *H01L 51/5271* (2013.01)

(58) Field of Classification Search
None
See application file for complete search history.

(56) References Cited

U.S. PATENT DOCUMENTS

| 8,410,688 | B2 | 4/2013 | Yamada et al. |
| 2012/0262943 | A1 | 10/2012 | Urabe et al. |
| 2017/0102487 | A1 | 4/2017 | Lee et al. |
| 2017/0125740 | A1* | 5/2017 | Lee .................. H01L 51/5271 |
| 2017/0254933 | A1 | 9/2017 | Li |
| 2021/0013455 | A1* | 1/2021 | Bae .................. H01L 51/5253 |

FOREIGN PATENT DOCUMENTS

| JP | 2007-248484 | 9/2007 |
| JP | 2007-305508 | 11/2007 |
| JP | 2009-049135 | 3/2009 |
| KR | 1020150874826 | 7/2015 |
| KR | 1020170041951 | 4/2017 |

* cited by examiner

*Primary Examiner* — Nduka E Ojeh
(74) *Attorney, Agent, or Firm* — F. Chau & Associates, LLC

(57) ABSTRACT

A display device is provided including a substrate. The substrate includes a pixel area and a light-blocking area. A light-emitting element is arranged in the pixel area of the substrate. An insulating layer is disposed on the substrate. The insulating layer has an opening corresponding to the light-blocking area and an insulating pattern corresponding to the pixel area. A light control pattern at least partially surrounds the insulating pattern of the insulating layer and is arranged in the opening corresponding to the light-blocking area.

9 Claims, 118 Drawing Sheets

< COMPARATIVE EXAMPLE 8 >

< COMPARATIVE EXAMPLE 9 >

< EMBODIMENT 7 >

< EMBODIMENT 8 >

DISPLAY DEVICE INCLUDING A LIGHT CONTROL PATTERN

CROSS-REFERENCE TO RELATED APPLICATION

This application claims priority under 35 U.S.C. § 119 to Korean Patent Application No. 10-2019-0084548, filed on Jul. 12, 2019, in the Korean Intellectual Property Office, the disclosure of which is incorporated by reference herein in its entirety.

1. Technical Field

The present disclosure relates to a display device, and more particularly, to a display device including a light control pattern and a method of manufacturing the same.

2. Discussion of the Related Art

As the demand for display devices used for various purposes increases, the necessity for display devices that possess a multitude of different dimensions has also increased. With this trend, display devices are gradually being manufactured to be larger and/or slimmer. The necessity for a display device that displays an accurate and clear color while also providing a larger and/or slimmer display device is increasing. Light emitted by a light-emitting element of one pixel may by incident on a color conversion layer of an adjacent pixel, thus compromising resultant image quality.

SUMMARY

According to an exemplary embodiment of the present invention, a display device is provided including a substrate. The substrate includes a pixel area and a light-blocking area. A light-emitting element is arranged in the pixel area of the substrate. An insulating layer is disposed on the substrate. The insulating layer has an opening corresponding to the light-blocking area and an insulating pattern corresponding to the pixel area. A light control pattern at least partially surrounds the insulating pattern of the insulating layer and is arranged in the opening corresponding to the light-blocking area.

According to an exemplary embodiment of the present invention, the light control pattern includes a reflective pattern and a light-blocking pattern. The reflective pattern and the light-blocking pattern are both arranged on a side and a bottom of the opening, and the light-blocking pattern is arranged on the reflective pattern.

According to an exemplary embodiment of the present invention, a level pattern at least partially covers the light control pattern.

According to an exemplary embodiment of the present invention, an upper surface of the level pattern is coplanar with an upper surface of the light control pattern.

According to an exemplary embodiment of the present invention, the light control pattern includes a reflective pattern and a light-blocking pattern. The reflective pattern is arranged on a side and a bottom of the opening. The light-blocking pattern is arranged on the bottom of the opening, and the reflective pattern is arranged on the light-blocking pattern.

According to an exemplary embodiment of the present invention, the display device further includes a level pattern at least partially covering the light control pattern.

According to an exemplary embodiment of the present invention, an upper surface of the level pattern is coplanar with the reflective pattern.

According to an exemplary embodiment of the present invention, the light control pattern includes a reflective pattern, a support pattern, and a light-blocking pattern. The reflective pattern and the support pattern are both arranged on a side and a bottom of the opening. The light-blocking pattern is arranged on the bottom of the opening. The support pattern is arranged under the reflective pattern, and the light-blocking pattern is arranged under the support pattern.

According to an exemplary embodiment of the present invention, the display device further includes an encapsulation layer disposed between the light control pattern and the light-emitting element.

According to an exemplary embodiment of the present invention, a display device is provided including a substrate including a pixel area and a light-blocking area. A light-emitting element is arranged in the pixel area of the substrate. An insulating layer is disposed on the substrate. The insulating layer has an opening corresponding to the pixel area and an insulating pattern corresponding to the light-blocking area. A light control pattern covers exposed surfaces of the insulating pattern corresponding to the light-blocking area.

According to an exemplary embodiment of the present invention, the light control pattern includes a reflective pattern and a light-blocking pattern. The reflective pattern and the light-blocking pattern are arranged on upper and side surfaces of the insulating pattern, and the light-blocking pattern is arranged between the reflective pattern and the insulating pattern.

According to an exemplary embodiment of the present invention, the light control pattern includes a reflective pattern and a light-blocking pattern. The reflective pattern is arranged on upper and side surfaces of the insulating pattern, and the light-blocking pattern is arranged between the insulating pattern and the light-emitting element.

According to an exemplary embodiment of the present invention, the display further includes an encapsulation layer disposed between the light control pattern and the light-emitting element.

According to an exemplary embodiment of the present invention, the display device further includes an encapsulation layer disposed between the light-emitting element and the light control pattern, and a color filter layer is disposed between the encapsulation layer and the light control pattern.

According to an exemplary embodiment of the present invention, the display device further includes an insulating layer disposed on the light control pattern, and a protective layer disposed on the insulating layer.

According to an exemplary embodiment of the present invention, the display device further comprises an air layer disposed between a plurality of light control patterns, and a protective layer disposed on the plurality of light control patterns.

According to an exemplary embodiment of the present invention, a display device is provided including a substrate. The substrate includes a pixel area and a light-blocking area adjacent to the pixel area. A light-emitting element is arranged in the pixel area of the substrate. A light control pattern at least partially surrounds the light-emitting element and is arranged in the light-blocking area, wherein the light control pattern has at least one hole.

According to an exemplary embodiment of the present invention, the light control pattern includes a reflective pattern, a support pattern, and a light-blocking pattern. The support pattern is arranged under the reflective pattern, and the light-blocking pattern is arranged in an air gap defined by the support pattern and the reflective pattern.

According to an exemplary embodiment of the present invention, the display device further includes an encapsulation layer disposed between the light control pattern and the light-emitting element.

According to an exemplary embodiment of the present invention, a display device is provided including a substrate. The substrate includes a pixel area and a light-blocking area adjacent to the pixel area. A light-emitting element is arranged in the pixel area of the substrate. A pixel-defining layer is arranged in the light-blocking area of the substrate, and a light control pattern is arranged on the pixel-defining layer at least partially surrounding the light-emitting element.

According to an exemplary embodiment of the present invention, the light control pattern includes a reflective pattern and a support pattern. The support pattern is arranged under the reflective pattern, and the light-emitting element at least partially covers the light control pattern.

According to an exemplary embodiment of the present invention, the display device further includes an insulating layer having an opening corresponding to the pixel area and an insulating pattern arranged on the pixel-defining layer. The light control pattern includes a reflective pattern and a support pattern. The reflective pattern and the support pattern cover the insulating pattern of the insulating layer, and at least one electrode of the light-emitting element covers the light control pattern.

According to an exemplary embodiment of the present invention, the pixel-defining layer includes a pixel-defining pattern. The light control pattern has a first non-inclined portion and a pair of inclined sides covering side surfaces of the pixel-defining pattern. The light control pattern further includes a reflective pattern and a first light blocking pattern, and the first light blocking pattern is an outermost layer of the light control pattern.

According to an exemplary embodiment of the present invention, the pixel-defining layer includes a pixel-defining pattern. The light control pattern has a first non-inclined portion and a pair of inclined sides covering side surfaces of the pixel-defining pattern. The light control pattern further includes a reflective pattern and a first light blocking pattern, and the reflective pattern is an outermost layer of the light control pattern.

According to an exemplary embodiment of the present invention, a second light blocking pattern is disposed directly on an encapsulation layer of the substrate in the light blocking area, and the second light blocking pattern is non-inclined and is parallel to the first non-inclined portion of the light control pattern.

According to an exemplary embodiment of the present invention, a second light blocking pattern is disposed directly on an encapsulation layer of the substrate in the light blocking area, and the second light blocking pattern is non-inclined and is parallel to the first non-inclined portion of the light control pattern.

BRIEF DESCRIPTION OF THE FIGURES

The above and other aspects and features of the present disclosure will be more clearly understood from the following Detailed Description taken in conjunction with the accompanying drawings, in which.

DETAILED DESCRIPTION OF THE EMBODIMENTS

Hereinafter, the present invention will be described more fully with reference to the accompanying drawings in which various exemplary embodiments are shown.

Like numerals may refer to like elements throughout the following description and corresponding figures. In the figures, the thickness, ratio, and dimension of components may be exaggerated for effective illustration of the technical content. However, the present invention is not limited thereto.

It will be understood that when a layer, region, or component is referred to as being "formed on" another layer, region, or component, it can be directly or indirectly formed on the other layer, region, or component. That is, for example, intervening layers, regions, or components may be present between the two elements. It will be understood that when a layer, region, or component is referred to as being "connected" to or "disposed on" another layer, region, or component, it may be "directly connected" to or "disposed on" the other layer, region, or the component may be "indirectly connected" to or "indirectly disposed on" the other layer, region, or component with another layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

When a process of manufacturing a display device according to an exemplary embodiment of the present invention may be implemented differently, a specific process order may be performed differently from the described order. For example, two consecutively described process steps may be performed substantially at the same time or performed in an order opposite to the described order where feasible.

Figure 1:
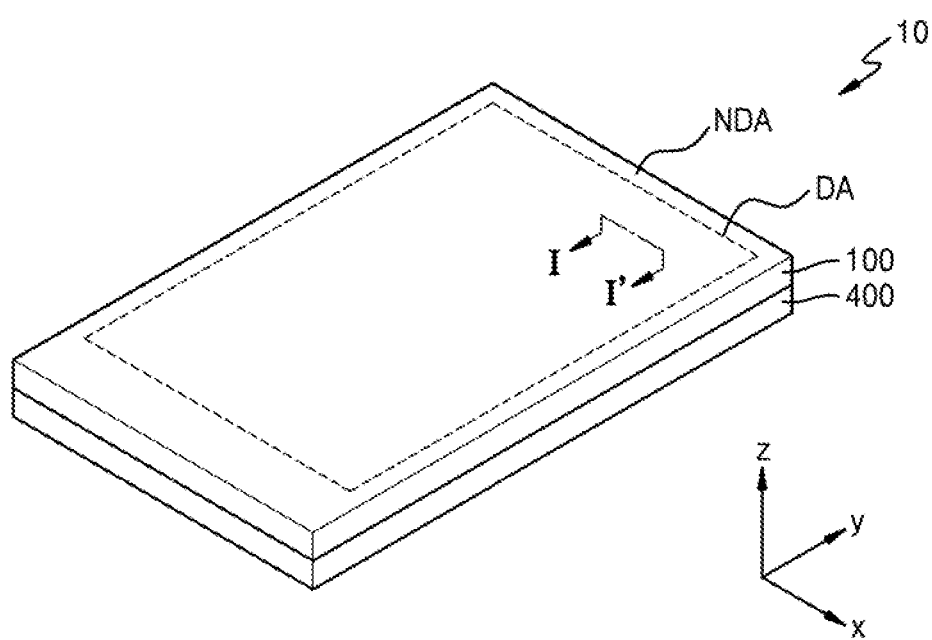
FIG. 1 is a perspective view illustrating a display device, according to an exemplary embodiment of the present invention.

FIG. 1 is a perspective view of a display device 10 according to an exemplary embodiment of the present invention.

Referring to FIG. 1, the display device 10 includes a display area DA that emits light and a non-display area NDA that does not emit light. The non-display area NDA is adjacent to the display area DA. The display device 10 may display a predetermined image by using light emitted from a plurality of pixels arranged in a first direction (e.g., an x direction) and a second direction (e.g., a y direction) of the display area DA.

The display device 10 may include a display panel 400 and a color control member 100 that are sequentially stacked in a third direction (e.g., a z direction). In an exemplary embodiment of the present invention, the color control member 100 may be formed separately from the display panel 400 and then coupled to the display panel 400. According to an exemplary embodiment of the present invention, the color control member 100 may be directly formed on the display panel 400. For example, the color control member 100 may be formed after the display panel 400 is formed.

Figure 2A:
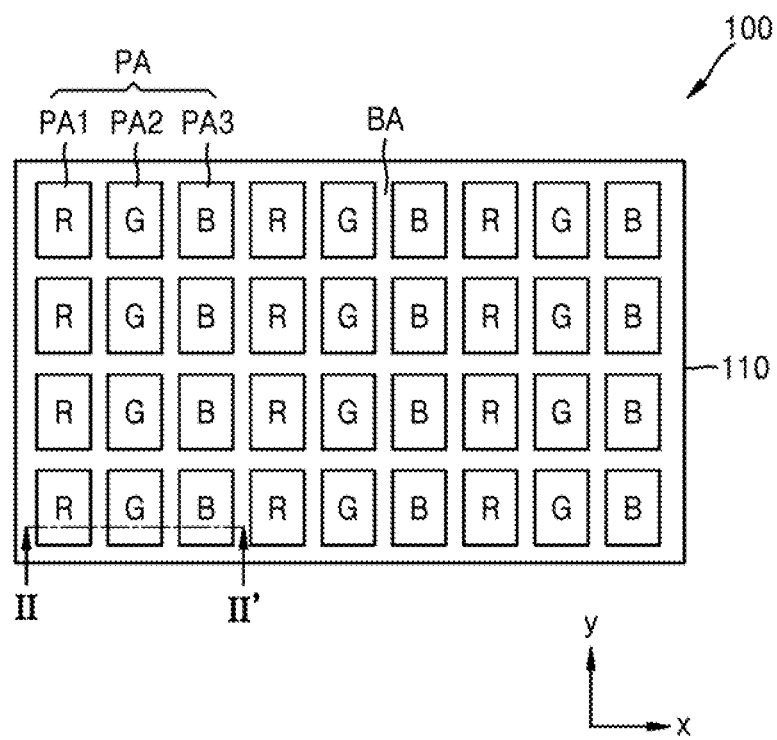
FIG. 2A is a plan view illustrating a color control member, according to an exemplary embodiment of the present invention.
Figure 2B:
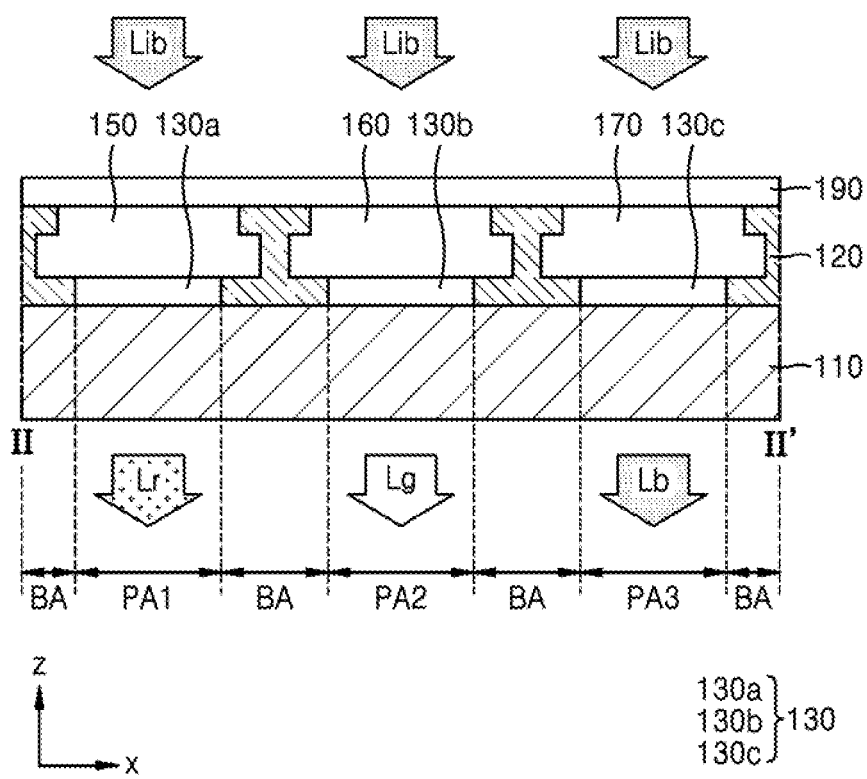
FIGS. 2B and 2C are cross-sectional views illustrating the color control member taken along line II-II' of FIG. 2A, according to exemplary embodiments of the present invention.
Figure 2C:
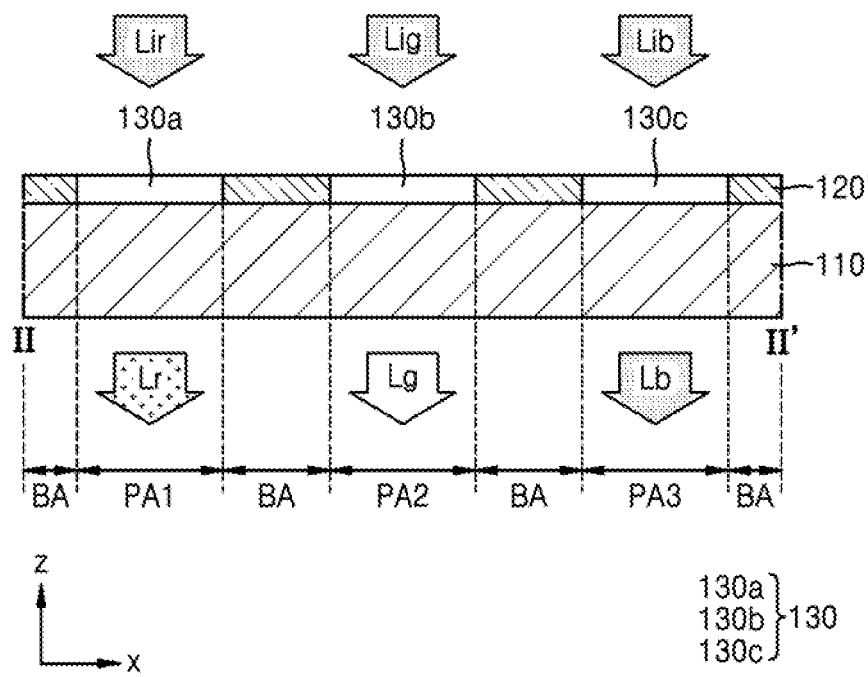

FIG. 2A is a plan view of a color control member 100 according to an exemplary embodiment of the present invention, and FIGS. 2B and 2C are cross-sectional views of the color control member 100 taken along line II-II' of FIG. 2A.

Referring to FIGS. 2A and 2B, the color control member 100 may include a substrate 110, light-blocking members 120, color filter layers 130, a first color conversion layer 150, and a second color conversion layer 160.

The substrate 110 may include a first pixel area PA1 and a second pixel area PA2 that are spaced apart from each other, and a light-blocking area BA between the first pixel area PA1 and the second pixel area PA2.

The first color conversion layer 150 is arranged in the first pixel area PA1 and converts incident light Lib to light Lr of a first color. The second color conversion layer 160 is arranged in the second pixel area PA2 and converts incident light Lib to light Lg of a second color.

The color control member 100 may further include a transmission layer 170. The substrate 110 may further have a third pixel area PA3 that is spaced apart from the first pixel area PA1 and the second pixel area PA2. The transmission layer 170 may be arranged in the third pixel area PA3 and may transmit the incident light Lib.

The color control member 100 may receive the incident light Lib and emit light Lr of a first color, light Lg of a second color, and light Lb of a third color.

A pixel area PA and a light-blocking area BA are defined in the substrate 110. The pixel area PA emits light and is surrounded by the light-blocking area BA. The pixel area PA may be divided into a first pixel area PA1, a second pixel area PA2, and a third pixel area PA3 depending on a color of emitted light. For example, the first pixel area PA1 may be an area that emits light Lr of a first color, the second pixel area PA2 may be an area that emits light Lg of a second color, and the third pixel area PA3 may be an area that emits light Lb of a third color. For example, the first pixel area PA1, the second pixel area PA2, and the third pixel area PA3 may respectively correspond to a red pixel R, a green pixel G, and a blue pixel B. Rows of the pixel areas PA may extend in the first direction (e.g., the x direction) in which consecutive pixels are aligned. The arrangement of the respective first to third pixel areas PA1, PA2, and PA3 shown in FIG. 2A is provided as an example, and the present invention is not limited thereto. The first to third pixel areas PA1, PA2, and PA3 may be arranged in various configurations, such as a zigzag arrangement, to correspond to the arrangement of pixels of the display device 10.

The light Lr of the first color may be red light, the light Lg of the second color may be green light, and the light Lb of the third color may be blue light. The red light is light having a peak wavelength of 580 nm or more and less than 750 nm. The green light is light having a peak wavelength of 495 nm or more and less than 580 nm. The blue light is light having a peak wavelength of 400 nm or more and less than 495 nm. The incident light Lib may be light of the third color.

The light-blocking area BA is an area that does not emit light, and may be arranged in a mesh configuration between the first to third pixel areas PA1, PA2, and PA3.

The substrate 110 may be a transparent substrate in which the light Lr and the light Lg respectively of the first color and the second color may be emitted through the first pixel area PA1 and the second pixel area PA2, the light Lr and the light Lg being respectively emitted from the first color conversion layer 150 and the second color conversion layer 160. The light Lb of the third color may be emitted through the third pixel area PA3 of the substrate 110.

The substrate 110 is not particularly limited, and may include, for example, an insulating material such as glass, plastic, and/or crystal. For example, the substrate 110 may include an organic polymer material such as polycarbonate (PC), polyethylene terephthalate (PET), polyethylene (PE), polypropylene (PP), polysulfone (PSF), polymethyl methacrylate (PMMA), triacetyl cellulose (TAC), cycloolefin polymer (COP) and/or cycloolefin copolymer (COC). The substrate 110 may be selected by taking into account mechanical strength, thermal stability, transparency, surface flatness, handling convenience, a waterproofing property, etc.

The light-blocking member 120 may be arranged in the light-blocking area BA. The light-blocking member 120 may be formed as a thin film in the light-blocking area BA. In the case where light is emitted through the light-blocking area BA, light leakage may occur in the display device 10. The light-blocking member 120 may prevent light from being emitted to the outside through the light-blocking area BA, and thus may prevent light leakage from occurring.

The light-blocking member 120 may have various colors including black or white. In the case where the light-blocking member 120 is black, the light-blocking member 120 may include a black matrix. In the case where the light-blocking member 120 is white, the light-blocking member 120 may include an organic insulating material such as a white resin. The light-blocking member 120 may include an opaque inorganic insulating material such as $CrO_x$ or $MoO_x$, and/or may include an opaque organic insulating material such as a black resin.

The light-blocking members 120 may be located between the first color conversion layer 150, the second color conversion layer 160, and the transmission layer 170 in a first direction (e.g., the x direction), and thus, the light-blocking member 120 may function as a partition wall. The light-blocking member 120 may contact side surfaces of the first color conversion layer 150, the second color conversion layer 160, and the transmission layer 170. The light-blocking member 120 may absorb light at an interface contacting the first color conversion layer 150, the second color conversion layer 160, and the transmission layer 170. The light-blocking member 120 may also be located between a first color filter layer 130a and the second color filter layer 130b, and between the second color filter layer 130b and the third color filter layer 130c in the first direction (e.g., the x direction). For example, the light blocking members 120 may be disposed in spaces provided between adjacent color filter layers 130 and/or between the first color conversion layer 150, the second color conversion layer 160 and the transmission layer 170, and may each have a substantially "I" shape in a cross-sectional view. An upper horizontal segment of each of the light blocking members 120 may be substantially a same width as a corresponding light blocking area BA in the first direction (e.g., the x direction). A lower horizontal segment may be the same width in the first direction (e.g., the x direction) as the pair of inclined portions of the light-control pattern LCP (Shown, e.g., in FIG. 9).

The light-blocking member 120 may prevent the light Lr of the first color emitted from the first color conversion layer 150 from being irradiated to the second color conversion layer 160 or the transmission layer 170, prevent the light Lg of the second color emitted from the second color conversion layer 160 from being irradiated to the first color conversion layer 150 or the transmission layer 170, and/or prevent the light Lb of the third color emitted from the transmission layer 170 from being irradiated to the first color conversion layer 150 or the second color conversion layer 160.

The light-blocking member 120 may prevent a portion of light emitted from a light-emitting element 430 (see FIG. 4B) from being incident to a color conversion layer 150 or 160 or a transmission layer 170 of a neighboring pixel area PA. Therefore, according to an exemplary embodiment of the present invention, since color mixing between pixel areas PA is prevented, color coincidence and color reproduction are increased and light efficiency is increased. Thus, power consumption may also be reduced.

The color filter layer 130 may include an organic material pattern including dye and/or pigment. The color filter layer 130 may include a first color filter layer 130a, a second color filter layer 130b, and a third color filter layer 130c. The first color filter layer 130a may be arranged in at least the first pixel area PA1, the second color filter layer 130b may be arranged in at least the second pixel area PA2, and the third color filter layer 130c may be arranged in at least the third pixel area PA3. The first color filter layer 130a may selectively transmit only light of the first color, the second color filter layer 130b may selectively transmit only light of the second color, and the third color filter layer 130c may selectively transmit only light of the third color.

The first color conversion layer 150, the second color conversion layer 160, and the transmission layer 170 each may be formed in a space defined between adjacent light-blocking members 120 by using an inkjet method. The first color conversion layer 150, the second color conversion layer 160, and the transmission layer 170 may have a substantially "T" shape, and each may have a lower horizontal portion in contact with the planarization layer 190 and an upper horizontal portion in contact with the color filter layer 130. The lower horizontal portion may have a smaller width in the first direction (e.g., the x direction) than a width of the upper horizontal portion in the first direction (e.g., the x direction). The upper horizontal segment of the light-blocking member 120 may have a lower surface that overlaps an upper surface of the upper horizontal portion of the first color conversion layer 150, the second color conversion layer 160, and/or the transmission layer 170.

The first color conversion layer 150 may overlap the first color filter layer 130a in the first pixel area PA1. The first color conversion layer 150 may convert the incident light Lib to the light Lr of the first color, and emit the light Lr toward the substrate 110 in a third direction (e.g., the z direction). The first color conversion layer 150 may include first quantum dots, the first quantum dots may be excited by the incident light Lib and emit the light Lr of the first color having a wavelength greater than a wavelength of the incident light Lib.

The second color conversion layer 160 may overlap the second color filter layer 130b in the second pixel area PA2, converts the incident light Lib to the light Lg of the second color, and emits the light Lg toward the substrate 110 in the third direction (e.g., the z direction). The second color conversion layer 160 may include second quantum dots, the second quantum dots being excited by the incident light Lib and emitting the light Lg of the second color having a wavelength greater than a wavelength of the incident light Lib.

The transmission layer 170 may overlap the third color filter layer 130c in the third pixel area PA3, transmit the light Lb of the third color, and emit the light Lb toward the substrate 110 in the third direction (e.g., the z direction).

The color control member 100 may further include the planarization layer 190 arranged on the first color conversion layer 150, the second color conversion layer 160, and the transmission layer 170. The planarization layer 190 may provide a flat upper surface. The planarization layer 190 may be arranged over the substrate 110 so as to cover lower surfaces of the first color conversion layer 150, the second color conversion layer 160, and the transmission layer 170. For example, the planarization layer 190 may overlap upper surfaces of each of the first color conversion layer 150, the second color conversion layer 160, and the transmission layer 170 in the third direction (e.g., the z direction) and may extend in the first direction (e.g., the x direction). The planarization layer 190 may be transparent such that incident light Lib is irradiated to the first color conversion layer 150, the second color conversion layer 160, and the transmission layer 170. The planarization layer 190 may include a single layer or multiple layers including an inorganic and/or an organic material. For example, the inorganic material may be silicon nitride ($SiN_x$) and/or silicon oxide ($SiO_x$). The transparent organic material may be a polyimide resin, an acrylic resin, and/or a resist material. The planarization layer 190 may be formed by a wet process such as a slit coating method and a spin coating method, or a dry process such as chemical vapor deposition and vacuum deposition. The present invention is not limited to these materials and forming methods described herein. According to an exemplary embodiment of the present invention, the planarization layer 190 may be omitted.

According to an exemplary embodiment of the present invention, the color control member 100 may include a substrate 110, a light-blocking member 120', and a color filter layer 130, as shown in FIG. 2C. The color control member 100 may receive incident light Lir, Lig, and Lib and emit light Lr, Lg, and Lb of first to third colors. The color filter layer 130 may include a first color filter layer 130a, a second color filter layer 130b, and a third color filter layer 130c. The first color filter layer 130a may be arranged in at least the first pixel area PA1 and may selectively transmit only light of the first color. The second color filter layer 130b may be arranged in at least the second pixel area PA2 and may selectively transmit only light of the second color. The third color filter layer 130c may be arranged in at least the third pixel area PA3 and may selectively transmit only light of the third color. The light-blocking member 120' may be arranged in a light-blocking area BA between the first color filter layer 130a and the second color filter layer 130b, and between the second color filter layer 130b and the third color filter layer 130c.

Figure 3:
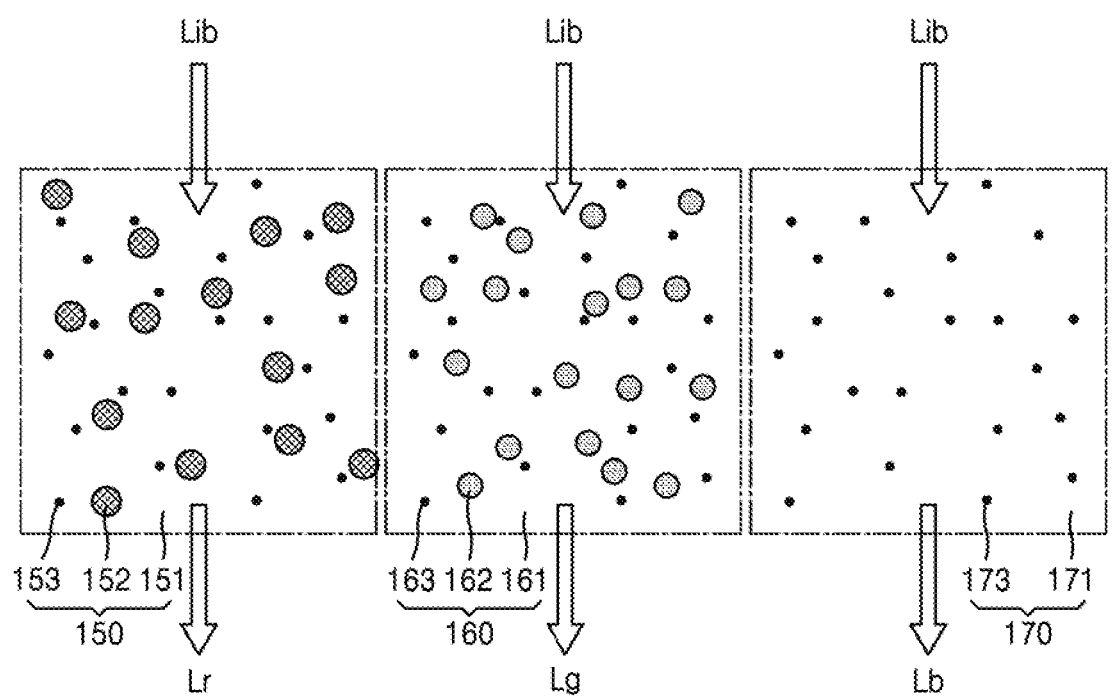
FIG. 3 is an enlarged cross-sectional view illustrating a first color conversion layer, a second color conversion layer, and a transmission layer of a color control member, according to an exemplary embodiment of the present invention.

FIG. 3 is an enlarged cross-sectional view of a first color conversion layer 150, a second color conversion layer 160, and a transmission layer 170 of a color control member 100, according to an exemplary embodiment of the present invention.

Referring to FIG. 3, the first color conversion layer 150 may convert blue incident light Lib to light Lr of the first color. The first color conversion layer 150 may include a first photosensitive polymer 151 in which first quantum dots 152 and first scattering particles 153 are dispersed.

The first quantum dots 152 may be excited by the blue incident light Lib and may emit light Lr of the first color having a wavelength greater than a wavelength of blue light in an isotropic way. The first photosensitive polymer 151 may include an organic material having a light transmissive property. The first scattering particles 153 may scatter the blue incident light Lib that is not absorbed by the first quantum dots 152 and allow more first quantum dots 152 to be excited, thereby increasing a color conversion efficiency of the first color conversion layer 150. The first scattering particles 153 may include, for example, titanium oxide ($TiO_2$) and/or a metal particle. A core of the first quantum dots 152 may include a Group II-VI compound, a Group III-V compound, a Group IV-VI compound, a Group IV element and/or a Group IV compound.

The second color conversion layer 160 may convert the blue incident light Lib to light Lg of the second color. The second color conversion layer 160 may include a second photosensitive polymer 161 in which second quantum dots 162 and second scattering particles 163 are dispersed.

The second quantum dots 162 may be excited by the blue incident light Lib and may emit light Lg of the second color having a wavelength greater than a wavelength of blue light in an isotropic way. The second photosensitive polymer 161 may include an organic material having a light transmissive property and may include the same material as that of the first photosensitive polymer 151. The second scattering particles 163 may scatter the blue incident light Lib that is not absorbed by the second quantum dots 162 and allow more second quantum dots 162 to be excited, thereby increasing a color conversion efficiency of the second color conversion layer 160. The second scattering particles 163 may include, for example, titanium oxide ($TiO_2$) and/or a metal particle and may include the same material as that of the first scattering particles 153. A core of the second quantum dots 162 may include a Group II-VI compound, a Group III-V compound, a Group IV-VI compound, a Group IV element and/or a Group IV compound. The second quantum dots 162 may include the same material as that of the first quantum dots 152. In this case, a size of the second quantum dots 162 may be less than a size of the first quantum dots 152.

The transmission layer 170 may transmit the blue incident light Lib and emit the blue incident light Lib in a third direction (e.g., the z direction) towards the substrate 110. The transmission layer 170 may include a third photosensitive polymer 171 in which third scattering particles 173 are dispersed. The third photosensitive polymer 171 may include an organic material having a light transmissive property, for example, a silicon resin and an epoxy resin, and may include the same material as those of the first photosensitive polymer 151 and the second photosensitive polymer 161. The third scattering particles 173 may scatter the blue incident light Lib and emit the blue incident light Lib. The third scattering particles 173 may include the same material as those of the first scattering particles 153 and/or the second scattering particles 163.

The Group II-VI compound may include a two-element compound including CdSe, CdTe, ZnS, ZnSe, ZnTe, ZnO, HgS, HgSe, HgTe, MgSe and/or MgS; a three-element compound including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe and/or MgZnS; and/or a four-element compound including HgZnTeS, CdZnSeS, CdZnSeTe, CdZnSTe, CdHgSeS, CdHgSeTe, CdHgSTe, HgZnSeS, HgZnSeTe and/or HgZnSTe.

The Group III-V compound may include one of: a two-element compound including GaN, GaP, GaAs, GaSb, AlN, AlP, AlAs, AlSb, InN, InP, InAs and/or InSb; a three-element compound including GaNP, GaNAs, GaNSb, GaPAs, GaPSb, AlNP, AlNAs, AlPSb, AlPAs, AlPSb, InGaP, InNP, InNAs, InNSb, InPAs, InPSb and/or GaAlNP; and/or a four-element compound including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and/or InAlPSb.

The Group IV-VI compound may include a two-element compound including SnS, SnSe, SnTe, PbS, PbSe and/or PbTe; a three-element compound including SnSeS, SnSeTe, SnSTe, PbSeS, PbSeTe, PbSTe, SnPbS, SnPbSe and/or SnPbTe; and/or a four-element compound including SnPbSSe, SnPbSeTe and/or SnPbSTe. The Group IV element may include Si and/or Ge. For example, the Group IV compound may include a two-element compound including SiC and/or SiGe.

In this case, the two-element compound, the three-element compound, or the four-element compound may be inside a particle at a uniform concentration or may be divided into states in which concentration distributions thereof are partially different and exist inside the same particle. Also, the quantum dot may include a core/shell structure in which one quantum dot surrounds another quantum dot. An interface between the core and the shell may have a concentration gradient in which the concentration of an element in the shell is reduced toward a center thereof.

According to an exemplary embodiment of the present invention, the quantum dot may include a core-shell structure including the core including a nano crystal, and the shell surrounding the core. The shell of the quantum dot may serve as a protective layer for maintaining a semiconductor characteristic by preventing chemical denaturalization of the core and/or serve as a charging layer for giving an electrophoretic characteristic to the quantum dot. The shell may have a single layer or multiple layers. An interface between the core and the shell may have a concentration gradient in which the concentration of an element in the shell is reduced toward a center thereof. Examples of the shell of the quantum dot may include an oxide of a metal, a non-metal and/or a semiconductor compound.

For example, though an oxide of the metal or non-metal may include a two-element compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$, and/or a three-element compound such as $MgAl_2O_4$, $CoFe_2O_4$, $NiFe_2O_4$, and/or $CoMn_2O_4$, the present invention is not limited thereto.

Also, the semiconductor compound may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP and/or AlSb, but the present invention is not limited thereto.

The quantum dot may have a full width of half maximum (FWHM) of a light-emission wavelength spectrum of 45 nm or less, preferably 40 nm or less, more preferably, 30 nm or less and may increase color saturation or color reproduction in this range. Also, since light emitted through this quantum dot is emitted in all directions, a wide viewing angle may be increased.

A shape of a quantum dot may be variously changed. For example, a spherical quantum dot, a pyramid-shape quantum dot, a multi-arm-shaped quantum dot, or a cubic nano particle, a nano tube-shaped quantum dot, a nano wire-shaped quantum dot, a nano fiber-shaped quantum dot, and/or a nano plate-shaped particle may be used.

The quantum dot may adjust the color of emitted light depending on a size of a particle thereof, and accordingly, the quantum dot may have various light-emitting colors such as blue, red, and green.

Figure 4A:
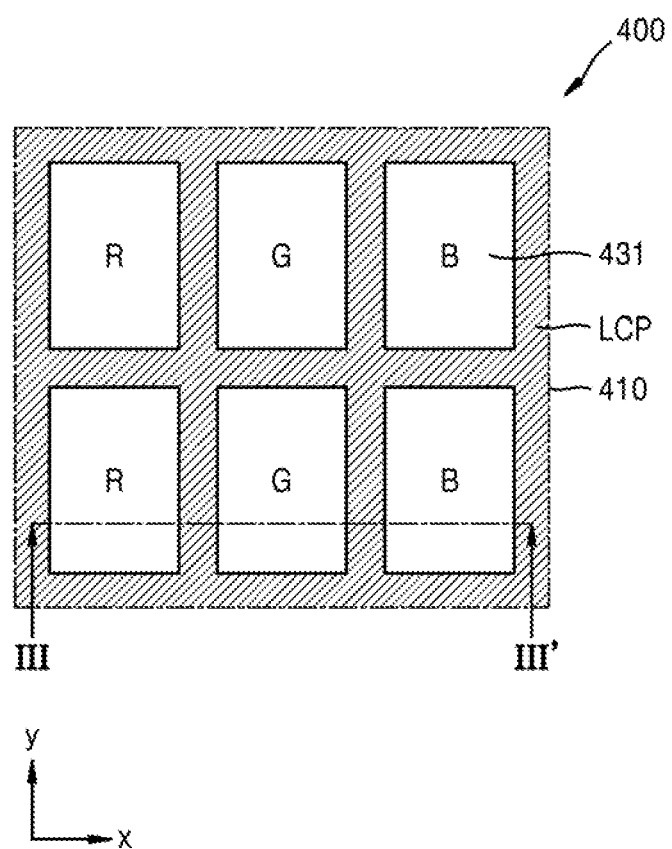
FIG. 4A is a plan view illustrating a display panel, according to an exemplary embodiment of the present invention.
Figure 4B:
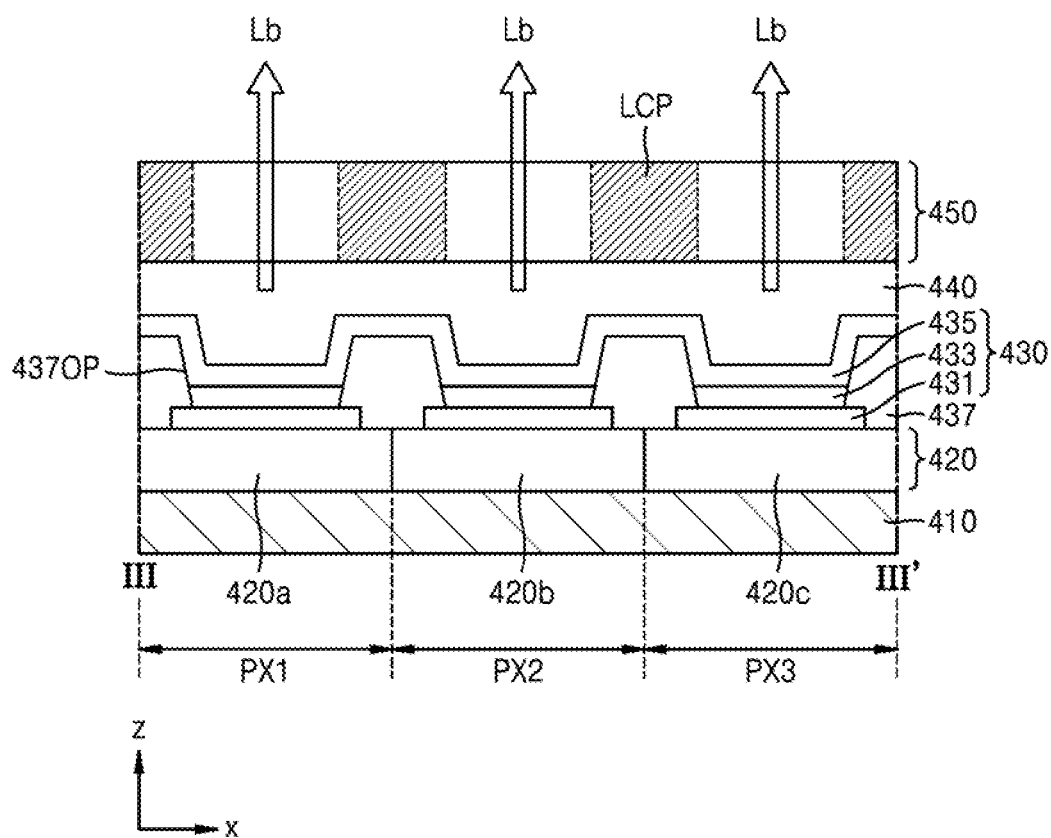
FIG. 4B is a cross-sectional view illustrating a cross-section of the display panel of FIG. 4A taken along line III-III', according to an exemplary embodiment of the present invention.
Figure 4C:
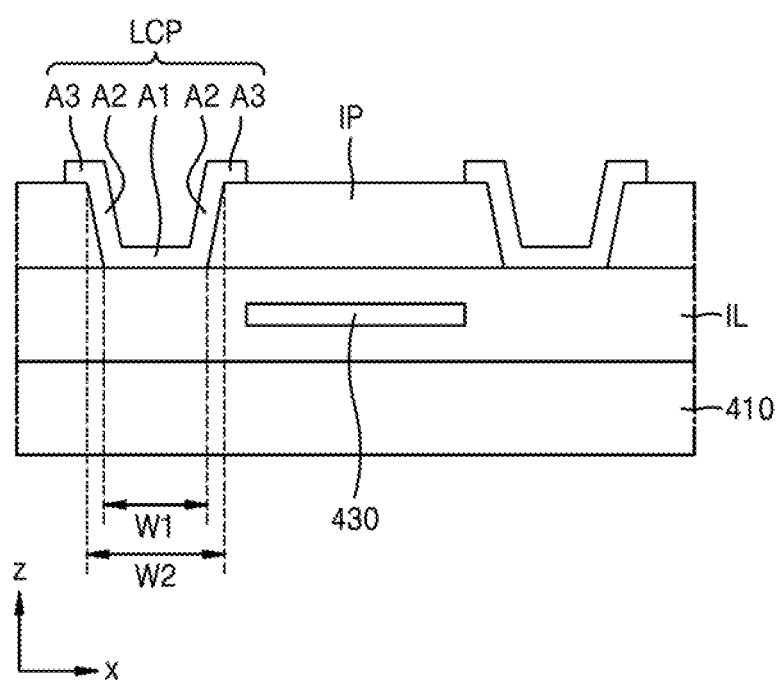
FIGS. 4C and 4D are cross-sectional views illustrating a light control pattern, according to exemplary embodiments of the present invention.
Figure 4D:
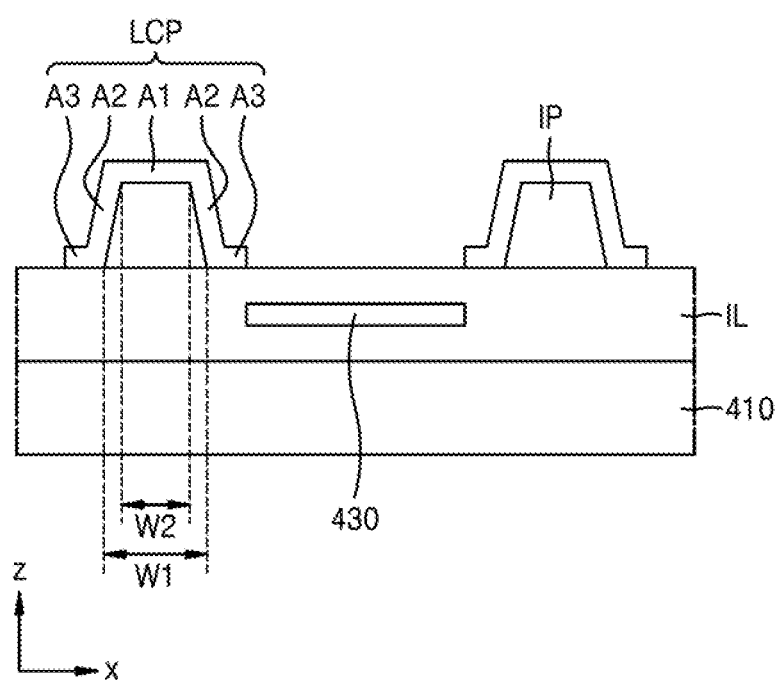

FIG. 4A is a plan view of a display panel 400 according to an exemplary embodiment of the present invention, and FIG. 4B is a cross-sectional view of the display panel 400 taken along line of FIG. 4A. FIGS. 4C and 4D are cross-sectional views illustrating the light control pattern LCP according to an exemplary embodiment of the present invention.

Referring to FIGS. 4A and 4B, the display panel 400 includes a plurality of pixels arranged in rows extending in the first direction (e.g., the x direction) and columns extending in the second direction (e.g., the y direction) in the display area DA. The plurality of pixels PX may include the first to third pixels PX1, PX2, and PX3. The first pixel PX1 may include a light-emitting element 430 and a first pixel circuit 420a for controlling the light-emitting element 430. The second pixel PX2 may include a light-emitting element 430 and a second pixel circuit 420b for controlling the light-emitting element 430. The third pixel PX3 may include a light-emitting element 430 and a third pixel circuit 420c for controlling the light-emitting element 430.

The light-emitting element 430 may include an organic light-emitting diode OLED. The light-emitting element 430 may emit the light Lb of the third color, for example, blue light, the light having an amount of light controlled by the first to third pixel circuits 420a, 420b, and 420c. The first to third pixel circuits 420a, 420b, and 420c each may be arranged in a pixel circuit layer 420, which is a lower layer under the light-emitting element 430, and may or may not partially overlap the light-emitting element 430. For example, the first to third pixel circuits 420a, 420b and 420c may be disposed between a substrate 410 and the light-emitting element 430. According to an exemplary embodiment of the present invention, the light-emitting element 430 may emit one of the light Lr of the first color, the light Lg of the second color, and the light Lb of the third color.

The substrate 410 may include a material such as a glass material, a metal material, and/or an organic material. For example, the substrate 410 may include a glass material containing $SiO_2$ as a main component, or may include various flexible or bendable materials, for example, a resin such as a reinforced plastic. According to an exemplary embodiment of the present invention, the substrate 410 may include a bending area in a portion of the non-display area NDA, the substrate 410 being bent.

The first to third pixel circuits 420a, 420b, and 420c respectively of the first to third pixels PX1, PX2, and PX3 may be arranged on the substrate 410. The first to third pixel circuits 420a, 420b, and 420c each may include a plurality of thin film transistors and at least one capacitor. In addition to the first to third pixel circuits 420a, 420b, and 420c, signal lines and power lines, which transfer signals and driving power voltage applied to the first to third pixels PX1, PX2, and PX3, may be arranged in the pixel circuit layer 420.

Each of the thin film transistors may include a semiconductor layer, a gate electrode, a source electrode, and a drain electrode. The semiconductor layer may include amorphous silicon and/or polycrystalline silicon. The semiconductor layer may include an oxide semiconductor. The semiconductor layer may include a source region, a drain region, and a channel region therebetween.

The light-emitting element 430 may be provided on the pixel circuit layer 420. The light-emitting element 430 may be arranged to correspond to the pixel area PA of the color control member 100. The light-emitting element 430 of the first pixel PX1 may be arranged to correspond to the first pixel area PA1 of the color control member 100. The light-emitting element 430 of the second pixel PX2 may be arranged to correspond to the second pixel area PA2 of the color control member 100. The light-emitting element 430 of the third pixel PX3 may be arranged to correspond to the third pixel area PA3 of the color control member 100. The first to third pixels PX1, PX2 and PX3 may overlap the first to third pixels areas PA1, PA2 and PA3, respectively, in the third direction (e.g., the z direction) such that the opening 437OP is substantially aligned with the first to third pixels areas PA1, PA2 and PA3. The portion of the pixel-defining layer 437 surrounded by the opening 437OP may also be referred to as a pixel-defining pattern. The light control pattern LCP may correspond to the pixel-defining pattern of the pixel-defining layer 437.

At least one insulating layer may be arranged between the first to third pixel circuits 420a, 420b, and 420c, and the light-emitting element 430. The light-emitting element 430 may include a pixel electrode 431, an intermediate layer 433, and an opposite electrode 435.

The pixel electrode 431 may be connected to a source electrode or a drain electrode of a thin film transistor. The pixel electrode 431 may be exposed through an opening 437OP of a pixel-defining layer 437, and edges (e.g., sidewalls) of the pixel electrode 431 may be covered by patterns of the pixel-defining layer 437. The patterns of the pixel-defining layer 437 may surround the pixel electrode 431 and may be arranged to correspond to a light-blocking area BA of the color control member 100.

Hereinafter, regions corresponding to the pixel area PA and the light-blocking area BA of the color control member 100 in the substrate 410 are also referred to herein, respectively, as a pixel area PA and a light-blocking area BA of the substrate 410. The boundaries of the pixel area PA and the light-blocking area BA demarcated by dotted lines throughout the figures may be equally applicable to regions of the substrate 410, and may, for example, extend continuously in the third direction (e.g., the z direction) to be provided through the substrate 410 to apportion regions of the same. Thus elements of the substrate 410 and the color control member 100 that are disposed in corresponding pixel areas PA and light-blocking areas BA may overlap in the third direction (e.g., the z direction).

The intermediate layer 433 may be arranged on a portion of the pixel electrode 431 exposed by the pixel-defining layer 437. The intermediate layer 433 may include an organic emission layer. The organic emission layer may include a low molecular weight organic material and/or a polymer organic material. The intermediate layer 433 may selectively further include functional layers such as a hole transport layer (HTL), a hole injection layer (HIL), an electron transport layer (ETL), and an electron injection layer (EIL). The functional layers may be integrally formed to cover a plurality of pixels.

The opposite electrode 435 may cover the intermediate layer 433 and the pixel-defining layer 437. The opposite electrode 435 may include a transparent or semi-transparent electrode. For example, the opposite electrode 435 may include a metal thin layer having a small work function. The opposite electrode 435 may include a transparent conductive oxide (TCO). The opposite electrode 435 may be integrally formed in a plurality of light-emitting elements 430 in the display area DA to face a plurality of pixel electrodes 431.

An encapsulation layer 440 may be arranged on the light-emitting element 430. The encapsulation layer 440 may cover the opposite electrode 435 and may be arranged over an entire surface of the substrate 410. For example, the encapsulation layer 440 may form a complimentary shape to the light-emitting elements 430 in a cross-sectional view. The encapsulation layer 440 may include an inorganic encapsulation layer including an inorganic material and/or an organic encapsulation layer including at least one organic material. In an exemplary embodiment of the present invention, the encapsulation layer 440 may have a structure in which a first inorganic encapsulation layer, an organic encapsulation layer, and a second inorganic encapsulation layer are stacked. For example, the first inorganic encapsulation layer, the organic encapsulation layer, and the second inorganic encapsulation layer may be sequentially stacked A light control layer 450 including a light control pattern LCP may be arranged on the encapsulation layer 440. The light control pattern LCP may be arranged to correspond to the light-blocking area BA (i.e., the light-blocking area of the substrate 410) of the color control member 100 and may overlap the pixel-defining layer 437.

As shown in FIG. 4C, the light control pattern LCP may be disposed on an insulating pattern IP. The insulating pattern IP may overlap a light-emitting element 430 in the third direction (e.g., the z direction). The light-emitting element 430 may be disposed in an interlayer insulating layer IL. The light control pattern LCP may include a first area A1 and a pair of second areas A2 extending from both ends of the first area A1. The first area A1 may be a non-inclined portion that is substantially flat (e.g., parallel) with respect to a main surface of the substrate 410. Each of the second areas A2 may be an inclined portion that is bent from the first area A1 and extends away from the substrate 410. The light control pattern LCP may further include third areas A3 that are bent and extend from the second areas A2. The third areas A3 may be non-inclined portions that are substantially flat (e.g., parallel) with respect to the main surface of the substrate 410. The first area A1 may contact the upper surface of an insulating layer IL, and the second areas A2 may surround sidewalls of an insulating pattern IP and extend along the side surface of the insulating pattern IP. The third areas A3 may extend along an upper surface of respective portions of the insulating pattern IP. The insulating pattern IP may overlap a pixel area and may overlap at least an emission area of the light-emitting element 430. The emission area is an area in which an emission layer is arranged, and may be defined by the opening 437OP of the pixel-defining layer 437.

The second areas A2 may extend in an oblique direction between a direction (z direction) perpendicular to a main surface of the substrate 100 and a direction (x direction) parallel to the main surface of the substrate 100. A first distance W1 between second areas A2 on a side closest to the substrate 410 and a second distance W2 between second areas A2 on a side farther from the substrate 410 may be different from each other. For example, as shown in FIG. 4C, the second distance W2 may be greater than the first distance W1.

According to an exemplary embodiment of the present invention, as shown in FIG. 4D, the second areas A2 of the light control pattern LCP may be inclined portions extending in a direction approaching the substrate 410. For example, the second areas A2 of the light control pattern LCP may extend in an oblique direction with respect to an upper surface of the substrate 410. The first area A1 of the light control pattern LCP may contact the upper surface of the insulating pattern IP, and the second areas A2 may extend along the side surface of the insulating pattern IP. The insulating pattern IP may have, for example, a trapezoidal shape. Therefore, the second distance W2 may be less than the first distance W1.

Each of the second areas A2 may be a reflective area that prevents light emitted from the light-emitting element 430 from being incident on a color conversion layer or a transmission layer of an adjacent pixel area and controls a light path so that the light is incident on a color conversion layer or a transmission layer of a corresponding pixel area. The first area A1 may be a light-blocking area that absorbs and/or blocks light emitted from the light-emitting element 430 and/or light emitted from a color conversion layer.

The light control pattern LCP may include a single layer or multiple layers. The second area A2 of the light control pattern LCP may include at least one reflective layer, and the first area A1 may include at least one light-blocking layer. However, the present invention is not limited thereto. For example, the first area A1 may be adjacent to a separate light-blocking layer. In this case, the first area A1 may be in direct contact with the separate light blocking layer or the first area A1 may be spaced apart from the light blocking layer by a predetermined distance.

According to an exemplary embodiment of the present invention, color mixing between pixel areas is prevented, color coincidence and color reproduction are increased and light efficiency is increased. Thus, power consumption is reduced.

In the following exemplary embodiments of the present invention, since the color control member 100 and the display panel 400 have been described above with reference to FIGS. 2A to 4B, detailed descriptions thereof may be omitted. In addition, descriptions that are the same as those already given above with reference to FIGS. 2A to 4B may be omitted.

Figure 5:
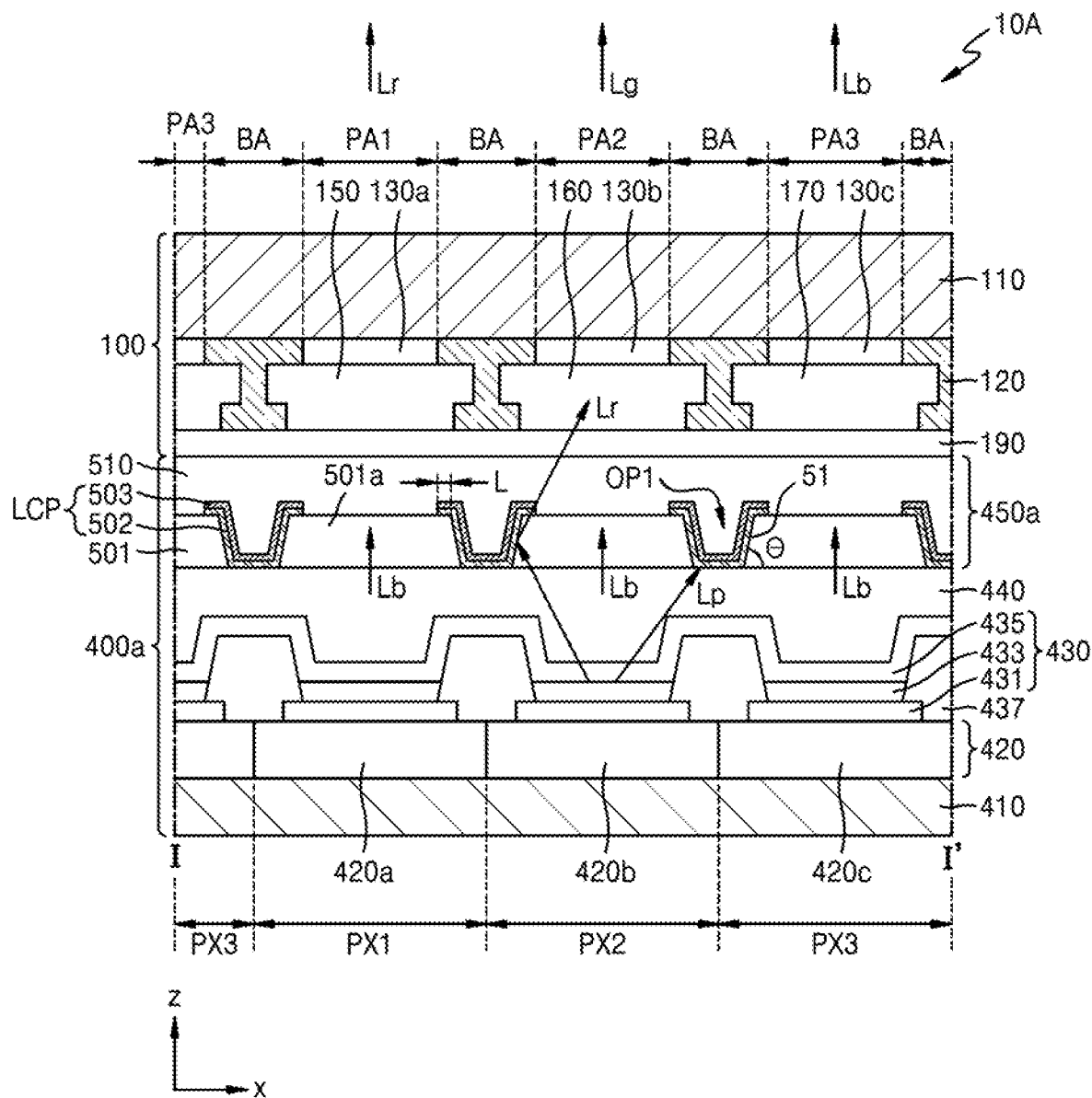
FIG. 5 is a cross-sectional view illustrating a cross-section taken along line I-I' of the display device of FIG. 1, according to an exemplary embodiment of the present invention.

FIG. 5 illustrates a cross-section taken along line I-I' of the display device of FIG. 1 according to an exemplary embodiment of the present invention.

Referring to FIG. 5, a display device 10A according to an exemplary embodiment of the present invention may include a display panel 400a and a color control member 100. First to third pixel circuits 420a, 420b, and 420c respectively of first to third pixels PX1, PX2, and PX3 may be arranged in a pixel circuit layer 420 of the display panel 400a. Light-emitting elements 430 may be arranged on the pixel circuit layer 420 to correspond to first to third pixel areas PA1, PA2, and PA3 of the color control member 100. An encapsulation layer 440 may be arranged on the light-emitting elements 430.

A light control layer 450a may be arranged on the encapsulation layer 440. For example, the light control layer 450a may be disposed between the light-emitting elements 430 and the color control member 100. The light control layer 450a may include a first insulating layer 501 having an insulating pattern 501a positioned in a pixel area PA of the substrate 410, and a light control pattern LCP positioned in a light-blocking area BA of the substrate 410 and arranged between insulating patterns 501a. The first insulating layer 501 may include a transparent material that transmits light. The light control layer 450a may further include a second insulating layer 510 covering the light control patterns LCP. For example, the second insulating layer 510 may have a complimentary shape to the exposed surfaces of the light control patterns LCP and the insulating patterns 501a.

The insulating pattern 501a may be arranged to correspond to the first to third pixel areas PA1, PA2, and PA3 of the color control member 100. The first insulating layer 501 may have an opening OP1 that surrounds the insulating pattern 501a (e.g., sidewalls) of the color control member 100 and corresponds to a light-blocking area BA, and the insulating pattern 501a may overlap the light-emitting element 430. The insulating layer 501 may include an organic material. The organic material may include an organic material having a low refractive index (n=1.52) or a monomer organic material of the encapsulation layer 440. The insulating pattern 501a may have a height of about 5.0 μm. An upper surface of the encapsulation layer 440 may be exposed by the opening OP1 arranged between the insulating patterns 501a. An inclination angle (e.g., an inner angle) formed between the side surface and the bottom surface of the insulating pattern 501a may be a first angle θ. The first angle θ may be an acute angle. For example, the first angle θ may be approximately 70 degrees. A distance (e.g., a width) between opposite sides of the insulating pattern 501a decreases away from the encapsulation layer 440. For example, a distance in the first direction (e.g., the x direction) between sides of the insulating pattern 501a, obliquely extending with respect to an upper surface of the encapsulation layer 440, may gradually decrease in the third direction (e.g., the z direction) from an upper surface of the encapsulation layer towards the planarization layer 190. Thus the insulating pattern 501 may have a tapered structure. A distance (e.g., a width) between opposite sides of the opening OP1 increases away from the encapsulation layer 440. For example, the opening OP1 may gradually increase in the third direction (e.g., the z direction) from an upper surface of the encapsulation layer towards the planarization layer 190. Thus the opening OP1 may have an inverse tapered structure relative to adjacent portions of insulating patterns 501a.

The light control pattern LCP may be arranged to correspond to a light-blocking area BA of the color control member 100. For example, the light control pattern LCP may overlap the light-blocking area BA in the third direction (e.g., the z direction) and may have substantially a same maximum width as a width of the light-blocking area BA. The light control pattern LCP may be located in the opening OP1 to surround the insulating pattern 501a and may completely cover the opening OP1. The light control pattern LCP may include a pair of inclined portions arranged on a side surface 51 of the opening OP1 (or the side surface of the insulating pattern 501) and facing each other. Each of the pair of inclined portions may form a first angle θ with a surface parallel to a main surface (e.g., an upper surface) of the substrate 410 or an upper surface of the encapsulation layer 440. The pair of inclined portions extends in a third direction (e.g., the z direction) away from the upper surface of the substrate 410, and the distance between inclined portions on the side closest to the substrate 410 is less than the distance between inclined portions on the side farther from the substrate 410. The light control pattern LCP may include a first non-inclined portion between the pair of inclined portions arranged on the bottom surface (e.g., a lower surface) of the opening OP1, for example, the upper surface of the encapsulation layer 440 exposed by the opening OP1. The light control pattern LCP may include second non-inclined portions formed on the inclined portions that extend to the upper surface of the insulating pattern 501a adjacent to the opening OP1. Each of the second non-inclined portions may have a length L extending from the inclined portion to the upper surface of the insulating pattern 501a in consideration of process dispersion due to mask alignment in a manufacturing process. For example, the second non-inclined portions may extend oppositely in the first direction (e.g., the x direction) across corresponding adjacent insulating patterns 501a towards parallel boundaries of the light-blocking area BA. Each inclined portion of a pair of inclined portions of the light control pattern LCP may partially overlap different adjacent pixels. According to an exemplary embodiment of the present invention, each pixel PX may overlap edge portions of two light-blocking areas BA and the pixel area PA disposed therebetween in the third direction (e.g., the z direction). The length L may be greater than the process dispersion. For example, when the process dispersion by mask alignment is ±2 μm, the length L of the second non-inclined portion may be approximately 4 μm.

The light control pattern LCP may include a reflective pattern 502 and a light-blocking pattern 503. The light-blocking pattern 503 is arranged on the reflective pattern 502 and has the same shape as the reflective pattern 502, and thus, end portions of the reflective pattern 502 and the light-blocking pattern 503 may coincide with each other. The reflective pattern 502 and the light blocking-pattern 503 may be arranged on the side surface and bottom surface of the opening OP1. The reflective pattern 502 may directly contact the upper surface of the encapsulation layer 440 exposed by the opening OP1 and the side surface of the insulating pattern 501a. The reflective pattern 502 may have a thickness of approximately 1500 Å, and the light-blocking pattern 503 may have a thickness of approximately 300 Å.

The reflective pattern 502 may include a reflective material. The reflective material may include a metal having high light reflectance. Examples of the metal may include silver (Ag), magnesium (Mg), aluminum (Al), platinum (Pt), palladium (Pd), gold (Au), nickel (Ni), neodymium (Nd), iridium (Ir), chromium (Cr) and/or an alloy. For example, the reflective pattern 502 may include Al or super Al.

The light-blocking pattern 503 may include a light-blocking material. The light-blocking material may include a light-absorbing material. The light-absorbing material may include a metal oxide such as $AlO_x$, $CrO_x$, $CuO_x$, $MoO_x$, $TiO_x$, $AlNdO_x$, $CuMoO_x$, $MoTaO_x$, $MoTiO_x$, or the like. For example, the light-blocking pattern 503 may include $MoTaO_x$ (MTO).

The reflective pattern 502 may reflect a portion Lp of light emitted from the light-emitting element 430 to an adjacent pixel area PA. Light Lr reflected by the light control pattern LCP may be incident on a color conversion layer 150 or 160 or a transmission layer 170 of a pixel area PA. The light-blocking pattern 503 of the light control pattern LCP may absorb the portion Lp of light emitted from the light-emitting element 430 to the adjacent pixel area PA.

FIGS. 6A to 6E illustrate steps in a manufacturing process of the display device 10A illustrated in FIG. 5.

Figure 6A:
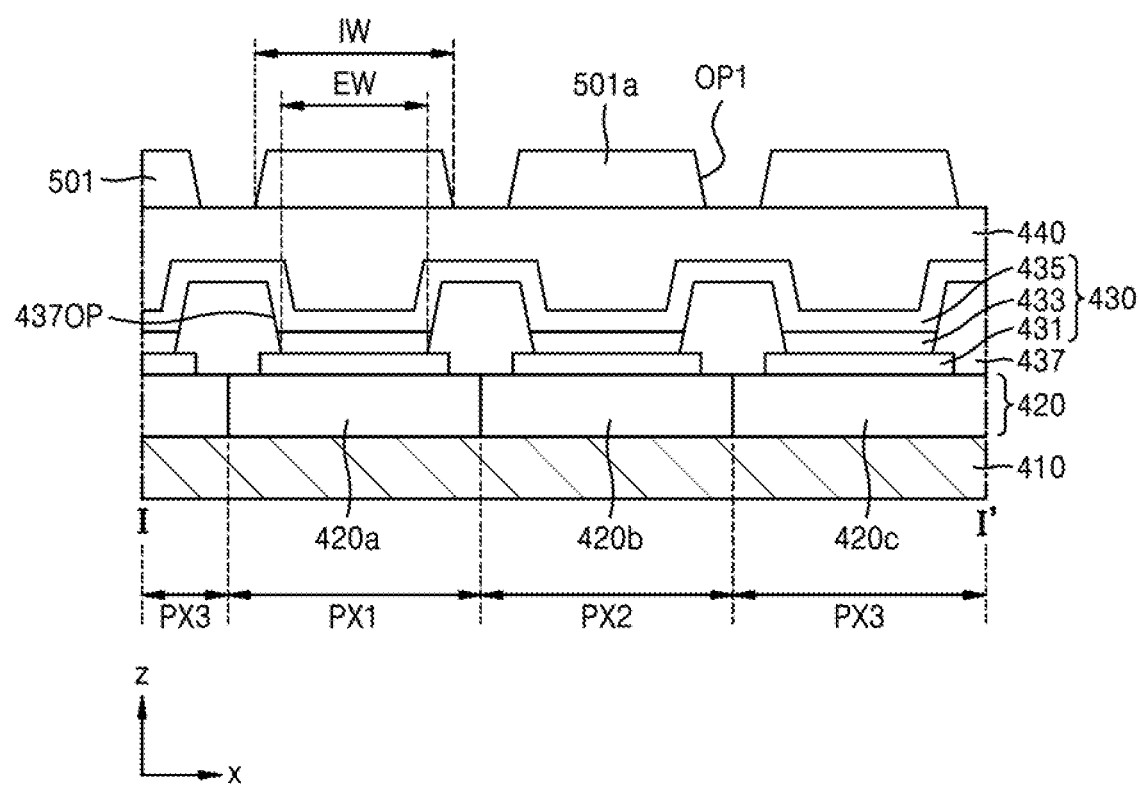
FIGS. 6A to 6E are cross-sectional views illustrating steps in a process of manufacturing the display device illustrated in FIG. 5, according to an exemplary embodiment of the present invention.

As shown in FIG. 6A, a first insulating layer 501 may be formed over a substrate 410 on which light-emitting elements 430, a pixel-defining layer 437 between the light-emitting elements 430, and an encapsulation layer 440 are formed, and then an opening OP1 penetrating the first insulating layer 501 may be formed, thereby forming an insulating pattern 501a. The first insulating layer 501 may include an organic insulating layer.

The opening OP1 may expose the upper surface of the encapsulation layer 440. Adjacent openings OP1 may entirely surround an opening 437OP of the pixel-defining layer 437 and may be located in a light-blocking area BA of the substrate 410. The insulating pattern 501a may be located in a pixel area PA of the substrate 410. The insulating pattern 501a may overlap the light-emitting element 430 (e.g., the pixel electrode 431). The insulating pattern 501a may overlap the opening 437OP of the pixel-defining layer 437, for example, in a third direction (e.g., the z direction). An inner width IW of the insulating pattern 501a may be equal to or greater than a width EW of the opening 437OP of the pixel-defining layer 437.

Figure 6B:
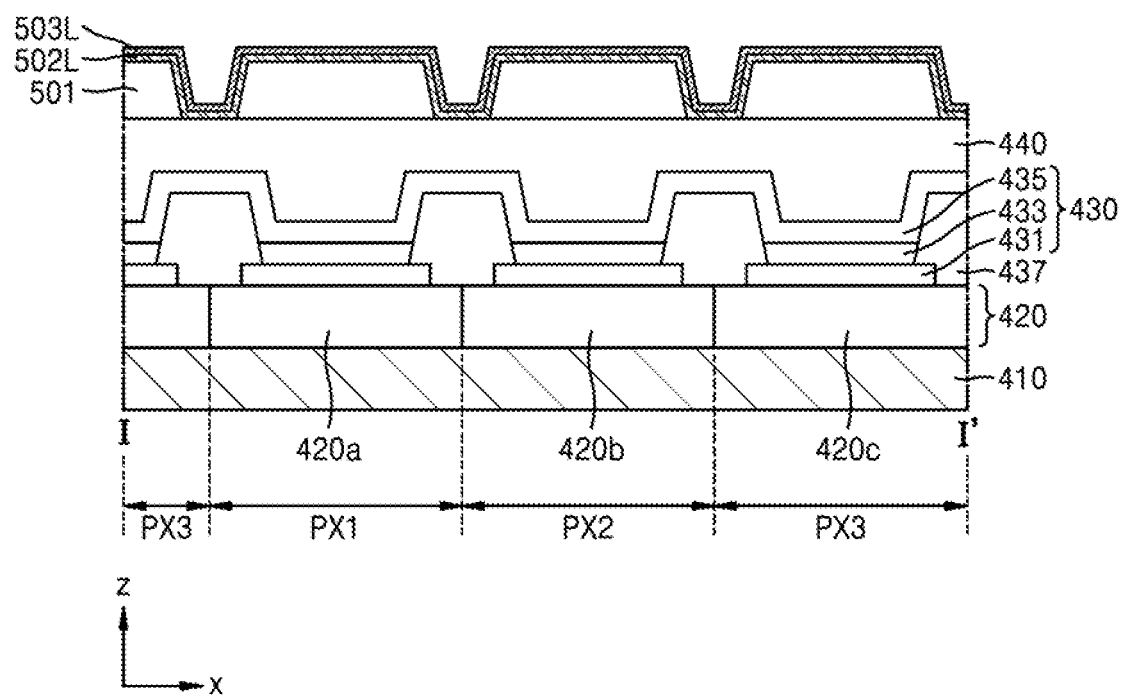

As shown in FIG. 6B, a reflective material layer 502L and a light-blocking material layer 503L may be sequentially deposited on the substrate 410 covering the first insulating layer 501, including the insulating pattern 501a, side and bottom surfaces of the openings OP1.

Figure 6C:
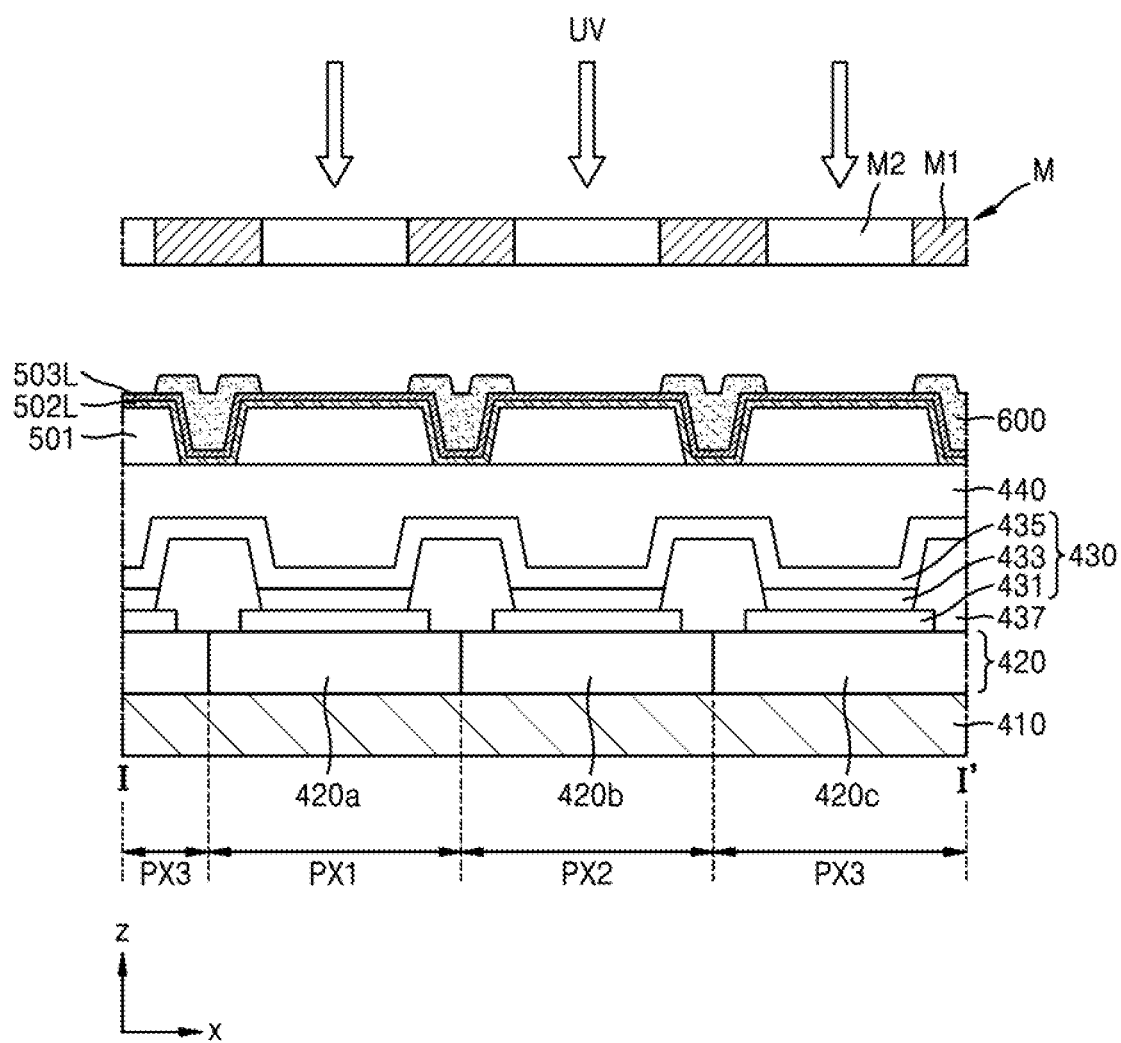

Subsequently, as shown in FIG. 6C, a photoresist 600 may be applied to at least partially cover the reflective material layer 502L and the light-blocking material layer 503L. For example the photoresist 600 may fill in the opening OP1 and may cover a portion of the light-blocking material layer overlying an edge of the insulating pattern 501a. The photoresist 600 may be ultraviolet (UV)-exposed and developed using an aligned mask M, and thus only a portion of the photoresist 600 corresponding to a light-blocking portion M1 may remain.

The photoresist 600 may include a photosensitive organic material such as acrylic resin, benzocyclobutene (BCB), polyimide (PI) and/or novolac resin. The photosensitive organic material may be a negative photosensitive material or a positive photosensitive material. FIG. 6C illustrates an example in which the photoresist 600 includes a positive photosensitive material. The mask M may include the light-blocking portion M1 and a light-transmitting portion M2. The light-blocking portion M1 may correspond to a region where the photoresist 600 remains after UV treatment, and the light-transmitting portion M2 may correspond to a region where the photoresist 600 is removed. The light-blocking portion M1 is at a position corresponding to the light-blocking area BA of the substrate 410, and the light-transmitting portion M2 is at a position corresponding to the pixel area PA of the substrate 410.

Figure 6D:
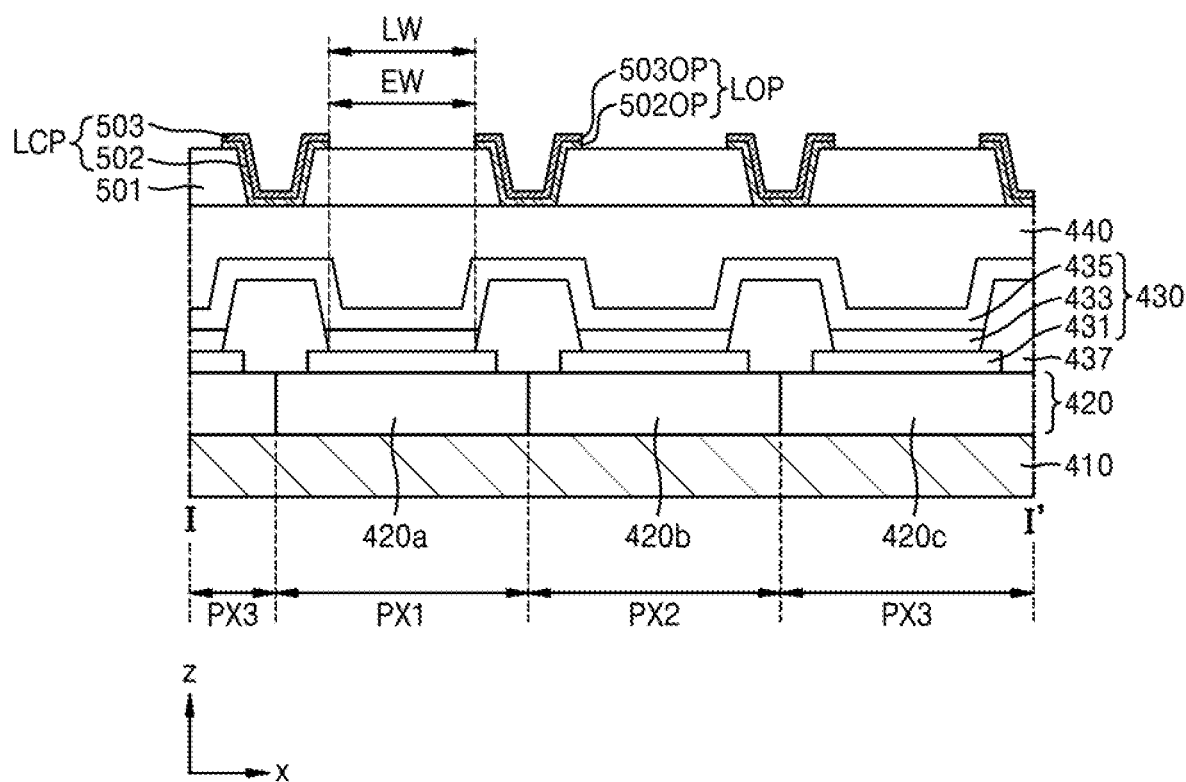

Next, as shown in FIG. 6D, the reflective material layer 502L and the light-blocking material layer 503L of a region where the photoresist 600 is removed may be etched to thereby form a light control pattern LCP including a reflective pattern 502 and a light-blocking pattern 503. Etching may be wet etching or dry etching. In an etching process in which the reflective material layer 502L and the light-blocking material layer 503L are removed, a portion of the upper portion of the first insulating layer 501 may be removed by overetching. An etched surface (e.g., a side surface) of the reflective material layer 502L corresponding to an opening 502OP and an etched surface of the light-blocking material layer 503L (e.g., a side surface) corresponding to an opening 503OP may coincide with each other (e.g., may be aligned). An opening LOP of the light control pattern LCP may include the opening 502OP of the reflective material layer 502L and the opening 503OP of the light-blocking material layer 503L. A width LW of the opening LOP of the light control pattern LCP may be equal to or greater than the width EW of the opening 437OP of the pixel-defining layer 437. Thereafter, the photoresist 600 remaining on the light control pattern LCP may be removed.

Figure 6E:
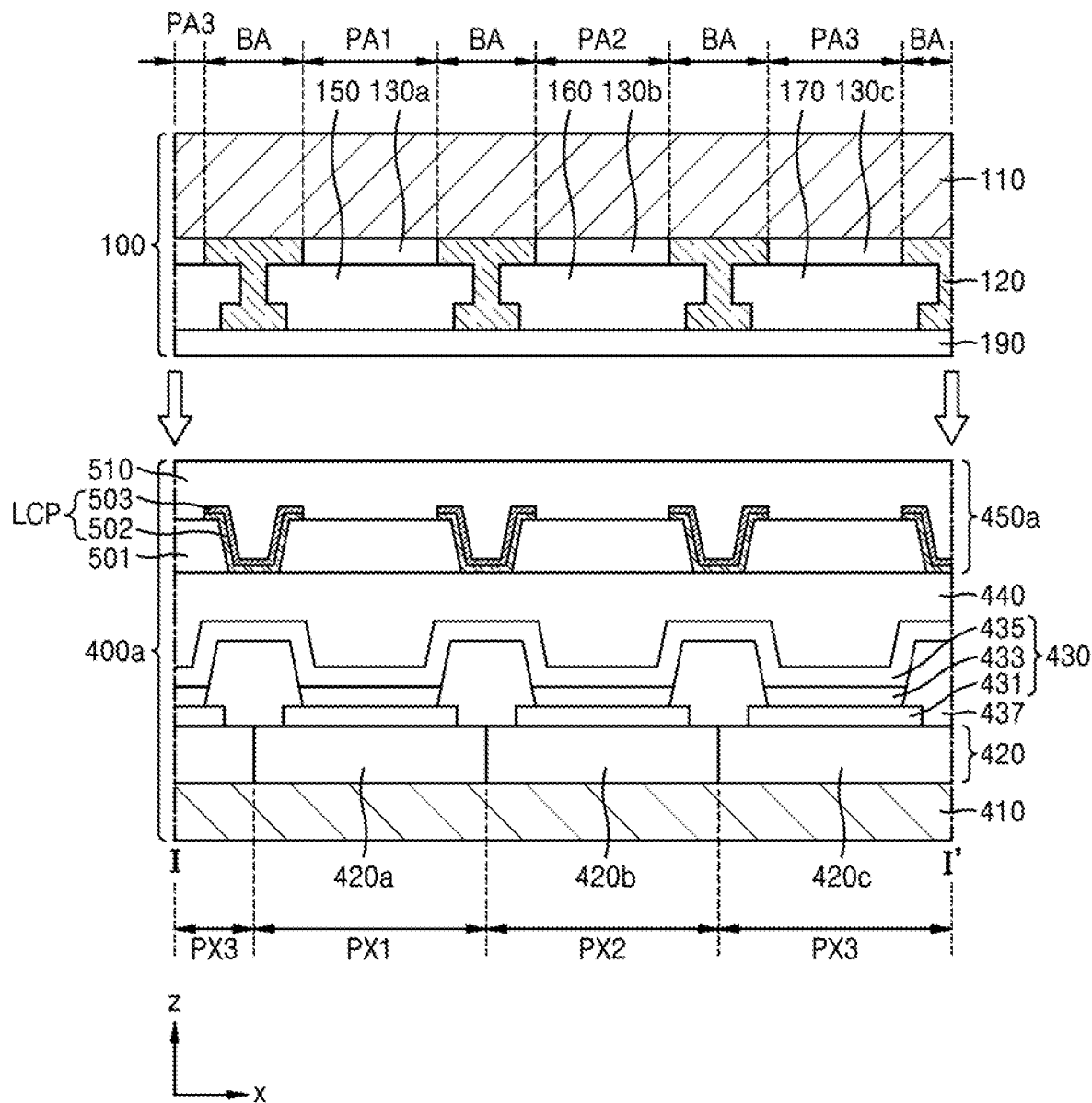

Next, as shown in FIG. 6E, a second insulating layer 510 covering the light control pattern LCP and the first insulating layer 501 may be arranged over the substrate 410. The second insulating layer 510 may include an organic insulating layer. The second insulating layer 510 may include the same material as that of the first insulating layer 501.

The display panel 400a and the color control member 100 may be aligned such that the pixel area PA and the light-blocking area BA of the substrate 410 correspond to a pixel area PA and a light-blocking area BA of the color control member 100, respectively, and then the display panel 400a and the color control member 100 may be combined.

For example, the display panel 400a and the color control member 100 may be aligned such that pixel areas PA1, PA2 and PA3 (and edge portions of light-blocking areas BA adjacent thereto) overlap a corresponding pixel PX1, PX2, and PX3, respectively, in the third direction (e.g., the z direction). Next, the display panel 400a and the color control member 100 may be combined.

Figure 7:
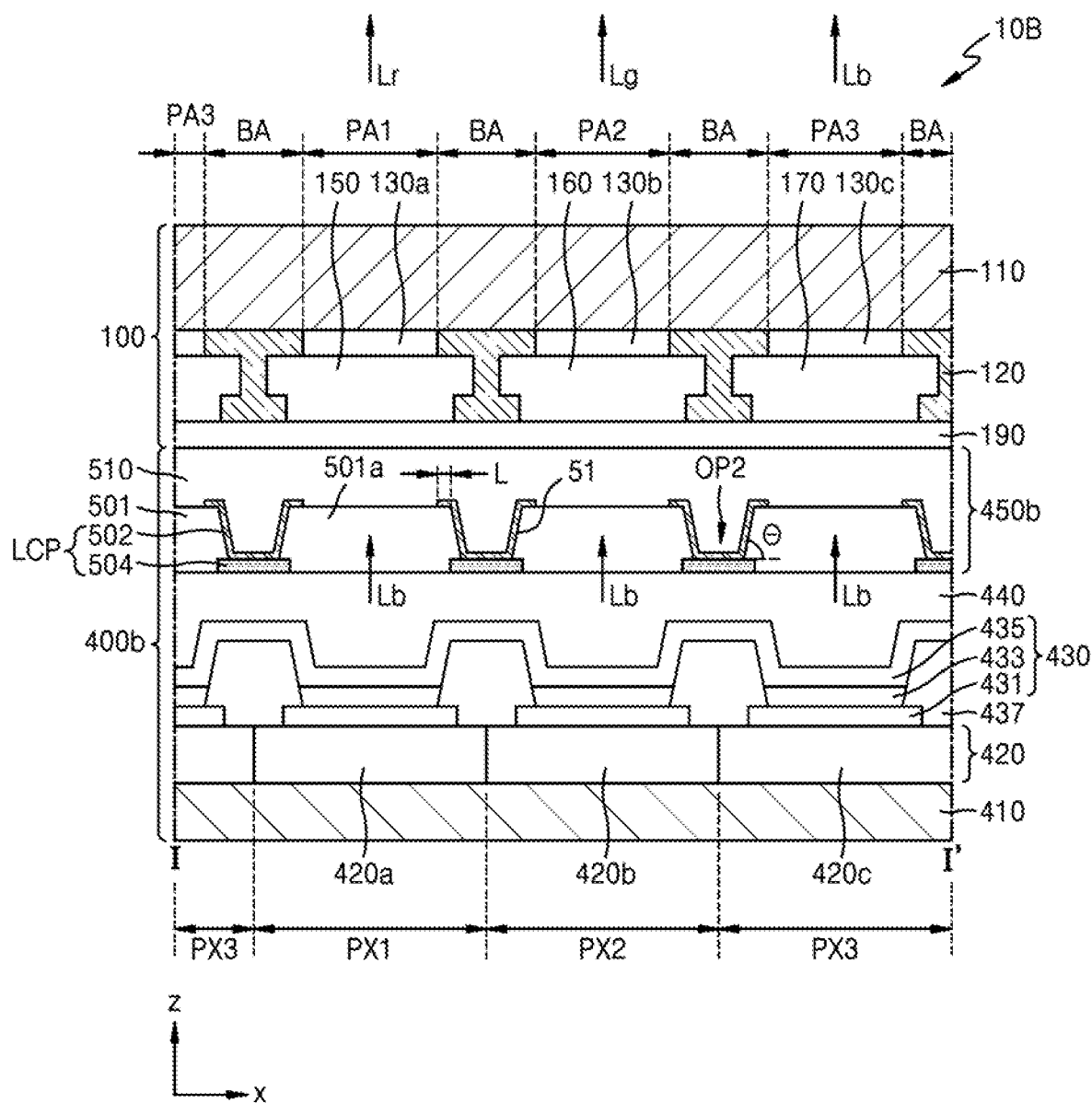
FIG. 7 is a cross-sectional view illustrating a cross-section taken along line I-I' of the display device of FIG. 1, according to an exemplary embodiment of the present invention.

FIG. 7 illustrates a cross-section taken along line I-I' of FIG. 1 according to an exemplary embodiment of the present invention.

Referring to FIG. 7, a display device 10B according to an exemplary embodiment of the present invention may include a display panel 400b and a color control member 100. First to third pixel circuits 420a, 420b, and 420c respectively of first to third pixels PX1, PX2, and PX3 may be arranged in a pixel circuit layer 420 of the display panel 400b. Light-emitting elements 430 may be arranged on the pixel circuit layer 420 to correspond to first to third pixel areas PA1, PA2, and PA3 of the color control member 100 (for example, first to third pixel areas of a substrate 410). An encapsulation layer 440 may be arranged on the light-emitting elements 430. For example, the encapsulation layer 440 may be disposed between the opposite electrode 435 and the first insulating layer 501.

A light control layer 450b may be arranged on the encapsulation layer 440. For example, the light control layer 450b may be disposed between the encapsulation layer 440 and the planarization layer 190. The light control layer 450b may include the insulating pattern 501a positioned in a pixel area PA of the substrate 410, and a light control pattern LCP positioned in a light-blocking area BA of the substrate 410 and arranged between insulating patterns 501a. The light control layer 450b may further include a second insulating layer 510 covering the light control pattern LCP.

The insulating pattern 501a may be arranged to correspond to first to third pixel areas PA1, PA2, and PA3 of the color control member 100. The first insulating layer 501 may have an opening OP2 that surrounds the insulating pattern 501a and corresponds to a light-blocking area BA of the color control member 100. The insulating pattern 501a may overlap the light-emitting element 430. An inner angle formed between the side surface and the lower surface (or a surface parallel to the lower surface) of the insulating pattern 501a may be a first angle θ. The insulating pattern 501a may have a tapered structure. The opening OP2 may have an inverse tapered structure relative to the tapered structure of the insulating pattern 501a.

The light control pattern LCP may be arranged to correspond to a light-blocking area BA of the color control member 100. The light control pattern LCP may be located in the opening OP2 to surround adjacent side surfaces of the insulating pattern 501a, and may completely cover surfaces of the opening OP2. The light control pattern LCP may include a pair of inclined portions arranged on a side surface 51 of the opening OP2 (or the side surface of the insulating pattern 501a). Each of the pair of inclined portions may form a first angle θ with the upper surface (or a surface parallel to the upper surface) of the encapsulation layer 440. The pair of inclined portions extends in a third direction (e.g., the z direction) away from the upper surface of the substrate 410, and the distance between inclined portions on the side closest to the substrate 410 is less than the distance between inclined portions on the side farther from the substrate 410. The light control pattern LCP may be arranged in the opening OP2 and may include a first non-inclined portion between the pair of inclined portions. The light control pattern LCP may include second non-inclined portions formed on the inclined portions and extending oppositely in the first direction (e.g., the x direction) to the upper surface of the insulating pattern 501a adjacent to the opening OP2. Each of the second non-inclined portions may extend by a length L to the upper surface of the insulating pattern 501a outside the opening OP2 in consideration of process dispersion due to mask alignment in a manufacturing process.

The light control pattern LCP may include a reflective pattern 502 and a light-blocking pattern 504. The reflective pattern 502 may be arranged on the side surface and bottom surface of the opening OP2. The light-blocking pattern 504 may be arranged on the bottom surface of the opening OP2.

The reflective pattern 502 may have a thickness of approximately 1500 Å. The reflective pattern 502 may include a reflective material.

The light-blocking pattern 504 may include a light-blocking material. The light-blocking material may include a light-absorbing material. The light-absorbing material may include a metal oxide such as $AlO_x$, $CrO_x$, $CuO_x$, $MoO_x$, $TiO_x$, $AlNdO_x$, $CuMoO_x$, $MoTaO_x$, $MoTiO_x$, or the like. The light-blocking pattern 504 may include an opaque inorganic insulating material or an opaque organic insulating material such as a black resin. The light-blocking pattern 504 may have various colors including black or white. In the case where the light-blocking pattern 504 is black, the light-blocking pattern 504 may include a black matrix. In the case where the light-blocking pattern 504 is white, the light-blocking pattern 504 may include an organic insulating material such as a white resin. The light-blocking pattern 504 may have a thickness of approximately 1.5 μm. The light-blocking pattern 504 may be arranged between the reflective pattern 502 and the encapsulation layer 440.

The reflective pattern 502 of the light control pattern LCP may include an inclined portion and first and second non-inclined portions. The light-blocking pattern 504 of the light control pattern LCP may be arranged under the first non-inclined portion of the reflective pattern 502. The light-blocking pattern 504 may directly contact the upper surface of the encapsulation layer 440. For example, the light-blocking pattern 504 may be disposed between the encapsulation layer 440 and the reflective pattern 502. The edge of the light-blocking pattern 504 may be covered by the insulating pattern 501a. The reflective pattern 502 may directly contact the upper surface of the light-blocking pattern 504 and the side surface of the insulating pattern 501a. For example, the insulating pattern 501a may have a stepped shape that accommodates a side surface of the light-blocking pattern 504 therein. The light-blocking pattern 504 may be wider in the first direction (e.g., the x direction) than a bottom surface of the opening OP2 and the first non-inclined portion of the reflective pattern 502 disposed thereon.

The reflective pattern 502 may reflect a portion of light emitted from the light-emitting element 430 to an adjacent pixel area. Light reflected by the light control pattern LCP may be incident on a color conversion layer 150 or 160 or a transmission layer 170 of a corresponding pixel area PA. The light-blocking pattern 504 may absorb the portion of light emitted from the light-emitting element 430 towards the adjacent pixel area associated with a neighboring light-emitting element 430.

FIGS. 8A to 8F illustrate steps in a manufacturing process of the display device 10B illustrated in FIG. 7.

Figure 8A:
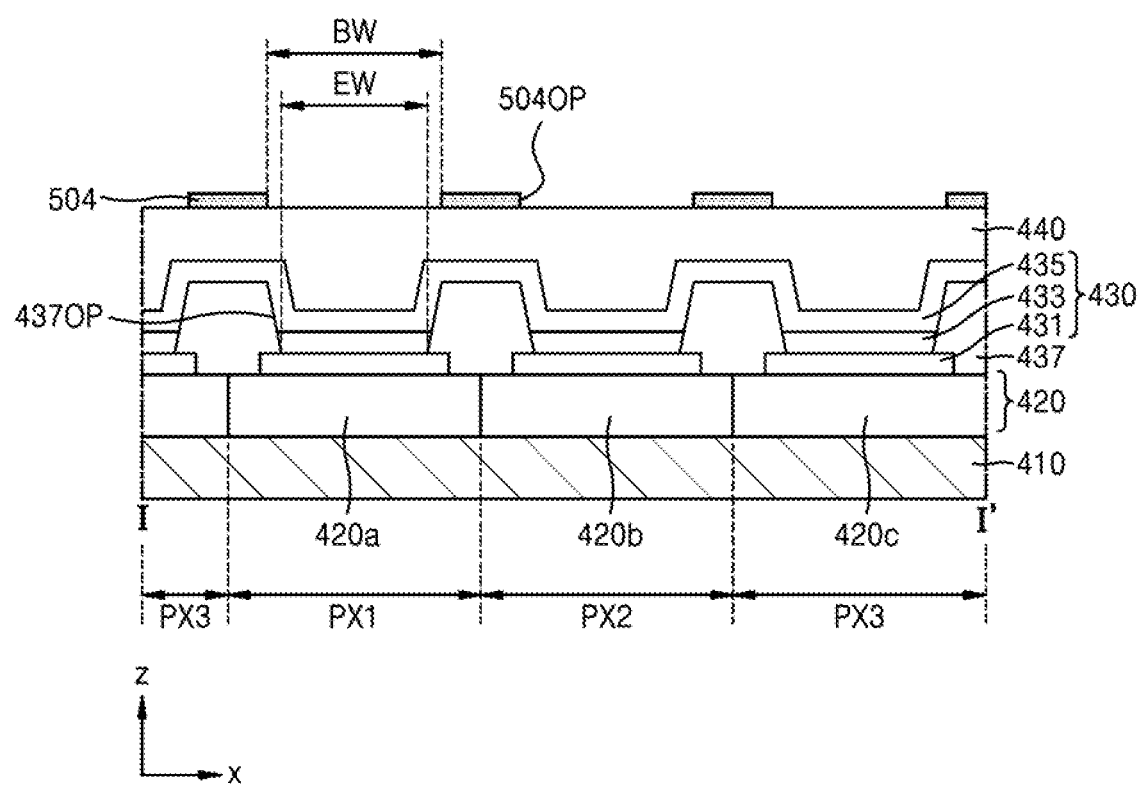
FIGS. 8A to 8F are cross-sectional views illustrating steps in a process of manufacturing the display device illustrated in FIG. 7, according to an exemplary embodiment of the present invention.

As shown in FIG. 8A, a light-blocking material layer may be formed over a substrate 410 on which light-emitting elements 430, a pixel-defining layer 437 between the light-emitting elements 430, and an encapsulation layer 440 are formed. Next, the light-blocking material layer may be patterned to thereby form a light-blocking pattern 504. The light-blocking pattern 504 may be arranged in a light-blocking area of the substrate 410 to overlap the pixel-defining layer 437. An opening 504OP of the light-blocking pattern 504 may be formed to entirely surround an opening 437OP of the pixel-defining layer 437. A width BW of the opening 504OP of the light-blocking pattern 504 may be equal to or greater than a width EW of the opening 437OP of the pixel-defining layer 437.

Figure 8B:
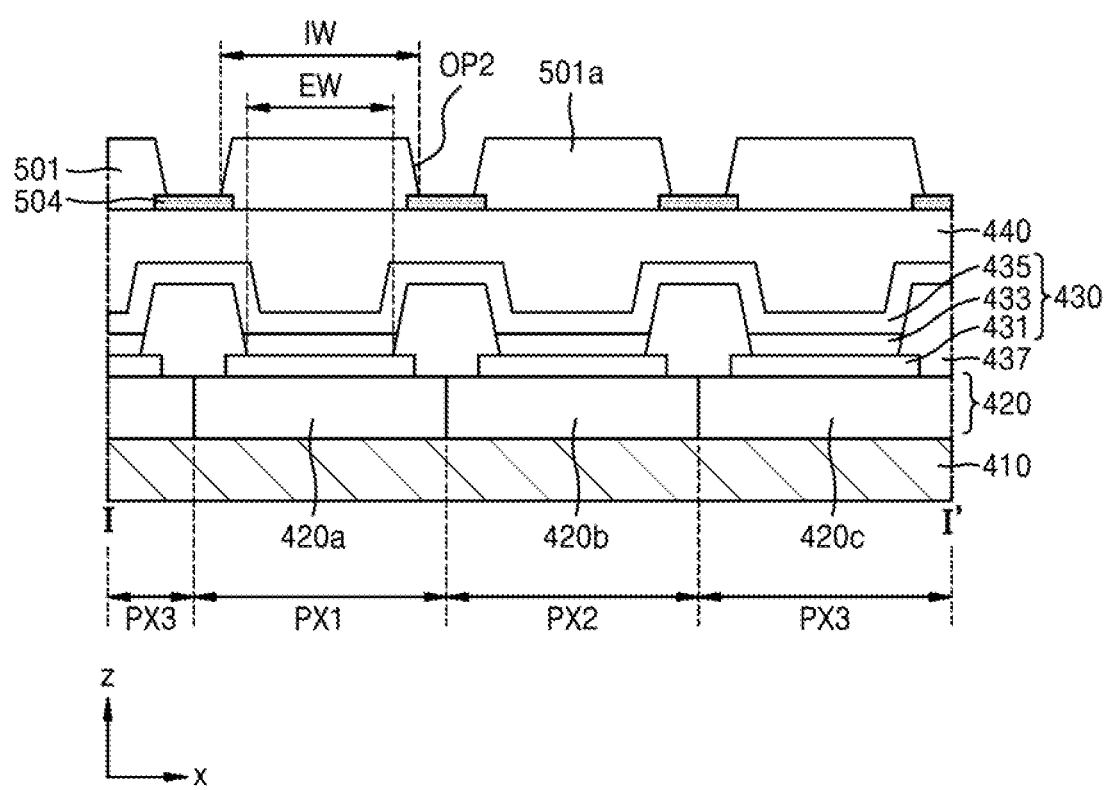

As shown in FIG. 8B, a first insulating layer 501 may be formed on the light-blocking pattern 504, and then an opening OP2 may be formed in the first insulating layer 501, thereby forming an insulating pattern 501a. The first insulating layer 501 may include an organic insulating layer. The opening OP2 may entirely surround the opening 437OP of the pixel-defining layer 437 and may be located in a light-blocking area BA of the substrate 410. The opening OP2 may expose an upper surface of the light-blocking pattern 504. The insulating pattern 501a may overlap the light-emitting element 430 (or a pixel electrode 431) in the third direction (e.g., the z direction). The insulating pattern 501a may overlap the opening 437OP of the pixel-defining layer 437, and an inner width IW of the insulating pattern 501a may be equal to or greater than a width EW of the opening 437OP of the pixel-defining layer 437.

Figure 8C:
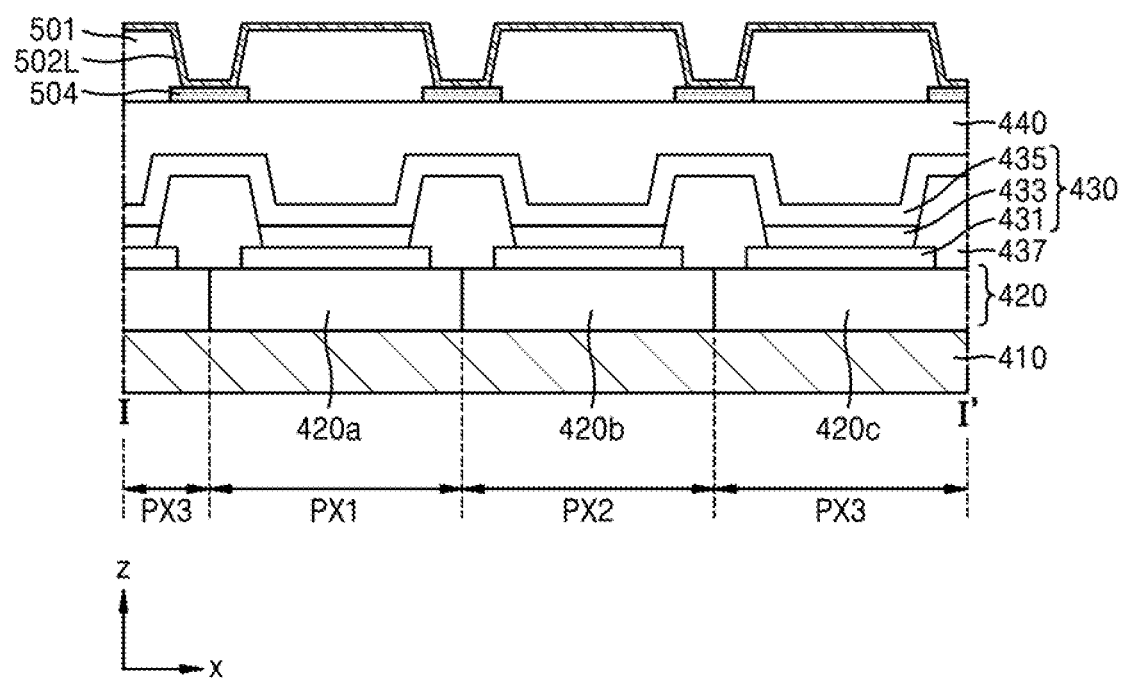

As shown in FIG. 8C, a reflective material layer 502L may be deposited on the substrate 410 covering the first insulating layer 501 which includes the insulating pattern 501a, side and bottom surfaces of the openings OP2, and an upper surface of the light-blocking pattern 504.

Figure 8D:
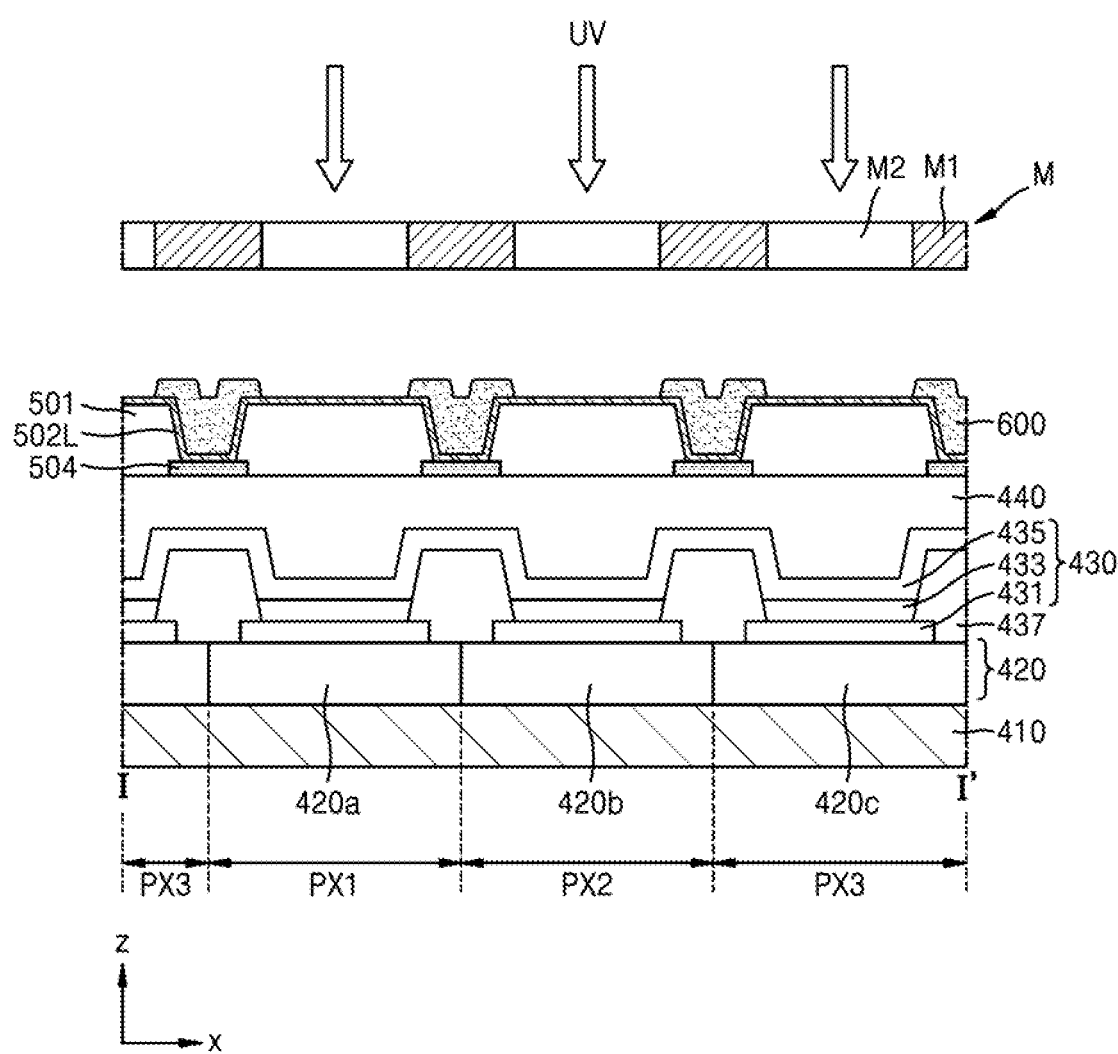

Subsequently, as shown in FIG. 8D, a photoresist 600 may be applied to cover the reflective material layer 502L, and the photoresist 600 may be UV-exposed and developed using an aligned mask M. Thus, a portion of the photoresist 600 corresponding to a light-transmitting portion M2 may be removed and only a portion of the photoresist 600 corresponding to a light-blocking portion M1 may remain.

Figure 8E:
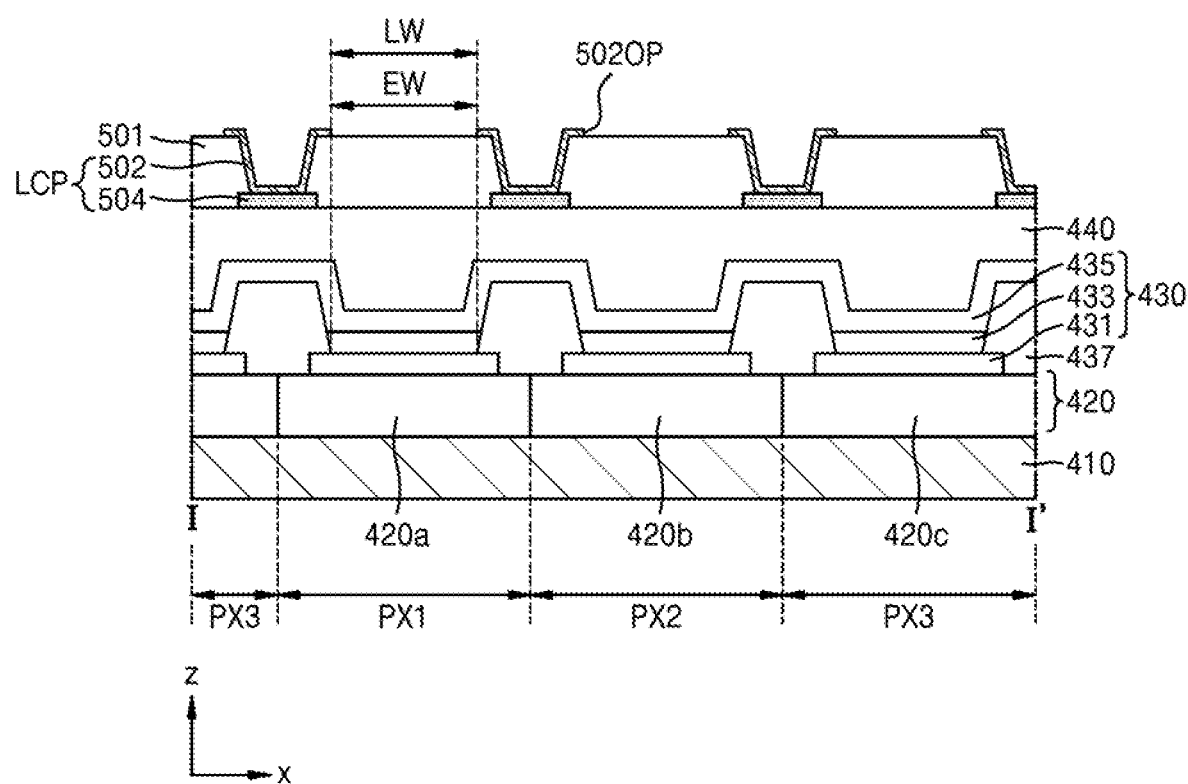

Next, as shown in FIG. 8E, the reflective material layer 502L of a region where the photoresist 600 is removed may be etched to thereby form a reflective pattern 502. Etching may be wet etching or dry etching. In an etching process in which the reflective material layer 502L is removed, a portion of the upper portion of the first insulating layer 501 may be removed by overetching. The width of an opening 502OP of the reflective material layer 502L, that is, a width LW of an opening LOP of the light control pattern LCP, may be equal to or greater than the width EW of the opening 437OP of the pixel-defining layer 437. Thereafter, the photoresist 600 remaining on the reflective pattern 502 may be removed.

Figure 8F:
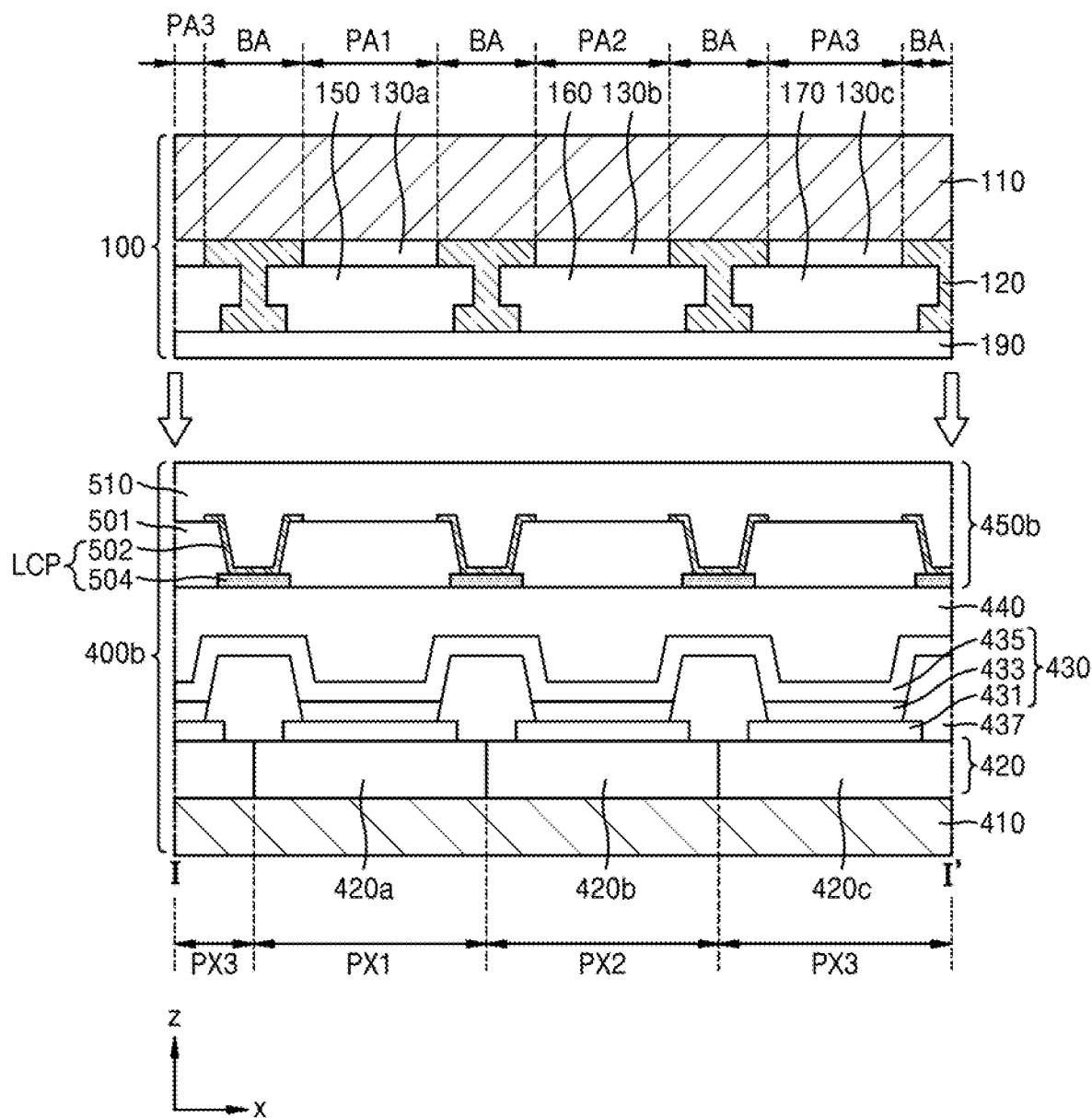

Next, as shown in FIG. 8F, a second insulating layer 510 covering the light control pattern LCP and the first insulating layer 501 may be arranged over the substrate 410. The second insulating layer 510 may include an organic insulating layer. The second insulating layer 510 may include the same material as that of the first insulating layer 501.

The display panel 400b and the color control member 100 may be aligned such that the pixel area PA and the light-blocking area BA of the substrate 410 correspond to the pixel area PA and the light-blocking area BA of the color control member 100, respectively, and then the display panel 400b and the color control member 100 may be combined.

Figure 9:
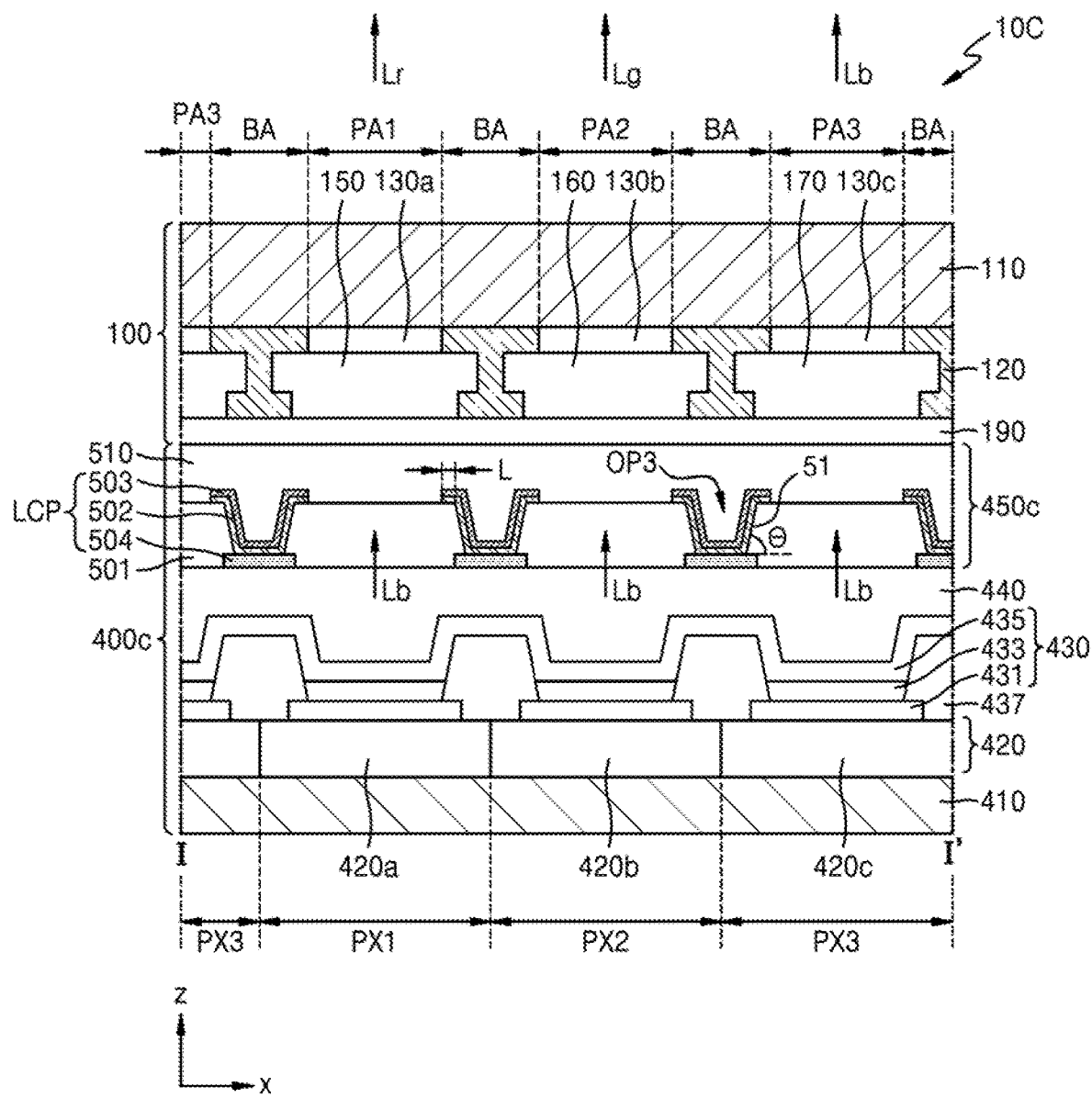
FIG. 9 is a cross-sectional view illustrating a cross-section taken along line I-I' of the display device of FIG. 1, according to an exemplary embodiment of the present invention.

FIG. 9 illustrates a cross-section taken along line I-I' of FIG. 1 according to an exemplary embodiment of the present invention.

Referring to FIG. 9, a display device 10C according to an exemplary embodiment of the present invention may include a display panel 400c and a color control member 100. A light control layer 450c may be arranged on an encapsulation layer 440.

The exemplary embodiment of the present invention illustrated in FIG. 9 is different from the exemplary embodiments of the present invention illustrated in FIGS. 5 and 7 in that a light control pattern LCP of a light control layer 450c includes a reflective pattern 502, a first light-blocking pattern 503, and a second light-blocking pattern 504. Since other configurations are the same as those of FIGS. 5 and 7, detailed descriptions thereof may be omitted.

The reflective pattern 502 and the first light-blocking pattern 503 of the light control pattern LCP may be arranged on the side surfaces and bottom of an opening OP3 of a first insulating layer 501, and the second light-blocking pattern 504 may be arranged on the bottom of the opening OP3.

The reflective pattern 502 and the first light-blocking pattern 503 of the light control pattern LCP may each include a pair of inclined portions and first and second non-inclined portions. The second light-blocking pattern 504 of the light control pattern LCP may be arranged under the first non-inclined portion of the reflective pattern 502. The first light-blocking pattern 503 may be formed on the reflective pattern 502 in the same shape as the reflective pattern 502. The second light-blocking pattern 504 may directly contact the upper surface of an encapsulation layer 440 and may be provided under the reflective pattern 502. The edge of the second light-blocking pattern 504 may be covered by an insulating pattern 501a. The reflective pattern 502 may directly contact the upper surface of the second light-blocking pattern 504 and the side surface of the insulating pattern 501a.

The reflective pattern 502 may reflect a portion of light emitted from the light-emitting element 430 to an adjacent pixel area. Light reflected by the light control pattern LCP may be incident on a color conversion layer 150 or 160 or a transmission layer 170 of a pixel area PA1, PA2 and PA3, respectively. The first light-blocking pattern 503 and the second light-blocking pattern 504 may absorb a portion of light emitted from the light-emitting element 430 to the adjacent pixel area PA associated with a neighboring pixel PX.

Figure 10:
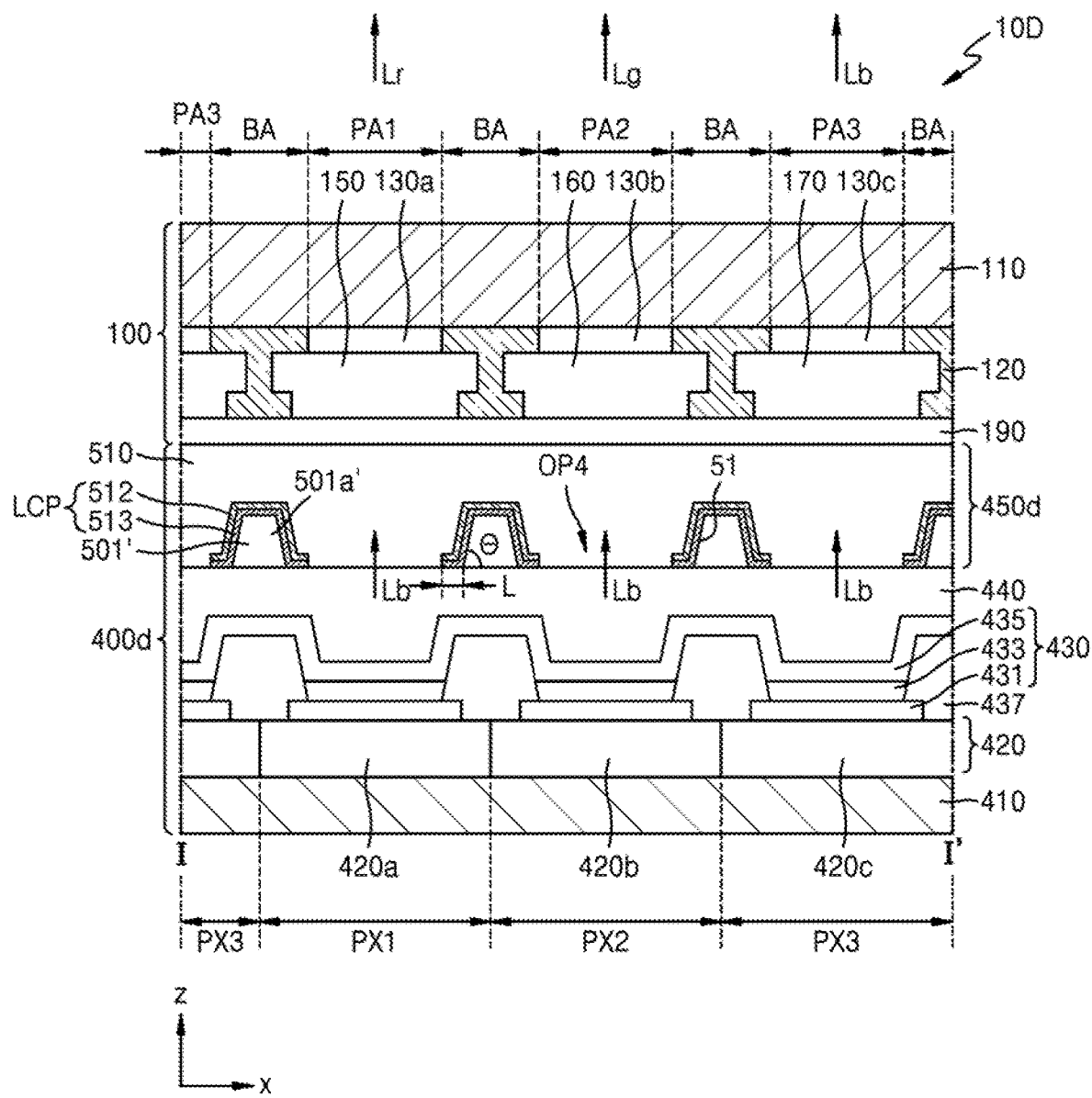
FIG. 10 is a cross-sectional view illustrating a cross-section taken along line I-I' of the display device of FIG. 1, according to an exemplary embodiment of the present invention.

FIG. 10 illustrates a cross-section taken along line of the display device of FIG. 1 according to an exemplary embodiment of the present invention.

Referring to FIG. 10, a display device 10D according to an exemplary embodiment of the present invention may include a display panel 400d and a color control member 100. First to third pixel circuits 420a, 420b, and 420c respectively of first to third pixels PX1, PX2, and PX3 may be arranged in a pixel circuit layer 420 of the display panel 400d. Light-emitting elements 430 may be arranged on the pixel circuit layer 420 to correspond to first to third pixel areas PA1, PA2, and PA3 of the color control member 100. An encapsulation layer 440 may be arranged on the light-emitting elements 430.

A light control layer 450d may be arranged on the encapsulation layer 440. The light control layer 450d may include a first insulating layer 501' having an insulating pattern 501a' positioned overlapping a light-blocking area BA of the color control member 100. The light control pattern LCP may be positioned overlapping the light-blocking area BA. The light control pattern LCP may cover the insulating pattern 501a' and may be arranged on the first insulating layer 501'. The light control layer 450d may further include a second insulating layer 510 covering the light control pattern LCP.

The insulating pattern 501a' may be arranged to correspond to a light-blocking area BA of the color control member 100. The insulating pattern 501a' may have a thickness of approximately 5.0 μm. The first insulating layer 501' may have an opening OP4 corresponding to the first to third pixel areas PA1, PA2, and PA3 of the color control member 100. The insulating pattern 501a' may surround a pixel area PA and may be located in the light-blocking area BA of the color control member 100. An upper surface of the encapsulation layer 440 may be exposed by the opening OP4 between insulating patterns 501a'. An inner angle formed between the side surface and the bottom surface of the insulating pattern 501a' may be a first angle θ. The insulating pattern 501a' may have a tapered structure. The opening OP4 may have an inverse tapered structure relative to the insulating patterns 501a'.

The light control pattern LCP may be arranged to correspond to a light-blocking area BA of the color control member 100. The light control pattern LCP may completely cover the insulating pattern 501a'. For example, the light control pattern LCP may be arranged to cover a side surface 51 of the insulating pattern 501a' and the upper surface of the insulating pattern 501a'. The light control pattern LCP may include a pair of inclined portions arranged on the side surface 51 of the insulating pattern 501a'. Each of the pair of inclined portions may form a first angle θ with the upper surface of the encapsulation layer 440. The pair of inclined portions may extend in an oblique direction from the upper surface of the encapsulation layer 440, and the distance between inclined portions on the side closest to the substrate 410 is greater than the distance between inclined portions on the side farther from the substrate 410. The light control pattern LCP may include a first non-inclined portion arranged on the upper surface of the insulating pattern 501*a*' and extending in the first direction (e.g., the x direction). The light control pattern LCP may include second non-inclined portions arranged on the upper surface of the encapsulation layer 440 connected to the inclined portions and extending into the opening OP4 in the first direction (e.g., the x direction). Each of the second non-inclined portions may extend by a length L to the upper surface of the encapsulation layer 440 inside the opening OP4 in consideration of process dispersion due to mask alignment in a manufacturing process.

The light control pattern LCP may include a reflective pattern 512 and a light-blocking pattern 513. The reflective pattern 512 and the light-blocking pattern 513 may be arranged on the side surface and upper surface of the insulating pattern 501*a*'. The reflective pattern 512 may be arranged on the light-blocking pattern 513 and may have the same shape as the light-blocking pattern 513, and thus, end portions of the reflective pattern 512 and the light-blocking pattern 513 may coincide with each other. The light-blocking pattern 513 may directly contact the side surface and upper surface of the insulating pattern 501*a*'. The reflective pattern 512 may have a thickness of approximately 1500 Å, and the light-blocking pattern 513 may have a thickness of approximately 300 Å.

The reflective pattern 512 may include a reflective material. For example, the reflective pattern 512 may include Al or super Al. The light-blocking pattern 513 may include a light-blocking material. For example, the light-blocking pattern 513 may include $MoTaO_x$ (MTO).

The reflective pattern 512 of the light control pattern LCP may reflect a portion of light emitted from the light-emitting element 430 of one pixel area PA away from an adjacent pixel area PA associated with a different light-emitting element 430. Emitted light that is reflected by the light control pattern LCP may be incident on a color conversion layer 150 or 160 or a transmission layer 170 of a corresponding pixel area PA in which the light-emitting element 430 overlaps. The light-blocking pattern 513 of the light control pattern LCP may absorb a portion of light emitted from the light-emitting element 430 that has a trajectory towards an adjacent pixel area PA and prevents it from reaching the adjacent pixel area PA.

FIGS. 11A to 11E illustrate steps in a manufacturing process of the display device 10D illustrated in FIG. 10.

Figure 11A:
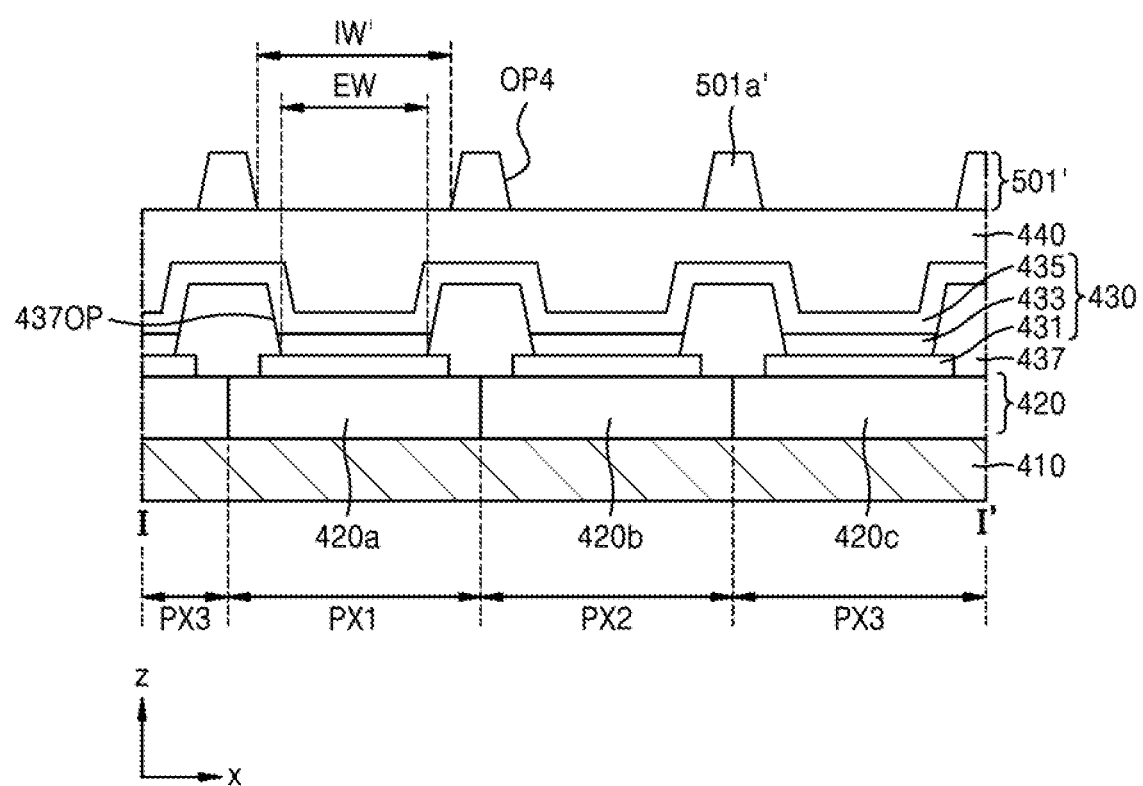
FIGS. 11A to 11E are cross-sectional view illustrating steps in a process of manufacturing the display device illustrated in FIG. 10, according to an exemplary embodiment of the present invention.

As shown in FIG. 11A, a first insulating layer 501' may be formed over a substrate 410 on which light-emitting elements 430, a pixel-defining layer 437 between light-emitting elements 430, and an encapsulation layer 440 are formed, and then an opening OP4 penetrating the first insulating layer 501' may be formed, thereby forming an insulating pattern 501*a*'. The first insulating layer 501' may include an organic insulating layer. The opening OP4 may expose the upper surface of the encapsulation layer 440. The opening OP4 may correspond to the pixel area PA of the substrate 410, and the insulating pattern 501*a*' may be correspond to a light-blocking area BA of the substrate 410. The insulating pattern 501*a*' may entirely surround an opening 437OP of the pixel-defining layer 437 and overlap the pixel-defining layer 437. A width IW' of the opening OP4 of the insulating pattern 501*a*' overlapping the opening 437OP of the pixel-defining layer 437 may be equal to or greater than a width EW of the opening 437OP of the pixel-defining layer 437.

Figure 11B:
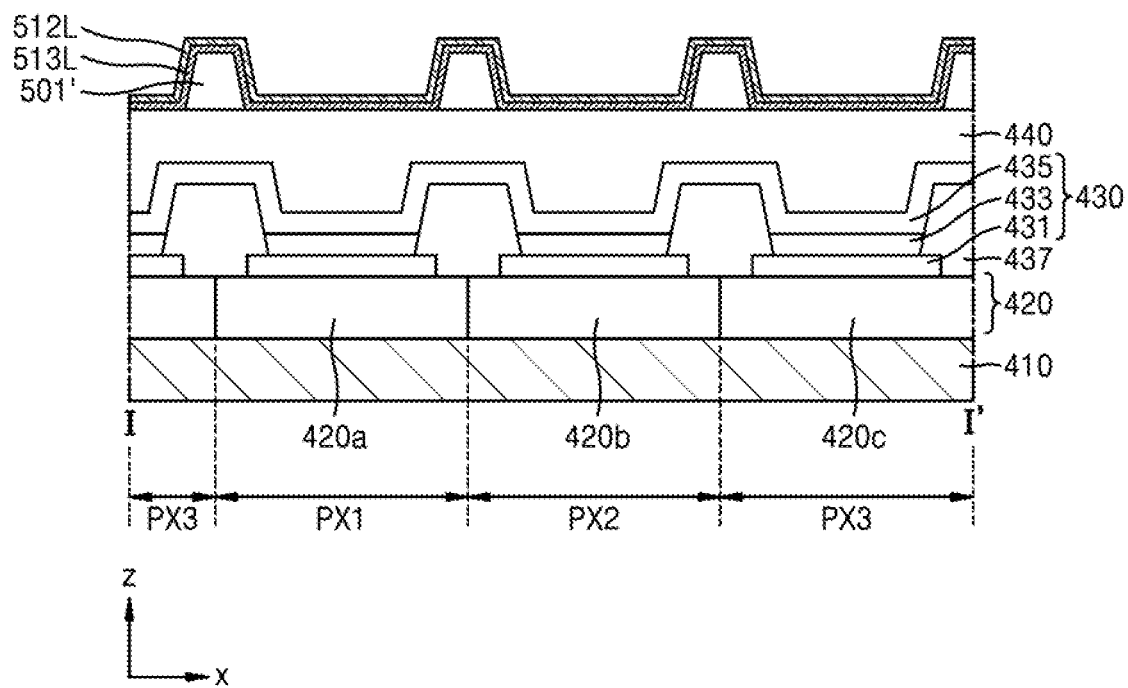

As shown in FIG. 11B, a light-blocking material layer 513L and a reflective material layer 512L may be sequentially deposited on the substrate 410 while covering the first insulating layer 501'.

Figure 11C:
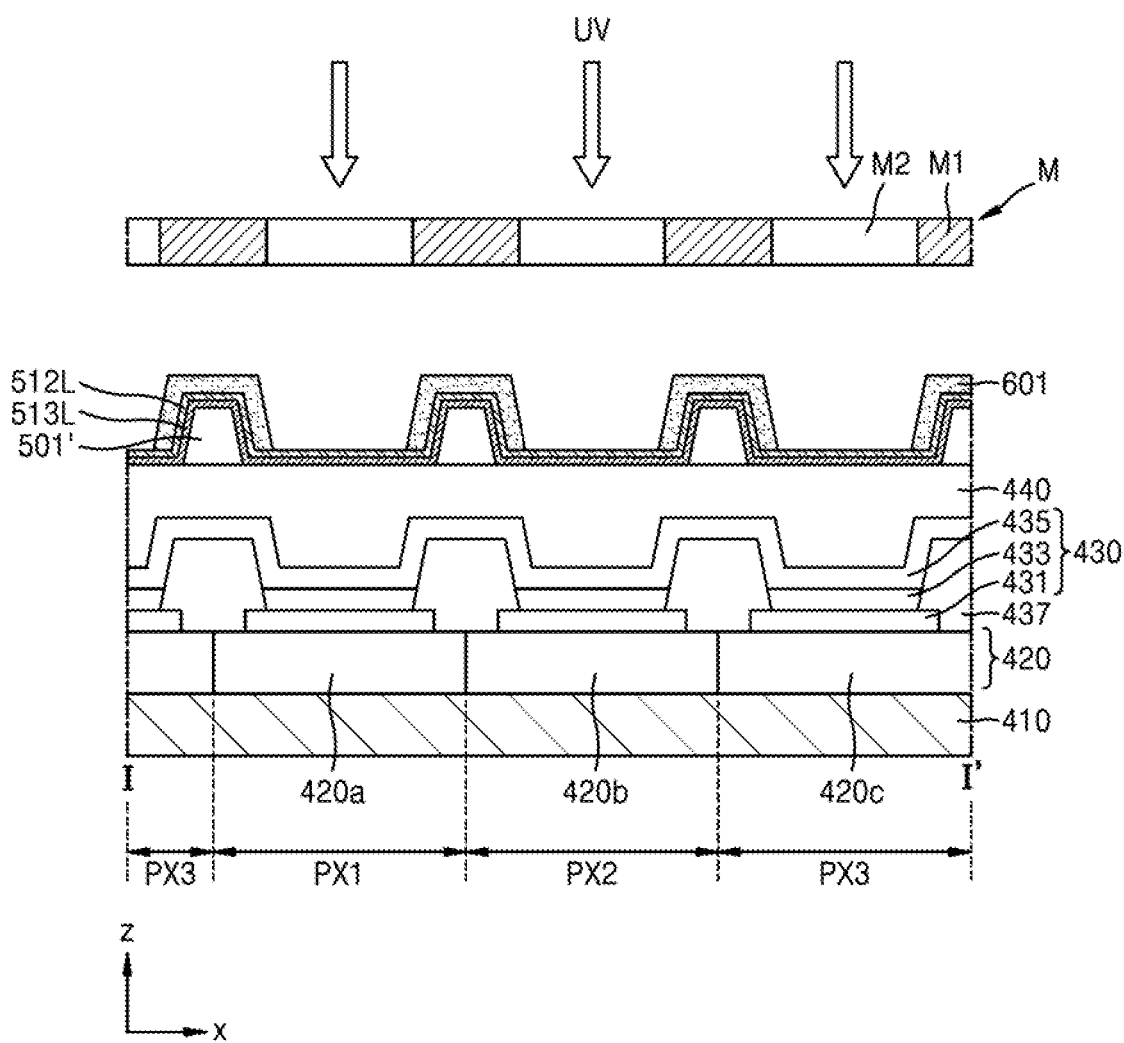

Subsequently, as shown in FIG. 11C, a photoresist 601 may be applied to cover the light-blocking material layer 513L and the reflective material layer 512L, and the photoresist 601 may be ultraviolet (UV)-exposed and developed using an aligned mask M, and thus, a portion of the photoresist 601 corresponding to a light-transmitting portion M2 may be removed and only a portion of the photoresist 601 corresponding to a light-blocking portion M1 may remain.

Figure 11D:
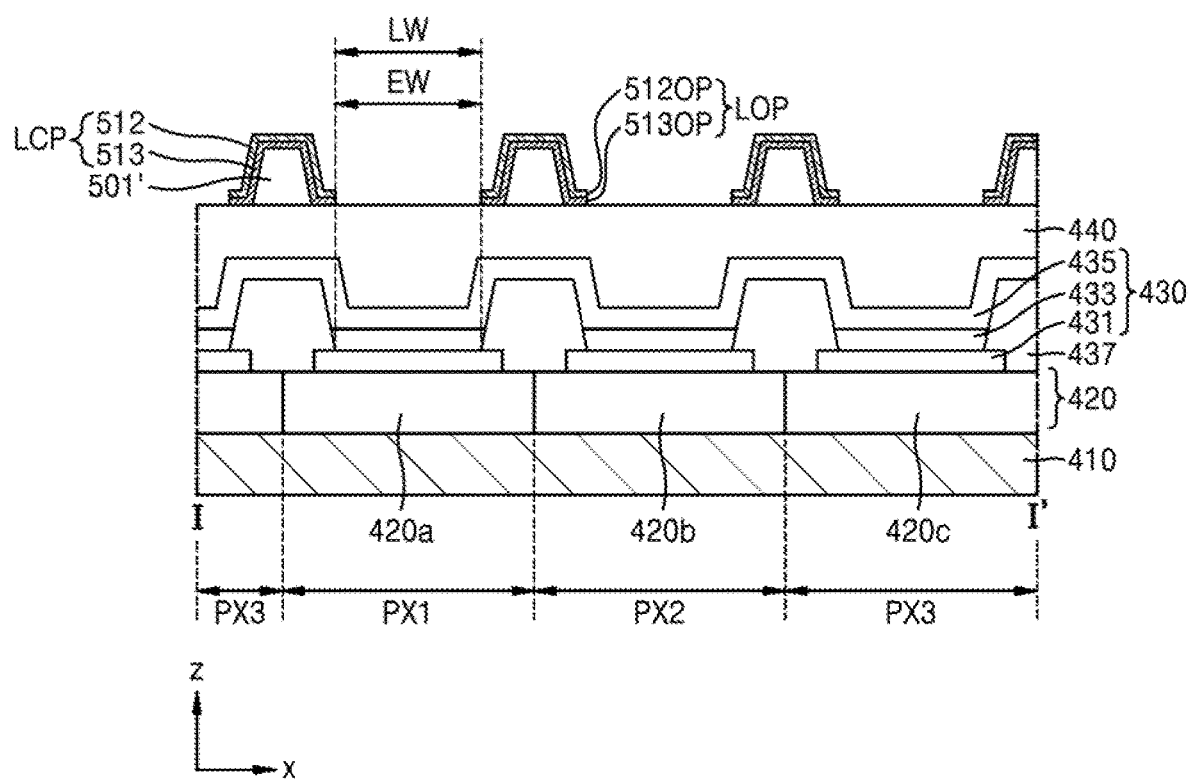

Next, as shown in FIG. 11D, the light-blocking material layer 513L and the reflective material layer 512L of a region where the photoresist 601 is removed may be etched to thereby form a light control pattern LCP including a reflective pattern 512 and a light-blocking pattern 513. Etching may be wet etching or dry etching. An etched surface (e.g., a side surface) of the reflective material layer 512L corresponding to an opening 512OP and an etched surface (e.g., a side surface) of the light-blocking material layer 513L corresponding to an opening 513OP may coincide with each other (e.g., may be aligned). An opening LOP of the light control pattern LCP may include the opening 512OP of the reflective material layer 512L and the opening 513OP of the light-blocking material layer 513L. A width LW of the opening LOP of the light control pattern LCP may be equal to or greater than the width EW of the opening 437OP of the pixel-defining layer 437. Thereafter, the photoresist 601 remaining on the light control pattern LCP may be removed.

Figure 11E:
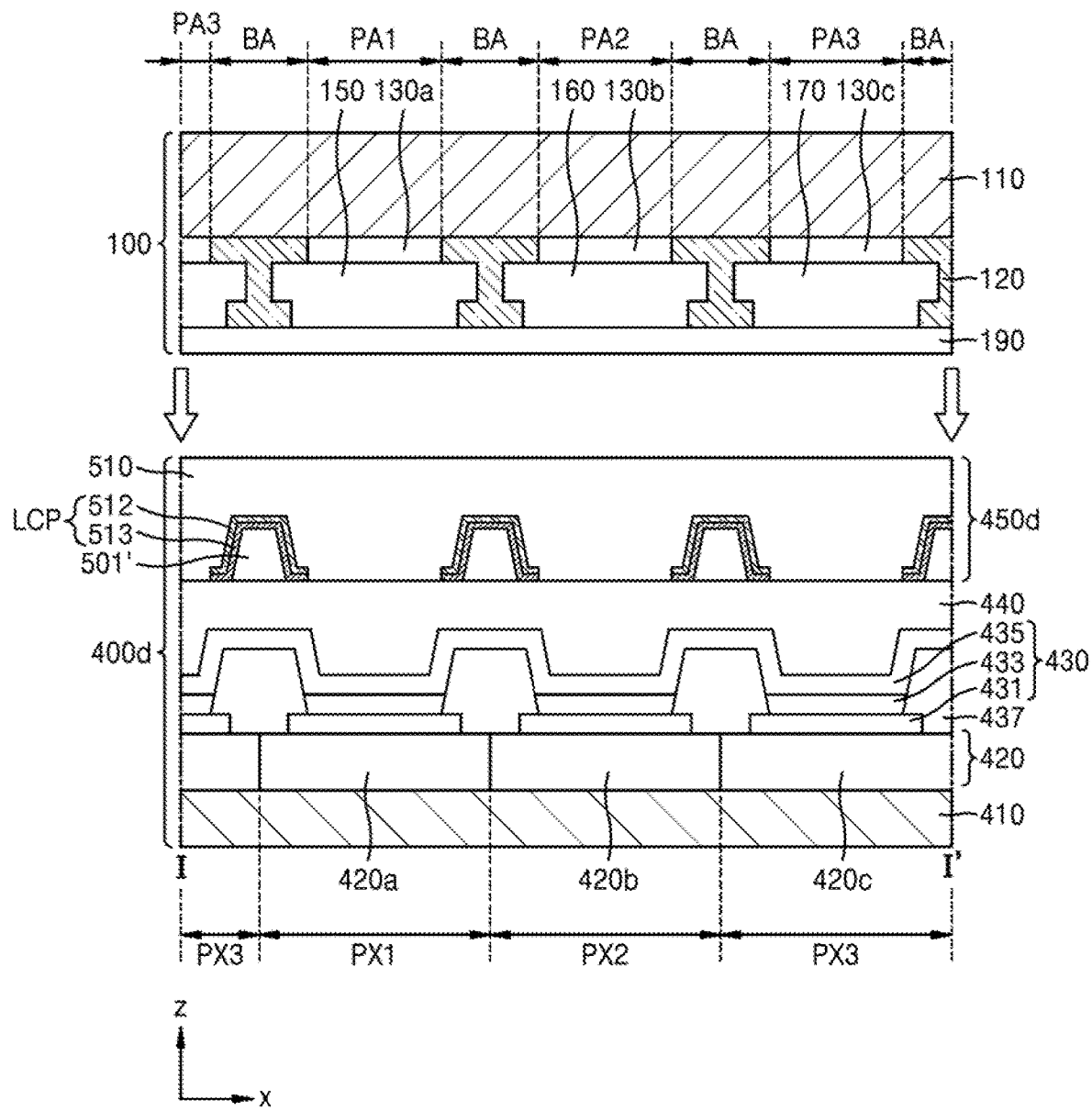

Next, as shown in FIG. 11E, a second insulating layer 510 covering the light control pattern LCP and the first insulating layer 501' may be arranged over the substrate 410. The second insulating layer 510 may include an organic layer including an organic material. The second insulating layer 510 may include the same material as that of the first insulating layer 501'.

The display panel 400*d* and the color control member 100 may be aligned such that a pixel area PA and a light-blocking area BA of the substrate 410 correspond to a pixel area PA and a light-blocking area BA of the color control member 100, respectively, and then the display panel 400*d* and the color control member 100 may be combined.

Figure 12:
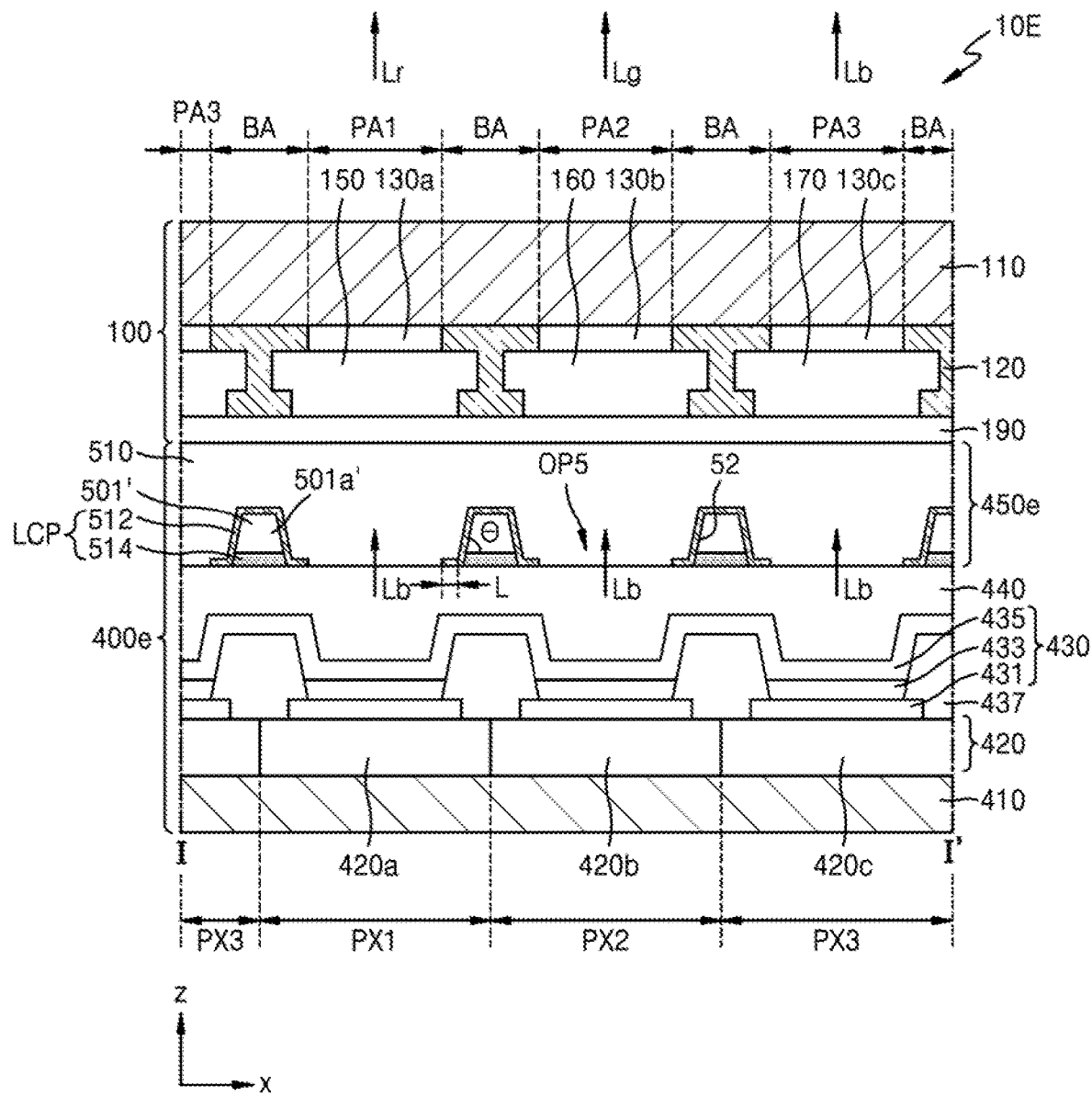
FIG. 12 is a cross-sectional view illustrating a cross-section taken along line I-I' of FIG. 1, according to an exemplary embodiment of the present invention.

FIG. 12 illustrates a cross-section taken along line I-I' of FIG. 1 according to an exemplary embodiment of the present invention.

Referring to FIG. 12, a display device 10E according to an exemplary embodiment of the present invention may include a display panel 400*e* and the color control member 100. First to third pixel circuits 420*a*, 420*b*, and 420*c* respectively of first to third pixels PX1, PX2, and PX3 may be arranged in a pixel circuit layer 420 of the display panel 400*e*. Light-emitting elements 430 may be arranged on the pixel circuit layer 420 to correspond to first to third pixel areas PA1, PA2, and PA3 of the color control member 100. The encapsulation layer 440 may be arranged on the light-emitting elements 430.

A light control layer 450*e* may be arranged on the encapsulation layer 440. The light control layer 450*e* may include a first insulating layer 501' having an insulating pattern 501*a*' positioned in a light-blocking area of the substrate 410, and a light control pattern LCP positioned in the light-blocking area of the substrate 410. The light control layer 450e may further include a second insulating layer 510 covering the light control pattern LCP.

The insulating pattern 501a' may be arranged to correspond to a light-blocking area BA of the color control member 100. An opening OP5 between the insulating pattern 501a' may be located to correspond to the first to third pixel areas PA1, PA2, and PA3 of the color control member 100. The inner angle formed between the side surface and the bottom surface of the insulating pattern 501a' may be a first angle θ. The insulating pattern 501a' may have a tapered structure. The opening OP5 may have an inverse tapered structure in relation to the insulating pattern 501a'.

The light control pattern LCP may be arranged to correspond to a light-blocking area BA of the color control member 100. The light control pattern LCP may completely cover the insulating pattern 501a'. The light control pattern LCP may be arranged to cover the side surface and upper surface of the insulating pattern 501a'. The light control pattern LCP may include a pair of inclined portions arranged on the side surface of the insulating pattern 501a'. Each of the pair of inclined portions may form a first angle θ with the upper surface (or a surface parallel to the upper surface) of the encapsulation layer 440. The pair of inclined portions extends in a third direction (e.g., the z direction) approaching the upper surface of the substrate 410, and the distance between inclined portions on the side closest to the substrate 410 is greater than the distance between inclined portions on the side farther from the substrate 410. The light control pattern LCP may include a first non-inclined portion arranged on the upper surface of the insulating pattern 501a'. The light control pattern LCP may include second non-inclined portions arranged on the upper surface of the encapsulation layer 440 connected to the inclined portions and extending into the opening OP5 in the first direction (e.g., the x direction). Each of the second non-inclined portions may extend by a length L to the upper surface of the encapsulation layer 440 inside the opening OP5 in consideration of process dispersion due to mask alignment in a manufacturing process.

The light control pattern LCP may include a reflective pattern 512 and a light-blocking pattern 514. The reflective pattern 512 may have a thickness of approximately 1500 Å. The reflective pattern 512 may include a reflective material. The light-blocking pattern 514 may include a light-blocking material. The light-blocking pattern 514 may include an opaque inorganic insulating material and/or an opaque organic insulating material such as a black resin. The light-blocking pattern 514 may have a thickness of approximately 1.5 μm. The light-blocking pattern 514 may be arranged between the insulating pattern 501a' and the encapsulation layer 440.

The reflective pattern 512 of the light control pattern LCP may include an inclined portion and first and second non-inclined portions. The reflective pattern 512 may completely cover the insulating pattern 501a'. The reflective pattern 512 may directly contact the side surface and upper surface of the insulating pattern 501a'. The light-blocking pattern 514 of the light control pattern LCP may be arranged in a space defined by the reflective pattern 512. The light-blocking pattern 514 may be arranged under the insulating pattern 501a'. The light-blocking pattern 514 may be disposed between the encapsulation layer 440 and the insulating pattern 501a'. For example, the light-blocking pattern 514 may directly contact the upper surface of the encapsulation layer 440. An etched surface of the light-blocking pattern 514 may coincide with an etched surface of the insulating pattern 501a' (e.g., may be aligned). The reflective pattern 512 may directly contact the side surface of the light-blocking pattern 514. For example, inclined portions of the reflective pattern 512 may overlap opposite side surfaces of the light-blocking pattern 514 in the first direction (e.g., the x direction), and an upper surface of the light-blocking pattern 514 may be spaced apart from a lower surface of the first non-inclined portion of the reflective pattern 512 in the third direction (e.g., the z direction) and may be parallel thereto.

The reflective pattern 512 may reflect a portion of light emitted from the light-emitting element 430 towards an adjacent pixel area associated with another light-emitting element 430. Light reflected by the light control pattern LCP may be incident on a color conversion layer 150 or 160 or a transmission layer 170 of a pixel area PA. The light-blocking pattern 514 may absorb the portion of light emitted from the light-emitting element 430 to the adjacent pixel area PA.

FIGS. 13A to 13E illustrate steps in a manufacturing process of the display device 10E illustrated in FIG. 12.

Figure 13A:
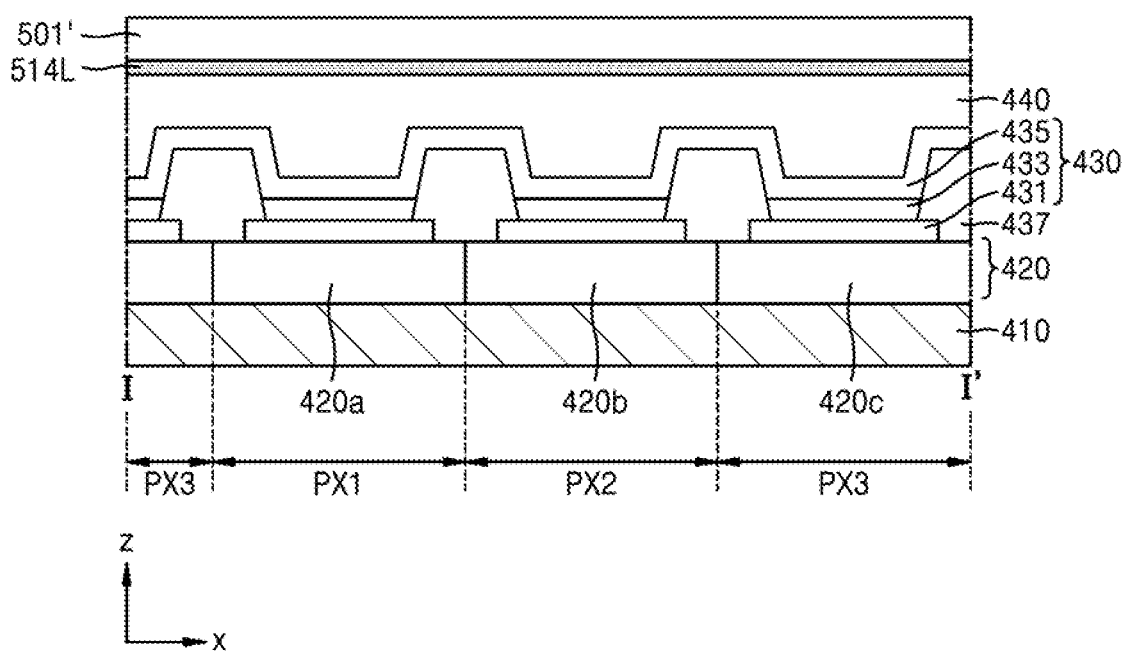
FIGS. 13A to 13E are cross-sectional view illustrating steps in a process of manufacturing the display device illustrated in FIG. 12, according to an exemplary embodiment of the present invention.

As shown in FIG. 13A, a light-blocking material layer 514L and a first insulating layer 501' may be sequentially formed over a substrate 410 on which light-emitting elements 430, a pixel-defining layer 437 between the light-emitting elements 430, and an encapsulation layer 440 are formed. The first insulating layer 501' may include an organic insulating layer.

Figure 13B:
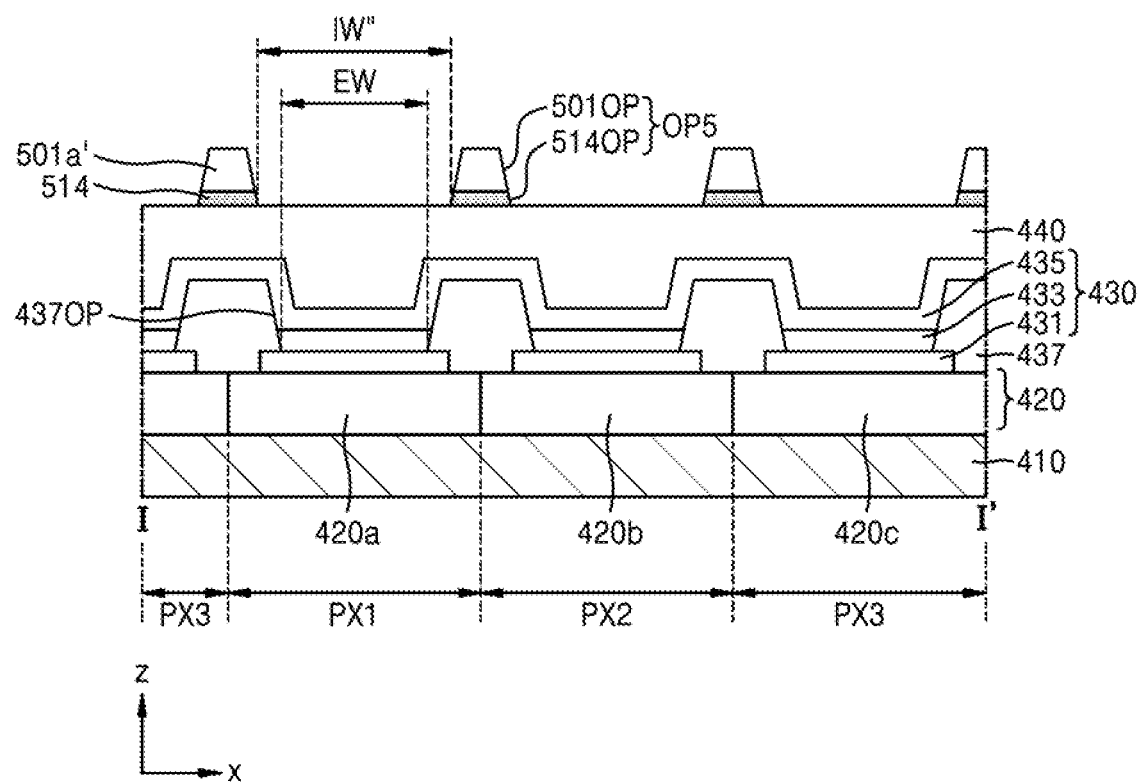

Subsequently, as shown in FIG. 13B, the light-blocking material layer 514L and the first insulating layer 501' may be patterned to form a light-blocking pattern 514 and an insulating pattern 501a', respectively. The light-blocking pattern 514 and the insulating pattern 501a' may be located in a light-blocking area BA of the substrate 410. The light-blocking pattern 514 and the insulating pattern 501a' may entirely surround an opening 437OP of the pixel-defining layer 437 and may overlap the pixel-defining layer 437. As the light-blocking material layer 514L and the first insulating layer 501' are simultaneously etched, etched surfaces of the light-blocking pattern 514 and the insulating pattern 501a' may coincide with each other (e.g., be coplanar and/or share a same slope). The light-blocking pattern 514 and the insulating pattern 501a' may have a continuously inclined structure in which the etched surfaces (e.g., side surfaces) have an inclination angle θ as shown in FIG. 12. An opening OP5 may include an opening 514OP of the light-blocking material layer 514L and an opening 501OP of the first insulating layer 501', and the opening OP5 may be located in a pixel area PA of the substrate 410. A width IW" of the opening OP5 may be equal to or greater than a width EW of the opening 437OP of the pixel-defining layer 437.

Figure 13C:
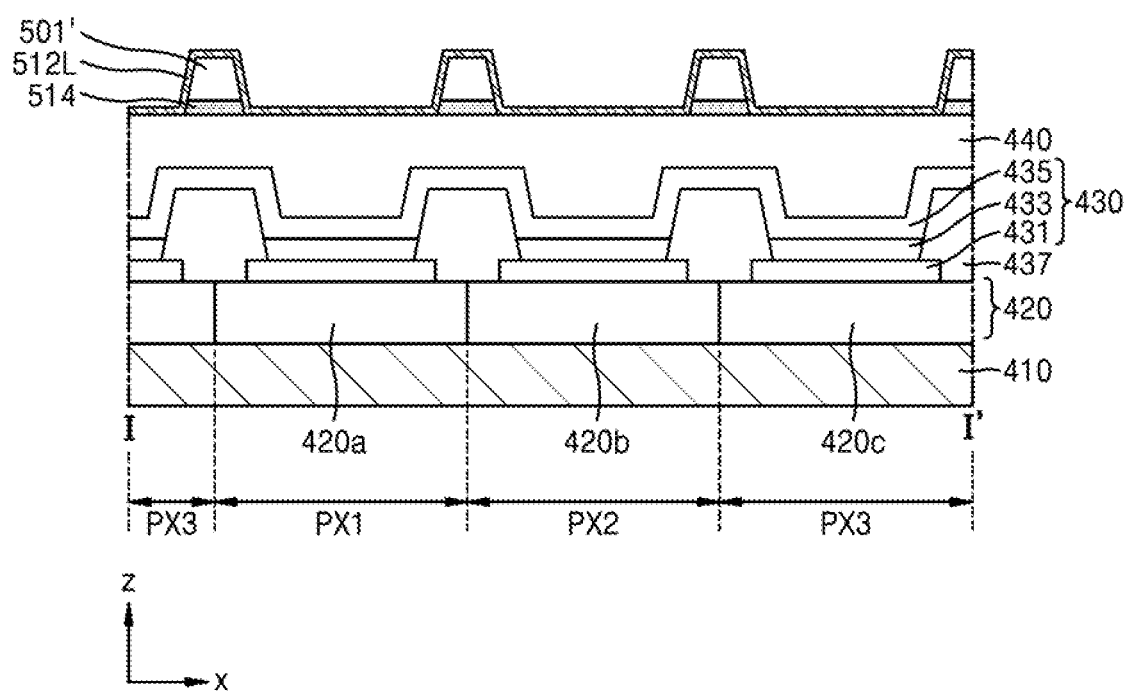

As shown in FIG. 13C, a reflective material layer 512L may be formed over the substrate 410 while covering the light-blocking pattern 514 and the first insulating layer 501' including the insulating pattern 501a'.

Figure 13D:
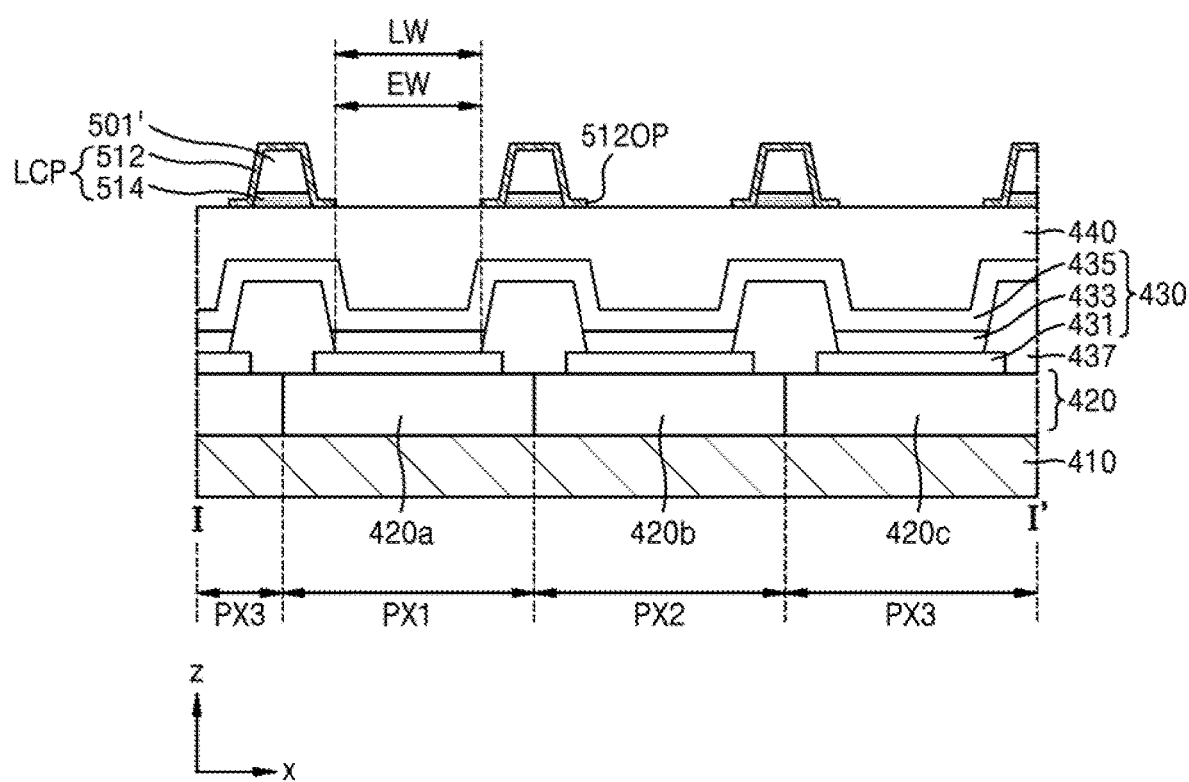

Subsequently, as shown in FIG. 13D, the reflective material layer 512L may be patterned to form a reflective pattern 512. As shown in FIG. 11C, a photoresist 601 may be applied to cover the reflective material layer 512L, and the photoresist 601 may be UV-exposed and developed using an aligned mask M, and thus, a portion of the photoresist 601 corresponding to a light-transmitting portion M2 may be removed and only a portion of the photoresist 601 corresponding to a light-blocking portion M1 may remain. The reflective material layer 512L of a region where the photoresist 601 is removed may be etched to thereby form the reflective pattern 512. Etching may be wet etching or dry etching. The width of an opening 512OP of the reflective material layer 512L, that is, a width LW of an opening LOP of the light control pattern LCP, may be equal to or greater than a width EW of the opening 437OP of the pixel-defining layer 437. Thereafter, the photoresist 601 remaining on the reflective pattern 512 may be removed.

The reflective pattern 512 may be located in a light-blocking area BA of the substrate 410. The reflective pattern 512 may cover the side surfaces of the light-blocking pattern 514 and the insulating pattern 501a' and the upper surface of the insulating pattern 501a'. A portion of the reflective pattern 512 may be arranged in the opening OP5.

Figure 13E:
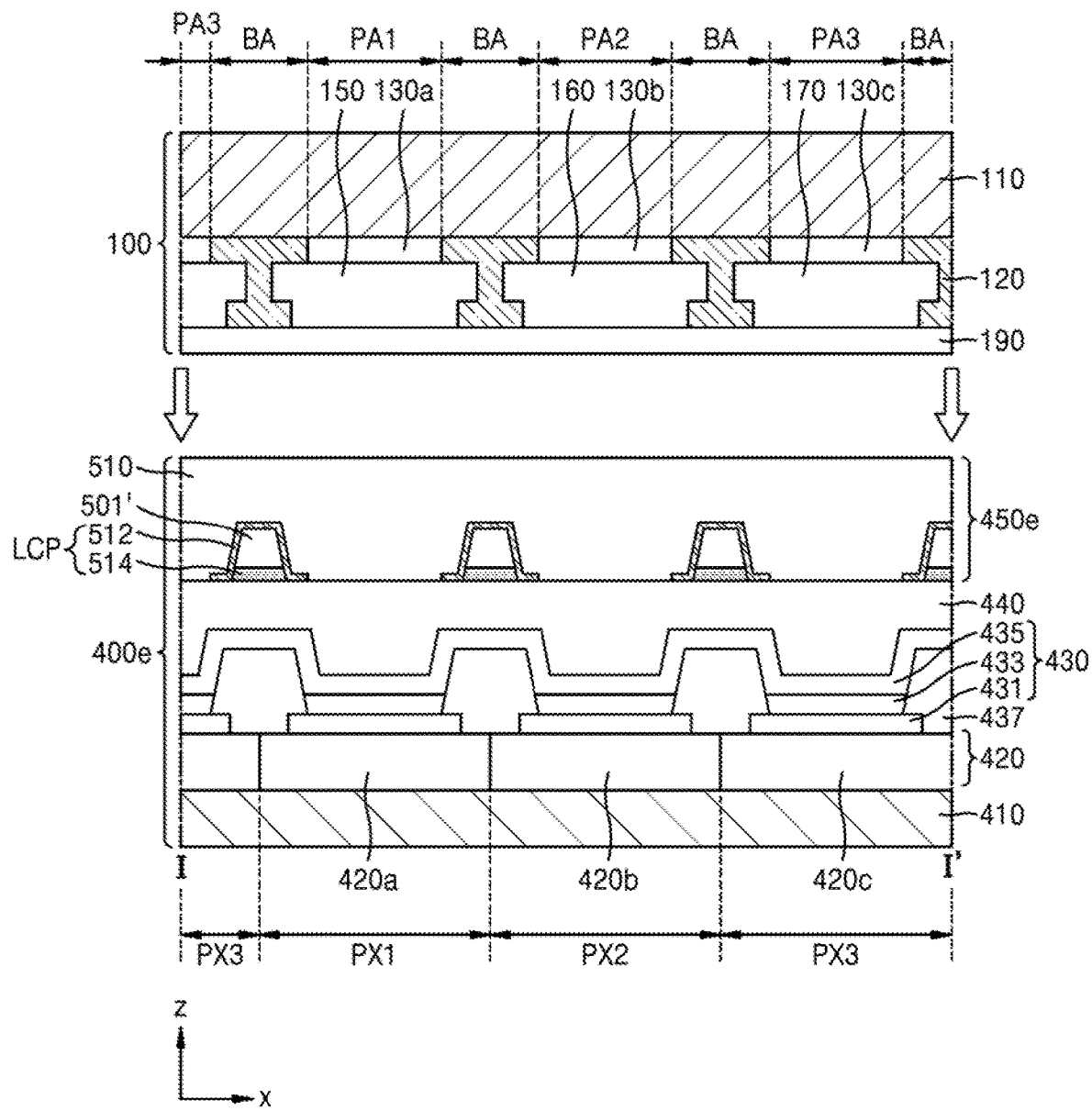

Next, as shown in FIG. 13E, a second insulating layer 510 covering the light control pattern LCP may be arranged over the substrate 410. The second insulating layer 510 may include an organic layer including an organic material. The second insulating layer 510 may include the same material as that of the first insulating layer 501' forming the insulating pattern 501a'.

The display panel 400e and the color control member 100 may be aligned such that the pixel area PA and the light-blocking area BA of the substrate 410 correspond to a pixel area PA and a light-blocking area BA of the color control member 100, respectively, and then the display panel 400e and the color control member 100 may be combined.

Figure 14:
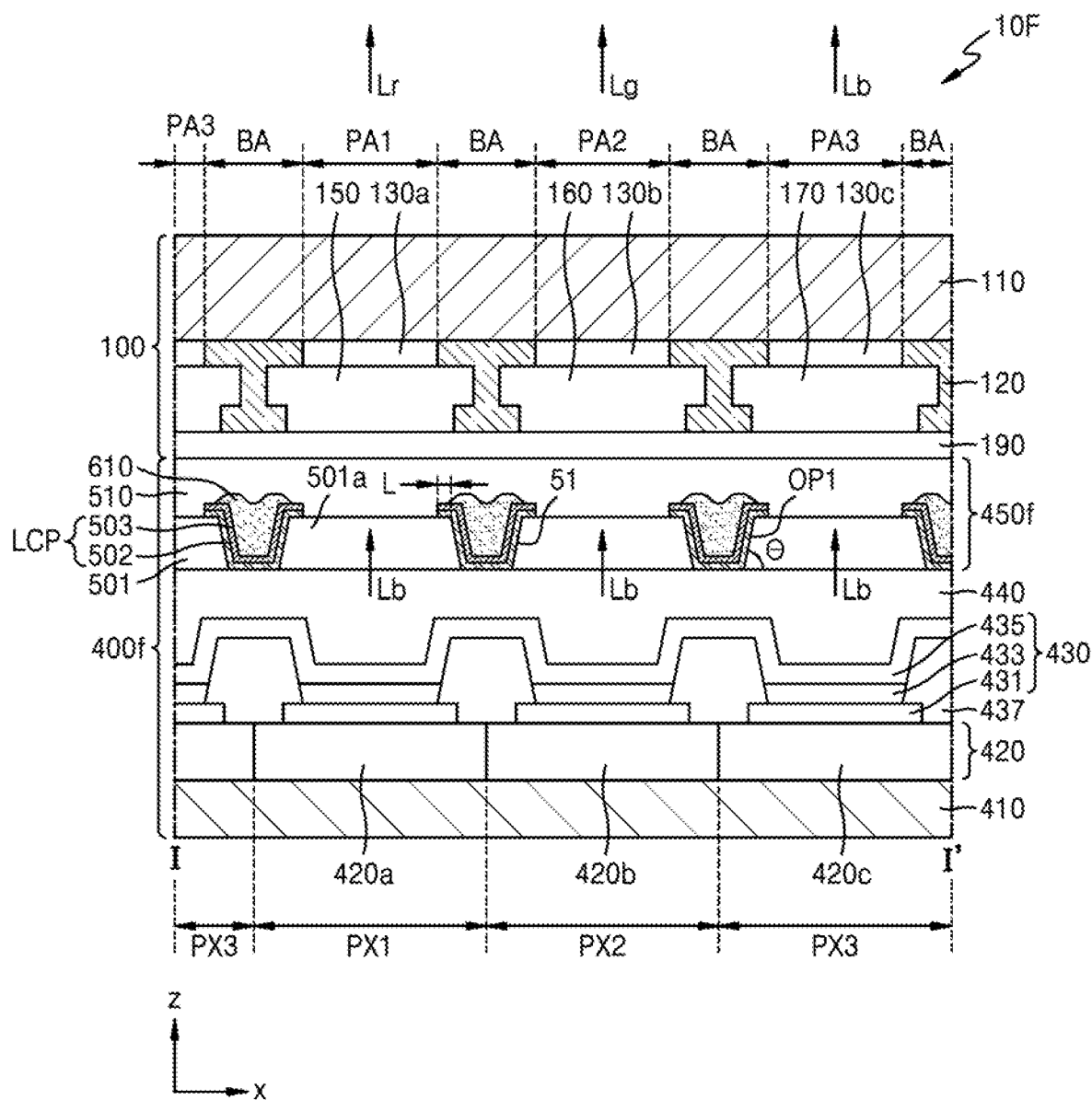
FIG. 14 illustrates a cross-section taken along line I-I' of the display device of FIG. 1, according to an exemplary embodiment of the present invention.

FIG. 14 illustrates a cross-section taken along line I-I' of the display device of FIG. 1 according to an exemplary embodiment of the present invention.

Referring to FIG. 14, a display device 10F according to an exemplary embodiment of the present invention may include a display panel 400f and a color control member 100. First to third pixel circuits 420a, 420b, and 420c respectively of first to third pixels PX1, PX2, and PX3 may be arranged in a pixel circuit layer 420 of the display panel 400f. Light-emitting elements 430 may be arranged on the pixel circuit layer 420 to correspond to first to third pixel areas PA1, PA2, and PA3 of the color control member 100. An encapsulation layer 440 may be arranged on the light-emitting elements 430.

A light control layer 450f may be arranged on the encapsulation layer 440. The light control layer 450f may include a first insulating layer 501 having an insulating pattern 501a positioned in a pixel area PA of the substrate 410, and a light control pattern LCP positioned in a light-blocking area of the substrate 410 and arranged between insulating patterns 501a. The light control layer 450f may further include a level pattern 610 on the light control pattern LCP. The light control layer 450f may further include a second insulating layer 510 covering the light control pattern LCP. The light control pattern LCP may include a reflective pattern 502 and a light-blocking pattern 503.

Since the insulating patterns 501a and the light control pattern LCP shown in FIG. 14 are the same as the insulating patterns 501a and the light control pattern LOP shown in FIG. 5, detailed descriptions thereof may be omitted.

The level pattern 610 may be further arranged on the light control pattern LCP. The level pattern 610 may overlap the pixel-defining layer 437. The level pattern 610 may include a photosensitive organic material such as acrylic resin, BCB, PI and/or novolac resin. The photosensitive organic material may be a negative photosensitive material and/or a positive photosensitive material. The level pattern 610 may cover a portion of the light control pattern LCP arranged in at least the opening OP1. According to an exemplary embodiment of the present invention, the level pattern 610 may completely cover the light control pattern LCP. The upper surface of the level pattern 610 may be at the same level as the upper surface of the light control pattern LCP. According to an exemplary embodiment of the present invention, the upper surface of the level pattern 610 may be at least partly higher or lower than the upper surface of the light control pattern LCP. The upper surface of the level pattern 610 may be flat or non-flat. For example, the upper surface of the level pattern 610 may have a ridged shape in which a valley is disposed between two adjacent peaks.

Figure 15A:
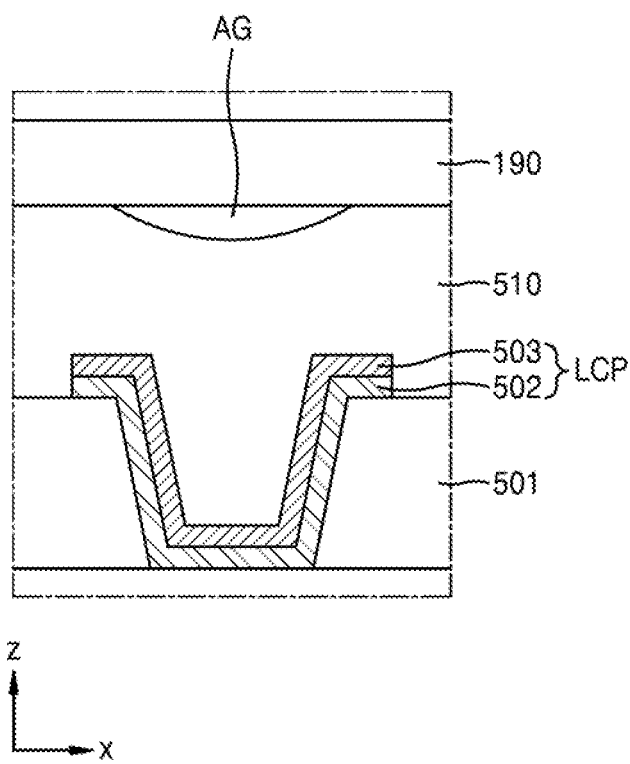
FIG. 15A illustrates a comparative example to FIG. 14.
Figure 15B:
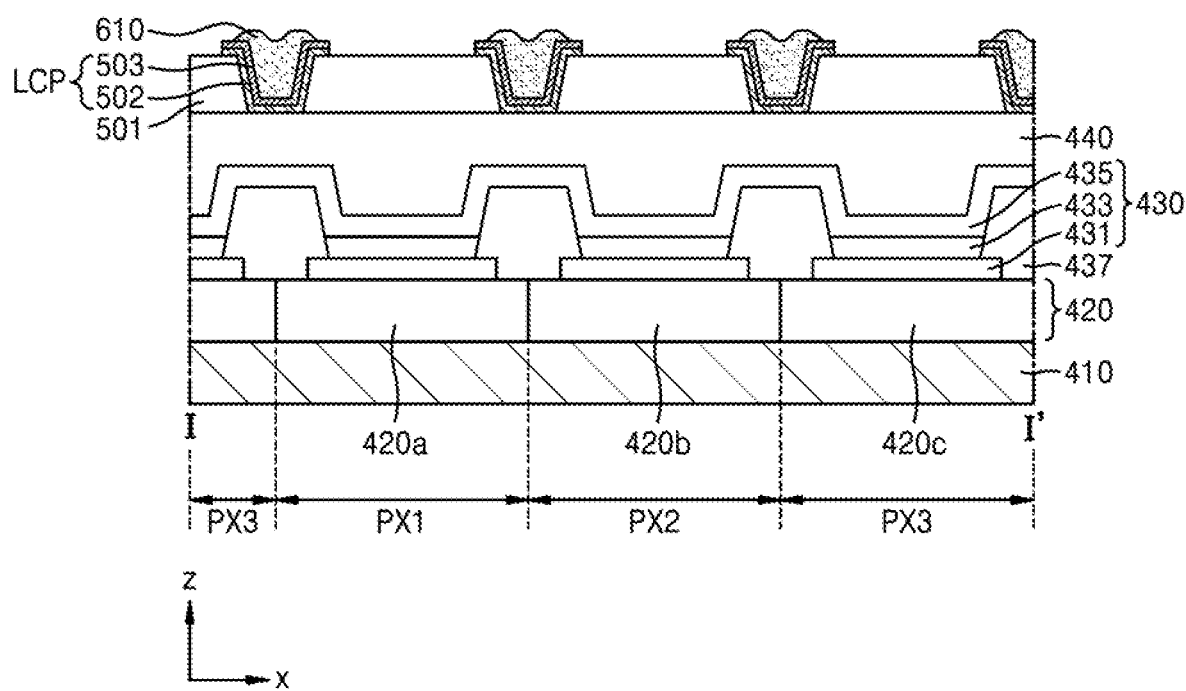
FIGS. 15B and 15C are cross-sectional views illustrating steps in a process of manufacturing the display device illustrated in FIG. 14, according to an exemplary embodiment of the present invention.
Figure 15C:
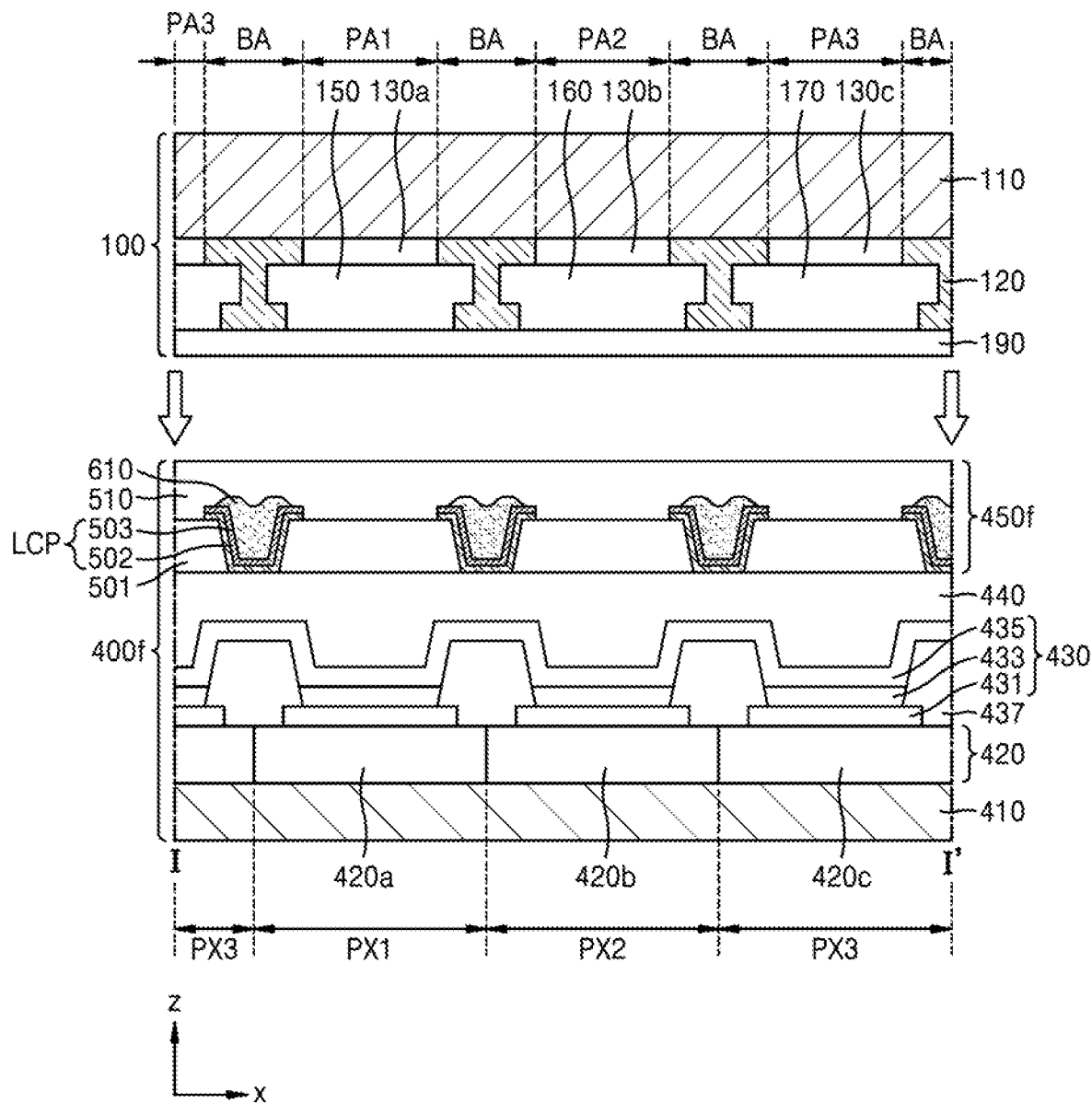

FIG. 15A illustrates a comparative example to FIG. 14. As shown in FIG. 15A, as the light control pattern LCP is provided in the opening OP1, the second insulating layer 510 on the light control pattern LCP might not be planarized. Accordingly, an air gap AG may occur between the color control member 100 and the second insulating layer 510. Light may be incident onto an adjacent pixel area PA by the refraction of the light in the air gap AG. This may cause color mixing between pixel areas PA. In a light-blocking area BA of the color control member 100, the level pattern 610 according to an exemplary embodiment of the present invention may be provided on the light control pattern LCP before forming the second insulating layer 510, and thus, the planarization of the second insulating layer 510 may be increased, thereby preventing the occurrence of an air gap between the color control member 100 and the second insulating layer 510. FIGS. 15B and 15C illustrate steps in a manufacturing process of the display device 10F illustrated in FIG. 14.

As shown in FIG. 6A, a first insulating layer 501 may be formed over a substrate 410 on which light-emitting elements 430, a pixel-defining layer 437 between the light-emitting elements 430, and an encapsulation layer 440 are formed, and then an opening OP1 penetrating the first insulating layer 501 may be formed and thus an insulating pattern 501a may be formed. As shown in FIG. 6B, a reflective material layer 502L and a light-blocking material layer 503L may be sequentially deposited on the substrate 410 while covering the insulating pattern 501a. Subsequently, as shown in FIG. 6C, a photoresist 600 may be applied to cover the reflective material layer 502L and the light-blocking material layer 503L, and the photoresist 600 may be ultraviolet (UV)-exposed and developed using an aligned mask M and thus only a portion of the photoresist 600 corresponding to a light-blocking portion M1 may remain.

Next, as shown in FIG. 15B, the reflective material layer 502L and the light-blocking material layer 503L of a region where the photoresist 600 is removed may be etched to thereby form a light control pattern LCP including a reflective pattern 502 and a light-blocking pattern 503. Etching may be wet etching or dry etching. In an etching process in which the reflective material layer 502L and the light-blocking material layer 503L are removed, a portion of the upper portion of the insulating pattern 501a may be removed by overetching. The photoresist 600 on the light control pattern LCP may remain as a level pattern 610. According to an exemplary embodiment of the present invention, the photoresist 600 on the light control pattern LCP may be removed, and an additional photoresist may be applied on the light control pattern LCP or a photoresist may be dropped by an inkjet technique to form the level pattern 610 via a separate process.

As shown in FIG. 15C, a second insulating layer 510, which covers the light control pattern LCP, the level pattern 610, and the first insulating layer 501 including the insulating pattern 501a, may be arranged over the substrate 410. The second insulating layer 510 may include an organic insulating layer. The second insulating layer 510 may include the same material as that of the first insulating layer 501.

The display panel 400f and the color control member 100 may be aligned such that the pixel area PA and the light-blocking area BA of the substrate 410 correspond to a pixel area PA and a light-blocking area BA of the color control member 100, respectively, and then the display panel 400f and the color control member 100 may be combined.

Figure 16:
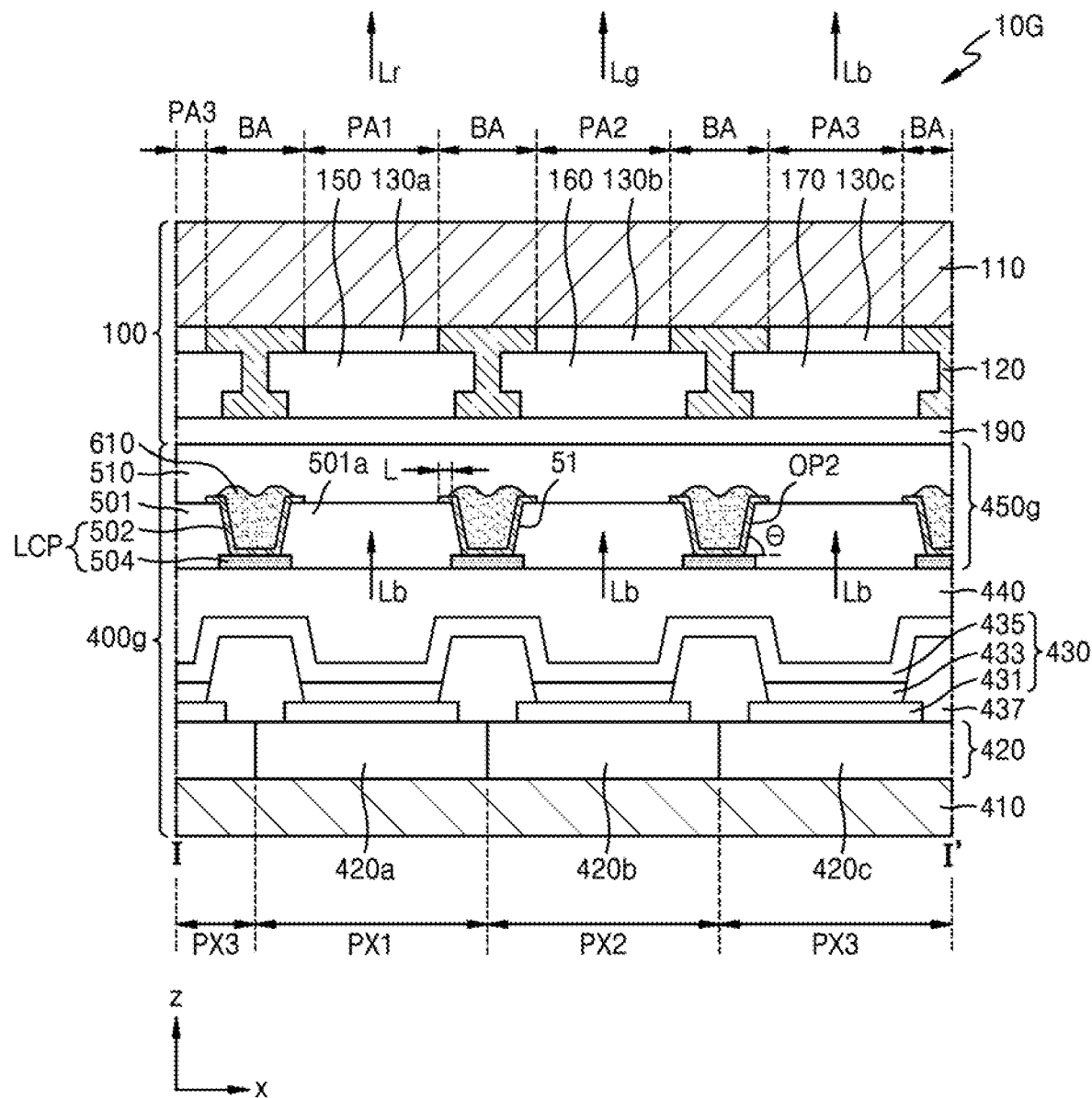
FIG. 16 illustrates a cross-section taken along line I-I' of the display device of FIG. 1, according to an exemplary embodiment of the present invention.

FIG. 16 illustrates a cross-section taken along line I-I' of FIG. 1 according to an exemplary embodiment of the present invention.

Referring to FIG. 16, a display device 10G according to an exemplary embodiment of the present invention may include a display panel 400g and a color control member 100. First to third pixel circuits 420a, 420b, and 420c respectively of first to third pixels PX1, PX2, and PX3 may be arranged in a pixel circuit layer 420 of the display panel 400g. Light-emitting elements 430 may be arranged on the pixel circuit layer 420 to correspond to first to third pixel areas PA1, PA2, and PA3 of the color control member 100. An encapsulation layer 440 may be arranged on the light-emitting elements 430.

A light control layer 450g may be arranged on the encapsulation layer 440. The light control layer 450g may include a first insulating layer 501 having an insulating pattern 501a positioned in a pixel area PA of the substrate 410, and a light control pattern LCP positioned in a light-blocking area BA of the substrate 410 and arranged between insulating patterns 501a. The light control layer 450g may further include a level pattern 610 on the light control pattern LCP. The light control layer 450g may further include a second insulating layer 510 covering the light control pattern LCP. The light control pattern LCP may include a reflective pattern 502 and a light-blocking pattern 504.

Since the insulating patterns 501a and the light control pattern LCP shown in FIG. 16 are the same as the insulating patterns 501a and the light control pattern LCP shown in FIG. 7, detailed descriptions thereof may be omitted.

The level pattern 610 may be further arranged on the light control pattern LCP. The level pattern 610 may overlap a pixel-defining layer 437, for example, in the third direction (e.g., the z direction). The level pattern 610 may include a photosensitive organic material such as acrylic resin, BCB, PI and/or novolac resin. The photosensitive organic material may be a negative photosensitive material or a positive photosensitive material.

Figure 17A:
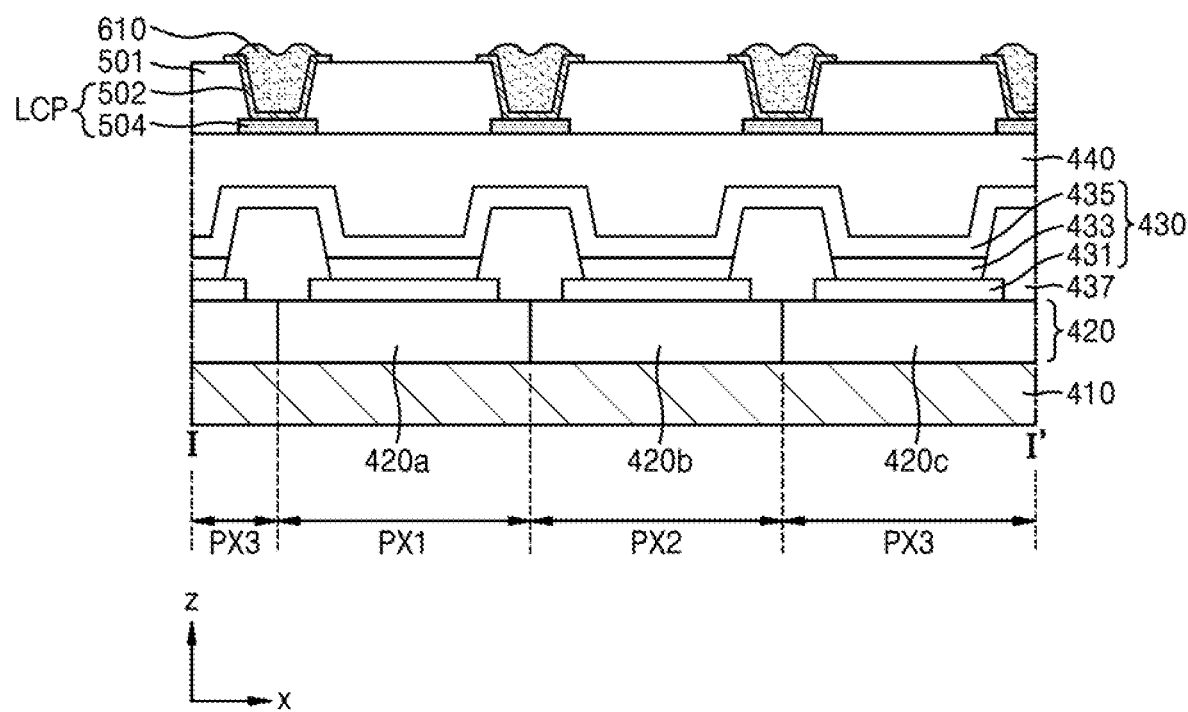
FIGS. 17A and 17B are cross-sectional views illustrating steps in a process of manufacturing the display device illustrated in FIG. 16, according to an exemplary embodiment of the present invention.
Figure 17B:
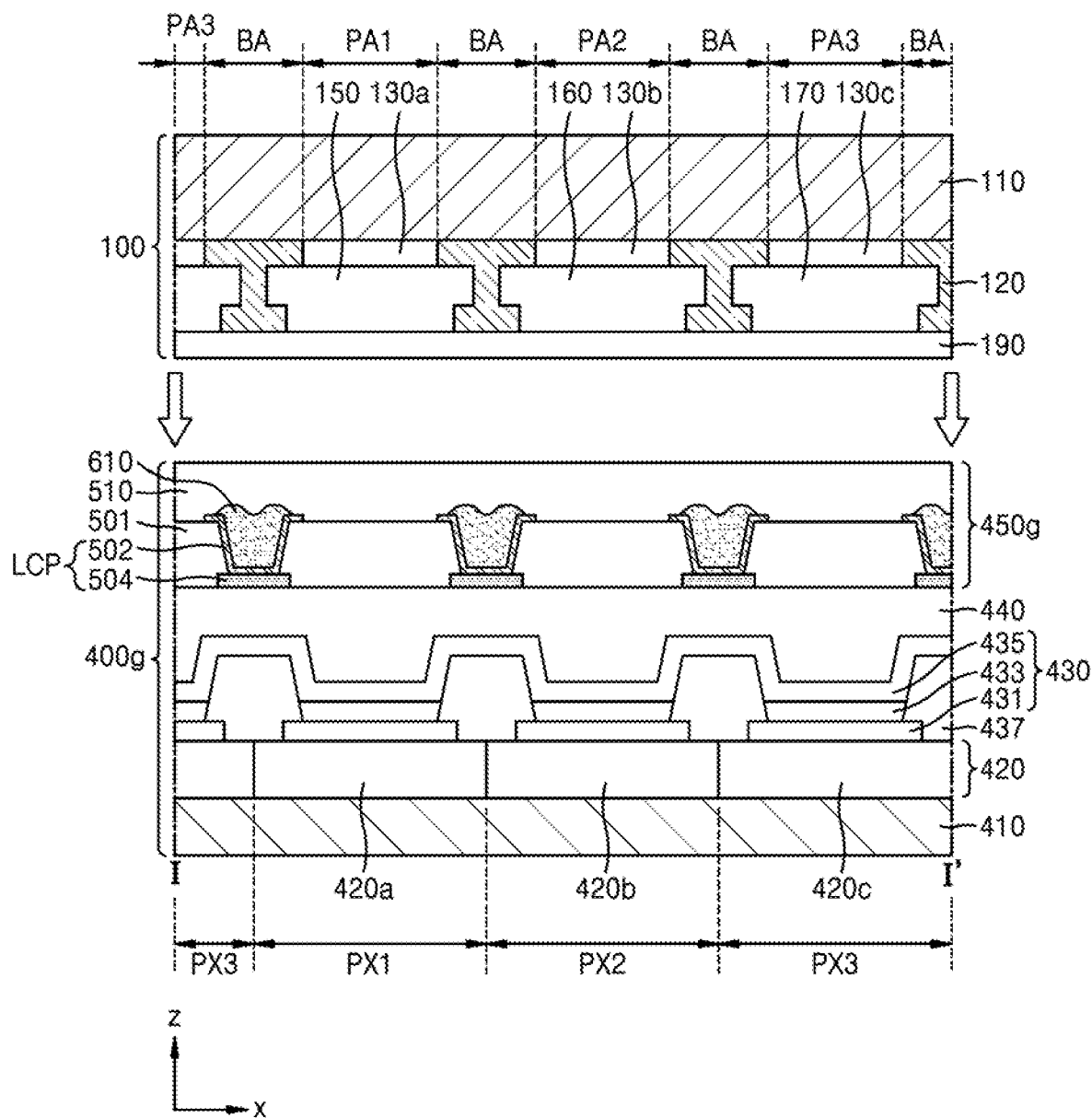

FIGS. 17A and 17B illustrate steps in a manufacturing process of the display device 10G illustrated in FIG. 16.

As shown in FIG. 8A, a light-blocking material layer may be formed over a substrate 410 on which light-emitting elements 430, a pixel-defining layer 437 between the light-emitting elements 430, and an encapsulation layer 440 are formed, and then the light-blocking material layer may be patterned to thereby form a light-blocking pattern 504 in a light-blocking area BA of the substrate 410. As shown in FIG. 8B, a first insulating layer 501 may be formed on the light-blocking pattern 504, and then an opening OP2 may be formed in the first insulating layer 501, thereby forming an insulating pattern 501a. As shown in FIG. 8C, a reflective material layer 502L may be deposited over the substrate 410 while covering the first insulating layer 501 and the light-blocking pattern 504. Subsequently, as shown in FIG. 8D, a photoresist 600 may be applied to cover the reflective material layer 502L, and the photoresist 600 may be UV-exposed and developed using an aligned mask M, and thus, only a portion of the photoresist 600 corresponding to a light-blocking portion M1 may remain.

Next, as shown in FIG. 17A, the reflective material layer 502L of a region where the photoresist 600 is removed may be etched to thereby form a reflective pattern 502. Etching may be wet etching or dry etching. In an etching process in which the reflective material layer 502L is removed, a portion of the upper portion of the first insulating layer 501 may be removed by overetching. The photoresist 600 on the light control pattern LCP may remain as the level pattern 610. In an exemplary embodiment of the present invention, the photoresist 600 on the light control pattern LCP may be removed, and an additional photoresist may be applied on the light control pattern LCP or a photoresist may be dropped by an inkjet technique to form the level pattern 610 via a separate process.

As shown in FIG. 17B, a second insulating layer 510, which covers the light control pattern LCP, the level pattern 610, and the first insulating layer 501 including the insulating pattern 501a, may be arranged over the substrate 410. The second insulating layer 510 may include an organic layer including an organic material. The second insulating layer 510 may include the same material as that of the first insulating layer 501.

The display panel 400g and the color control member 100 may be aligned such that the pixel area PA and the light-blocking area BA of the substrate 410 correspond to the pixel area PA and the light-blocking area BA of the color control member 100, respectively, and then the display panel 400g and the color control member 100 may be combined.

Figure 18:
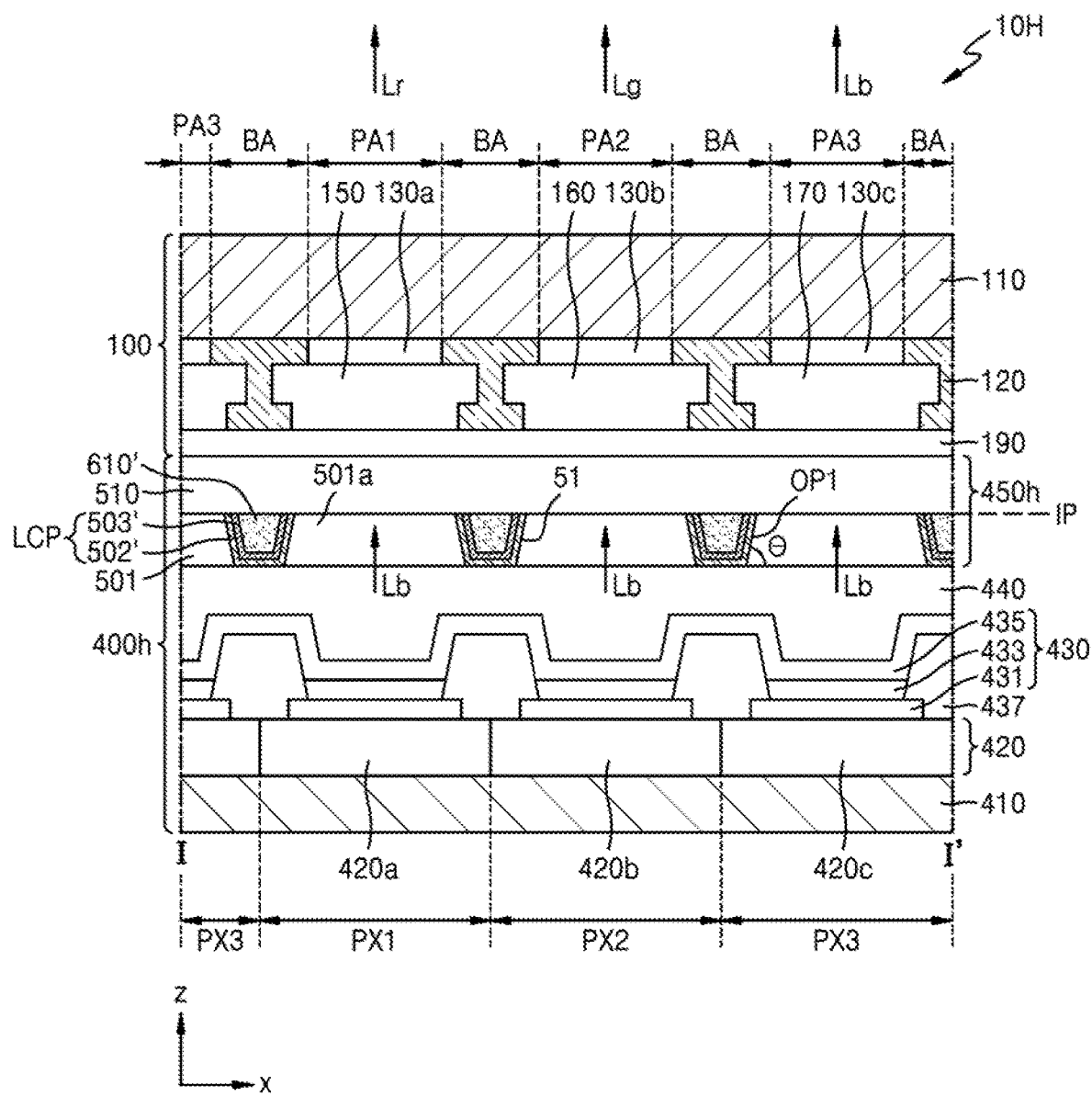
FIG. 18 is a cross-sectional view illustrating a cross-section taken along line I-I' of the display device of FIG. 1, according to an exemplary embodiment of the present invention.

FIG. 18 illustrates a cross-section taken along line I-I' of FIG. 1 according to an exemplary embodiment of the present invention.

Referring to FIG. 18, a display device 10H according to an exemplary embodiment of the present invention may include a display panel 400h and a color control member 100. First to third pixel circuits 420a, 420b, and 420c respectively of first to third pixels PX1, PX2, and PX3 may be arranged in a pixel circuit layer 420 of the display panel 400h. Light-emitting elements 430 may be arranged on the pixel circuit layer 420 to correspond to first to third pixel areas PA1, PA2, and PA3 of the color control member 100. An encapsulation layer 440 may be arranged on the light-emitting elements 430.

A light control layer 450h may be arranged on the encapsulation layer 440. The light control layer 450h may include a first insulating layer 501 having an insulating pattern 501a positioned in a pixel area PA of the substrate 410, and a light control pattern LCP positioned in a light-blocking area BA of the substrate 410 and arranged between insulating patterns 501a. The light control layer 450h may further include a level pattern 610' on the light control pattern LCP. The light control layer 450h may further include a second insulating layer 510 covering the light control pattern LCP. The light control pattern LCP may include a reflective pattern 502' and a light-blocking pattern 503'.

Since the insulating patterns 501a shown in FIG. 18 are the same as the insulating patterns 501a shown in FIG. 5, detailed descriptions thereof may be omitted.

The light control pattern LCP shown in FIG. 18 is different from the light control pattern LCP shown in FIG. 5 in that the light control pattern LCP shown in FIG. 18 includes the level pattern 610' and does not include a second non-inclined portion arranged on the upper surface of the insulating pattern 501a. The following description will focus on the differences.

The light control pattern LCP may be arranged to correspond to a light-blocking area BA of the color control member 100. The light control pattern LCP may include an inclined portion arranged on a side surface 51 of an opening OP1 (or the side surface of the insulating pattern 501a). An inner angle of the insulating pattern 501a and an angle formed by the inclined portion of the light control pattern LCP with the upper surface of the encapsulation layer 440 may be referred to as a first angle θ. The light control pattern LCP may include a first non-inclined portion arranged on the bottom surface of the opening OP1, that is, the upper surface of the encapsulation layer 440 exposed by the opening OP1.

The level pattern 610' may be further arranged on the light control pattern LCP. The level pattern 610' may include a photosensitive organic material such as acrylic resin, BCB, PI and/or novolac resin. The photosensitive organic material may be a negative photosensitive material or a positive photosensitive material.

The upper surface of the insulating pattern 501a, the upper surface of the light control pattern LCP, and the upper surface of the level pattern 610' may be on the same plane IP and may be flat upper surfaces.

Figure 19A:
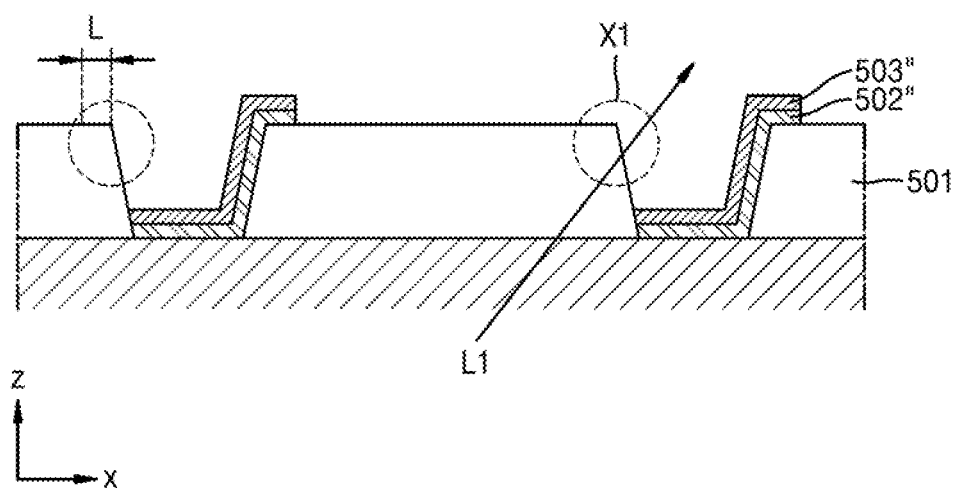
FIGS. 19A and 19B illustrate comparative examples of FIG. 18.
Figure 19B:
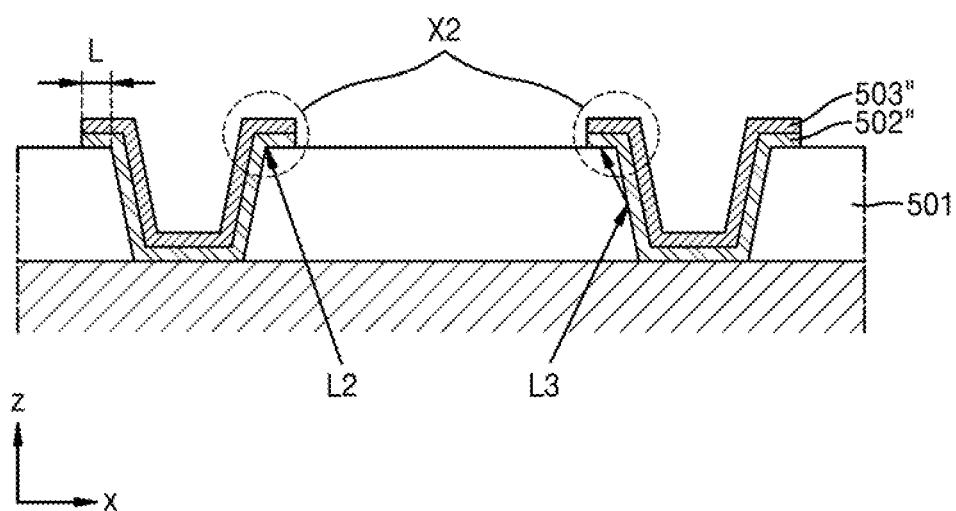

FIGS. 19A and 19B illustrate comparative examples to FIG. 18.

Referring to FIG. 19A, when the light control pattern LCP or the insulating pattern 501a is shifted by a predetermined distance to the left or the right by process dispersion due to mask alignment in a manufacturing process, a region where the light control pattern LCP is not formed, like a region X1 may occur. Accordingly, a portion L1 of light emitted from a light-emitting element 430 may be incident onto an adjacent pixel area associated with a different light-emitting element 430 and thus color mixing between pixel areas PA may occur.

Referring to FIG. 19B, when a portion corresponding to a second non-inclined portion of the light control pattern LCP, having a length L, is added to a region X2 in consideration of the process dispersion due to the mask alignment, a region in which the light control pattern LCP is not formed may not occur, even if the light control pattern LCP is shifted by a predetermined distance to the left or the right by the second non-inclined portion. However, in this case, a portion L2 and L3 of the light emitted from the light-emitting element 430 may be shielded by the second non-inclined portion, and thus, loss of a light component contributing to the luminance of a pixel PX may occur.

According to the exemplary embodiment of the present invention illustrated in FIG. 18, by using a manufacturing process not limited by the process dispersion, the second non-inclined portion may not be necessary and the light control pattern LCP may be formed in the opening OP1 without a region where the light control pattern LCP is not formed. In addition, according to the exemplary embodiment of the present invention illustrated in FIG. 18, the flatness of the second insulating layer 510 may be increased by providing the level pattern 610' on the light control pattern LCP before forming the second insulating layer 510, and thus, an air gap may be prevented from occurring between the color control member 100 and the second insulating layer 510.

Figure 19C:
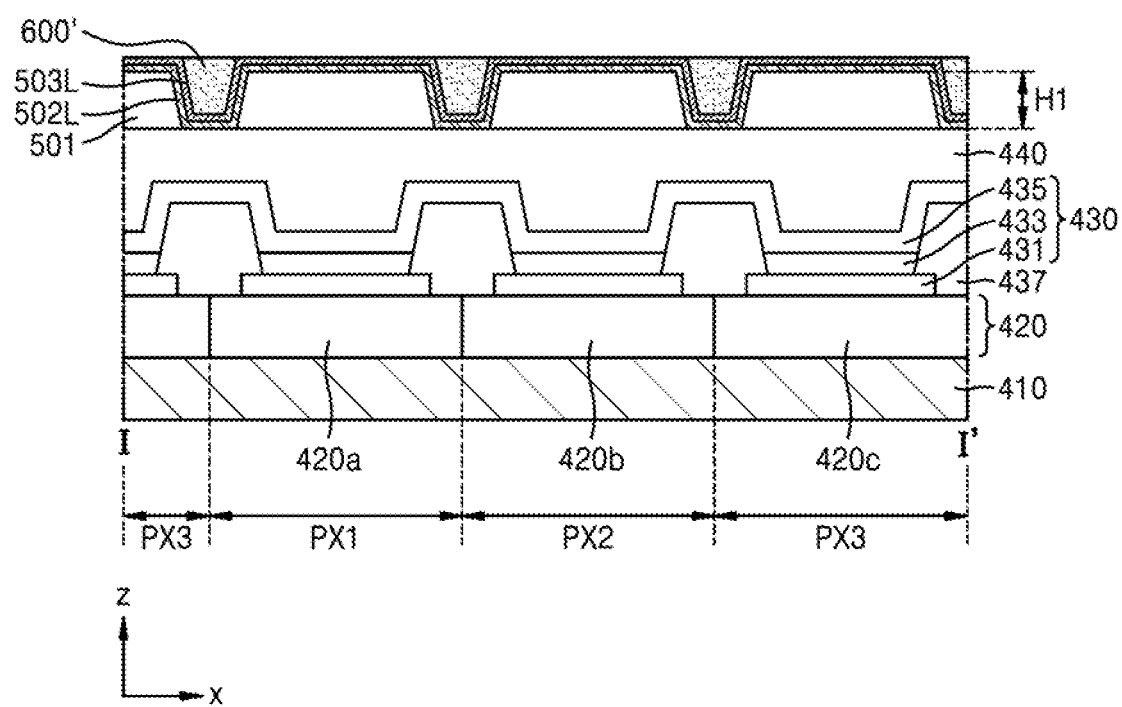
FIGS. 19C to 19E are cross-sectional views illustrating steps in a process of manufacturing a display device illustrated in FIG. 18, according to an exemplary embodiment of the present invention.
Figure 19D:
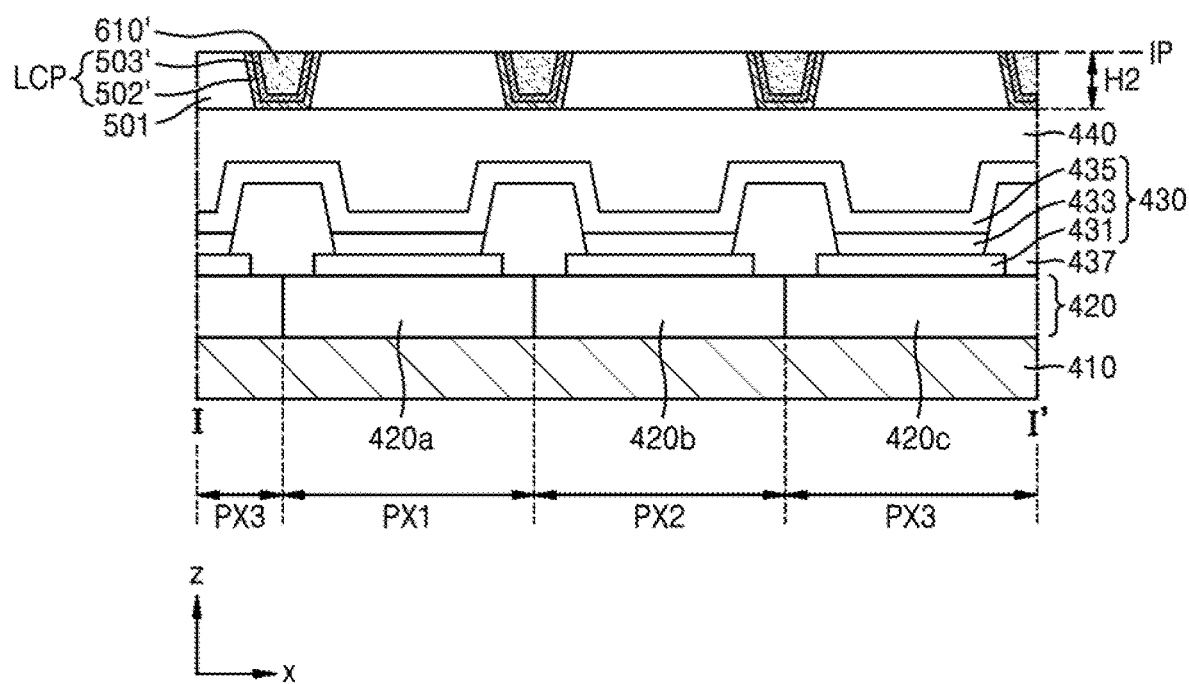
Figure 19E:
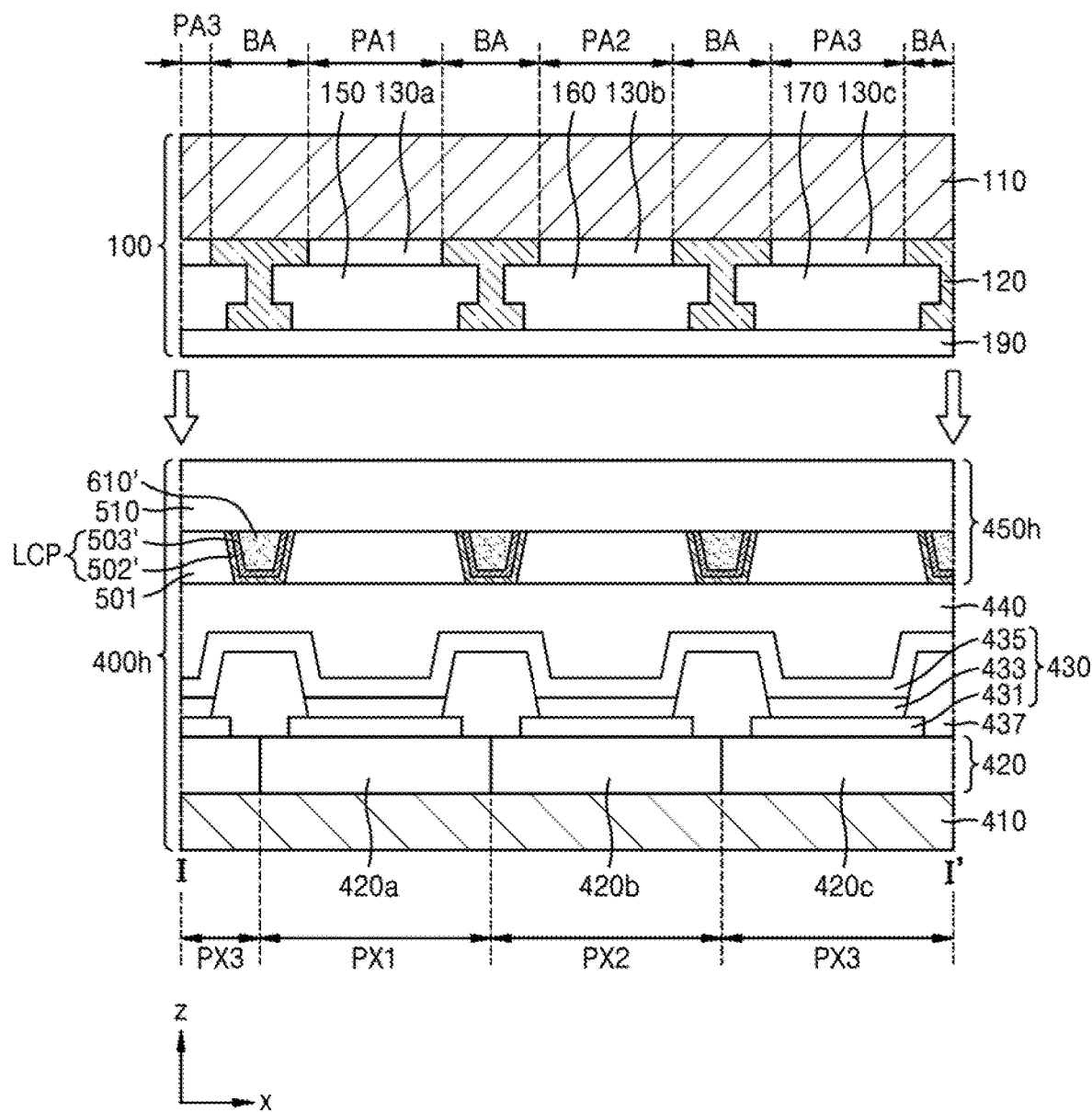

FIGS. 19C to 19E illustrate steps in a manufacturing process of the display device 10H illustrated in FIG. 18.

As shown in FIG. 6A, a first insulating layer 501 may be formed over a substrate 410 on which light-emitting elements 430, a pixel-defining layer 437 between the light-emitting elements 430, and an encapsulation layer 440 are formed, and then an opening OP1 penetrating the first insulating layer 501 may be formed and thus an insulating pattern 501a may be formed. As shown in FIG. 6B, a reflective material layer 502L and a light-blocking material layer 503L may be sequentially deposited on the substrate 410 while covering the first insulating layer 501.

Subsequently, as shown in FIG. 19C, a photoresist 600' may be arranged in the opening OP1 by spin coating or inkjet method. The photoresist 600' may include a low viscosity photosensitive material.

Next, as shown in FIG. 19D, the reflective material layer 502L and the light-blocking material layer 503L may be etched such that the upper surface of the first insulating layer 501, the upper surface of the light control pattern LCP, and the upper surface of the photoresist 600' are on the same plane IP. Etching may be wet etching or dry etching. After etching, the photoresist 600' in the opening OP1 may remain as a level pattern 610'. An etched surface of the first insulating layer 501, an etched surface of the light control pattern LCP, and an etched surface of the level pattern 610' may coincide with one another (e.g., may be aligned). A height H2 of the first insulating layer 501 after etching, shown in FIG. 19D, may be equal to or less than a height H1 of the first insulating layer 501 before etching, shown in FIG. 19C.

As shown in FIG. 19E, a second insulating layer 510, which covers the light control pattern LCP, the level pattern 610', and the first insulating layer 501, may be arranged over the substrate 410. The second insulating layer 510 may include an organic insulating layer. The second insulating layer 510 may include the same material as that of the first insulating layer 501.

The display panel 400h and the color control member 100 may be aligned such that the pixel area PA and the light-blocking area BA of the substrate 410 correspond to the pixel area PA and the light-blocking area BA of the color control member 100, respectively, and then the display panel 400h and the color control member 100 may be combined.

According to the present exemplary embodiment of the present invention, by using a spin coating or inkjet method, there is no need to use a photo process using a mask, as shown in FIG. 6C, and thus, there is no restriction on process dispersion due to mask alignment error. Therefore, the area of an intermediate layer 433 (or the area of an organic emission layer) may be expanded by an area corresponding to the second non-inclined portion, thereby increasing an aperture ratio. As the resolution of a display device increases, effects according to the increase of the aperture ratio increase.

Figure 20:
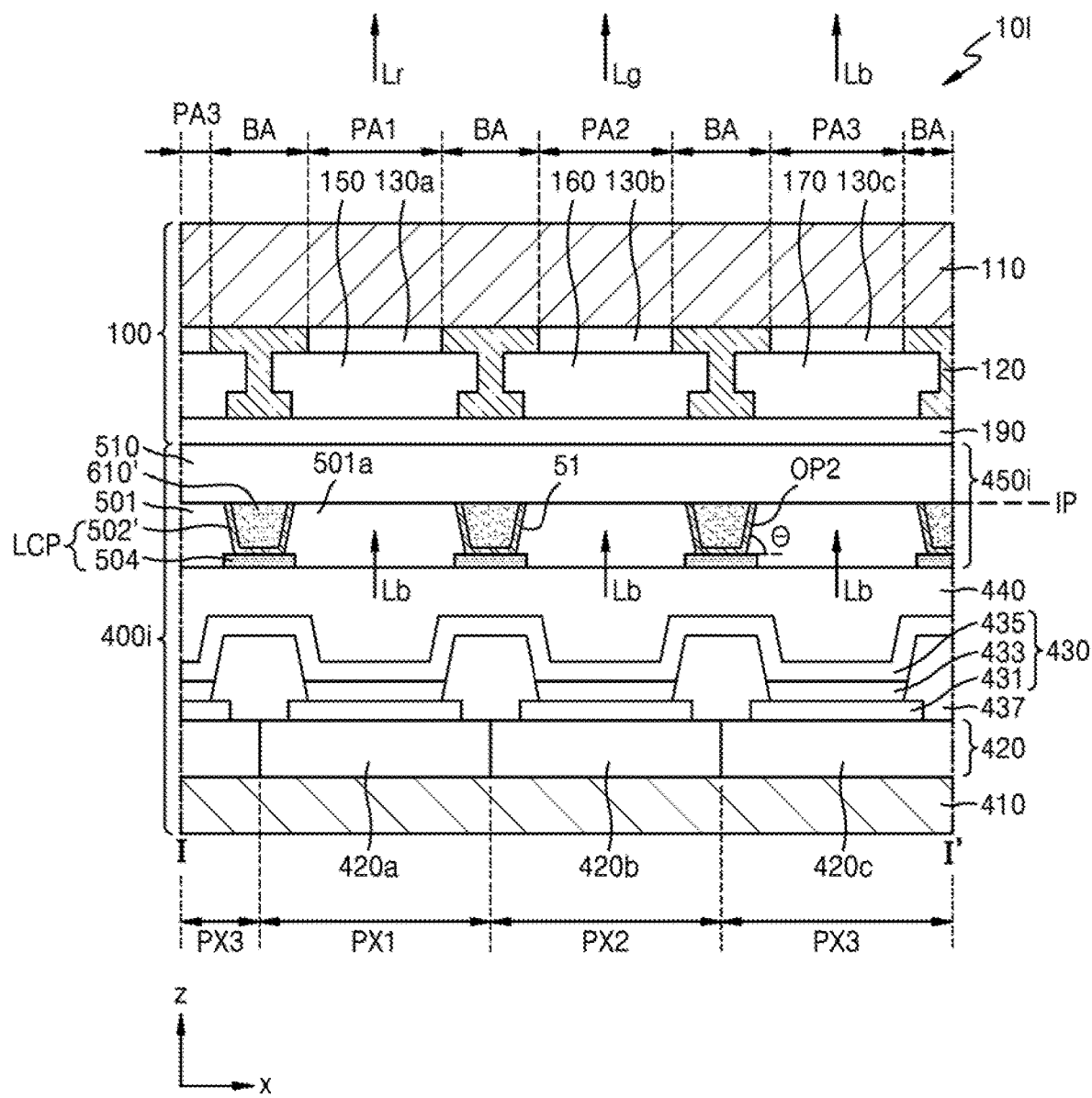
FIG. 20 is a cross-sectional view illustrating a cross-section taken along line I-I' of the display device of FIG. 1, according to an exemplary embodiment of the present invention.

FIG. 20 illustrates a cross-section taken along line I-I' of the display device of FIG. 1 according to an exemplary embodiment of the present invention.

Referring to FIG. 20, a display device 10I according to an exemplary embodiment of the present invention may include a display panel 400i and a color control member 100. First to third pixel circuits 420a, 420b, and 420c respectively of first to third pixels PX1, PX2, and PX3 may be arranged in a pixel circuit layer 420 of the display panel 400i. Light-emitting elements 430 may be arranged on the pixel circuit layer 420 to correspond to first to third pixel areas PA1, PA2, and PA3 of the color control member 100. An encapsulation layer 440 may be arranged on the light-emitting elements 430.

A light control layer 450i may be arranged on the encapsulation layer 440. The light control layer 450i may include a first insulating layer 501 having an insulating pattern 501a positioned in a pixel area PA of the substrate 410, and a light control pattern LCP positioned in a light-blocking area BA of the substrate 410 and arranged between insulating patterns 501a. The light control layer 450i may further include a level pattern 610' on the light control pattern LCP. The light control layer 450i may further include a second insulating layer 510 covering the light control pattern LCP. The light control pattern LCP may include a reflective pattern 502' and a light-blocking pattern 504.

Since the insulating patterns 501a shown in FIG. 20 are the same as the insulating patterns 501a shown in FIG. 7, detailed descriptions thereof may be omitted.

The light control pattern LCP shown in FIG. 20 is different from the light control pattern LCP shown in FIG. 7 in that the light control pattern LCP shown in FIG. 20 includes a level pattern 610' and does not include a second non-inclined portion arranged on the upper surface of the insulating pattern 501a. The following description will focus on the differences.

The light control pattern LCP may be arranged to correspond to a light-blocking area BA of the color control member 100. The light control pattern LCP may include an inclined portion arranged on a side surface 51 of an opening OP2 (or the side surface of the insulating pattern 501a). An inner angle of the insulating pattern 501a and an angle formed by the inclined portion of the light control pattern LCP with an axis parallel to the upper surface of the encapsulation layer 440 may be referred to as a first angle θ. The light control pattern LCP may include a first non-inclined portion arranged on the bottom surface of the opening OP2.

The level pattern 610' may be further arranged on the light control pattern LCP. For example, the level pattern 610' may fill the opening OP2. The level pattern 610' may include a photosensitive organic material such as acrylic resin, BCB, PI and/or novolac resin. The photosensitive organic material may be a negative photosensitive material or a positive photosensitive material.

The upper surface of the insulating pattern 501a, the upper surface of the light control pattern LCP, and the upper surface of the level pattern 610' may be on the same plane IP and may be planarized upper surfaces.

Figure 21A:
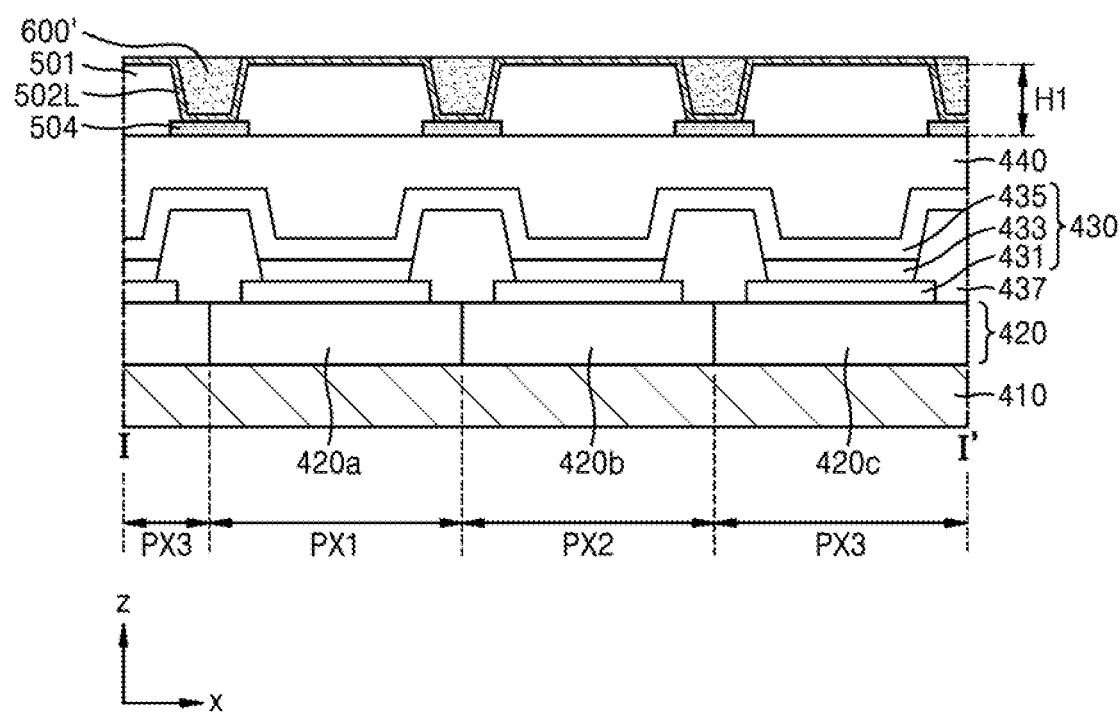
FIGS. 21A to 21C are cross-sectional views illustrating a process of manufacturing the display device illustrated in FIG. 20, according to an exemplary embodiment of the present invention.
Figure 21B:
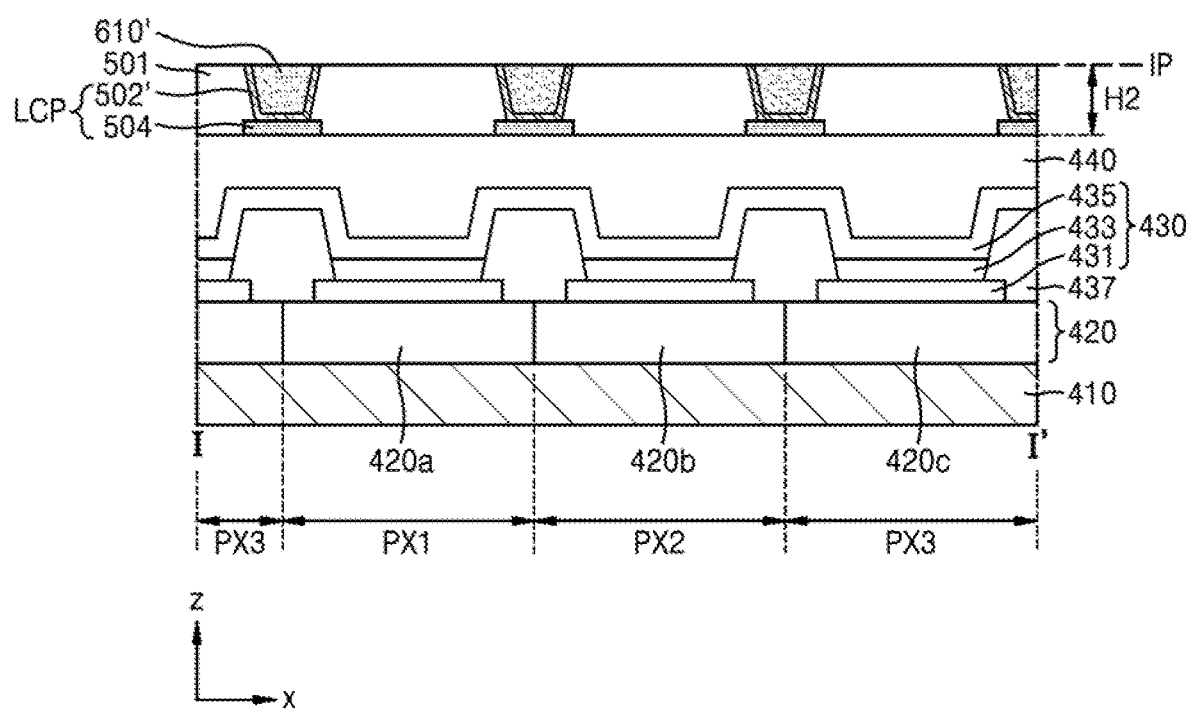
Figure 21C:
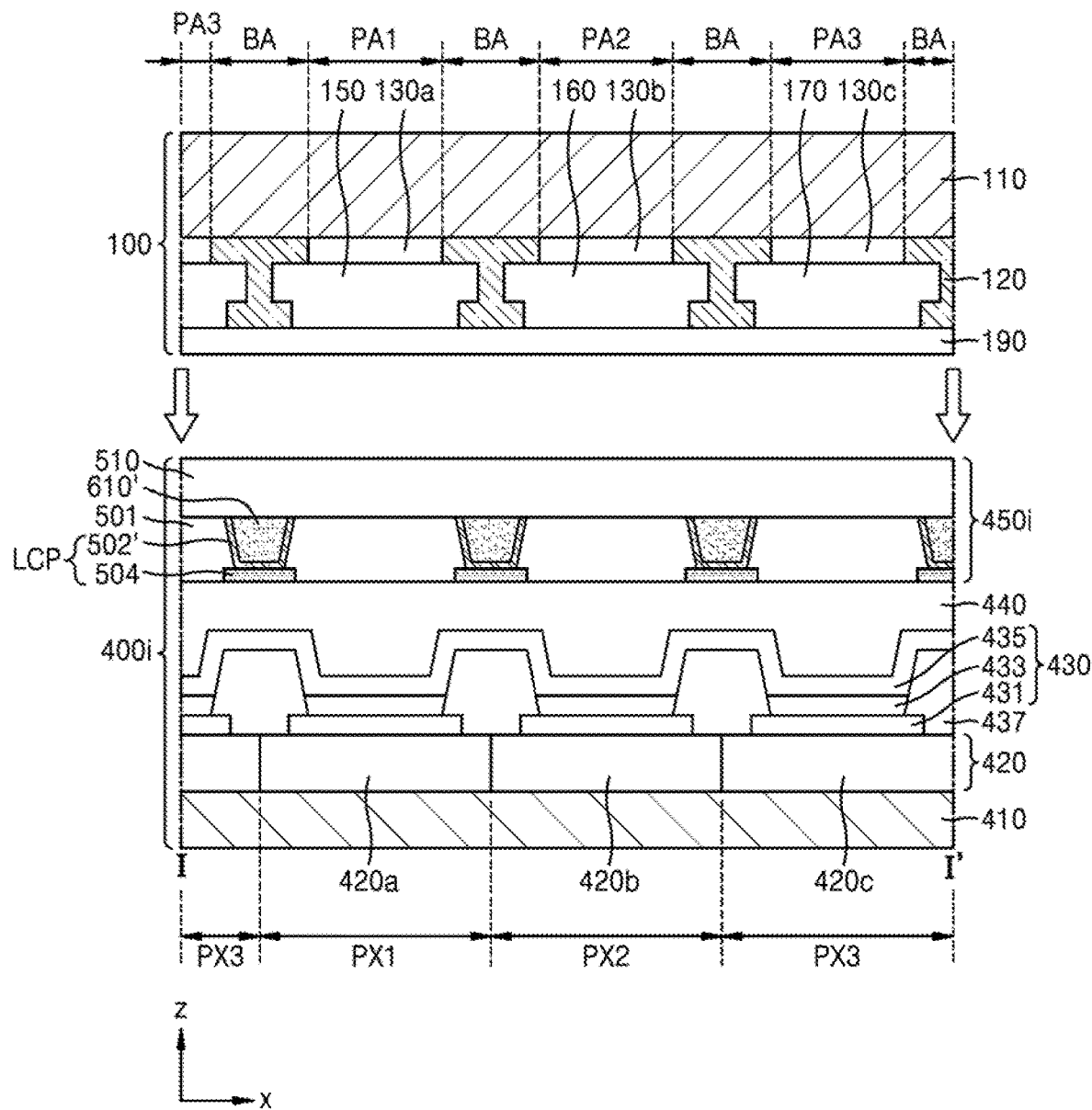

FIGS. 21A to 21C illustrate steps in a manufacturing process of the display device 10I illustrated in FIG. 20.

As shown in FIG. 8A, a light-blocking material layer may be formed over a substrate 410 on which light-emitting elements 430, pixel-defining layer 437 between the light-emitting elements 430, and an encapsulation layer 440 are formed, and then a light-blocking pattern 504 may be formed in the light-blocking area of the substrate 410 by patterning the light-blocking material layer. As shown in FIG. 8B, an insulating pattern 501a may be formed by forming a first insulating layer 501 on the light-blocking pattern 504 and then forming an opening OP2 in the first insulating layer 501. As shown in FIG. 8C, a reflective material layer 502L may be deposited over the substrate 410 while covering the first insulating layer 501 and the light-blocking pattern 504.

Subsequently, as shown in FIG. 21A, a photoresist 600' may be arranged in the opening OP2, in which the reflective material layer 502 is arranged, by spin coating or inkjet drop. The photoresist 600' may include a low viscosity photosensitive material.

Next, as shown in FIG. 21B, the reflective material layer 502L may be etched such that the upper surface of the first insulating layer 501, the upper surface of the light control pattern LCP (e.g., the reflective pattern 502'), and the upper surface of the photoresist 600' are on the same plane IP. Etching may be wet etching or dry etching. After etching, the photoresist 600' in the opening OP2 may be provided as a level pattern 610'. An etched surface of the insulating pattern 501a, an etched surface of the light control pattern LCP, and an etched surface of the level pattern 610' may coincide with one another (e.g., may be aligned). A height H2 of the first insulating layer 501 after etching, shown in FIG. 21B, may be equal to or less than a height H1 of the first insulating layer 501 before etching, shown in FIG. 21A.

As shown in FIG. 21C, a second insulating layer 510, which covers the light control pattern LCP, the level pattern 610', and the first insulating layer 501, may be arranged over the substrate 410. The second insulating layer 510 may include an organic insulating layer. The second insulating layer 510 may include the same material as that of the first insulating layer 501.

The display panel 400i and the color control member 100 may be aligned such that the pixel area PA and the light-blocking area BA of the substrate 410 correspond to the pixel area PA and the light-blocking area BA of the color control member 100, respectively, and then the display panel 400i and the color control member 100 may be combined.

Figure 22:
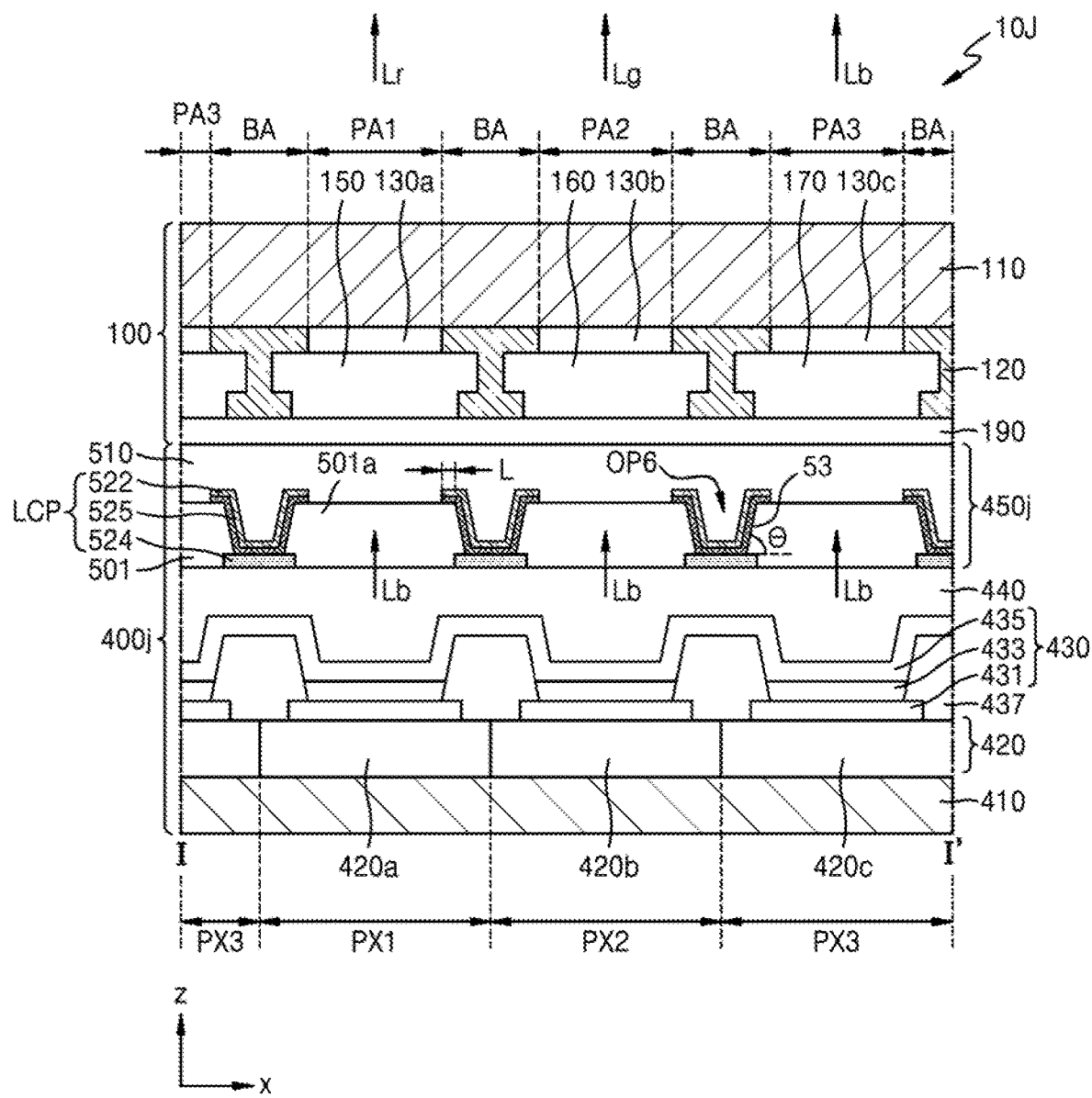
FIG. 22 is a cross-sectional view illustrating a cross-section taken along line I-I' of the display device of FIG. 1 according to an exemplary embodiment of the present invention.

FIG. 22 illustrates a cross-section taken along line I-I' of the display device of FIG. 1 according to an exemplary embodiment of the present invention.

Referring to FIG. 22, a display device 10J according to an exemplary embodiment of the present invention may include a display panel 400j and a color control member 100. First to third pixel circuits 420a, 420b, and 420c respectively of first to third pixels PX1, PX2, and PX3 may be arranged in a pixel circuit layer 420 of the display panel 400j. Light-emitting elements 430 may be arranged on the pixel circuit layer 420 to correspond to first to third pixel areas PA1, PA2, and PA3 of the color control member 100. An encapsulation layer 440 may be arranged on the light-emitting elements 430.

A light control layer 450j may be arranged on the encapsulation layer 440. The light control layer 450j may include a first insulating layer 501 having an insulating pattern 501a positioned in a pixel area of the substrate 410, and a light control pattern LCP positioned in a light-blocking area BA of the substrate 410 and arranged between insulating patterns 501a. The light control layer 450j may further include a second insulating layer 510 covering the light control pattern LCP.

The insulating pattern 501a may be arranged to correspond to the first to third pixel areas PA1, PA2, and PA3 of the color control member 100. The first insulating layer 501 may have an opening OP6 that surrounds the insulating pattern 501a and corresponds to a light-blocking area BA of the color control member 100. The insulating pattern 501a may overlap the light-emitting element 430. An inner angle formed between the side surface and the lower surface (or a surface parallel to the lower surface) of the insulating pattern 501a may be a first angle θ. The insulating pattern 501a may have a tapered structure. The opening OP6 may have an inverse tapered structure in relation to the tapered structure of the insulating pattern 501a.

The light control pattern LCP may be arranged to correspond to the light-blocking area BA of the color control member 100. The light control pattern LCP may at least partially surround the insulating pattern 501a and may be located in the opening OP6. The light control pattern LCP may include a pair of inclined portions arranged on a side surface 53 of the opening OP6 (or the side surface of the insulating pattern 501a). Each of the pair of inclined portions may form the first angle θ with the upper surface (or the upper surface of a light-blocking pattern 524) of the encapsulation layer 440. The pair of inclined portions extends in a direction away from the upper surface of the substrate 410, and the distance between inclined portions on the side closest to the substrate 410 is less than the distance between inclined portions on the side farther from the substrate 410. The light control pattern LCP may include a first non-inclined portion between the pair of inclined portions arranged in the opening OP6. The light control pattern LCP may include second non-inclined portions formed as the inclined portions extend to the upper surface of the insulating pattern 501a adjacent to the opening OP6. Each of the second non-inclined portions may extend by a length L to the upper surface of the insulating pattern 501a outside the opening OP6 in consideration of process dispersion due to mask alignment in a manufacturing process.

The light control pattern LCP may include a reflective pattern 522, a light-blocking pattern 524, and a support pattern 525. The reflective pattern 522 and the support pattern 525 may be arranged on the side surface and bottom surface of the opening OP6. The light-blocking pattern 524 may be arranged on the bottom surface of the opening OP6.

The support pattern 525 may directly contact the upper surface of the light-blocking pattern 524 and the side surface of the insulating pattern 501a, which are exposed by the opening OP6. The reflective pattern 522 may include a reflective material. The light-blocking pattern 524 may include a light-blocking material. The light-blocking material may include a light-absorbing material. The light-absorbing material may include a metal oxide such as $AlO_x$, $CrO_x$, $CuO_x$, $MoO_x$, $TiO_x$, $AlNdO_x$, $CuMoO_x$, $MoTaO_x$, $MoTiO_x$, or the like. The light-blocking pattern 524 may include an opaque inorganic insulating material or an opaque organic insulating material such as a black resin. The light-blocking pattern 524 may have various colors including black or white. In the case where the light-blocking pattern 524 is black, the light-blocking pattern 524 may include a black matrix. In the case where the light-blocking pattern 524 is white, the light-blocking pattern 524 may include an organic insulating material such as a white resin.

The support pattern 525 may include an inorganic material such as silicon nitride (SiNx). The support pattern 525 may be arranged under the reflective pattern 522. For example, the support pattern 525 may be arranged between the reflective pattern 522 and the light-blocking pattern 524.

A first pattern, which includes the reflective pattern 522 and the support pattern 525 of the light control pattern LCP, may include an inclined portion and first and second non-inclined portions. The light-blocking pattern 524 of the light control pattern LCP may be arranged under the first non-inclined portion of the reflective pattern 522 of the first pattern. The light-blocking pattern 524 may directly contact the upper surface of the encapsulation layer 440. The edge of the light-blocking pattern 524 may be covered by the insulating pattern 501a. The support pattern 525 of the first pattern may directly contact the upper surface of the light-blocking pattern 524 and the side surface of the insulating pattern 501a. The support pattern 525 may function as a support member for supporting the shape of the reflective pattern 522. For example, the support pattern 525 may be disposed between the inclined portions of the insulating pattern 501a and the inclined portions of the reflective pattern 522, and at a bottom of the opening OP6 between the non-inclined light-blocking pattern 524 and the first non-inclined portion of the reflective pattern 522.

The reflective pattern 522 may reflect a portion of light emitted from the light-emitting element 430 to an adjacent pixel area PA. Light reflected by the reflective pattern 522 may be incident on a color conversion layer 150 or 160 or a transmission layer 170 of a pixel area PA. The light-blocking pattern 524 may absorb a portion of light emitted from the light-emitting element 430 to the adjacent pixel area PA.

FIGS. 23A to 23F illustrate steps in a manufacturing process of the display device 10J illustrated in FIG. 22.

Figure 23A:
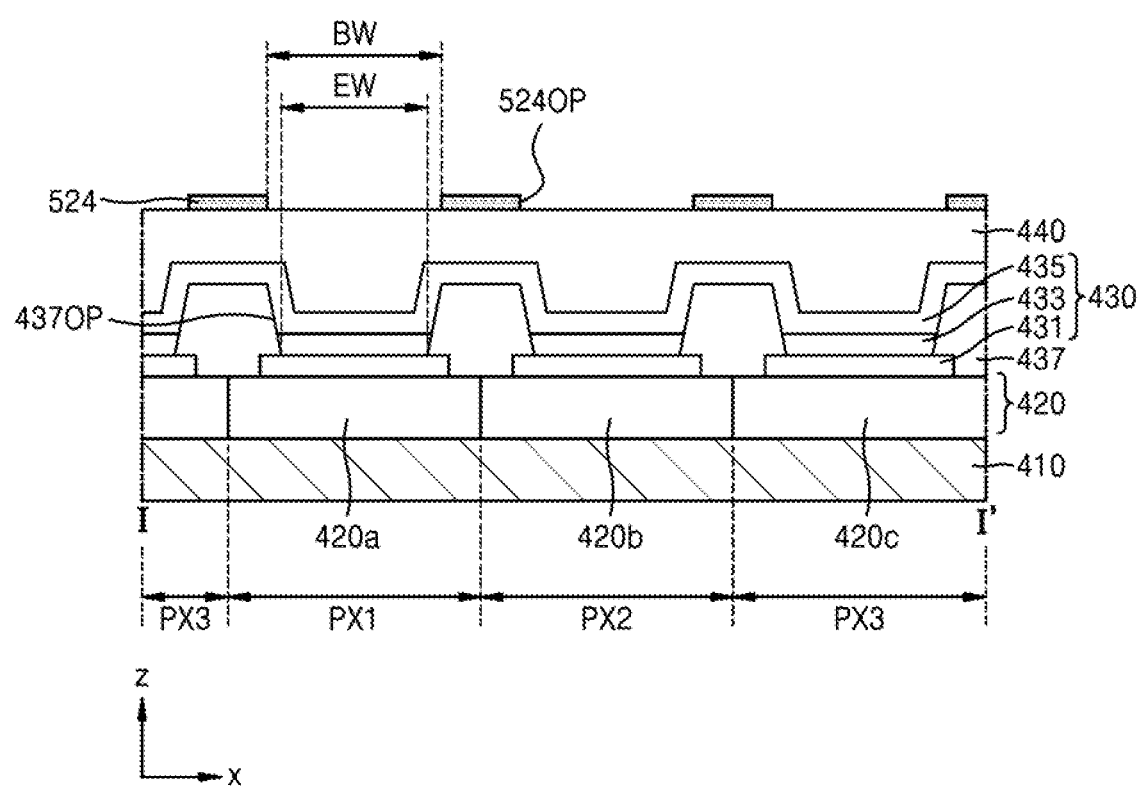
FIGS. 23A to 23F are cross-sectional views illustrating steps in a process of manufacturing the display device illustrated in FIG. 22, according to an exemplary embodiment of the present invention.

As shown in FIG. 23A, a light-blocking material layer may be formed over a substrate 410 on which light-emitting elements 430, a pixel-defining layer 437 between the light-emitting elements 430, and an encapsulation layer 440 are formed, and then the light-blocking material layer may be patterned to thereby form a light-blocking pattern 524. The light-blocking pattern 524 may overlap the pixel-defining layer 437 and may be arranged in a light-blocking area of the substrate 410. An opening 524OP of the light-blocking pattern 524 may be formed to entirely surround an opening 437OP of the pixel-defining layer 437. A width BW of the opening 524OP of the light-blocking pattern 524 may be equal to or greater than a width EW of the opening 437OP of the pixel-defining layer 437.

Figure 23B:
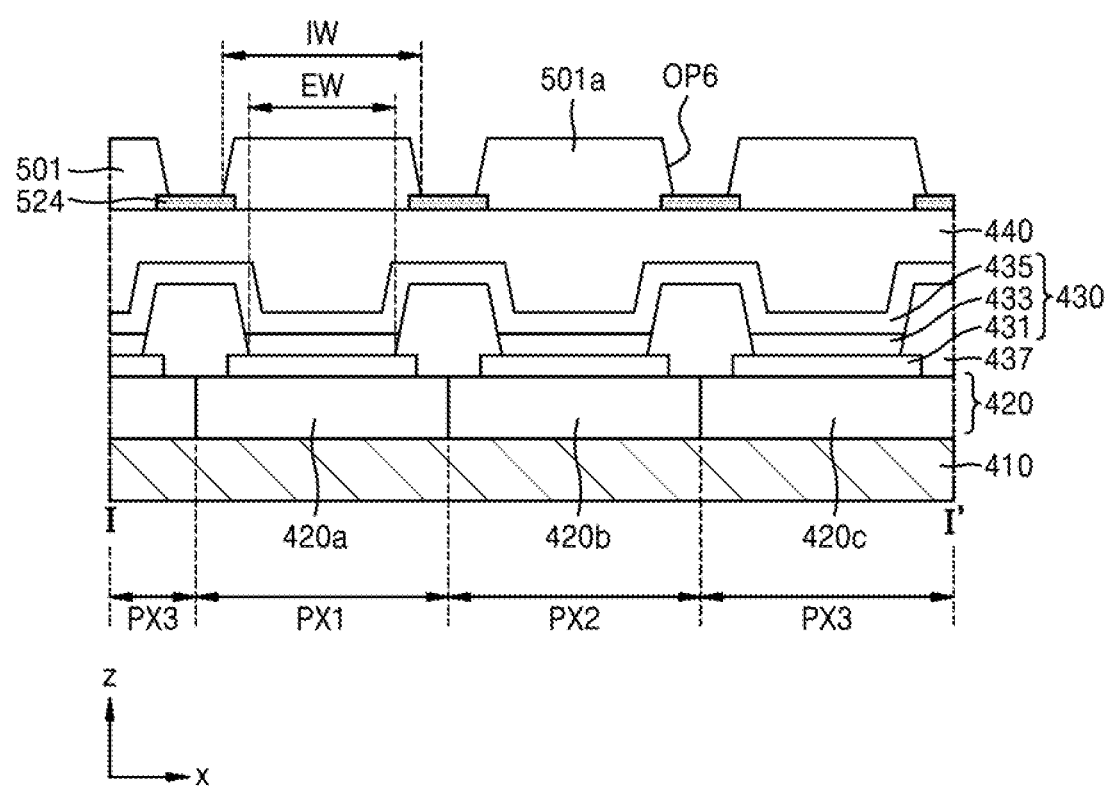

As shown in FIG. 23B, a first insulating layer 501 may be formed on the light-blocking pattern 524, and then an opening OP2 penetrating the first insulating layer 501 may be formed to thereby form an insulating pattern 501a. The first insulating layer 501 may include an organic insulating layer. The opening OP6 may entirely surround the opening 437OP of the pixel-defining layer 437 and may be located in the light-blocking area BA of the substrate 410. The opening OP6 may expose an upper surface of the light-blocking pattern 524. The insulating pattern 501a may overlap the light-emitting element 430 (e.g., the pixel electrode 431). The insulating pattern 501a may overlap the opening 437OP of the pixel-defining layer 437, and an inner width IW of the insulating pattern 501a may be equal to or greater than a width EW of the opening 437OP of the pixel-defining layer 437.

Figure 23C:
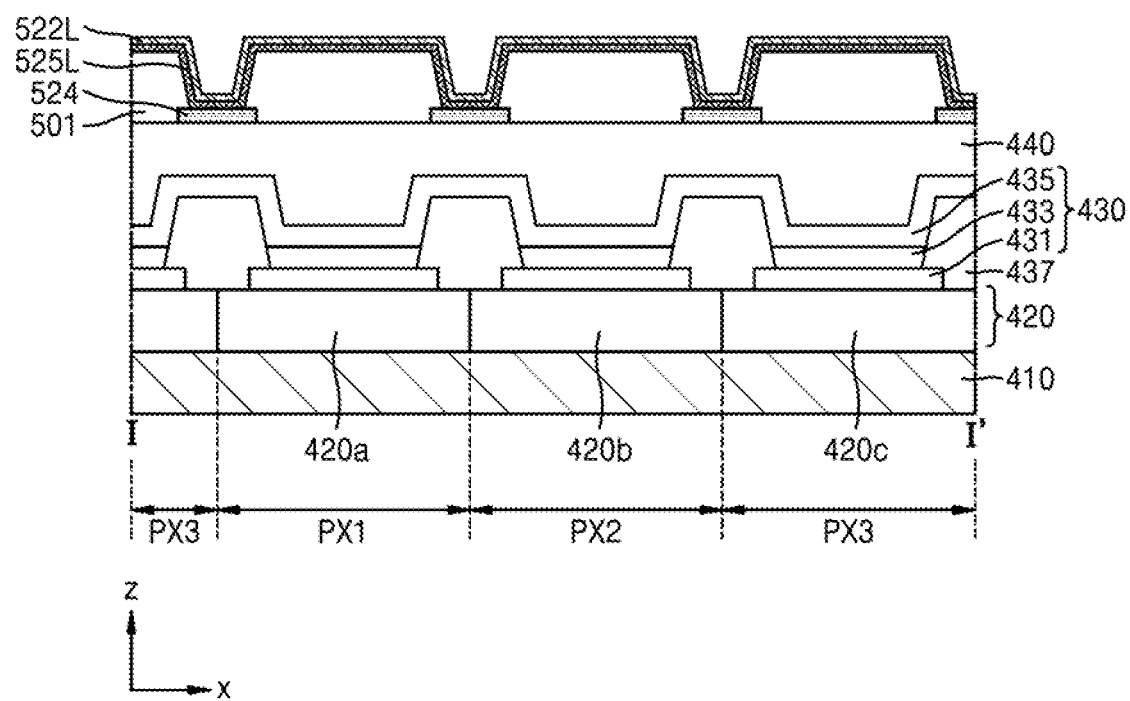

As shown in FIG. 23C, an inorganic material layer 525L and a reflective material layer 522L may be sequentially deposited on the first insulating layer 501 including the insulating pattern 501a.

Figure 23D:
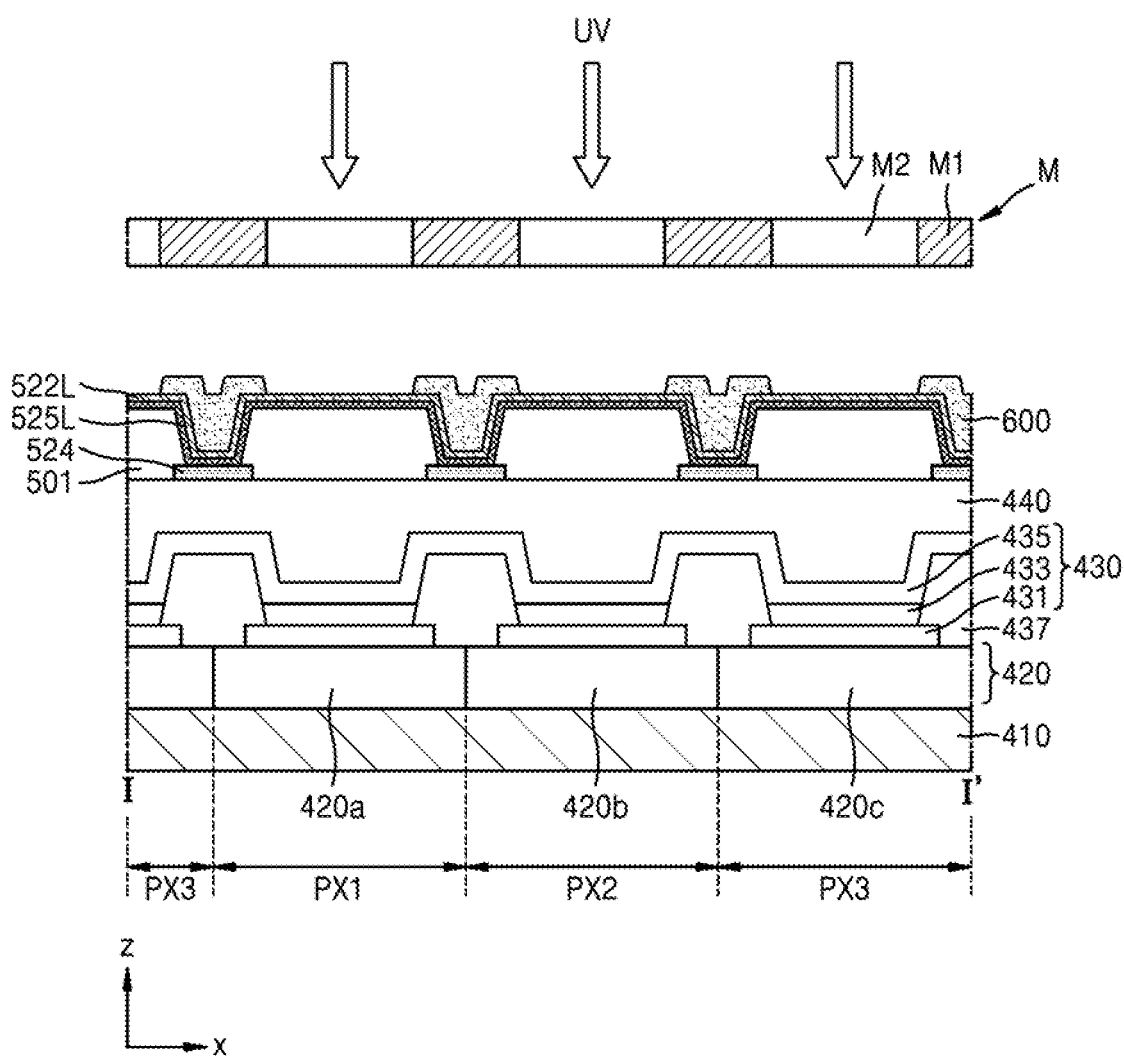

Subsequently, as shown in FIG. 23D, a photoresist 600 may be applied to cover the inorganic material layer 525L and the reflective material layer 522L, and the photoresist 600 may be UV-exposed and developed using an aligned mask M, and thus, a portion of the photoresist 600 corresponding to a light-transmitting portion M2 may be removed and only a portion of the photoresist 600 corresponding to a light-blocking portion M1 may remain.

Figure 23E:
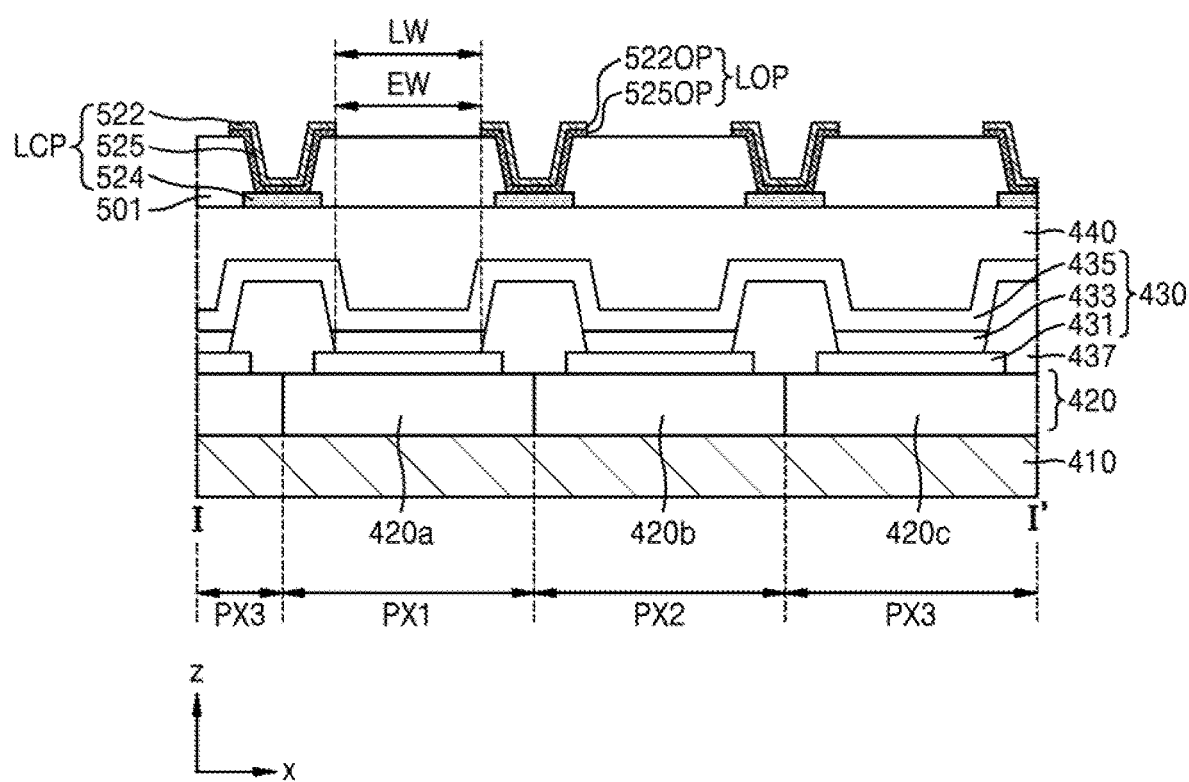

Next, as shown in FIG. 23E, the inorganic material layer 525L and the reflective material layer 522L of a region where the photoresist 600 is removed may be etched to thereby form the support pattern 525 and the reflective pattern 522. Etching may be wet etching or dry etching. In an etching process in which a portion of the inorganic material layer 525L and the reflective material layer 522L are removed, a portion of the upper portion of the first insulating layer 501 may be removed by overetching. An etched surface (e.g., a side surface) of the reflective material layer 522L corresponding to an opening 522OP and an etched surface (e.g., a side surface) of the inorganic material layer 525L corresponding to an opening 525OP may coincide with each other (e.g., may be aligned). An opening LOP of the light control pattern LCP may include the opening 522OP of the reflective material layer 522L and the opening 525OP of the inorganic material layer 525L. The width of an opening 502OP of the reflective material layer 502L, that is, a width LW of an opening LOP of the light control pattern LCP, may be equal to or greater than the width EW of the opening 437OP of the pixel-defining layer 437. Thereafter, the photoresist 600 remaining on the light control pattern LCP may be removed.

Figure 23F:
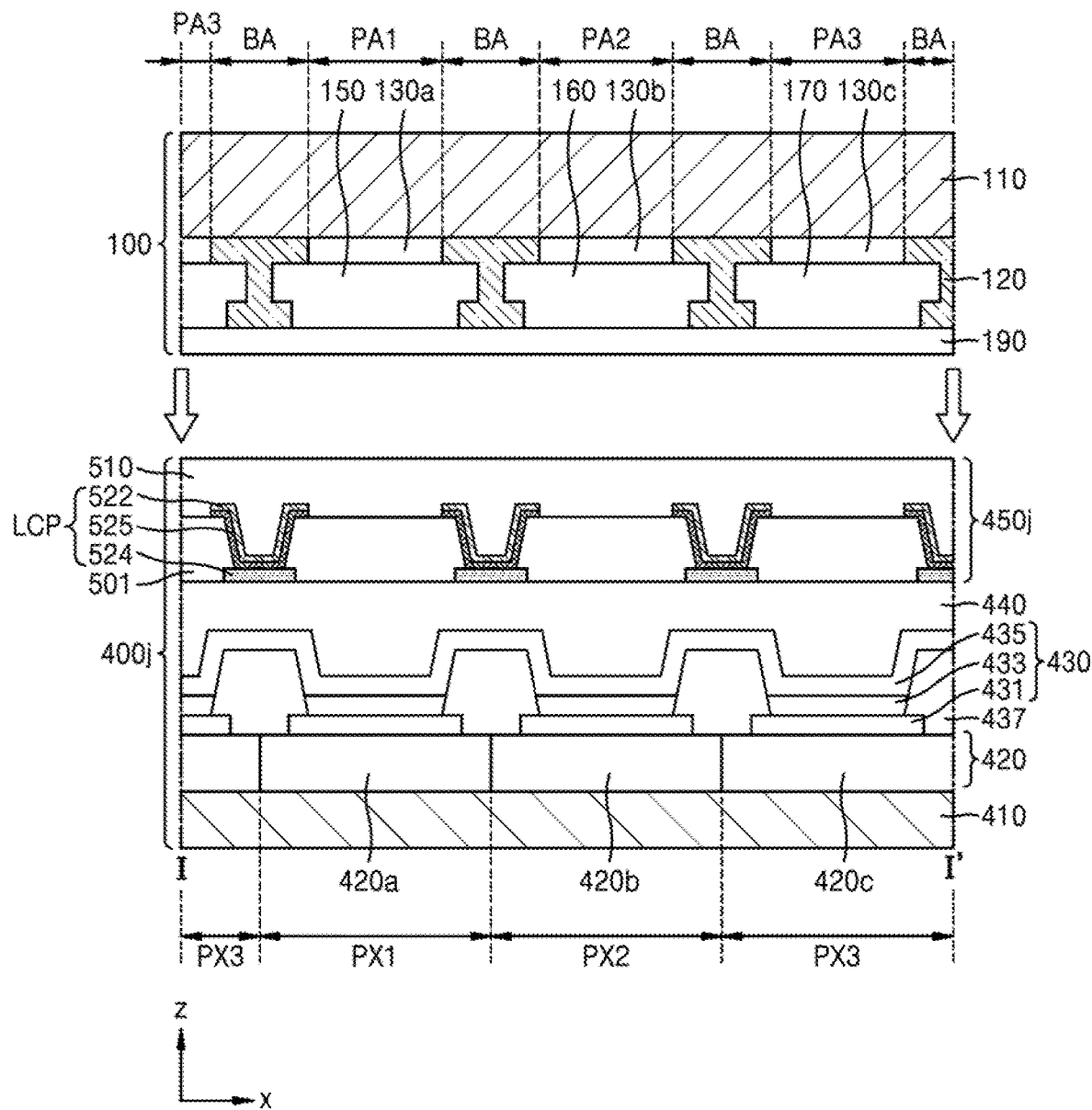

Next, as shown in FIG. 23F, the second insulating layer 510, which covers the light control pattern LCP and the first insulating layer 501 including the insulating pattern 501a, may be arranged over the substrate 410. The second insulating layer 510 may include an organic insulating layer. The second insulating layer 510 may include the same material as that of the first insulating layer 501.

The display panel 400j and the color control member 100 may be aligned such that the pixel area PA and the light-blocking area BA of the substrate 410 correspond to the pixel area PA and the light-blocking area BA of the color control member 100, respectively, and then the display panel 400j and the color control member 100 may be combined.

Figure 24:
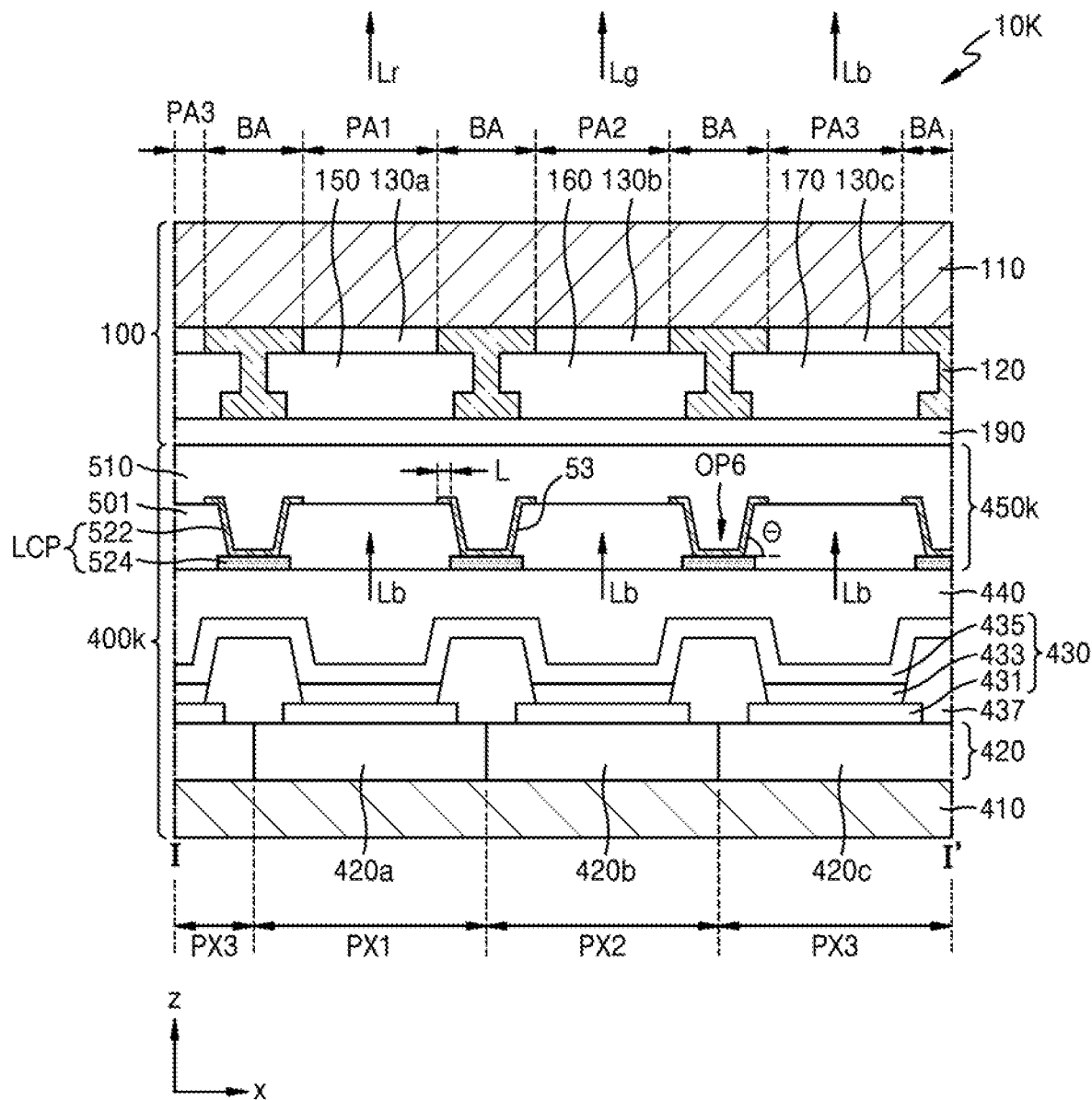
FIG. 24 is a cross-sectional view illustrating a cross-section taken along line I-I' of the display device of FIG. 1, according to an exemplary embodiment of the present invention.

FIG. 24 illustrates a cross-section taken along line I-I" of the display device of FIG. 1 according to an exemplary embodiment of the present invention.

Referring to FIG. 24, a display device 10K according to an exemplary embodiment of the present invention may include a display panel 400k and a color control member 100. A light control layer 450k may be arranged on an encapsulation layer 440.

The exemplary embodiment of the present invention illustrated in FIG. 24 is different from the exemplary embodiment of the present invention illustrated in FIG. 22 in that a light control pattern LCP of the light control layer 450k does not include the support pattern 525 and includes only a reflective pattern 522 and a light-blocking pattern 524. For example, the interior surfaces of the opening OP6 may be lined only by the reflective pattern 522, and the light blocking pattern 524 may be a flat portion disposed at the bottom of the opening OP6 between the encapsulation layer 440 and the portion of the reflective pattern 522 covering the bottom of the opening OP6. Since other configurations are the same as those of the embodiments of FIGS. 22 and 7, detailed descriptions thereof may be omitted.

Figure 25:
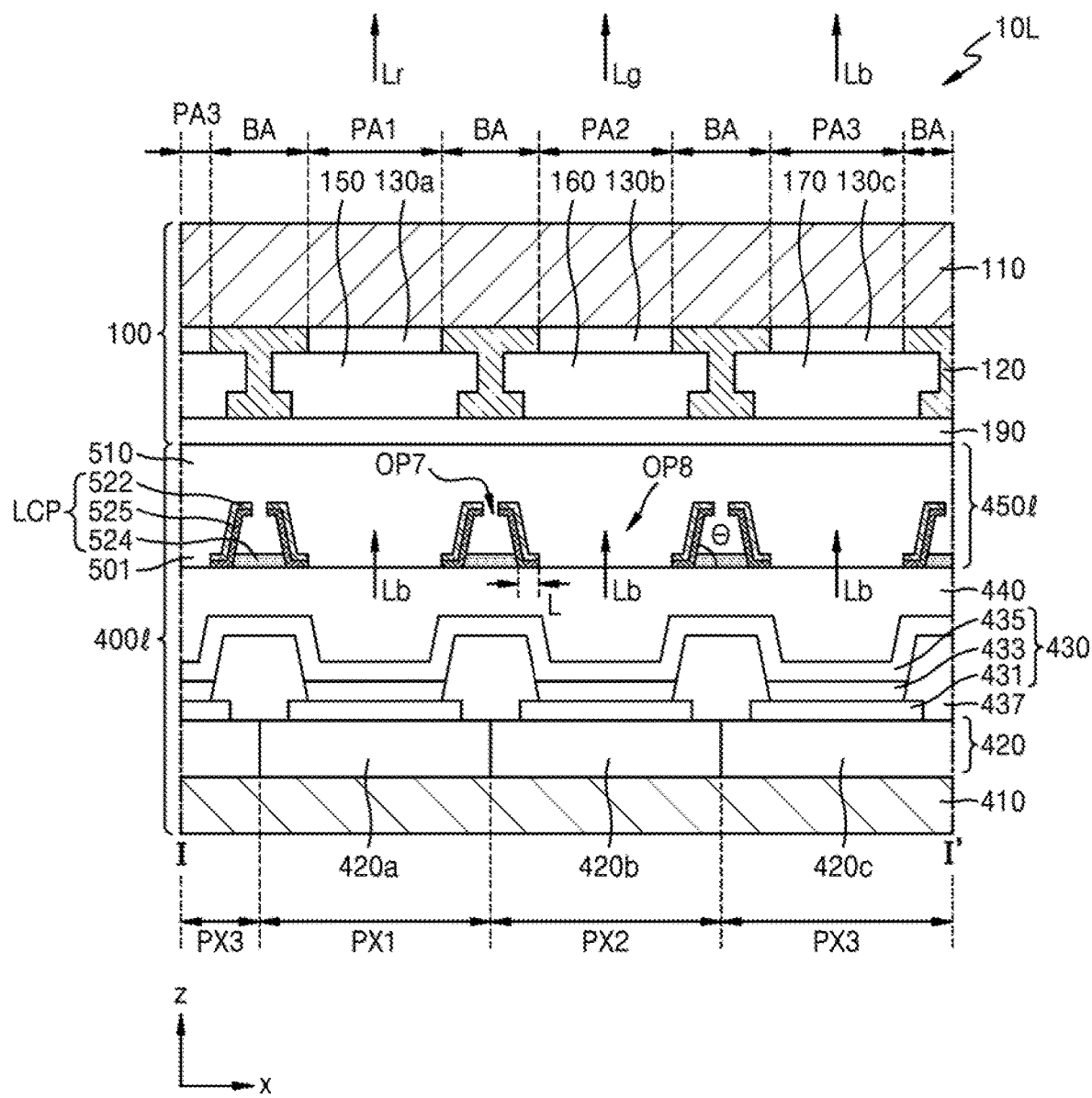
FIG. 25 is a cross-sectional view illustrating a cross-section taken along line I-I' of the display device of FIG. 1, according to an exemplary embodiment of the present invention.

FIG. 25 illustrates a cross-section taken along line I-I' of the display device of FIG. 1 according to an exemplary embodiment of the present invention.

Referring to FIG. 25, a display device 10L according to an exemplary embodiment of the present invention may include a display panel 400l and a color control member 100. First to third pixel circuits 420a, 420b, and 420c respectively of first to third pixels PX1, PX2, and PX3 may be arranged in a pixel circuit layer 420 of the display panel 400l. Light-emitting elements 430 may be arranged on the pixel circuit layer 420 to correspond to first to third pixel areas PA1, PA2, and PA3 of the color control member 100. An encapsulation layer 440 may be arranged on the light-emitting elements 430.

A light control layer 450l may be arranged on the encapsulation layer 440. The light control layer 450l may include a light control pattern LCP positioned in a light-blocking area BA of the substrate 410. The light control layer 450l may further include a second insulating layer 510, which covers the interior of a space defined between inclined portions of the light control pattern LCP (e.g., a hole OP7) and the outer surfaces of the light control pattern LCP.

The light control pattern LCP may be arranged to correspond to a light-blocking area BA of the color control member 100. The light control pattern LCP may include a pair of inclined portions. Each of the pair of inclined portions may form a first angle with the upper surface (or a surface parallel to the upper surface) of the encapsulation layer 440. The pair of inclined portions extends in a converging oblique direction from an upper surface of the encapsulation layer 440 towards a planarization layer 190. For example, the distance between inclined portions on the side closest to the substrate 410 is greater than the distance between inclined portions on the side farther from the substrate 410. The light control pattern LCP may include a first non-inclined portion between the pair of inclined portions. The first non-inclined portion may have the hole OP7. The light control pattern LCP may include second non-inclined portions formed on the encapsulation layer 440, connected to the inclined portions, and extending in the first direction (e.g., the x direction) toward an opening OP8. Each of the second non-inclined portions may extend by a length L across the upper surface of the encapsulation layer 440 towards the opening OP8 in consideration of process dispersion due to mask alignment in a manufacturing process. The opening OP8 may represent an opening between the second non-inclined portions of adjacent light control patterns LCP. In this case, although the hole and the opening are named separately, the hole and the opening correspond to through-holes formed to penetrate the upper and lower surfaces of a component with only differences in size.

The light control pattern LCP may include a first pattern and a light-blocking pattern 524. The first pattern may include a reflective pattern 522 and a support pattern 525. The first pattern of the light control pattern LCP may include an inclined portion and first and second non-inclined portions. The first pattern may have at least one hole OP7 in a central portion thereof. The first pattern may have a tapered structure. The light-blocking pattern 524 of the light control pattern LCP may be arranged in a space defined by the first pattern. The light-blocking pattern 524 may directly contact the upper surface of the encapsulation layer 440. The side surface of the light-blocking pattern 524 may directly contact the inner side surface of the first pattern, for example, the support pattern 525.

The reflective pattern 522 may include a reflective material. The light-blocking pattern 524 may include a light-blocking material. The light-blocking pattern 524 may include an opaque inorganic insulating material and/or an opaque organic insulating material such as a black resin. The support pattern 525 may include an inorganic material such as silicon nitride (SiNx). The support pattern 525 may be arranged under the reflective pattern 522. The support pattern 525 may function as a support member for supporting the shape of the reflective pattern 522.

FIGS. 26A to 26F illustrate steps in a manufacturing process of the display device 10L illustrated in FIG. 25.

Figure 26A:
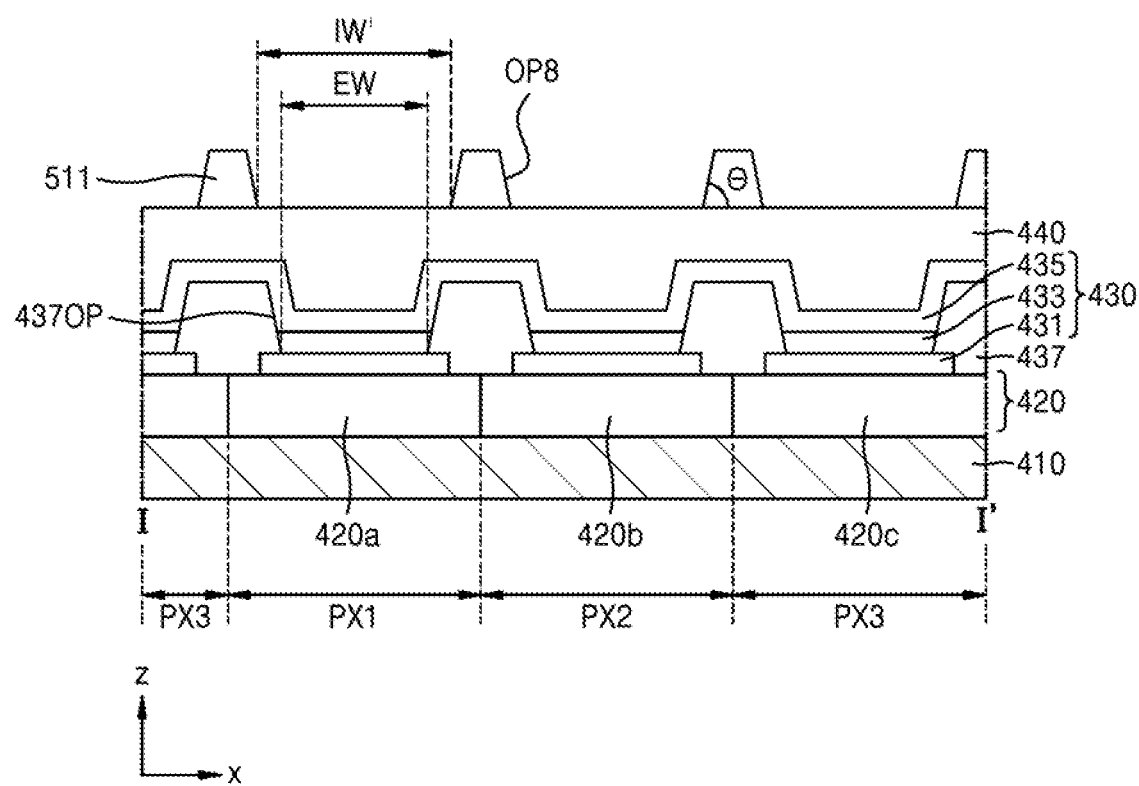
FIGS. 26A to 26F are cross-sectional views illustrating steps in a process of manufacturing the display device illustrated in FIG. 25, according to an exemplary embodiment of the present invention.

As shown in FIG. 26A, a first insulating layer may be formed over a substrate 410 on which light-emitting elements 430, a pixel-defining layer 437 between the light-emitting elements 430, and an encapsulation layer 440 are formed, and then an opening OP8 penetrating the first insulating layer may be formed, thereby forming an insulating pattern 511. The first insulating layer may include an organic insulating layer. The opening OP8 may expose the upper surface of the encapsulation layer 440 and side surfaces of the insulating pattern 511. The opening OP8 may be located in a pixel area PA of the substrate 410. The insulating pattern 511 may be located in a light-blocking area BA of the substrate 410, may entirely surround an opening 437OP of the pixel-defining layer 437, and may overlap the pixel-defining layer 437 (e.g., the pixel-defining pattern of the pixel-defining layer). An inner angle of the insulating pattern 511 may be a first angle θ. The opening OP8 of the first insulating layer may overlap the opening 437OP of the pixel-defining layer 437. A width IW' of the opening OP8 of the first insulating layer may be equal to or greater than a width EW of the opening 437OP of the pixel-defining layer 437. The insulating pattern 511 may have a tapered structure in which the distance (the width) between opposite sides of the insulating pattern 511 gradually decreases away from the encapsulation layer 440. A cross-section of the insulating pattern 511 may have a substantially trapezoidal shape. The opening OP8 may have an inverse tapered structure in relation to the insulating pattern 511.

Figure 26B:
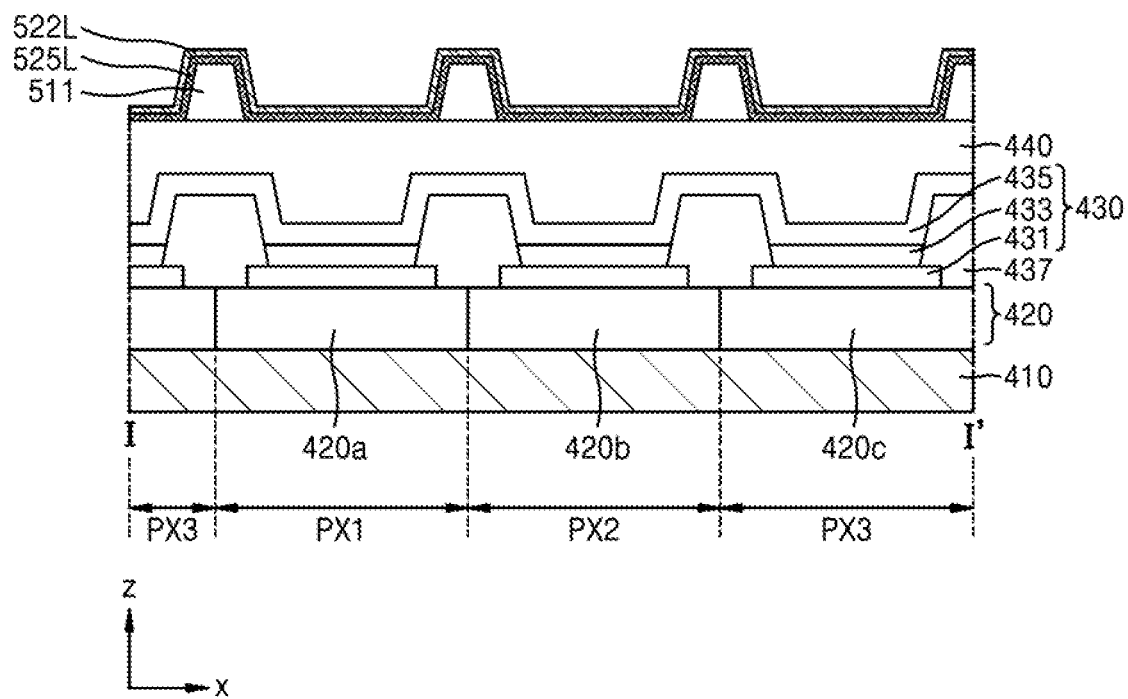

As shown in FIG. 26B, an inorganic material layer 525L and a reflective material layer 522L may be sequentially deposited on the first insulating layer including the insulating pattern 511.

Figure 26C:
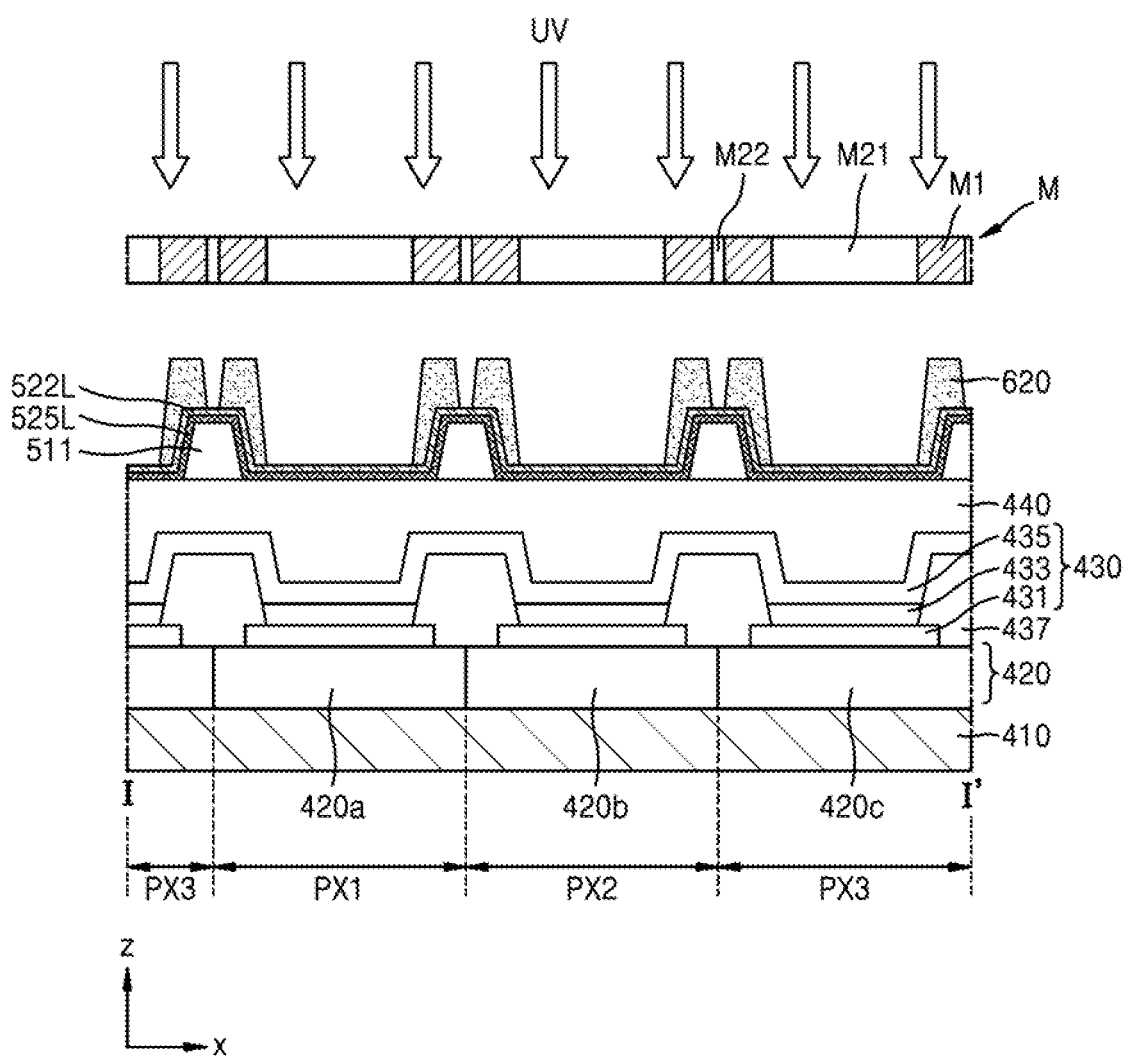

Subsequently, as shown in FIG. 26C, a photoresist 620 may be applied to cover the inorganic material layer 525L and the reflective material layer 522L, and the photoresist 620 may be UV-exposed and developed using an aligned mask M, and thus, a portion of the photoresist 620 corresponding to a light-transmitting portion M21 and M22 may be removed and only a portion of the photoresist 620 corresponding to a light-blocking portion M1 may remain.

Figure 26D:
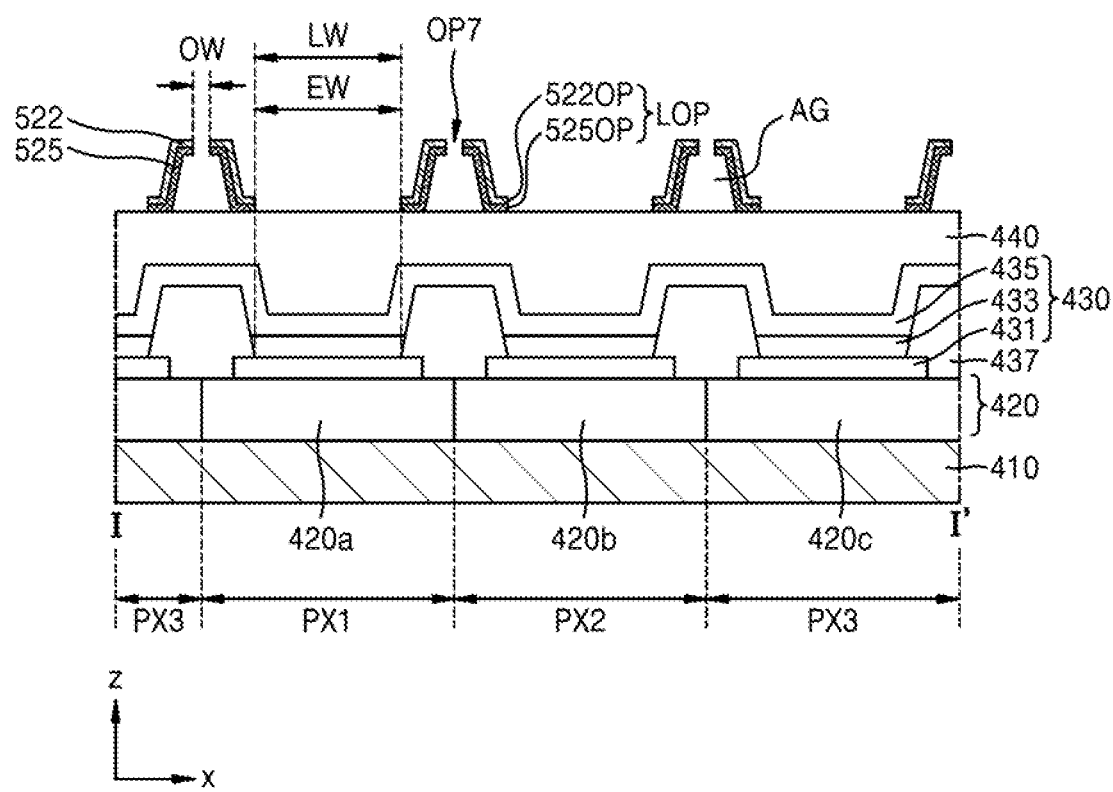

Next, as shown in FIG. 26D, the inorganic material layer 525L and the reflective material layer 522L of a region where the photoresist 620 is removed may be etched to thereby form a first pattern having a hole OP7. Etching may be wet etching or dry etching. The photoresist 620 remaining on the first pattern may be removed. The insulating pattern 511 in the first pattern covered by the first pattern may be removed through the hole OP7 of the first pattern. The insulating pattern 511 may be removed through a developing process, and an air gap AG may be formed in a space where the insulating pattern 511 was present. An inner space of the first pattern, for example, the air gap AG, may have a shape of the insulating pattern 511. An etched surface (e.g., a side surface) of the reflective material layer 522L corresponding to an opening 522OP and an etched surface (e.g., a side surface) of the inorganic material layer 525L corresponding to an opening 525OP may coincide with each other (e.g., may be aligned). An opening LOP of the light control pattern LCP may include the opening 522OP of the reflective material layer 522L and the opening 525OP of the inorganic material layer 525L. A width LW of the opening LOP of the light control pattern LCP may be equal to or greater than the width EW of the opening 437OP of the pixel-defining layer 437. A width OW of the hole OP7 may be approximately 1 μm to 3 μm.

Figure 26E:
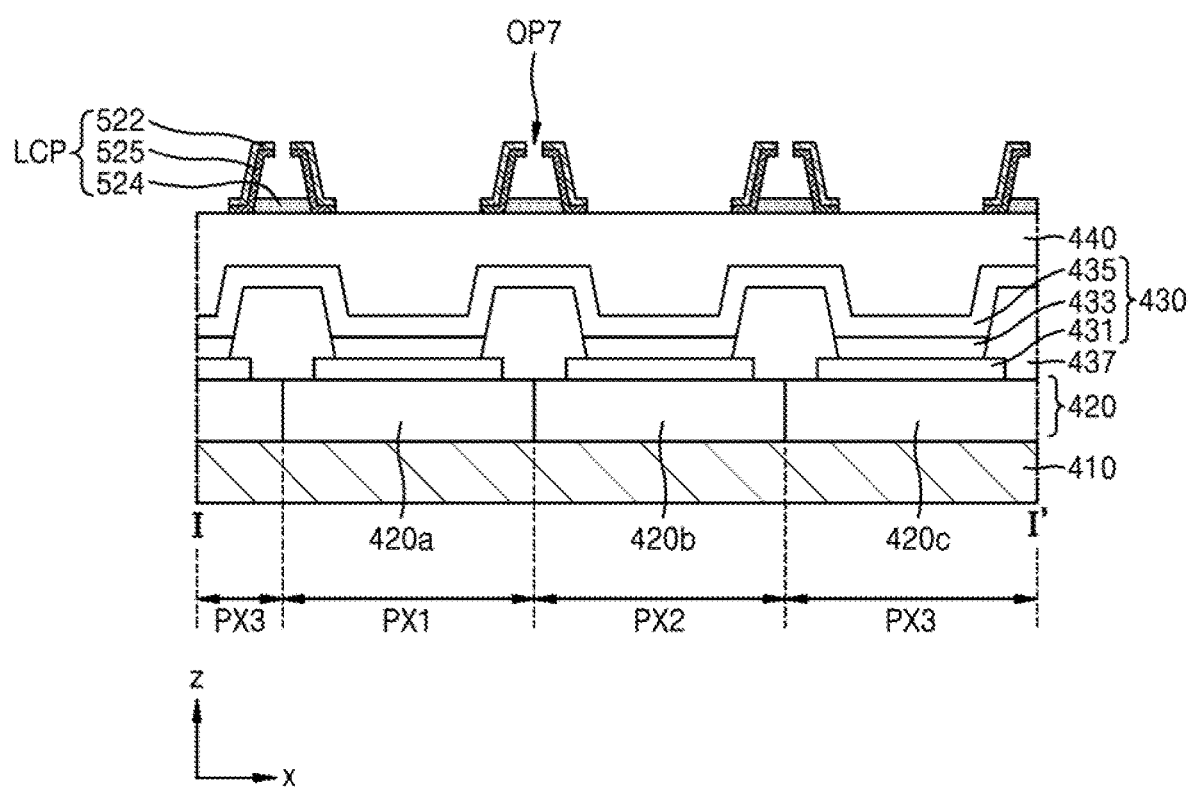

Next, a light-blocking material may be applied over the entire surface of the substrate 410. In this case, the light-blocking material may be injected into the air gap AG of the first pattern through the hole OP7 of the first pattern. Thereafter, as shown in FIG. 26E, only a portion of the light-blocking material may remain in the air gap AG of the first pattern and the other portion of the light-blocking material may be removed, and thus, the light-blocking pattern 524 may be provided in the air gap AG of the first pattern.

Figure 26F:
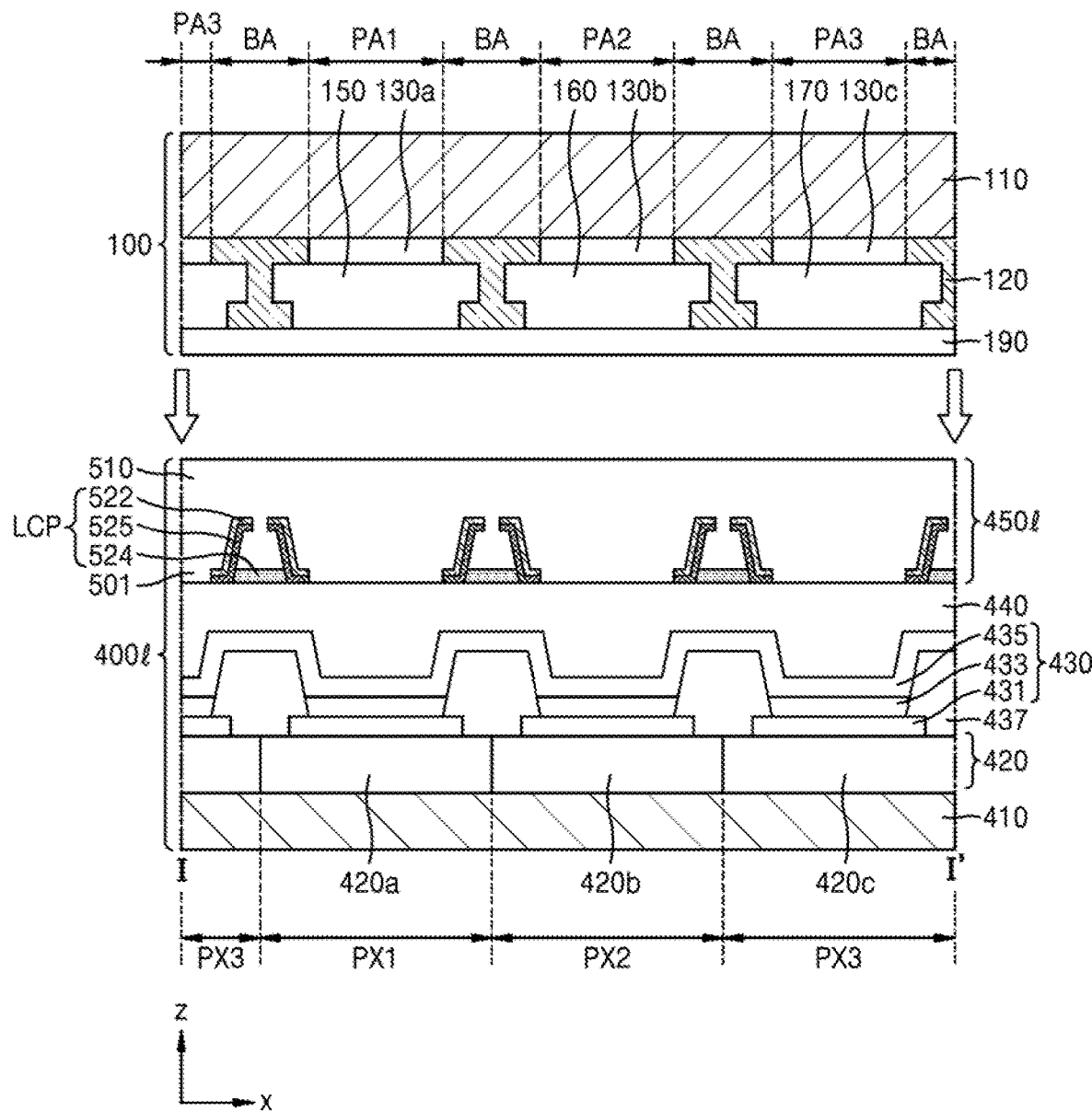

Next, as shown in FIG. 26F, a second insulating layer 510 covering the light control pattern LCP while filling the air gap AG of the first pattern may be arranged over the substrate 410. The second insulating layer 510 may include an organic insulating layer. The second insulating layer 510 may include the same material as that of the first insulating layer forming the insulating pattern 511.

The display panel 400I and the color control member 100 may be aligned such that the pixel area PA and the light-blocking area BA of the substrate 410 correspond to the pixel area PA and the light-blocking area BA of the color control member 100, respectively, and then the display panel 400I and the color control member 100 may be combined.

Figure 27:
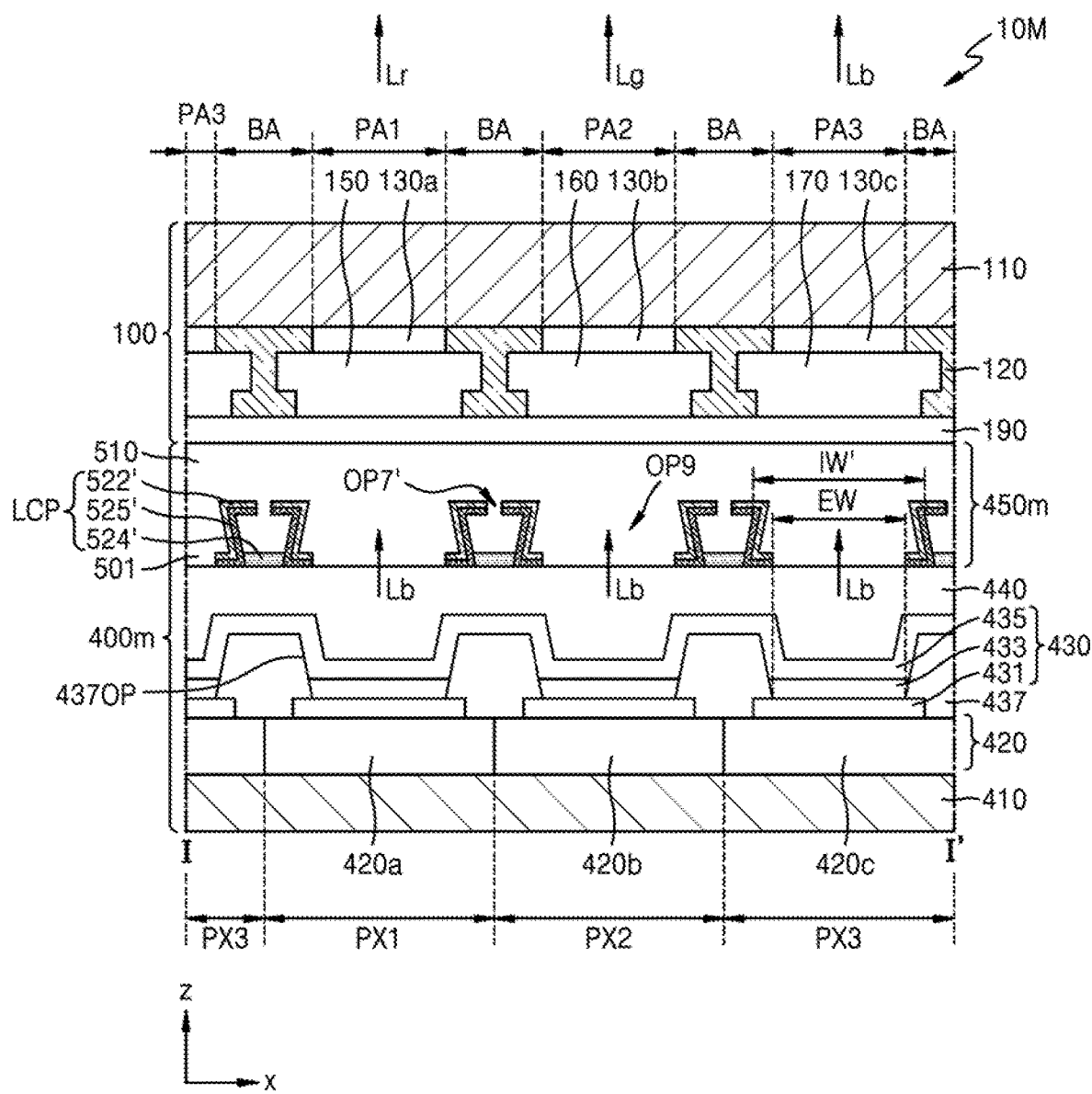
FIG. 27 is a cross-sectional view illustrating a cross-section taken along line I-I' of the display device of FIG. 1, according to an exemplary embodiment of the present invention.

FIG. 27 illustrates a cross-section taken along line I-I' of the display device of FIG. 1 according to an exemplary embodiment of the present invention.

Referring to FIG. 27, a display device 10M according to an exemplary embodiment of the present invention may include a display panel 400m and a color control member 100. A light control layer 450m may be arranged on an encapsulation layer 440.

The exemplary embodiment of FIG. 27 is different from the exemplary embodiment of FIG. 25 in that a light control pattern LCP of the light control layer 450m has an inverse tapered "z" shaped structure in which the width in the first direction (e.g., the x direction) between each inclined portion of a pair of inclined portions gradually increases in a third direction (e.g., the z direction) away from the encapsulation layer 440 towards a planarization layer 190. The light control pattern LCP may include a first pattern including a reflective pattern 522' and a support pattern 525' and a light-blocking pattern 524'. The first pattern may include an inclined portion and first and second non-inclined portions. A hole OP7' may be provided on the first pattern. The support pattern 525' may be arranged under the reflective pattern 522'. The light-blocking pattern 524' may be arranged in a space defined by the first pattern (e.g., between the inclined portions of the pair of inclined portions) and may directly contact the upper surface of the encapsulation layer 440.

The exemplary embodiment of FIG. 27 has a difference in that, after a first insulating layer is formed in the process of FIG. 26A, the first insulating layer is patterned such that an inner angle of an insulating pattern 511 is an obtuse angle. For example, in contrast to the exemplary embodiment of FIG. 26A, the distance in the first direction (e.g., the width in the x direction) between opposite sides of the insulating pattern 511 may gradually increase in a direction away from the encapsulation layer 440 towards the planarization layer 190. An opening OP9 of the first insulating layer may overlap an opening 437OP of the pixel-defining layer 437. A width IW' of the opening OP9 of the first insulating layer may be equal to or greater than a width EW of the opening 437OP of the pixel-defining layer 437. The width IWe of the opening OP9 may be defined as the width in the first direction e.g., the x direction) of the upper surface of the opening OP9, the upper surface having a minimum area in the opening OP9. The distance in the first direction (e.g., the x direction) (or the width) between opposite sides of the opening OP9 may gradually decrease in a third direction (e.g., the z direction) away from the encapsulation layer 440 towards a planarization layer 190. Other configurations are the same as those in the embodiment of FIG. 25, and thus detailed descriptions thereof may be omitted.

The above-described exemplary embodiments of the present invention are examples in which one light control pattern LCP is provided in the light-blocking area BA of the substrate 410. In another exemplary embodiment of the present invention, one or more light control patterns LCP may be provided in the light-blocking area of the substrate 410. In this case, each of the light control patterns LCP may correspond to any one of the light control patterns LCP of the embodiments illustrated in FIGS. 5 to 27. Hereinafter, examples in which one or more light control patterns LCP of the above-described exemplary embodiments of the present invention are provided in the light-blocking area BA are illustrated.

Figure 28:
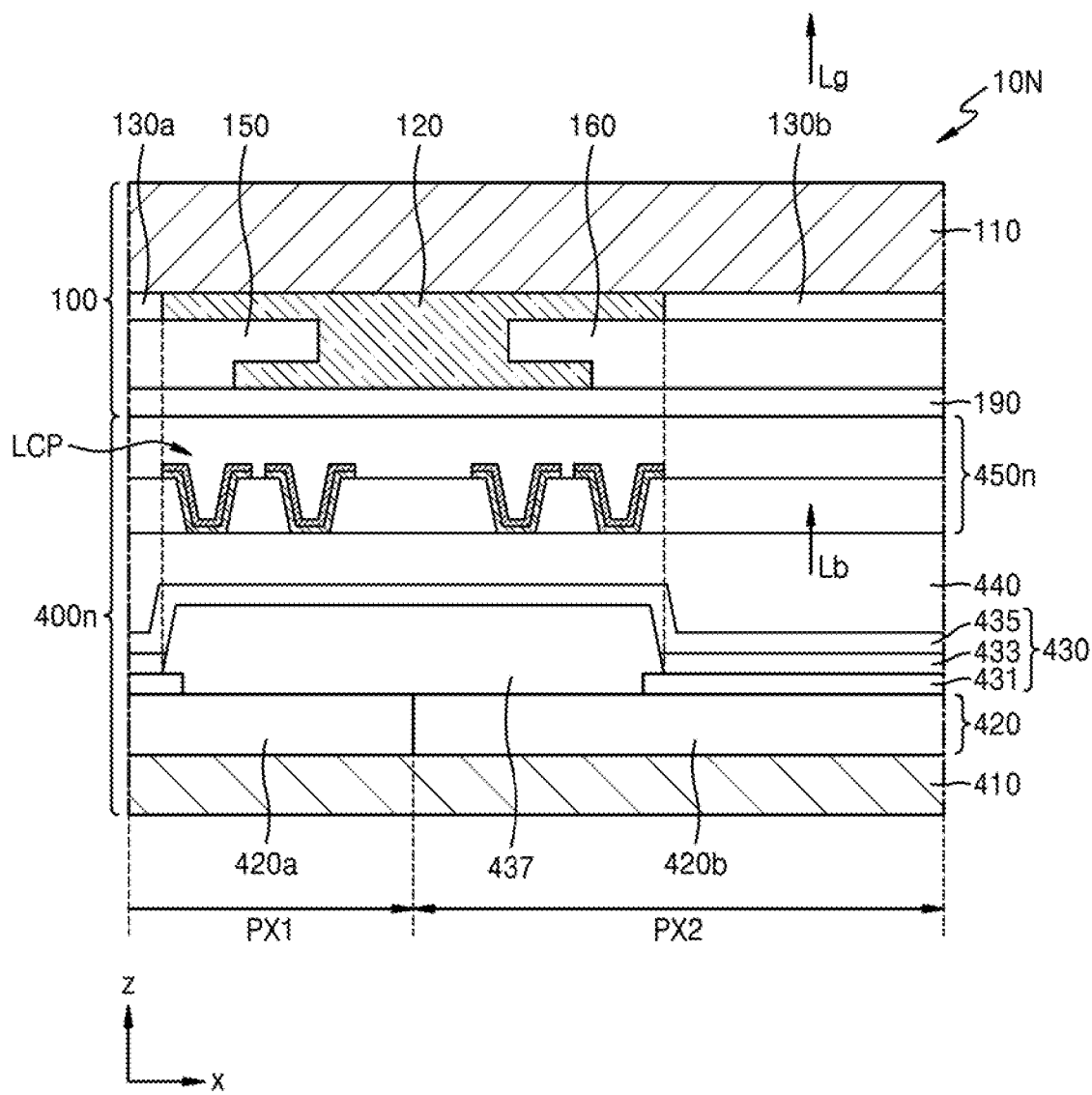
FIGS. 28 to 30 are cross-sectional views illustrating cross-sections taken along line I-I' of the display device of FIG. 1, according to exemplary embodiments of the present invention.
Figure 29:
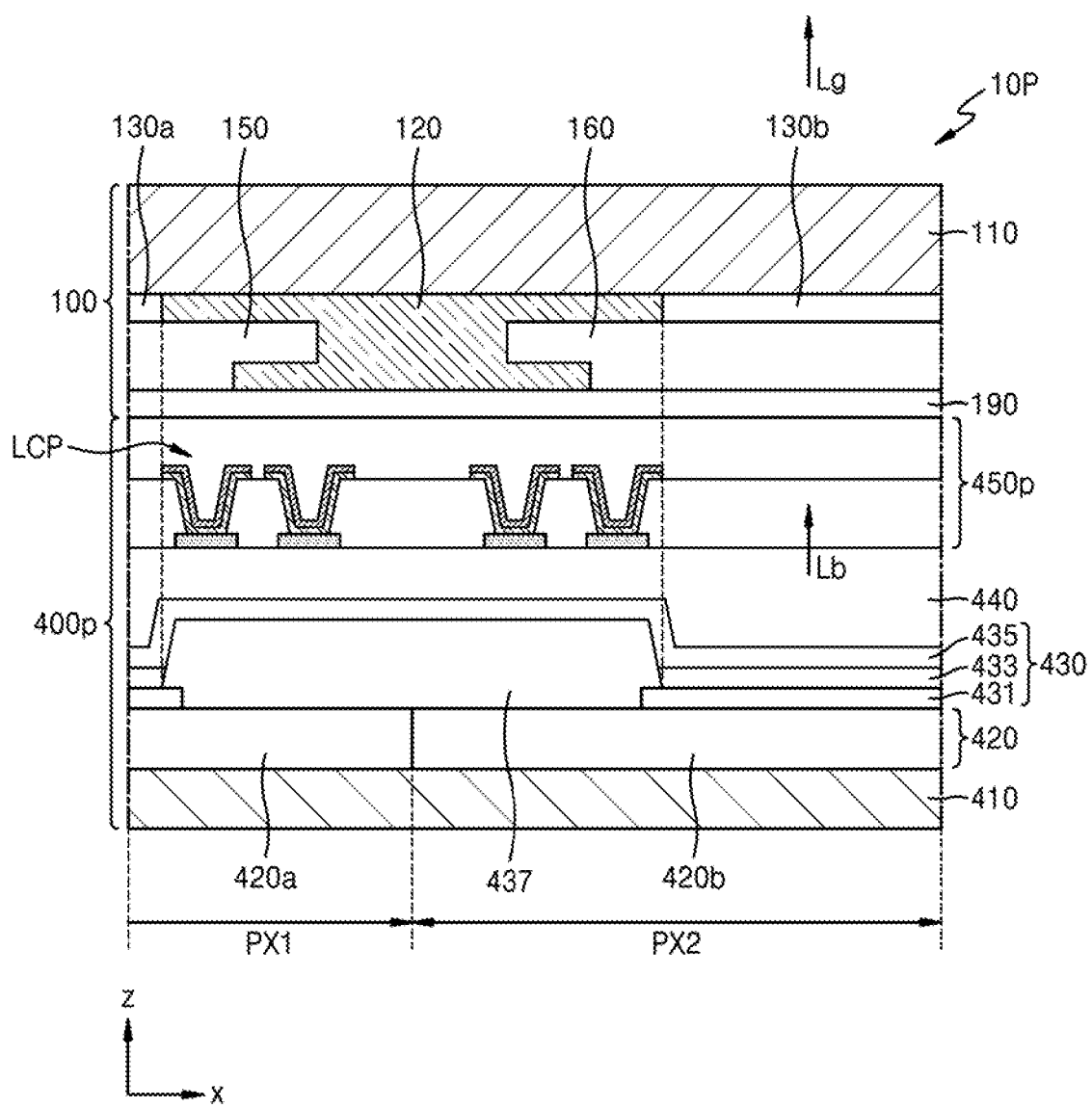
Figure 30:
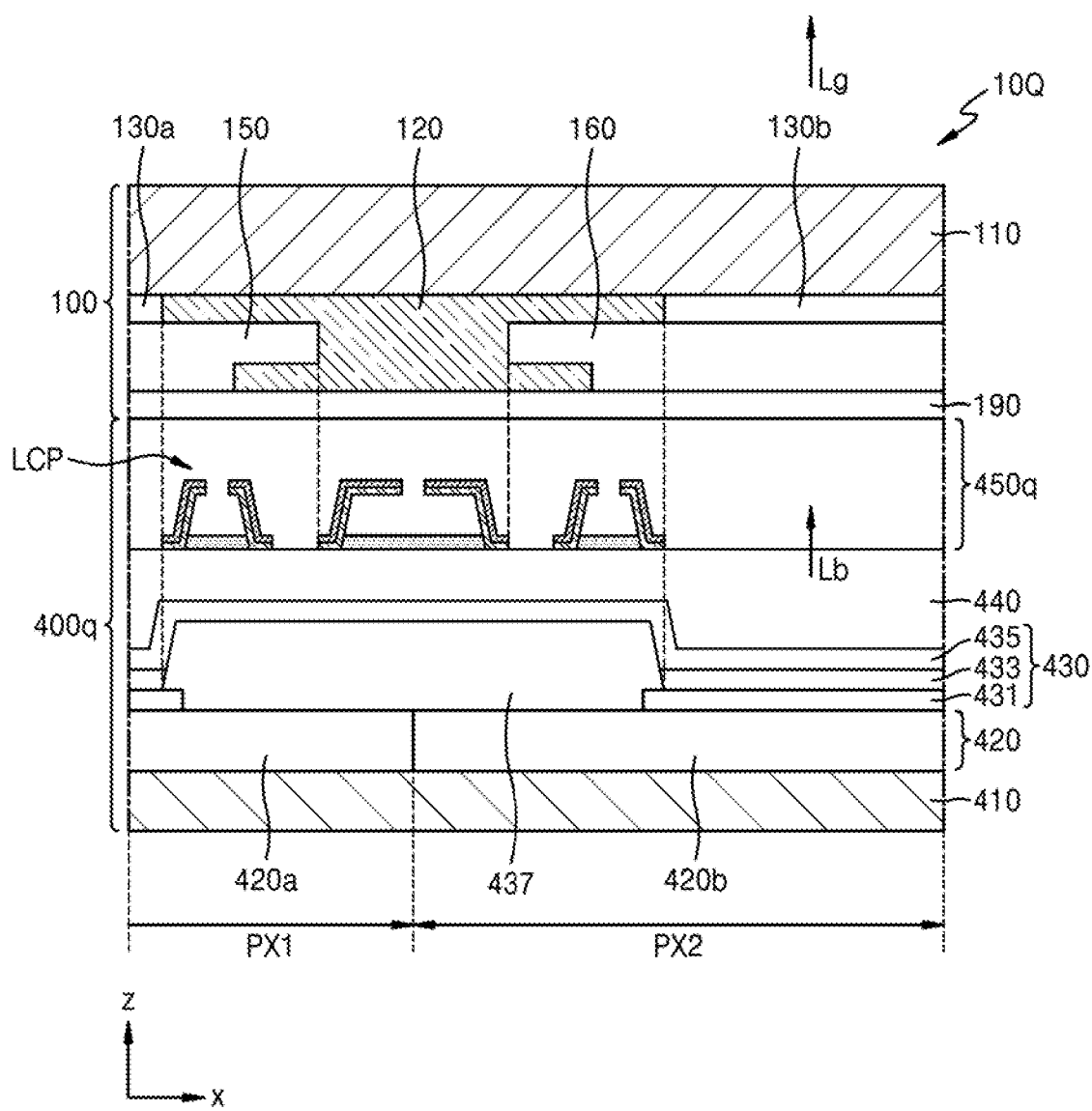

FIGS. 28 to 30 illustrate cross-sections taken along line I-I' of the display device of FIG. 1 according to exemplary embodiments of the present invention.

A display device 10N illustrated in the exemplary embodiment of FIG. 28 may include a display panel 400n and a color control member 100. A light control layer 450n may be arranged on an encapsulation layer 440. The exemplary embodiment of FIG. 28 is different from the exemplary embodiment of FIG. 5 in that four light control patterns LCP are provided in each light-blocking area BA of a substrate 410 between light-emitting elements 430 (for example, pixel electrodes 431). A cross-section width of the light control pattern LCP in the first direction (e.g., the x direction), a distance between the light control patterns LCP in the first direction (e.g., the x direction) and a number of the light control patterns LCP may vary according to a size of the light blocking area BA. Other configurations are the same as those shown and described in the exemplary embodiment of FIG. 5, and thus detailed descriptions thereof may be omitted.

A display device 10P illustrated in FIG. 29 may include a display panel 400p and a color control member 100. A light control layer 450p may be arranged on an encapsulation layer 440. The exemplary embodiment of FIG. 29 is different from the exemplary embodiment of FIG. 22 in that four light control patterns LCP are provided in a light-blocking area BA of a substrate 410 between light-emitting element 430 or pixel electrodes 431. Other configurations are the same as those in the exemplary embodiment of FIG. 22, and thus detailed descriptions thereof may be omitted.

A display device 10Q illustrated in FIG. 30 may include a display panel 400q and a color control member 100. A light control layer 450q may be arranged on an encapsulation layer 440. The exemplary embodiment of FIG. 30 is different from the exemplary embodiment of FIG. 25 in that three light control patterns LCP are provided in a light-blocking area BA of a substrate 410 between light-emitting element 430 (e.g., pixel electrodes 431). A cross-section width of the light control pattern LCP in the first direction (e.g., the x direction), a distance between the light control patterns LCP in the first direction (e.g., the x direction) and a number of the light control patterns LCP may vary according to a size of the light blocking area BA. For example, The two light control patterns LCP overlapping opposing edges of the pixel-defining pattern may collectively have a same width as a width of the light-blocking member 120. However, the central light control pattern LCP disposed between the outermost light control patterns LCP may have a greater width in the first direction (e.g., the x direction) than either of the outermost light control patterns LCP. Other configurations are the same as those in the exemplary embodiment of FIG. 25, and thus detailed descriptions thereof may be omitted.

Figure 31:
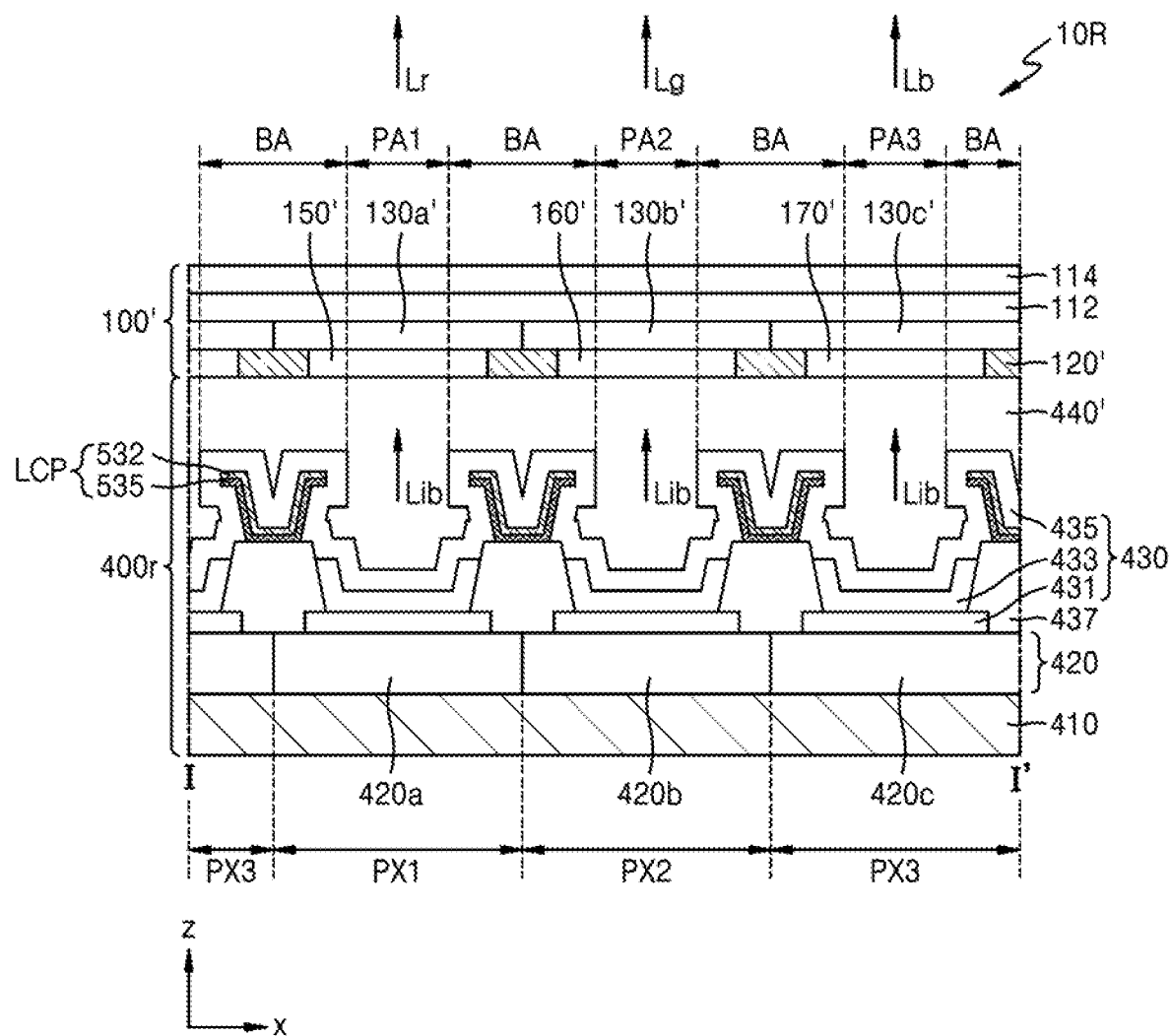
FIG. 31 is a cross-sectional view illustrating a portion of a display device, according to an exemplary embodiment of the present invention.

FIG. 31 is a cross-sectional view of a portion of a display device 10R according to an exemplary embodiment of the present invention.

Referring to FIG. 31, the display device 10R according to the exemplary embodiment of the present invention may include a display panel 400r and a color control member 100'.

The color control member 100' may include a light-blocking member 120', a color filter layer 130', a first color conversion layer 150', and a second color conversion layer 160'. The color control member 100' may be directly formed on the display panel 400r after the process of forming the display panel 400r. Hereinafter, descriptions that are the same as those of the color control member 100 described with reference to FIGS. 2A, 2B, and 3 may be omitted.

The color control member 100 at are the same as those of the color cona second pixel area PA2 that are spaced apart from each other, and a light-blocking area BA between the first pixel area PA1 and the second pixel area PA2. The first color conversion layer 150' is arranged in the first pixel area PA1 and converts incident light Lib to light Lr of a first color. The second color conversion layer 160' is arranged in the second pixel area PA2 and converts incident light Lib to light Lg of a second color. The first color conversion layer 150' and the second color conversion layer 160' may have edge portions that overlap the light-blocking members 120' in the third direction (e.g., the z direction). For example, the color filter layer 130' may be disposed in a different layer from the light-blocking members 120'. The light-blocking members 120' may have a substantially rectangular shape, each with an upper surface that is coplanar with upper surfaces of the first color conversion layer 150' and the second color conversion layer 160'.

The color control member 100' may further include a transmission layer 170e. The color control member 100' may further have a third pixel area PA3 that is spaced apart from the first pixel area PA1 and the second pixel area PA2. The transmission layer 170' may be arranged in the third pixel area PA3 and may transmit the incident light Lib.

The color control member 100' may receive the incident light Lib and emit light Lr of a first color, light Lg of a second color, and light Lb of a third color.

The pixel area PA emits light and is surrounded by the light-blocking area BA. The pixel area PA may be divided into a first pixel area PA1, a second pixel area PA2, and a third pixel area PA3 depending on a color of emitted light. The light-blocking area BA is an area that does not emit light, and may be arranged in a mesh configuration between the first to third pixel areas PA1, PA2, and PA3.

The light-blocking member 120' may be arranged in the light-blocking area BA. The light-blocking member 120' may be located between the first color conversion layer 150', the second color conversion layer 160', and the transmission layer 170' in a horizontal direction and thus may function as a partition wall.

The color filter layer 130' may include an organic material pattern including dye and/or pigment. The color filter layer 130' may include a first color filter layer 130a', a second color filter layer 130b', and a third color filter layer 130c'. The first color filter layer 130a' may be arranged in at least the first pixel area PA1, the second color filter layer 130b' may be arranged in at least the second pixel area PA2, and the third color filter layer 130c' may be arranged in at least the third pixel area PA3. In an exemplary embodiment of the present invention, the light-blocking member 120' may be further provided between the first color filter layer 130a', the second color filter layer 130b', and the third color filter layer 130c'.

The first color conversion layer 150', the second color conversion layer 160', and the transmission layer 170' each may be formed in a space defined by a light-blocking member 120' by using an inkjet method.

The color control member 100' may further include an inorganic layer 112 and a protective layer 114 on the color filter layer 130'. The inorganic layer 112 may include a single layer or multiple layers including an inorganic material such $SiN_x$ and/or $SiO_x$. The inorganic layer 112 may be omitted. The protective layer 114 may include a transparent organic material such as a polyimide resin, an acrylic resin and/or a resist material. In an exemplary embodiment of the present invention, the protective layer 114 may include a single layer or multiple layers including the same inorganic material as that of the inorganic layer 112.

A planarization layer 190 may be further included between the color control member 100*iple* layers including the sam The display panel 400*r* includes a plurality of pixels PX arranged in a predetermined pattern in the first direction (e.g., the x direction, or the row direction) and a second direction (e.g., the y direction, or the column direction) in the display area DA. The plurality of pixels may include first to third pixels PX1, PX2, and PX3. The first pixel PX1 may include a light-emitting element 430 and a first pixel circuit 420*a* for controlling the light-emitting element 430, the second pixel PX2 may include a light-emitting element 430 and a second pixel circuit 420*b* for controlling the light-emitting element 430, and the third pixel PX3 may include a light-emitting element 430 and a third pixel circuit 420*c* for controlling the light-emitting element 430. Hereinafter, descriptions that are the same as those of the display panel 400 described with reference to FIGS. 4A and 4B may be omitted.

The first to third pixel circuits 420*a*, 420*b*, and 420*c* respectively of the first to third pixels PX1, PX2, and PX3 may be arranged in a pixel circuit layer 420 of the display panel 400*r*. Light-emitting elements 430 may be arranged on the pixel circuit layer 420 to correspond to first to third pixel areas PA1, PA2, and PA3 of the color control member 100' (for example, first to third pixel areas PA1, PA2 and PA3 of a substrate 410).

Each of the light-emitting elements 430 may include a pixel electrode 431, an intermediate layer 433, and an opposite electrode 435. The edge of the pixel electrode 431 may be covered by the pixel-defining layer 437 (e.g., the pixel-defining patterns). The pixel-defining layer 437 may be arranged to correspond to the light-blocking area BA of the color control member 100'.

A light control pattern LCP may be arranged between the light-emitting elements 430, that is, in an area corresponding to the light-blocking area BA of the color control member 100*i*. The light control pattern LCP may surround the light-emitting element 430 and be arranged directly on the pixel-defining layer 437 to overlap the pixel-defining layer 437. The light control pattern LCP may be covered by the opposite electrode 435 of the light-emitting element 430. For example, exposed surfaces of the light control pattern LCP, the pixel-defining pattern and the pixel electrode 431 may be covered by the opposite electrode 435 conforming to the collective shape thereof. An encapsulation layer 440' may be arranged on the opposite electrode 435.

The light control pattern LCP may include a reflective pattern 532 and a support pattern 535. The light control pattern LCP may include a first non-inclined portion contacting the upper surface of the pixel-defining layer 437 (e.g., the pixel-defining pattern), an inclined portion having an inclined surface away from the pixel-defining layer 437, and a second non-inclined portion extending from the inclined portion to a pixel area.

The reflective pattern 532 may include a reflective material. The reflective material may include a metal having high light reflectance. The support pattern 535 may include an inorganic material such as SiNx. The support pattern 535 may be arranged under the reflective pattern 532.

According to the present exemplary embodiment of the present invention, a light control pattern LCP is arranged on a pixel-defining layer 437 (e.g., the pixel-defining pattern), thereby eliminating the need for a separate light-blocking pattern on the display panel. By reducing the light absorbance at a light-blocking member 120' of a color control member 100' while reducing a light path along the third direction (e.g., the z direction), the amount of light incident on a color conversion layer 150 or 160 and a color filter layer 130' may be increased.

FIGS. 32A to 32F illustrate steps in a manufacturing process of the display device 10R illustrated in the exemplary embodiment of FIG. 31.

A pixel circuit layer 420 may be formed on a substrate 410, and a pixel electrode 431 may be arranged on the pixel circuit layer 420 to correspond to a pixel area PA of a color control member 100". The pixel electrode 431 may be exposed through an opening 437OP of a pixel-defining layer 437, and the edge of the pixel electrode 431 may be covered by the pixel-defining layer 437. The pixel-defining layer 437 may be arranged to correspond to a light-blocking area BA of the color control member 100'.

Figure 32A:
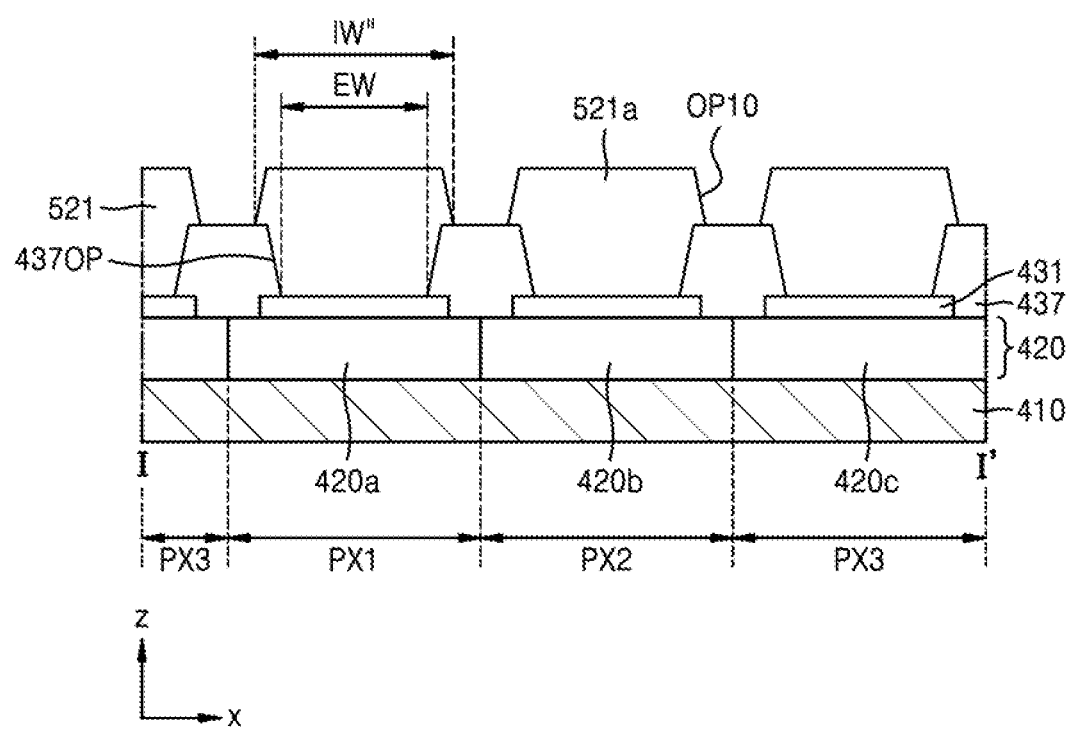
FIGS. 32A to 32F are cross-sectional views illustrating steps in a process of manufacturing the display device illustrated in FIG. 31, according to an exemplary embodiment of the present invention.

As shown in FIG. 32A, a first insulating layer 521 may be formed over a substrate 410 on which the pixel electrode 431 and the pixel-defining layer 437 are formed, and then an opening OP10 may be formed in the first insulating layer 521, thereby forming an insulating pattern 521*a*. The first insulating layer 521 may include an organic insulating layer. The opening OP10 may surround the insulating pattern 521*a* and may be located in a light-blocking area BA of the substrate 410. The opening OP10 may entirely surround the opening 437OP of the pixel-defining layer 437 and may expose the upper surface of the pixel-defining layer 437. The insulating pattern 521*a* may be located in a pixel area PA of the substrate 410 and may overlap the opening 437OP of the pixel-defining layer 437 and cover the pixel electrode 431 and the edges of the pixel-defining layer 437. An inner width IW" of the insulating pattern 521*a* may be equal to or greater than a width EW of the opening 437OP of the pixel-defining layer 437.

Figure 32B:
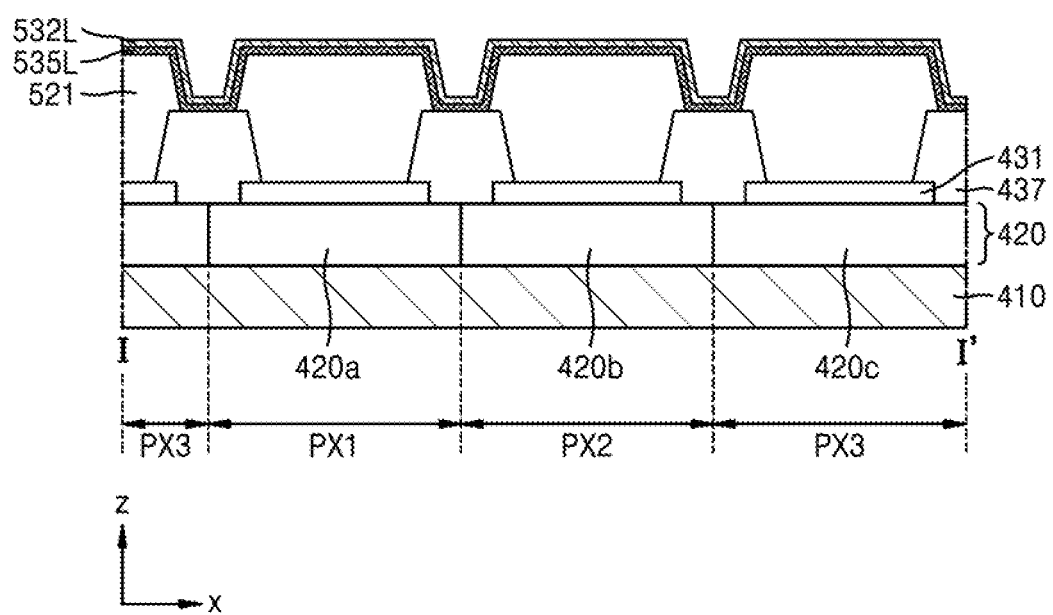

As shown in FIG. 32B, an inorganic material layer 535L and a reflective material layer 532L may be sequentially deposited over the substrate 410 while covering the opening OP10 and the first insulating layer 521 including the insulating pattern 521*a*.

Figure 32C:
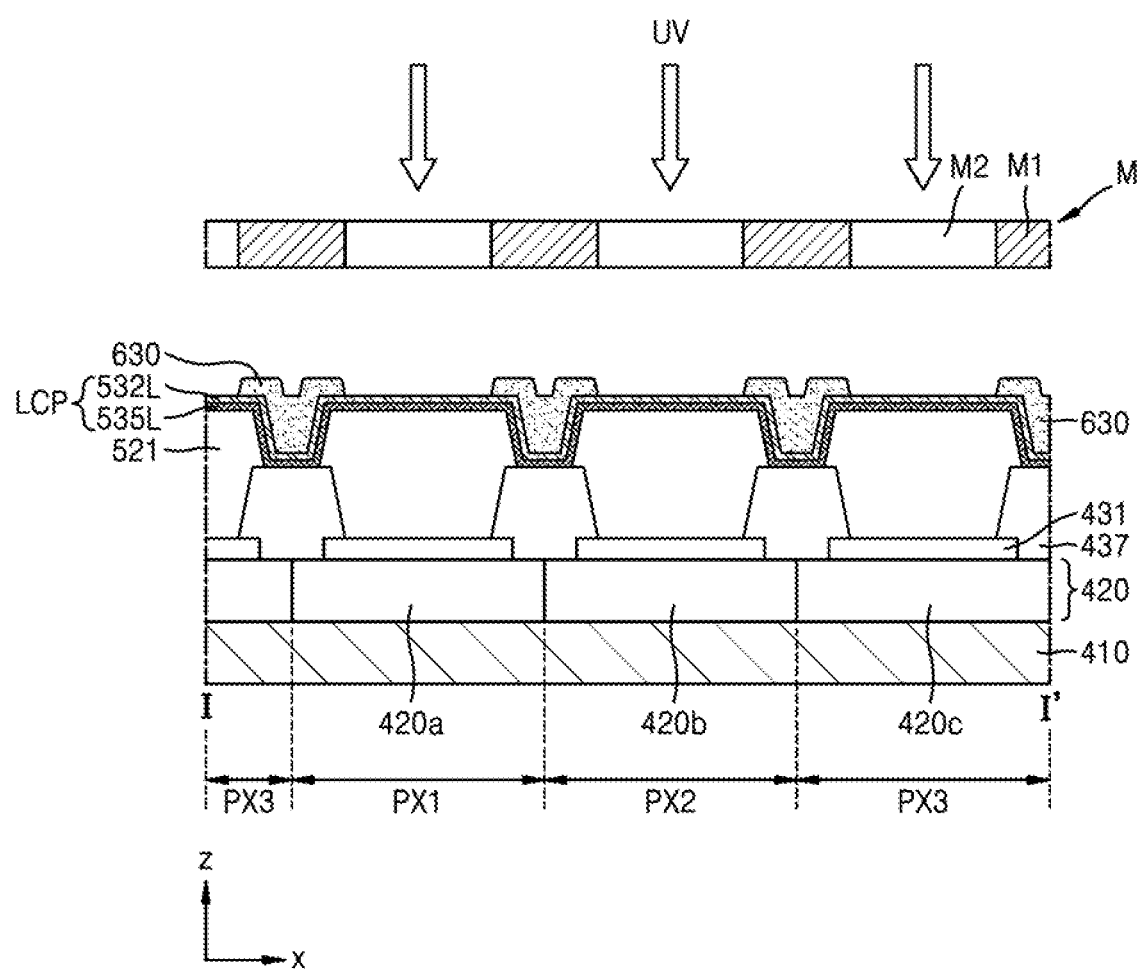

Subsequently, as shown in FIG. 32C, a photoresist 630 may be applied to cover the inorganic material layer 535L and the reflective material layer 532L, and the photoresist 630 may be UV-exposed and developed using an aligned mask M. Thus, a portion of the photoresist 630 corresponding to a light-transmitting portion M2 may be removed and only a portion of the photoresist 630 corresponding to a light-blocking portion M1 may remain.

Figure 32D:
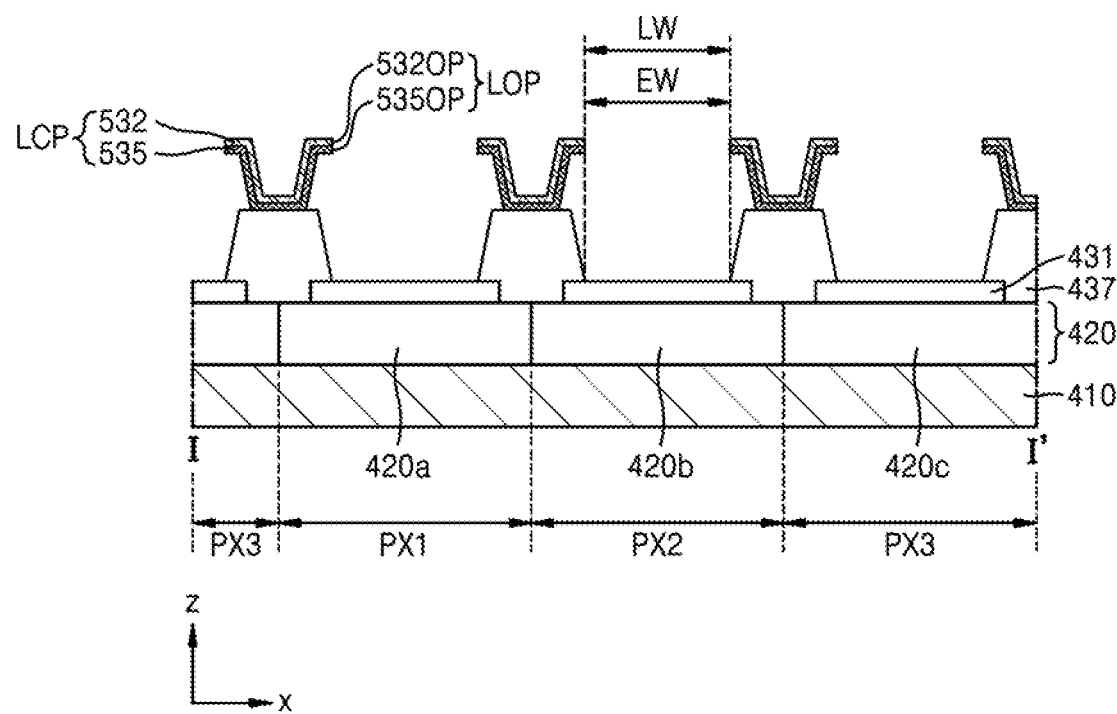

Next, as shown in FIG. 32D, the inorganic material layer 535L and the reflective material layer 532L of a region where the photoresist 630 is removed may be etched to thereby form a support pattern 535 and a reflective pattern 532. Etching may be wet etching or dry etching. An etched surface (e.g., a side surface) of the reflective material layer 532L corresponding to an opening 532OP and an etched surface (e.g., a side surface) of the inorganic material layer 535L corresponding to an opening 535OP may coincide with each other (e.g., may be aligned). An opening LOP of the light control pattern LCP may include the opening 532OP of the reflective material layer 532L and the opening 535OP of the inorganic material layer 535L. A width LW of the opening LOP of the light control pattern LCP may be equal to or greater than the width EW of the opening 437OP of the pixel-defining layer 437. Thereafter, the photoresist 630, which remains on the light control pattern LCP, and the insulating pattern 521 may be removed.

Figure 32E:
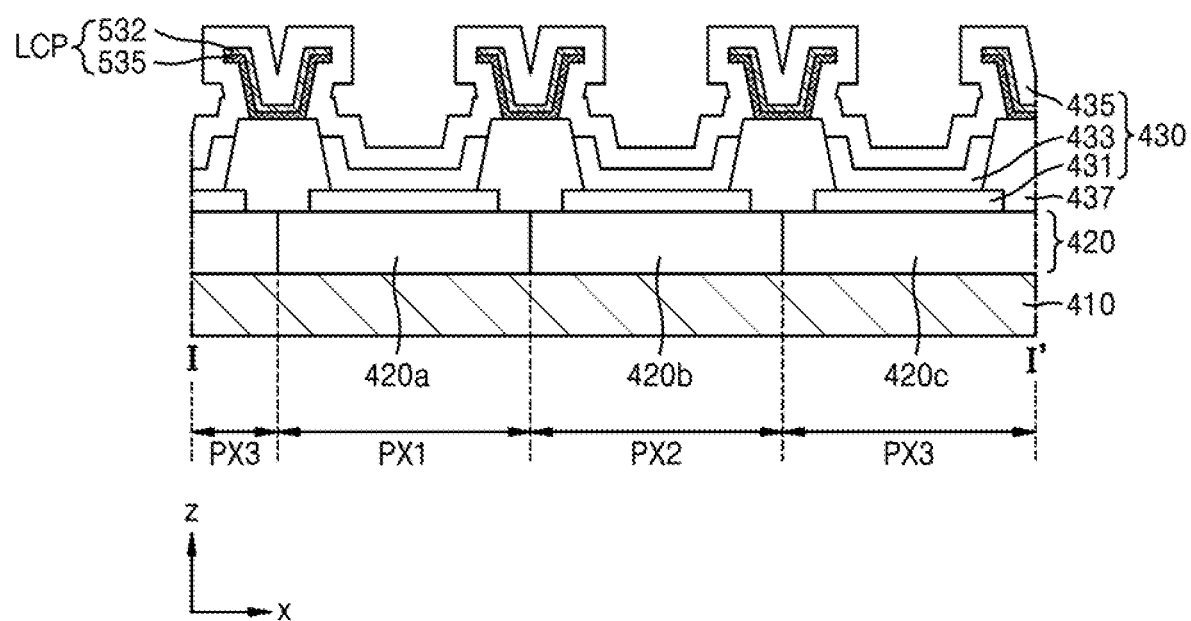

Next, as shown in FIG. 32E, an intermediate layer 433 may be arranged on the pixel electrode 431, and an opposite electrode 435 may be formed over the substrate 410 to cover the intermediate layer 433 and the light control pattern LCP.

Figure 32F:
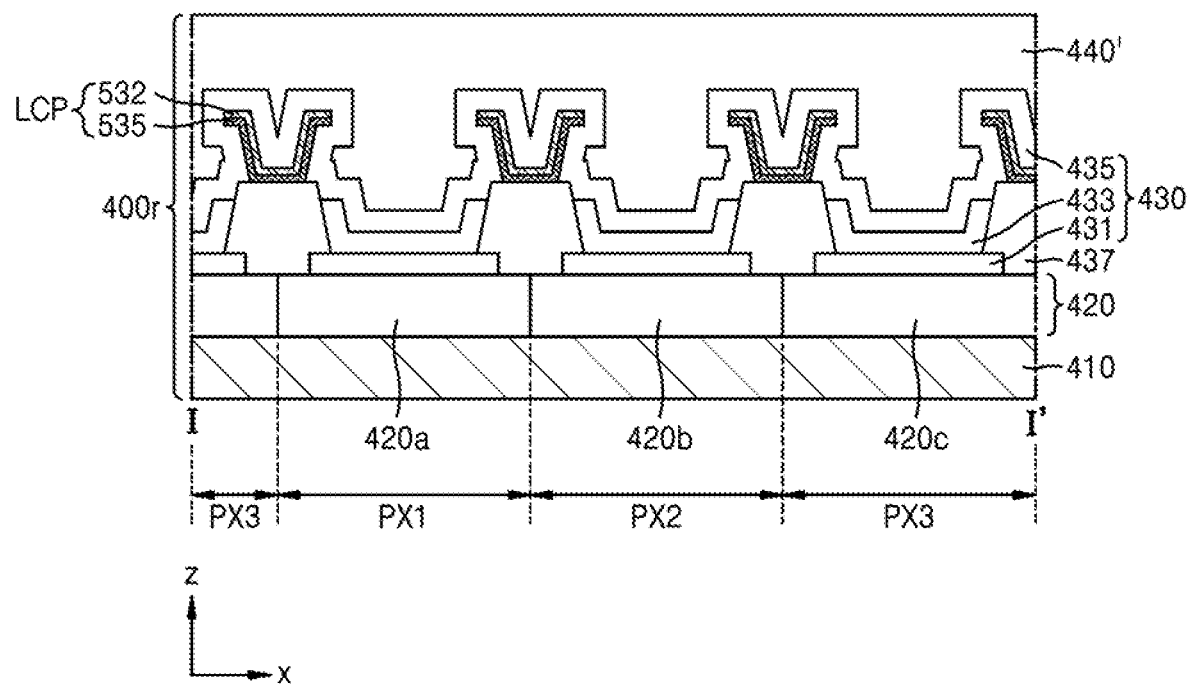

As shown in FIG. 32F, an encapsulation layer 440' may be arranged over the substrate 410 while covering the opposite electrode 435. For example, the encapsulation layer 440' may have a lower surface that forms a complimentary shape to the opposite electrode 435 and an upper surface that is planarized. Subsequently, as shown in FIG. 31, a light-blocking member 120', a first color conversion layer 150', a second color conversion layer 160', a transmission layer 170', a color filter layer 130', an inorganic layer 112, and a protective layer 114 may be formed to form the color control member 100 on the display panel 400r.

Figure 33:
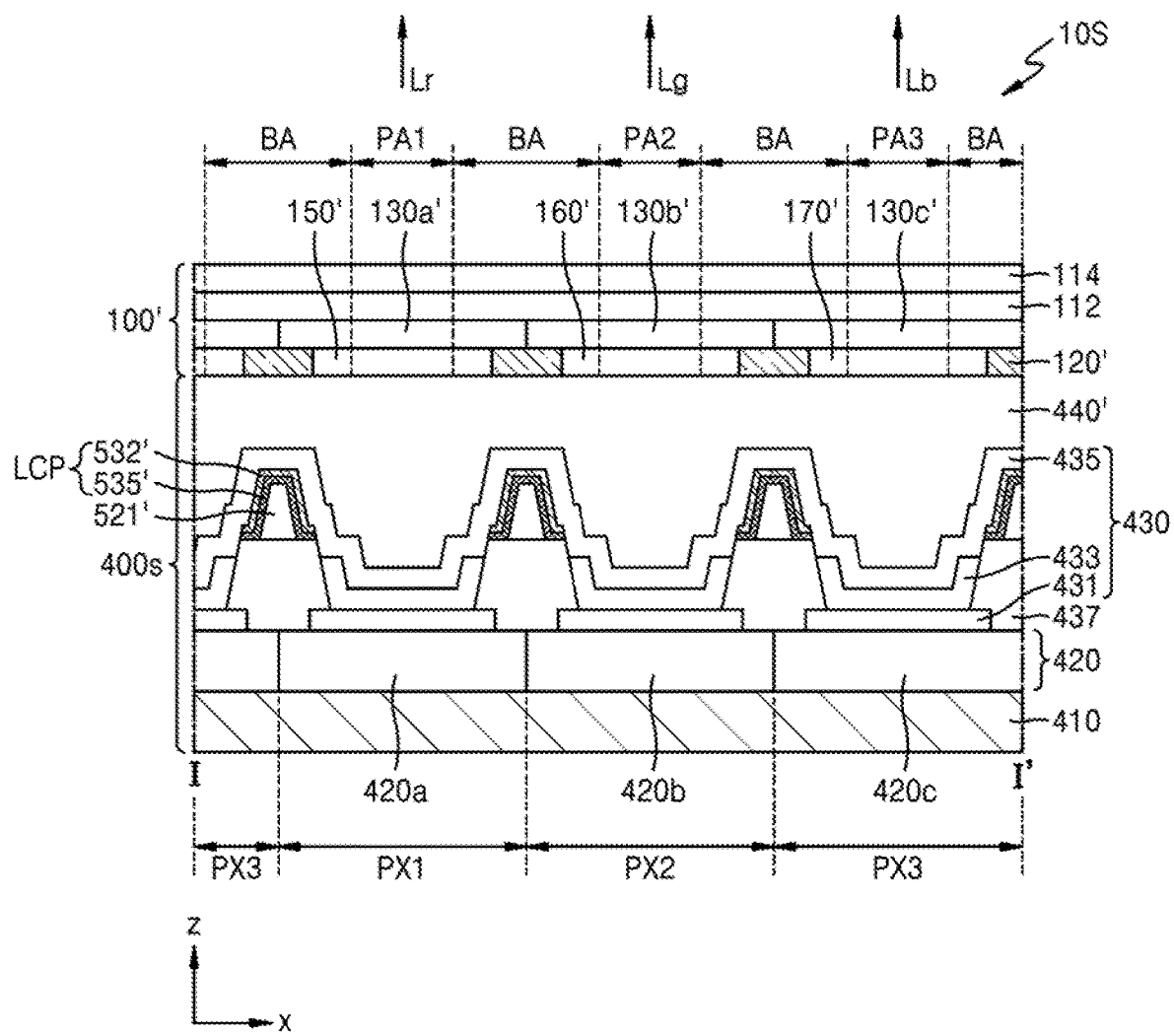
FIG. 33 is a cross-sectional view illustrating a portion of a display device, according to an exemplary embodiment of the present invention.

FIG. 33 is a cross-sectional view of a portion of the display device 10S according to an exemplary embodiment of the present invention.

Referring to FIG. 33, the display device 10S according to the exemplary embodiment of the present invention may include a display panel 400s and a color control member 100d.

The color control member 100' may include a light-blocking member 120', a color filter layer 130', a first color conversion layer 150', and a second color conversion layer 160'. The color control member 100' may be directly formed on the display panel 400s. Since the color control member 100' has been described with reference to FIG. 31, a detailed description thereof may be omitted.

The display panel 400s includes a plurality of pixels PX arranged in a predetermined pattern in the first direction (e.g., the x direction, or the row direction) and a second direction (e.g., the y direction, or the column direction) in the display area DA. The plurality of pixels PX may include first to third pixels PX1, PX2, and PX3. The first pixel PX1 may include a light-emitting element 430 and a first pixel circuit 420a for controlling the light-emitting element 430, the second pixel PX2 may include a light-emitting element 430 and a second pixel circuit 420b for controlling the light-emitting element 430, and the third pixel PX3 may include a light-emitting element 430 and a third pixel circuit 420c for controlling the light-emitting element 430. Hereinafter, descriptions that are the same as those of the display panel 400 described with reference to FIGS. 4A and 4B may be omitted.

The first to third pixel circuits 420a, 420b, and 420c respectively of the first to third pixels PX1, PX2, and PX3 may be arranged in a pixel circuit layer 420 of the display panel 400s. Light-emitting elements 430 may be arranged on the pixel circuit layer 420 to correspond to first to third pixel areas PA1, PA2, and PA3 of the color control member 100' (for example, first to third pixel areas PA1, PA2 and PA3 of a substrate 410).

Each of the light-emitting elements 430 may include a pixel electrode 431, an intermediate layer 433, and an opposite electrode 435. The edge of the pixel electrode 431 may be covered by the pixel-defining layer 437. The pixel-defining layer 437 may be arranged to correspond to the light-blocking area BA of the color control member 100'.

A light control pattern LCP may be arranged between the light-emitting elements 430, for example, in an area corresponding to the light-blocking area BA of the color control member 100'. The light control pattern LCP may be arranged on the pixel-defining layer 437 to overlap the pixel-defining layer 437 (e.g., the pixel-defining patterns). The light control pattern LCP may be covered by the opposite electrode 435 of the light-emitting element 430. An encapsulation layer 440' may be arranged on the opposite electrode 435. An insulating pattern 521" may be arranged between the light control pattern LCP and the pixel-defining layer 437. The insulating pattern 521 may contact the upper surface of the pixel-defining layer 437 and may have a width narrower in the first direction (e.g., the x direction) than a width of the pixel-defining layer 437. The insulating pattern 521er 437.exdirection)ining layer 437 and may have a width narrowerting eledecreasing width in a direction away from the pixel-defining layer 437 toward the color control member 100' (e.g., the z direction).

The light control pattern LCP may be arranged on the insulating pattern 521' while covering the insulating pattern 521i. The light control pattern LCP may include a reflective pattern 532' and a support pattern 535'. The light control pattern LCP may include a first non-inclined portion contacting the upper surface of the insulating pattern 521' and an inclined portion contacting the side surface of the insulating pattern 521'. The light control pattern LCP may contact a portion of the pixel-defining layer 437 (e.g., the pixel-defining pattern). The light control pattern LCP might not completely cover the side surface of the pixel-defining layer 437 and might not be in contact with the pixel electrode 431.

The reflective pattern 532' may include a reflective material. The reflective material may include a metal having high light reflectance. The support pattern 535' may include an inorganic material such as SiNx. The support pattern 535' may be arranged under the reflective pattern 532'.

According to the present exemplary embodiment of the present invention, a light control pattern LCP is arranged on a pixel-defining layer 437, thereby eliminating the need for a separate light-blocking pattern on the display panel 400s, and by reducing a light path along the third direction (e.g., the z direction) and reducing the absorbance of a light-blocking member of a color control member, the amount of incident light may be increased.

FIGS. 34A to 34F illustrate steps in a manufacturing process of the display device 10S illustrated in the exemplary embodiment of FIG. 31.

A pixel circuit layer 420 may be formed on a substrate 410, and a pixel electrode 431 may be arranged on the pixel circuit layer 420 to correspond to a pixel area PA of a color control member 100' The pixel electrode 431 may be exposed through an opening 437OP of a pixel-defining layer 437, and the edge of the pixel electrode 431 may be covered by the pixel-defining layer 437. The pixel-defining layer 437 may be arranged to correspond to a light-blocking area BA of the color control member 100'.

Figure 34A:
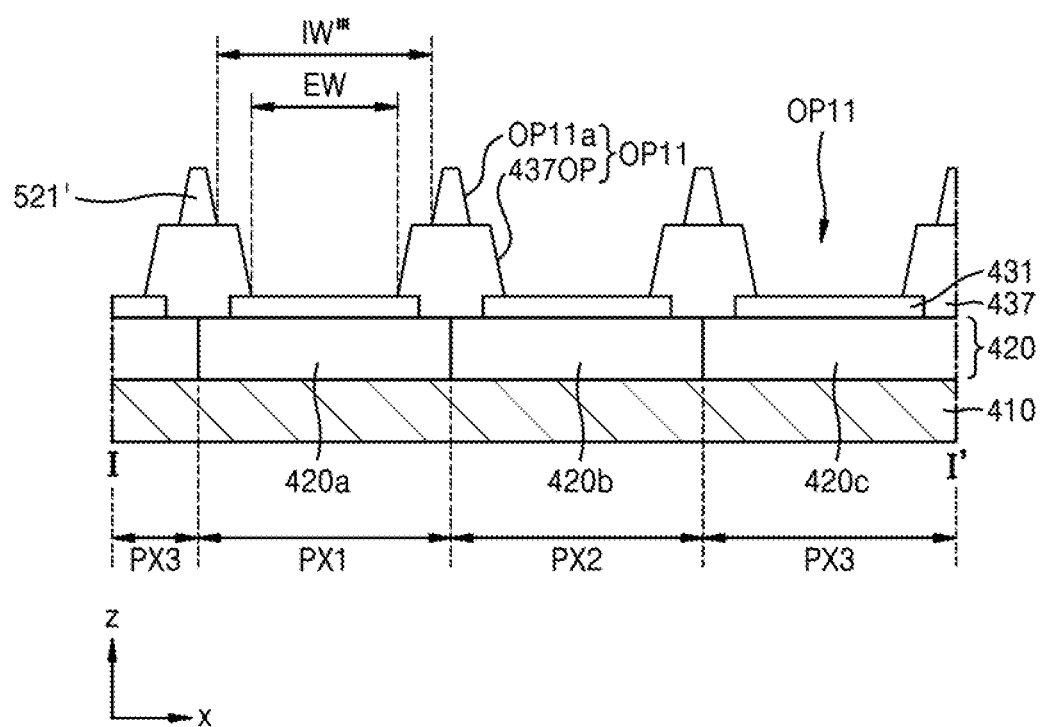
FIGS. 34A to 34F illustrate steps in a process of manufacturing the display device illustrated in FIG. 31, according to an exemplary embodiment of the present invention.

As shown in FIG. 34A, a first insulating layer may be formed over the substrate 410 on which the pixel electrode 431 and the pixel-defining layer 437 are formed, and then an opening OP11a may be formed in the first insulating layer, thereby forming an insulating pattern 521'. The first insulating layer may include an organic insulating layer. The opening OP11a may be located in a pixel area PA of the substrate 410. A width IW'" of the opening OP11a of the first insulating layer 521 may be greater than the width EW of the opening 437OP of the pixel-defining layer 437, which exposes the upper surface of the pixel electrode 431. An opening OP11 may include the opening OP11a of the first insulating layer 521 and the opening 437OP of the pixel-defining layer 437, and the opening OP11 may have a step by the pixel-defining layer 437 and the insulating pattern 5210. The insulating pattern 521' may be located on the pixel-defining layer 437 (e.g., the pixel-defining pattern).

In an exemplary embodiment of the present invention, a layer forming the pixel-defining layer 437 and a first insulating layer 521 may be sequentially formed on the substrate 410 on which the pixel electrode 431 is formed, and the pixel-defining layer 437 and the insulating pattern 521' may be formed using a halftone mask.

Figure 34B:
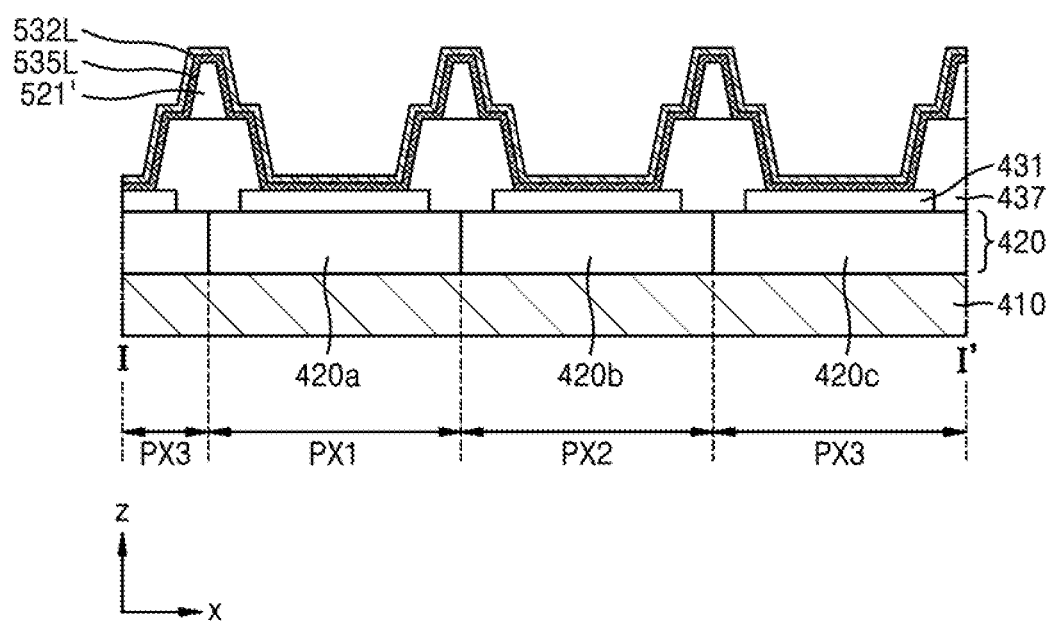

As shown in FIG. 34B, an inorganic material layer 535L and a reflective material layer 532L may be sequentially deposited over the substrate 410 while covering the opening OP11 and the first insulating layer 521 including the insulating pattern 521'.

Figure 34C:
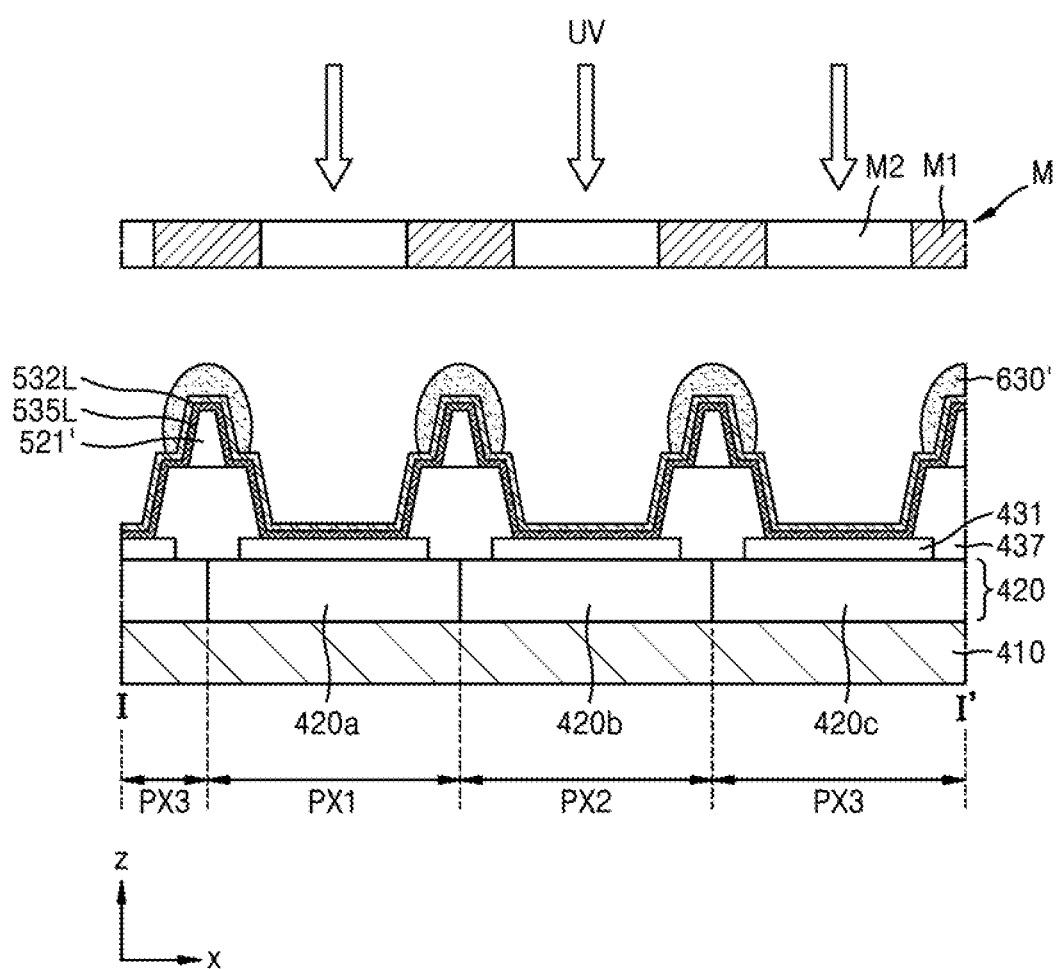

Subsequently, as shown in FIG. 34C, a photoresist 630 equently, as shown in FIG. 34C, a photoresist 535L and a reflective material layer 532L mayer 532L, and the photoresist 630oresisty, as shown in FIG. 34C, a photoresist 535L and a. Thus, a portion of the photoresist 630 a portion of the photoresistC, a photoresist 535L and a reflective material layer 532L mayephotoresist 630oresistion of g to a light-blocking portion M1 may remain.

Figure 34D:
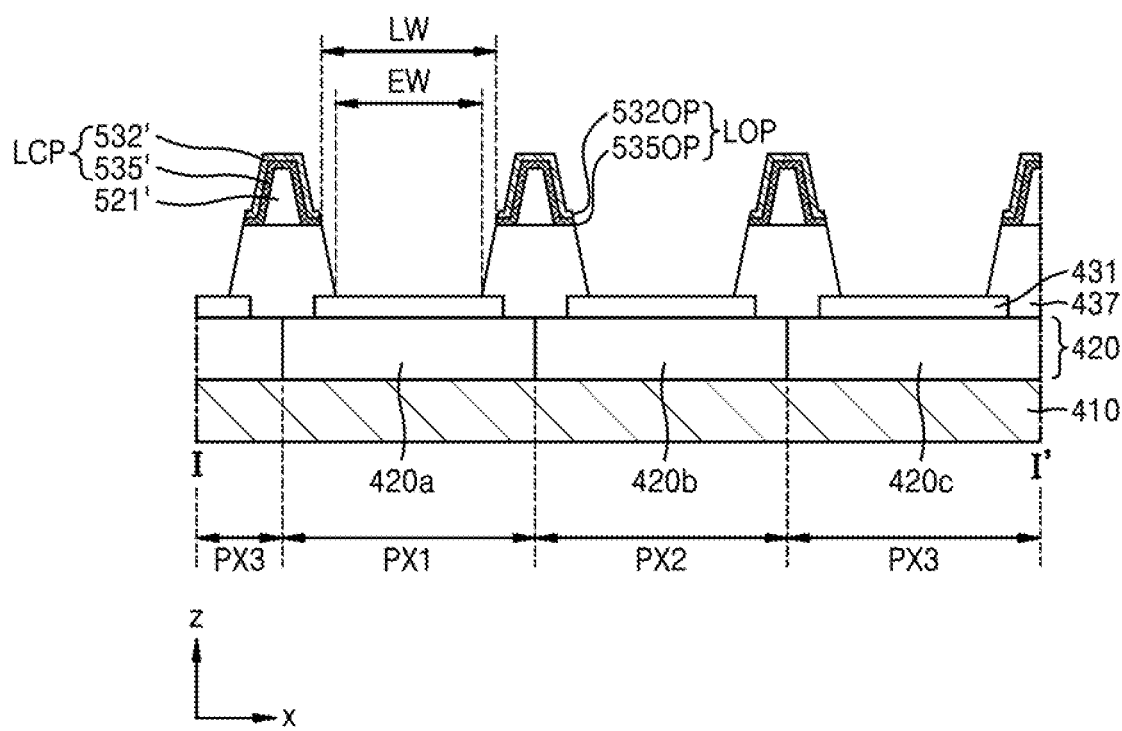

Next, as shown in FIG. 34D, the inorganic material layer 535L and the reflective material layer 532L of a region where the photoresist 630' is removed may be etched to thereby form a support pattern 535' and a reflective pattern 532'. Etching may be wet etching or dry etching. An etched surface (e.g., a side surface) of the reflective material layer 532L corresponding to an opening 532OP and an etched surface (e.g., a side surface) of the inorganic material layer 535L corresponding to an opening 535OP may coincide with each other (e.g., may be aligned). An opening LOP of the light control pattern LCP may include the opening 532OP of the reflective material layer 532L and the opening 535OP of the inorganic material layer 535L. A width LW of the opening LOP of the light control pattern LCP may be equal to or greater than the width EW of the opening 437OP of the pixel-defining layer 437. Thereafter, the photoresist 630' remaining on the light control pattern LCP may be removed.

Figure 34E:
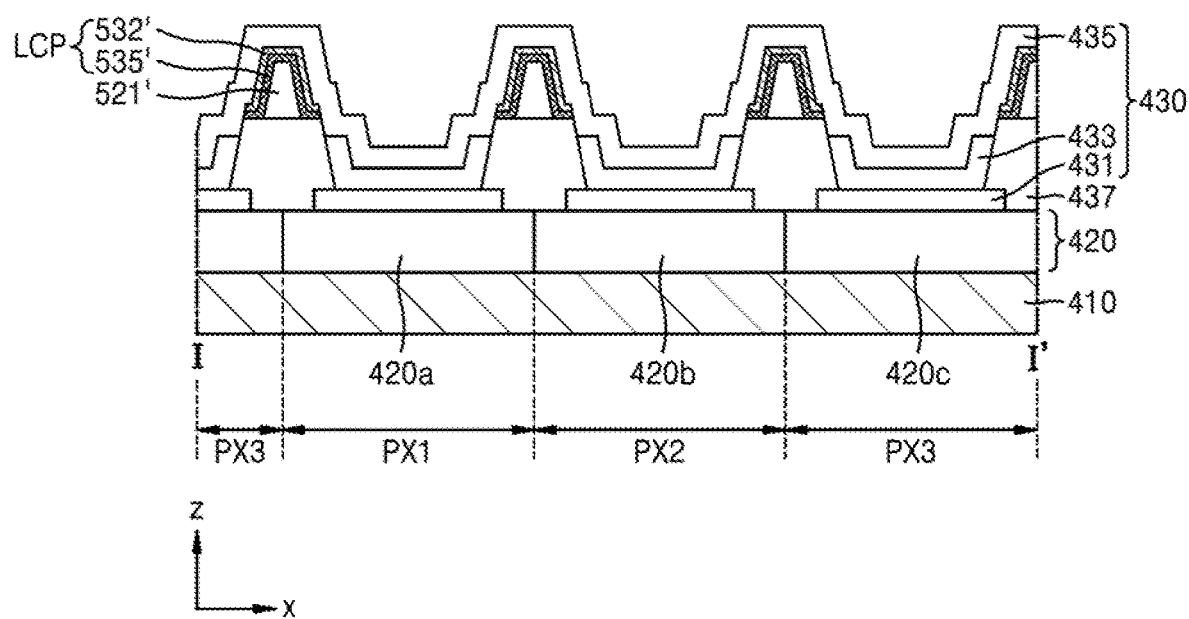

Next, as shown in FIG. 34E, an intermediate layer 433 may be arranged on the pixel electrode 431, and an opposite electrode 435 may be formed over the substrate 410 to cover the intermediate layer 433 and the light control pattern LCP.

Figure 34F:
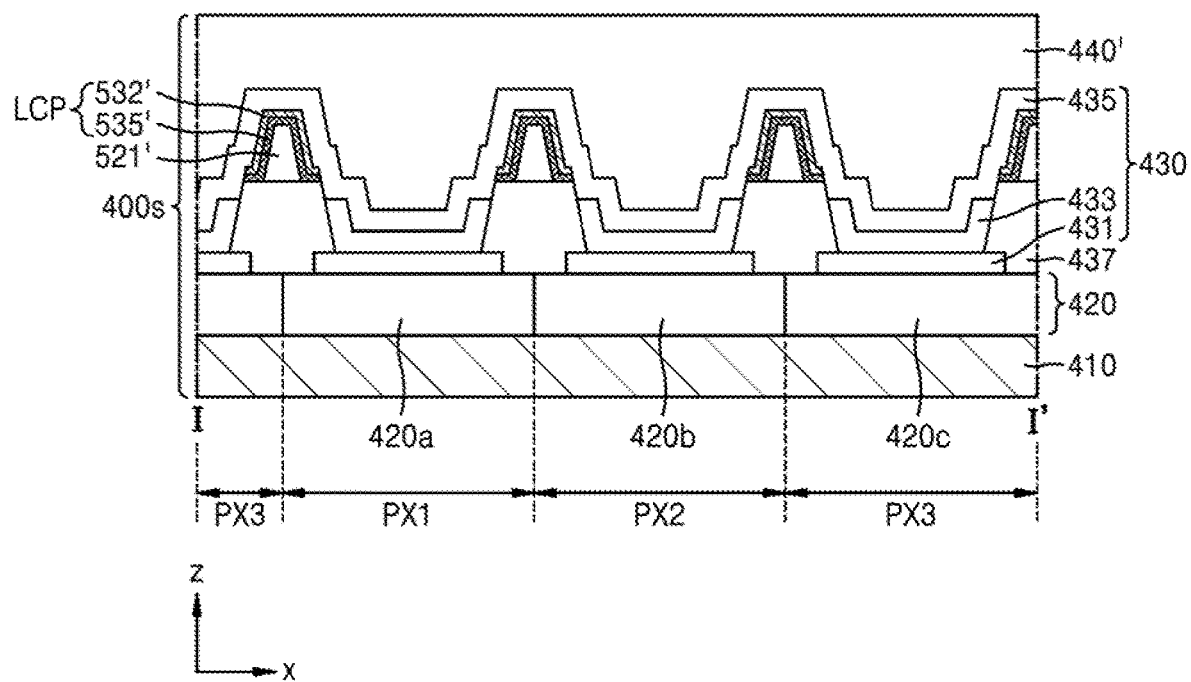

As shown in FIG. 34F, an encapsulation layer 440' may be arranged over the substrate 410 while covering the opposite electrode 435. As shown in FIG. 33, a light-blocking member 120', a first color conversion layer 150', a second color conversion layer 160', a transmission layer 170', a color filter layer 130', an inorganic layer 112, and a protective layer 114 may be formed to form the color control member 100 on the display panel 400s.

In the exemplary embodiments of FIGS. 31 and 33, the color control member 100' may include the first color conversion layer 150', the second color conversion layer 160', and the transmission layer 170' and may emit light Lr, Lg, and Lb of different first to third colors with respect to a single incident light Lib. In an exemplary embodiment of the present invention, as shown in FIG. 2C, the color control member 100' might not include the first color conversion layer 150', the second color conversion layer 160', and the transmission layer 170' and may emit light Lr, Lg, and Lb of different first to third colors with respect to different incident lights Lir, Lig, and Lib by the color filter layer 130.

FIGS. 35A to 36F schematically illustrate the shapes of a light control pattern LCP of a display panel 400 according to exemplary embodiments of the present invention.

Figure 35A:
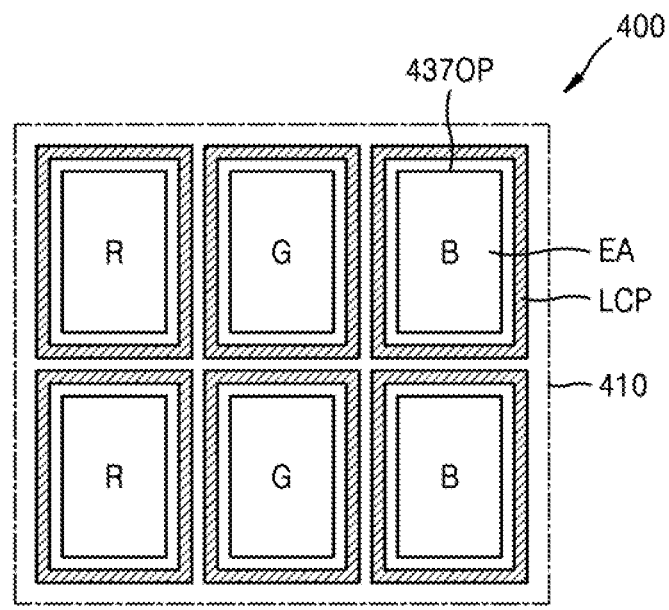
FIGS. 35A to 36F are plan views illustrating shapes of a light control pattern of a display panel, according to exemplary embodiments of the present invention.

Referring to FIG. 35A, the light control pattern LCP may be formed in a closed loop shape surrounding a light-emitting element 430 (e.g., a pixel electrode) in a light-blocking area BA of a substrate 410. For example, the light control pattern LCP may surround an emission area EA corresponding to an opening 437OP of the pixel-defining layer 437.

In an exemplary embodiment of the present invention, the light control pattern LCP may be located in an opening of an insulating layer, which has an insulating pattern IP (see FIG. 4C) corresponding to (e.g., overlapping) the light-emitting element 430 and the opening corresponding to (e.g., overlapping) the pixel-defining layer 437 and surrounding the insulating pattern IP. In an exemplary embodiment of the present invention, the light control pattern LCP may be located on an insulating pattern IP of an insulating layer, which has an opening corresponding to (e.g., overlapping) the light-emitting element 430 and the insulating pattern IP (see FIG. 4D) corresponding to (e.g., overlapping) the pixel-defining layer 437 and surrounding the opening.

Figure 35B:
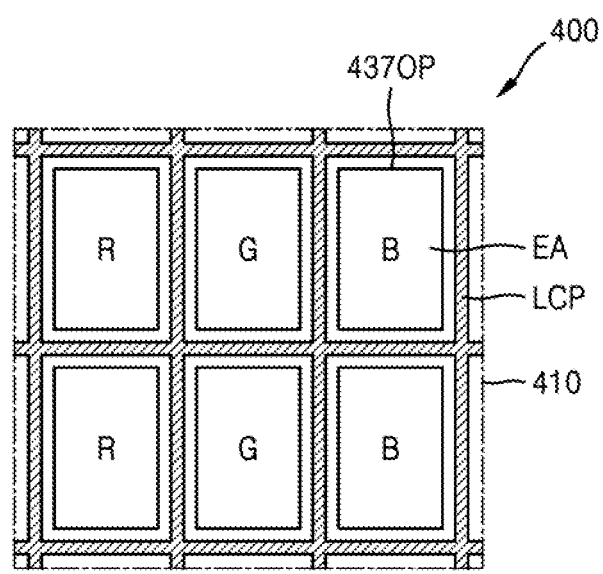

The light control pattern LCP may be provided in pixel units. In an exemplary embodiment of the present invention, the light control pattern LCP may be shared between adjacent pixels R, G and B, as shown in FIG. 35B.

Figure 35C:
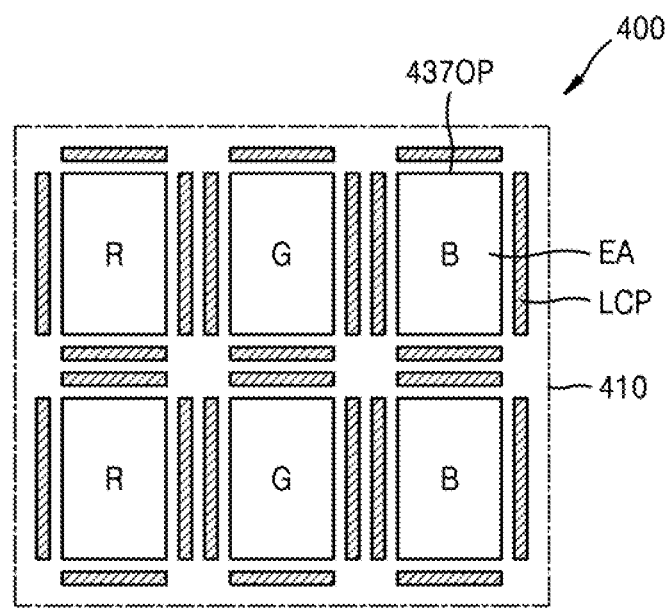

Referring to FIG. 35C, in a light-blocking area BA of the substrate 410, a plurality of line-shaped light control patterns LCP may be spaced apart from each other and may be arranged along the edge of an emission area EA and surround the emission area EA.

In an exemplary embodiment of the present invention, the light control pattern LCP may be located in openings of an insulating layer, which has an insulating pattern IP (see FIG. 4C) corresponding to (e.g., overlapping) the light-emitting element 430 and the openings corresponding to (e.g., overlapping) the pixel-defining layer 437 and surrounding the insulating pattern IP, and being spaced apart from each other. In an exemplary embodiment of the present invention, the light control pattern LCP may be located on insulating patterns IP of an insulating layer, which has an opening corresponding to (e.g., overlapping) the light-emitting element 430 and the insulating patterns IP (see FIG. 4D) corresponding to (e.g., overlapping) the pixel-defining layer 437 and surrounding the opening, and being spaced apart from each other. The insulating patterns IP may have line shapes.

Figure 35D:
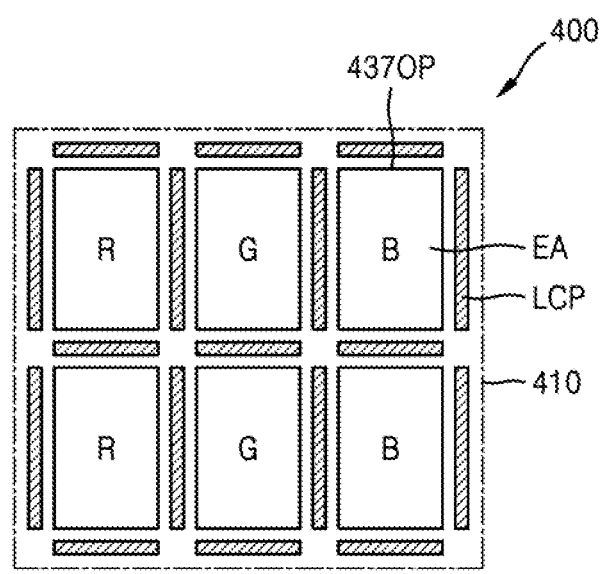

The light control pattern LCP may be provided in pixel units. In an exemplary embodiment of the present invention, the light control pattern LCP may be shared between adjacent pixels R, G and B, as shown in FIG. 35D.

Figure 35E:
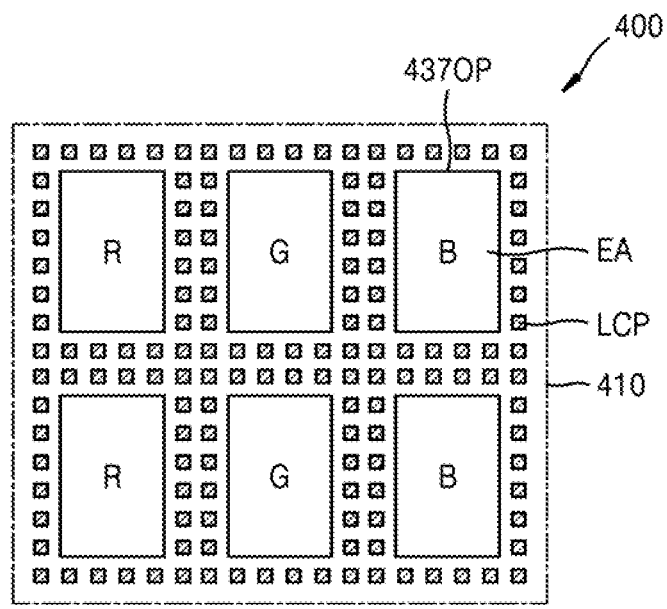

Referring to FIG. 35E, in a light-blocking area BA of the substrate 410, a plurality of island-shaped light control patterns LCP may be spaced apart from each other and may surround an emission area EA.

In an exemplary embodiment of the present invention, the light control pattern LCP may be located in openings of an insulating layer, which has an insulating pattern IP (see FIG. 4C) corresponding to (e.g., overlapping) the light-emitting element 430 and the openings corresponding to (e.g., overlapping) the pixel-defining layer 437 and surrounding the insulating pattern IP, and being spaced apart from each other. In an exemplary embodiment of the present invention, the light control pattern LCP may be located on insulating patterns IP of an insulating layer, which has an opening corresponding to (e.g., overlapping) the light-emitting element and the insulating patterns IP (see FIG. 4D) corresponding to (e.g., overlapping) the pixel-defining layer 437 and surrounding the opening, and being spaced apart from each other. The insulating patterns IP may have island shapes.

Figure 35F:
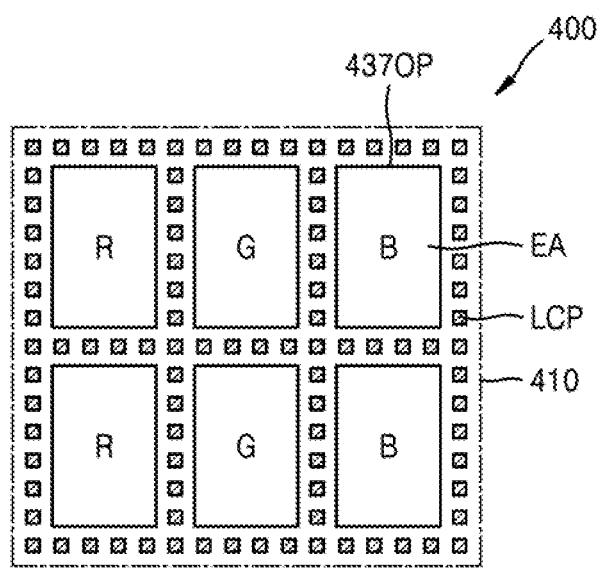

The light control pattern LCP may be provided in pixel units. In an exemplary embodiment of the present invention, the light control pattern LCP may be shared between adjacent pixels R, G and B, as shown in FIG. 35F.

Figure 36A:
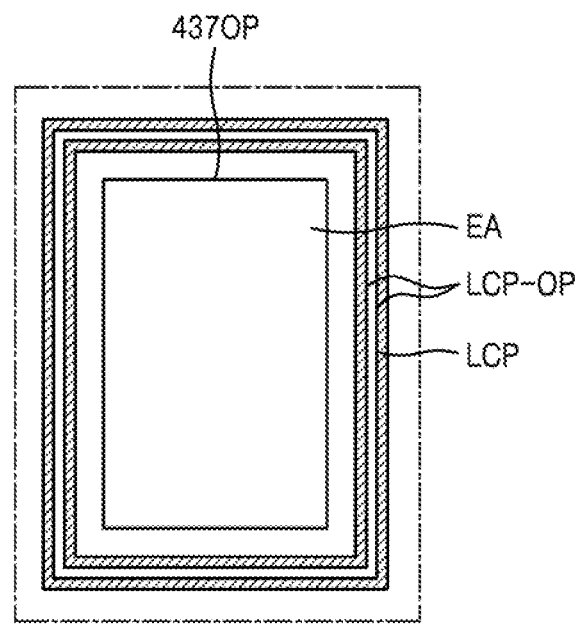

In exemplary embodiments of the present invention, the light control pattern LCP may have at least one hole LCP)_OP (see FIG. 36A).

Figure 36B:
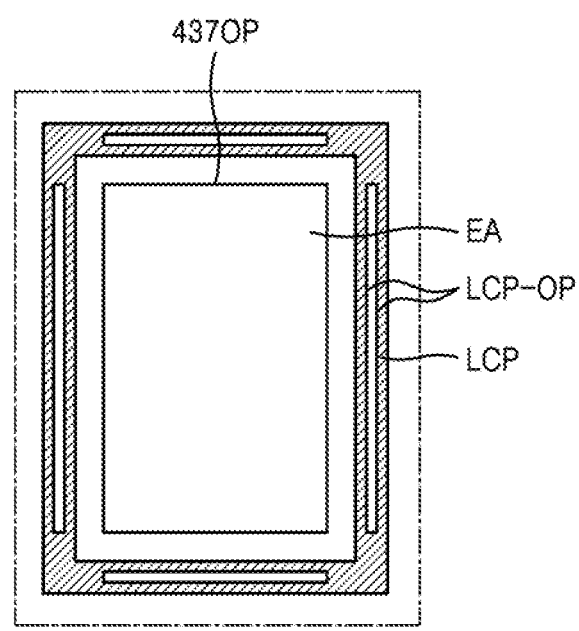

As shown in FIGS. 36A and 36B, the light control pattern LCP may have the shape of a closed loop surrounding the emission area EA corresponding to the opening 437OP of the pixel-defining layer 437. As shown in FIG. 36A, the light control pattern LCP may have a structure in which one hole LCP_OP entirely surrounds the emission area EA. For example, referring to FIG. 36A, an inner light control pattern LOP may be disposed between the opening 437OP and the outer light control pattern LCP. The inner light control pattern LCP may be spaced apart from the emission area EA (e.g., the opening 437) by a first distance and spaced apart from the outer light control pattern LCP at an opposite side by a second distance.

Figure 36C:
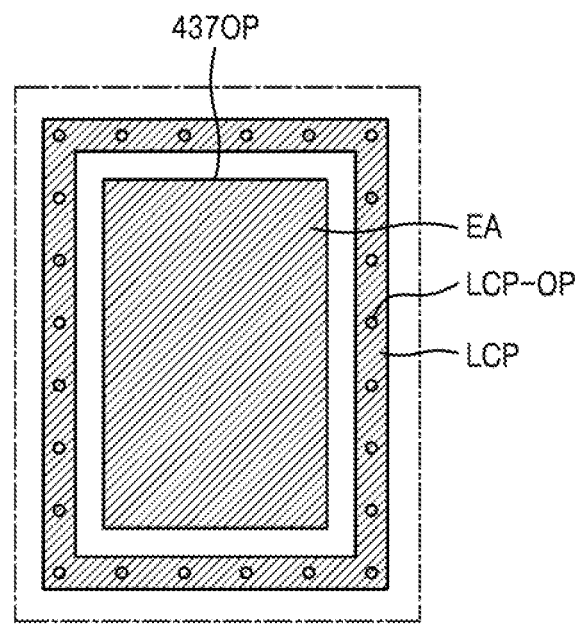
Figure 36D:
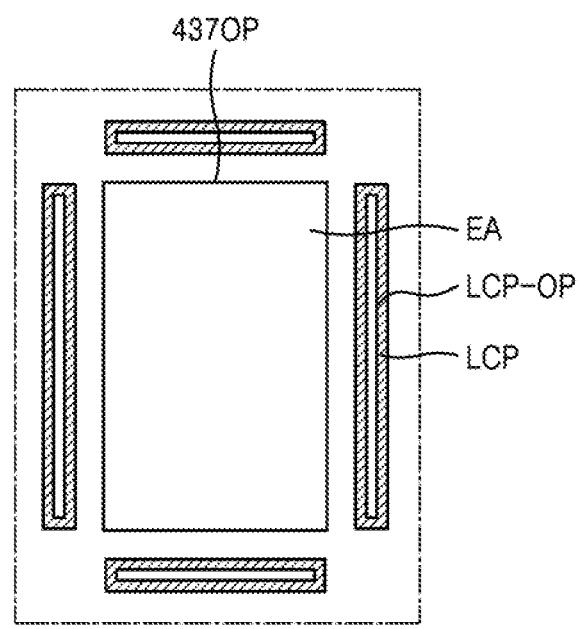

And as shown in FIG. 36B, the light control pattern LCP may have a structure in which a plurality of slit-shaped holes LCP_OP are spaced apart from each other and are arranged along the edge of the emission area EA. And as shown in FIG. 36C, the light control pattern LCP may have a structure in which a plurality of holes LCP_OP are spaced apart from each other and surround the emission area EA along the edge of the emission area EA. For example, the plurality of slit-shaped holes may have a rectangular shape As shown in FIGS. 36C and 36D, the plurality of line-shaped light control patterns LCP may be spaced apart from each other and arranged along the edge of the emission area EA. For example, referring to FIG. 36C, the slit-shaped hole may be substantially circular and may be disposed at pre-determined intervals within a closed-line shaped light control pattern LCP. As shown in FIG. 36D, the light control pattern LCP may be comprised of discrete closed-line rectangular loops that correspond to side surfaces of the opening 437OP. One slit-shaped hole LCP_OP may be arranged in each of the plurality of light control patterns LCP.

Figure 36E:
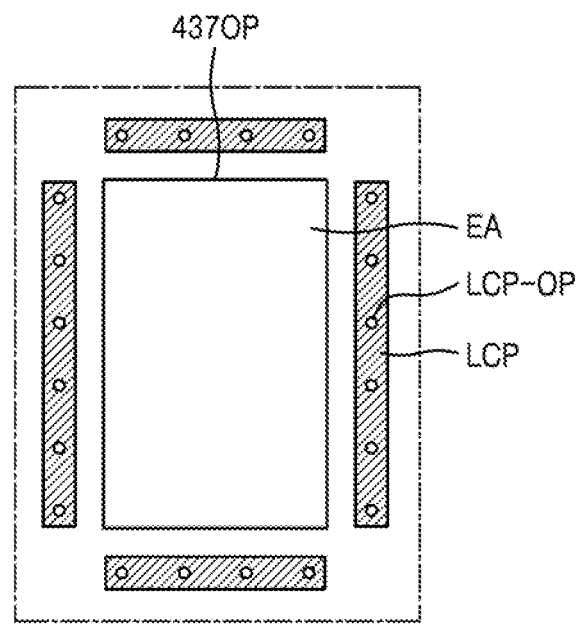

As shown in FIG. 36E, the light control pattern LCP may be comprised of discrete, solid-rectangular shapes that correspond to side surfaces of the opening 437OP. The plurality of holes LCP_OP may be spaced apart from each other and bored in each of the plurality of light control patterns LCP.

Figure 36F:
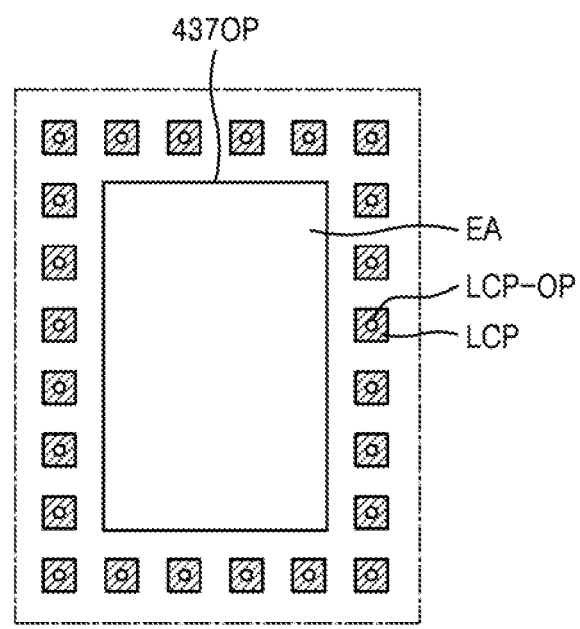

Referring to FIG. 36F, a plurality of island-shaped light control patterns LCP may be spaced apart from each other in the first direction (e.g., the x direction) and may surround an emission area EA, and one hole LCP_OP may be formed in each of the plurality of light control patterns LCP.

Figure 37:
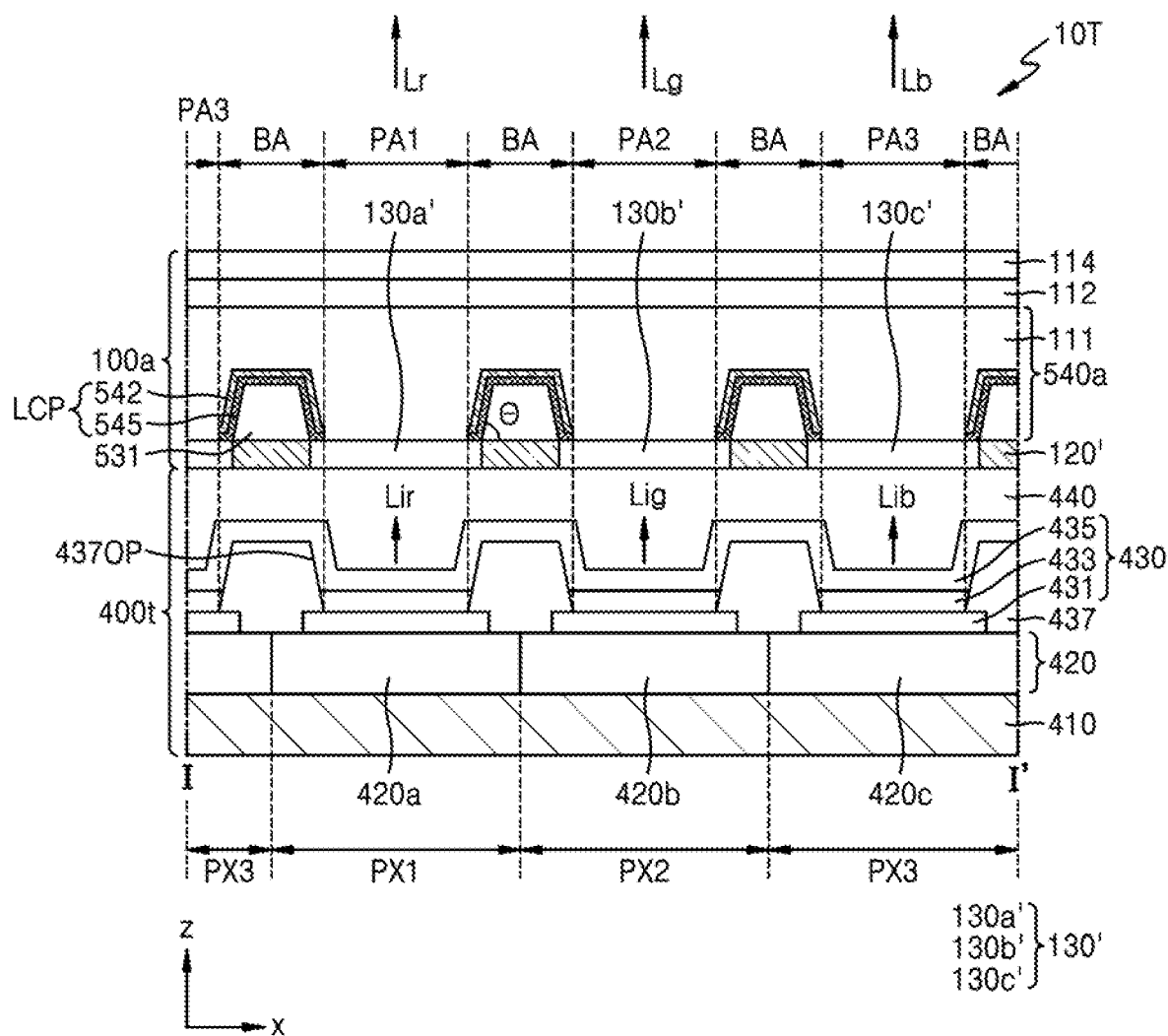
FIGS. 37 and 39 are cross-sectional views illustrating a portion of a display device, according to exemplary embodiments of the present invention.
Figure 39:
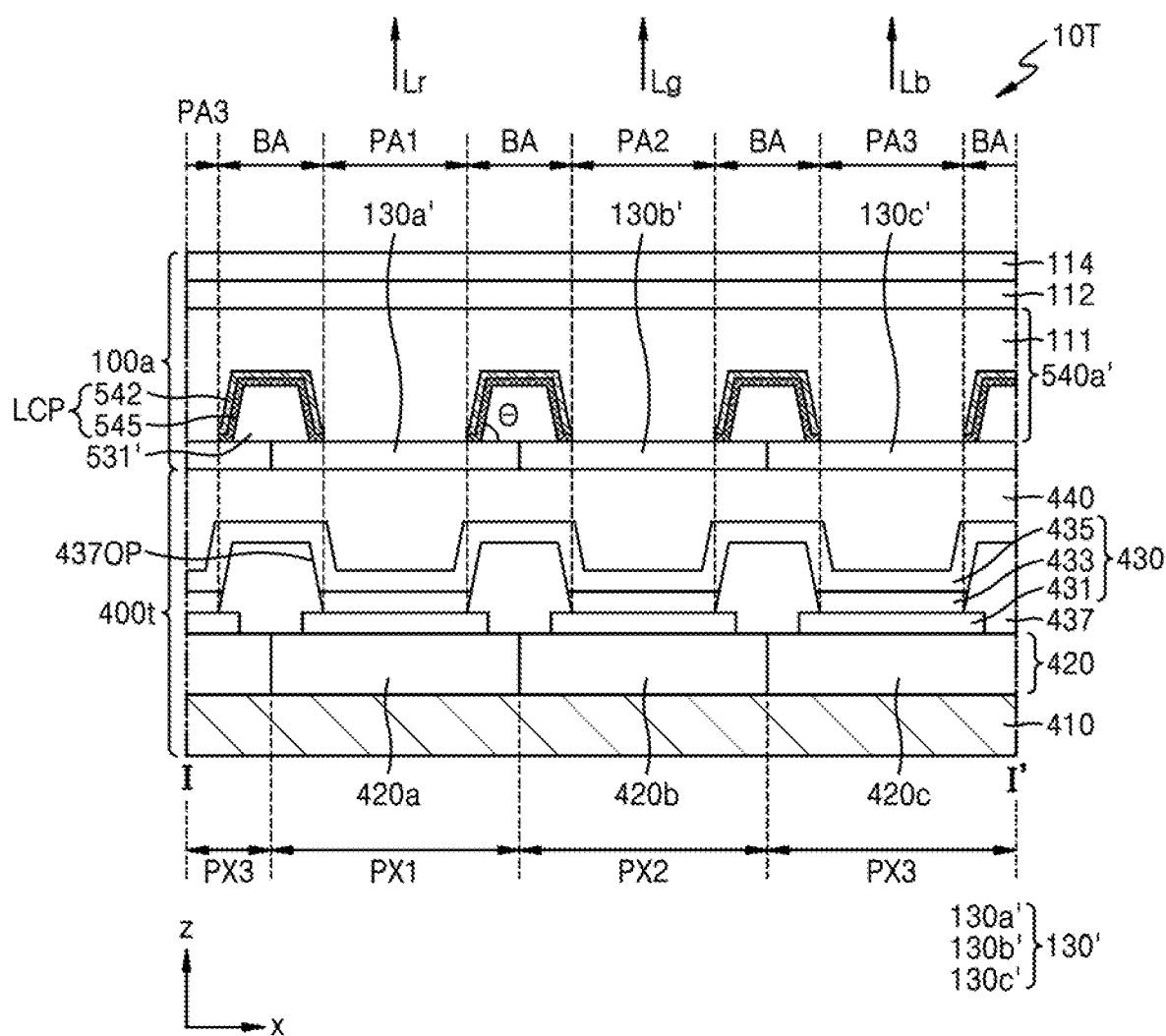

FIGS. 37 and 39 are cross-sectional views of a portion of a display device 10T according to an exemplary embodiment of the present invention. According to the exemplary embodiments depicted with reference to FIG. 37, the first color conversion layer 150' and the second color conversion layer 160' may be omitted. Additionally, the color filter layer 130' may be in a same layer, and alternately disposed, with the light-blocking member 120. The layer containing both the color filter layer 130' and the light-blocking member 120 may be disposed between the second non-inclined portions of the light control pattern LCP and the light-emitting element 430 in a third direction (e.g., the z direction). The exemplary embodiment of the present invention depicted with reference to FIG. 39 may be substantially similar to FIG. 37 except that the light-blocking members 120 are omitted.

Referring to FIG. 37, the display device 10T according to the exemplary embodiment of the present invention may include a display panel 400t and a color control member 100a. The color control member 100a may be directly formed on the display panel 400t after the process of forming the display panel 400t.

The color control member 100a may include first to third pixel areas PA1, PA2, and PA3 that are spaced apart from each other, and a light-blocking area BA between the first to third pixel areas PA1, PA2, and PA3.

The color control member 100a may include a light-blocking member 120' and a color filter layer 130'. The color filter layer 130' may include a first color filter layer 130a', a second color filter layer 130b', and a third color filter layer 130c'. The first color filter layer 130a' may be arranged in at least the first pixel area PA1, the second color filter layer 130b' may be arranged in at least the second pixel area PA2, and the third color filter layer 130c' may be arranged in at least the third pixel area PA3. The color filter layer 130' may emit light Lr, Lg, and Lb of different first to third colors with respect to different incident lights Lir, Lig, and Lib, respectively. The color control member 100a may further include an inorganic layer 112 and a protective layer 114 on the color filter layer 130'. The light-blocking member 120' may be located between the first color filter layer 130a', the second color filter layer 130b', and the third color filter layer 130c'.

The color control member 100a may further include a light control layer 540a. The light control layer 540a may be located between the color filter layer 130' and the inorganic layer 112. The light control layer 540a may include a first insulating layer including an insulating pattern 531 and a light control pattern LCP arranged on the first insulating layer. The insulating pattern 531 and the light control pattern LCP may be located to correspond to the light-blocking area BA of the color control member 100a. The insulating pattern 531 and the light control pattern LCP may overlap the light-blocking member 120'. The light control layer 540a may further include a second insulating layer 111, which covers the light control pattern LCP, on the light control pattern LCP.

The light control pattern LCP may include a pair of inclined portions. Each of the pair of inclined portions may form a first angle θ with the upper surface (or a surface parallel to the upper surface) of the color filter layer 130'. The pair of inclined portions may extend in a direction approaching the upper surface of the color filter layer 130', and the distance between inclined portions on the side closest to the color filter layer 130' is greater than the distance between inclined portions on the side farther from the color filter layer 130'. The light control pattern LCP may include a first non-inclined portion between the pair of inclined portions. The light control pattern LCP may include second non-inclined portions extending from the inclined portions and contacting the upper surface of the color filter layer 130'.

The light control pattern LCP may include a reflective pattern 542 and a support pattern 545. The support pattern 545 may directly contact the upper surface and side surface of the insulating pattern 531. The reflective pattern 542 may include a reflective material. The support pattern 545 may include an inorganic material such as SiNx.

The display panel 400t includes a plurality of pixels PX arranged in a predetermined pattern in the first direction (e.g., the x direction, or the row direction) and a second direction (e.g., the y direction, or the column direction) in the display area DA. The plurality of pixels PX may include first to third pixels PX1, PX2, and PX3. First to third pixel circuits 420a, 420b, and 420c respectively of the first to third pixels PX1, PX2, and PX3 may be arranged in a pixel circuit layer 420 of the display panel 400t. Light-emitting elements 430 may be arranged on the pixel circuit layer 420 to correspond to first to third pixel areas PA1, PA2, and PA3 of the color control member 100a (for example, first to third pixel areas PA1, PA2 and PA3 of a substrate 410).

Each of the light-emitting elements 430 may include a pixel electrode 431, an intermediate layer 433, and an opposite electrode 435. The edge of the pixel electrode 431 may be covered by the pixel-defining layer 437. The pixel-defining layer 437 may be arranged to correspond to the light-blocking area BA of the color control member 100a.

FIGS. 38A to 38E illustrate steps in a manufacturing process of the display device 10T illustrated in FIG. 37.

A color filter layer 130' may be formed on a substrate 410 on which light-emitting elements 430, a pixel-defining layer 437 between the light-emitting elements 430, and an encapsulation layer 440 are formed.

Figure 38A:
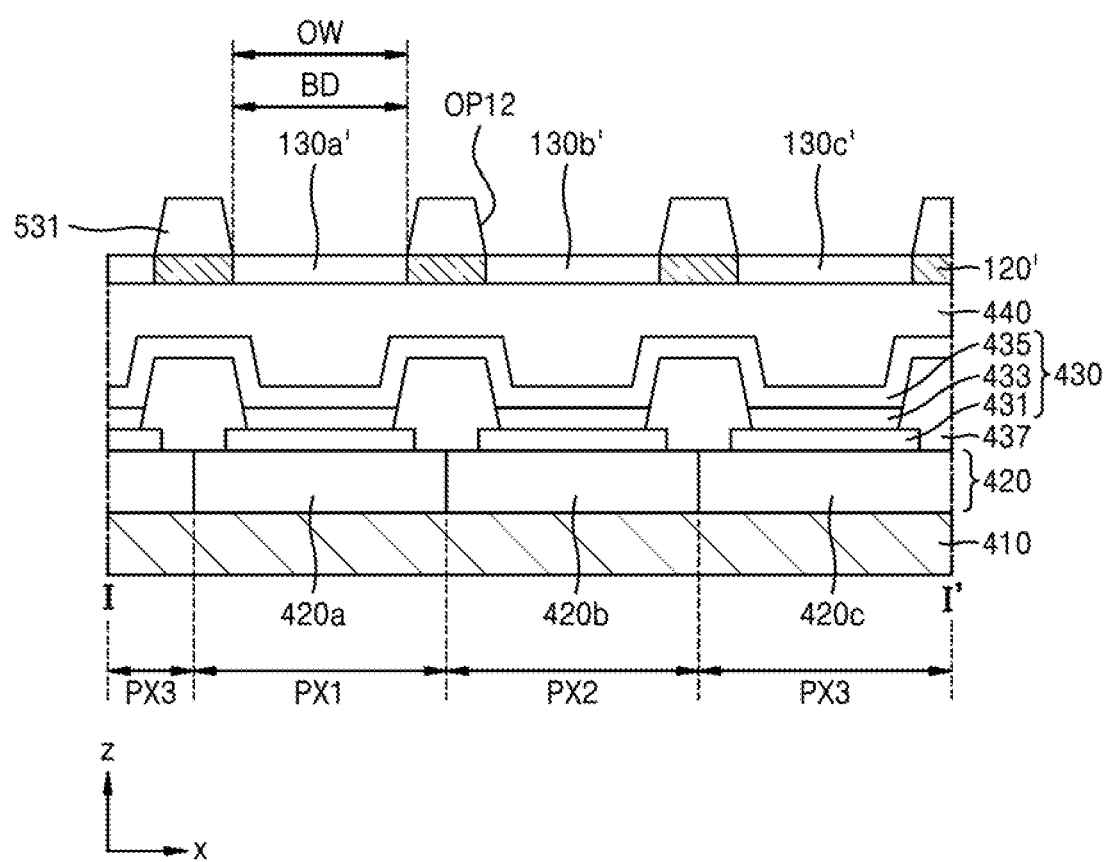
FIGS. 38A to 38E illustrate steps in a process of manufacturing the display device illustrated in FIG. 37, according to an exemplary embodiment of the present invention.

As shown in FIG. 38A, a first insulating layer may be formed over the color filter layer 130', and then an opening OP12 penetrating the first insulating layer may be formed, thereby forming an insulating pattern 531. The first insulating layer may include an organic insulating layer. The opening OP12 of the first insulating layer may expose the upper surface of the color filter layer 130'. The opening OP12 of the first insulating layer may be located in the pixel area PA, and the insulating pattern 531 may be located in the light-blocking area BA. The insulating pattern 531 may entirely surround each of the first to third color filter layers 130a', 130b', and 130c' and overlap the light-blocking member 120'. For example, the insulating pattern 531 may surround the light-emitting element 430 and overlap the pixel-defining layer 437. A width OW of the opening OP12 of the first insulating layer may be equal to or greater than a distance BD between the light-blocking members 120'.

Figure 38B:
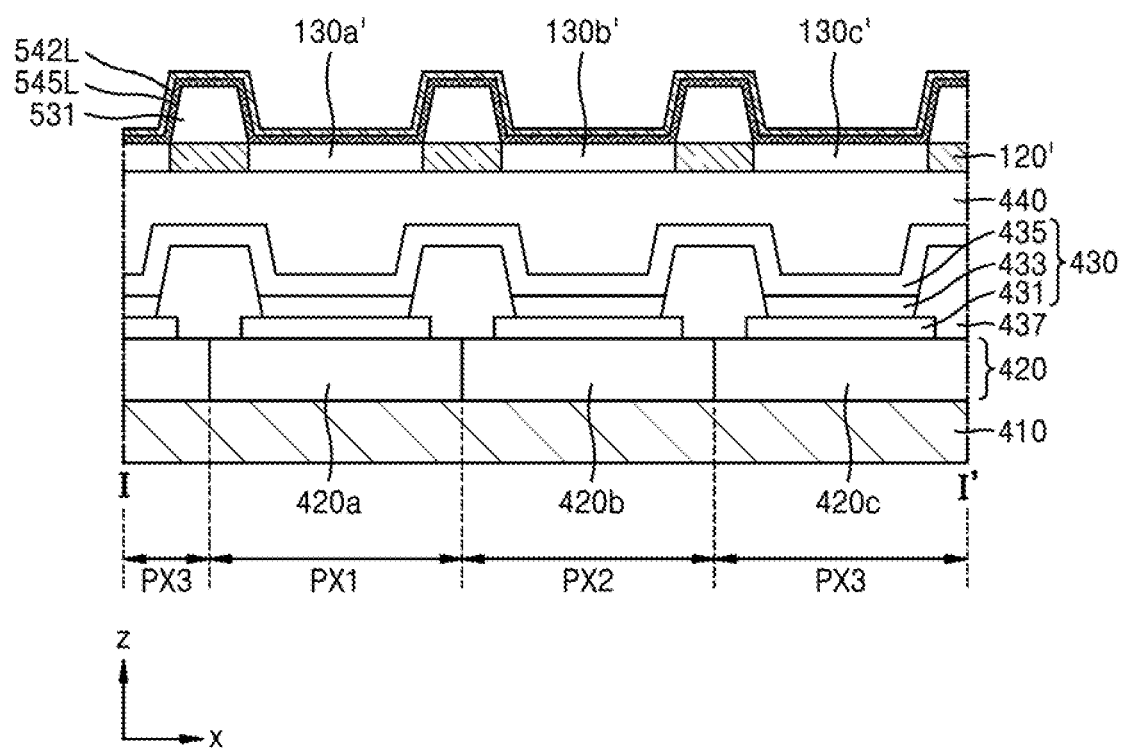

As shown in FIG. 38B, an a reflective material layer 545L and an inorganic material layer 542L may be sequentially deposited over the color filter layer 130' while covering the first insulating layer including the insulating pattern 531.

Figure 38C:
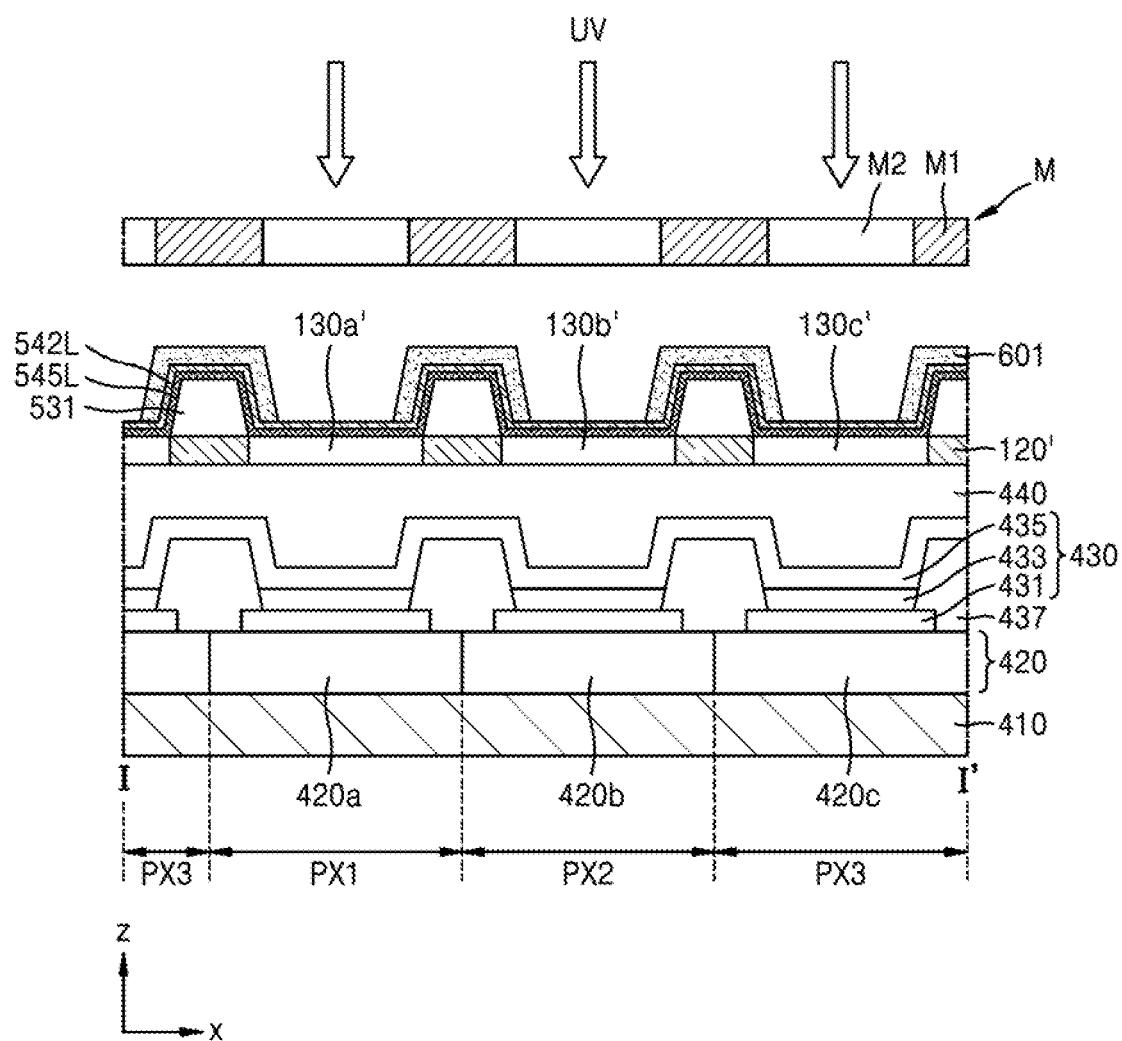

Subsequently, as shown in FIG. 38C, a photoresist 601 may be applied to cover the inorganic material layer 542L and the reflective material layer 545L, and the photoresist 601 may be UV-exposed and developed using an aligned mask M. Thus, a portion of the photoresist 601 corresponding to a light-transmitting portion M2 may be removed and only a portion of the photoresist 601 corresponding to a light-blocking portion M1 may remain.

Figure 38D:
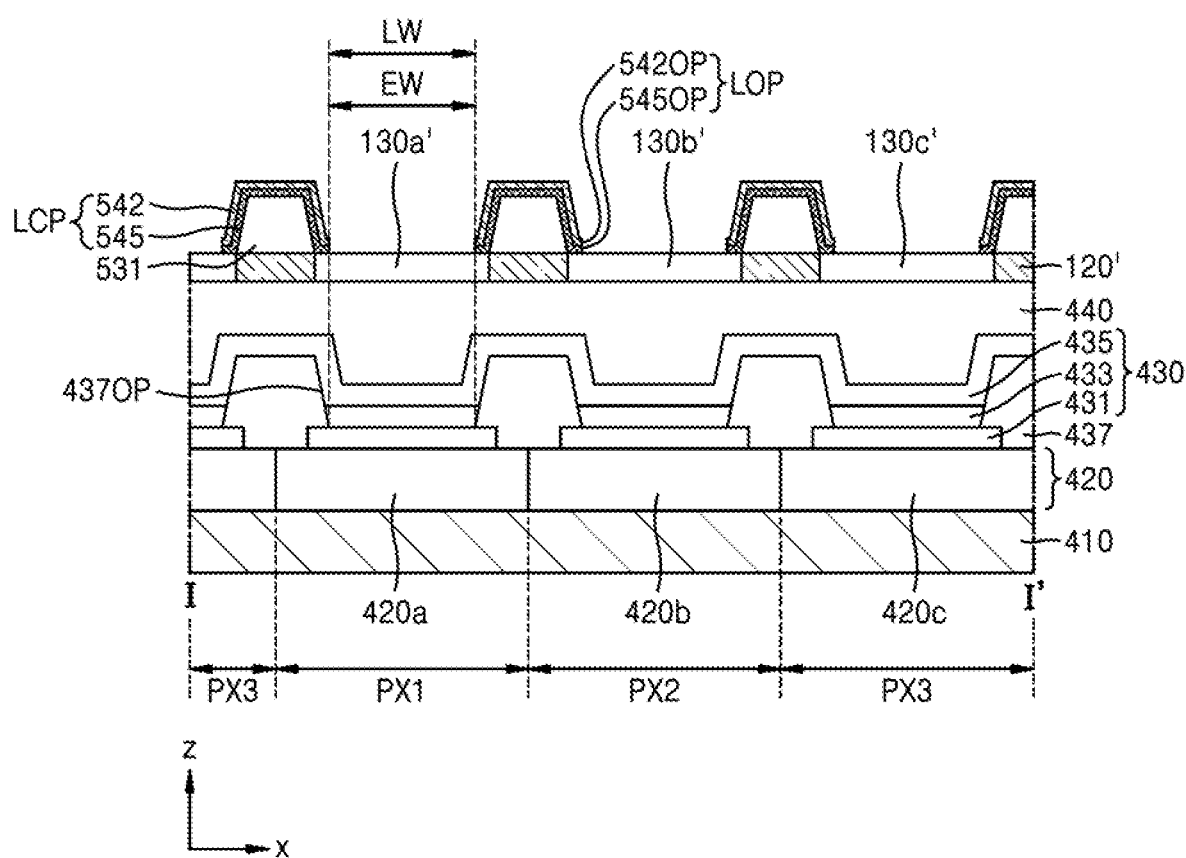

Next, as shown in FIG. 38D, the inorganic material layer 542L and the reflective material layer 545L of a region where the photoresist 601 is removed may be etched to thereby form a support pattern 542 and a reflective pattern 545 of the light control pattern LCP. Etching may be wet etching or dry etching. An etched surface (e.g., a side surface) of the reflective material layer 542L corresponding to an opening 542OP and an etched surface (e.g., a side surface) of the inorganic material layer 545L corresponding to an opening 545OP may coincide with each other (e.g., may be aligned). An opening LOP of the light control pattern LCP may include the opening 542OP of the reflective material layer 542L and the opening 545OP of the inorganic material layer 545L. A width LW of the opening LOP of the light control pattern LCP may be equal to or greater than the width EW of the opening 437OP of the pixel-defining layer 437. Thereafter, the photoresist 601 remaining on the light control pattern LCP may be removed.

Figure 38E:
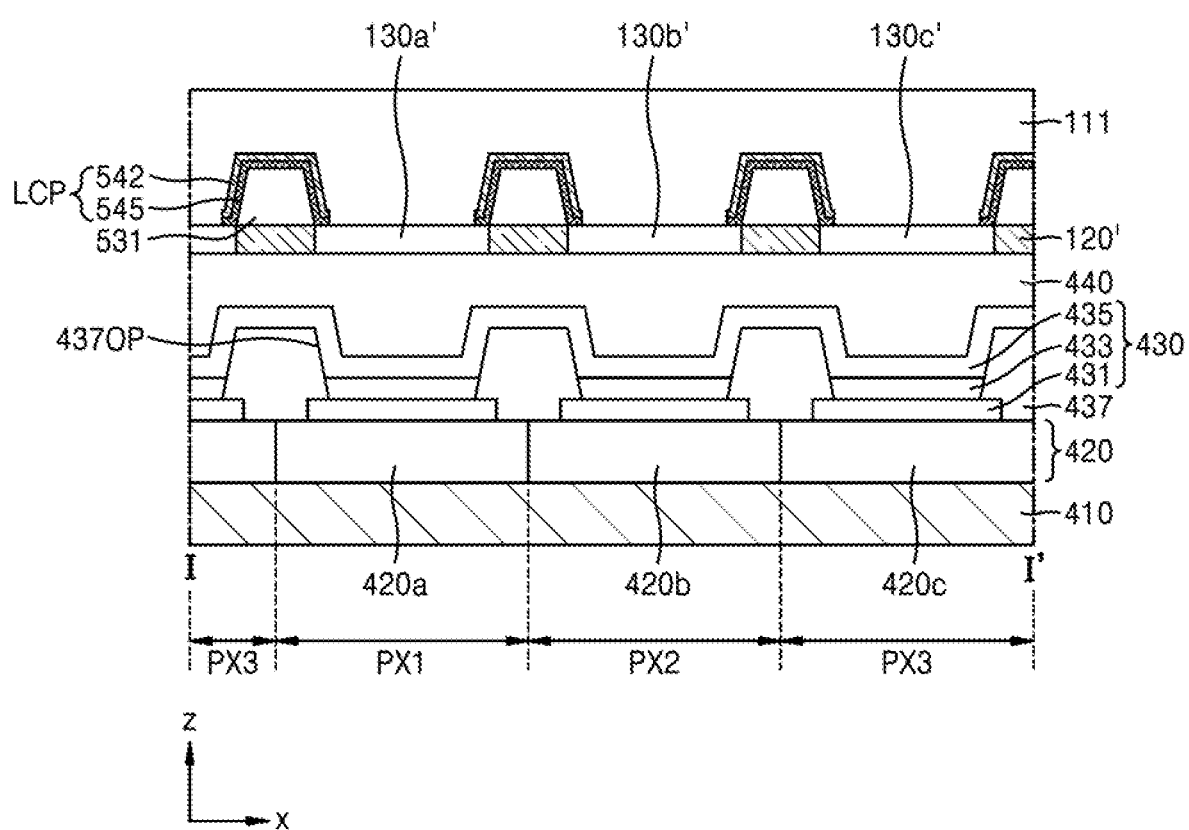

Next, as shown in FIG. 38E, a second insulating layer 111, which covers the light control pattern LCP and the color filter layer 130', may be arranged on the color filter layer 130'. The second insulating layer 111 may include a planarization layer including an organic material. The second insulating layer 111 may include the same material as that of the first insulating layer.

As shown in FIG. 37, the inorganic layer 112 and the protective layer 114 may be sequentially arranged on the second insulating layer 111.

Although it is shown in FIG. 37 that the light-blocking member 120' is provided between the first color filter layer 130a', the second color filter layer 130b', and the third color filter layer 130c', the present invention is not limited to thereto. For example, as shown in FIG. 39, the light-blocking member 120' might not be provided in the color filter layer 130'. In this case, the insulating pattern 531' provided in the light control layer 540a' and positioned in the light-blocking area BA may include a light blocking material.

Figure 40:
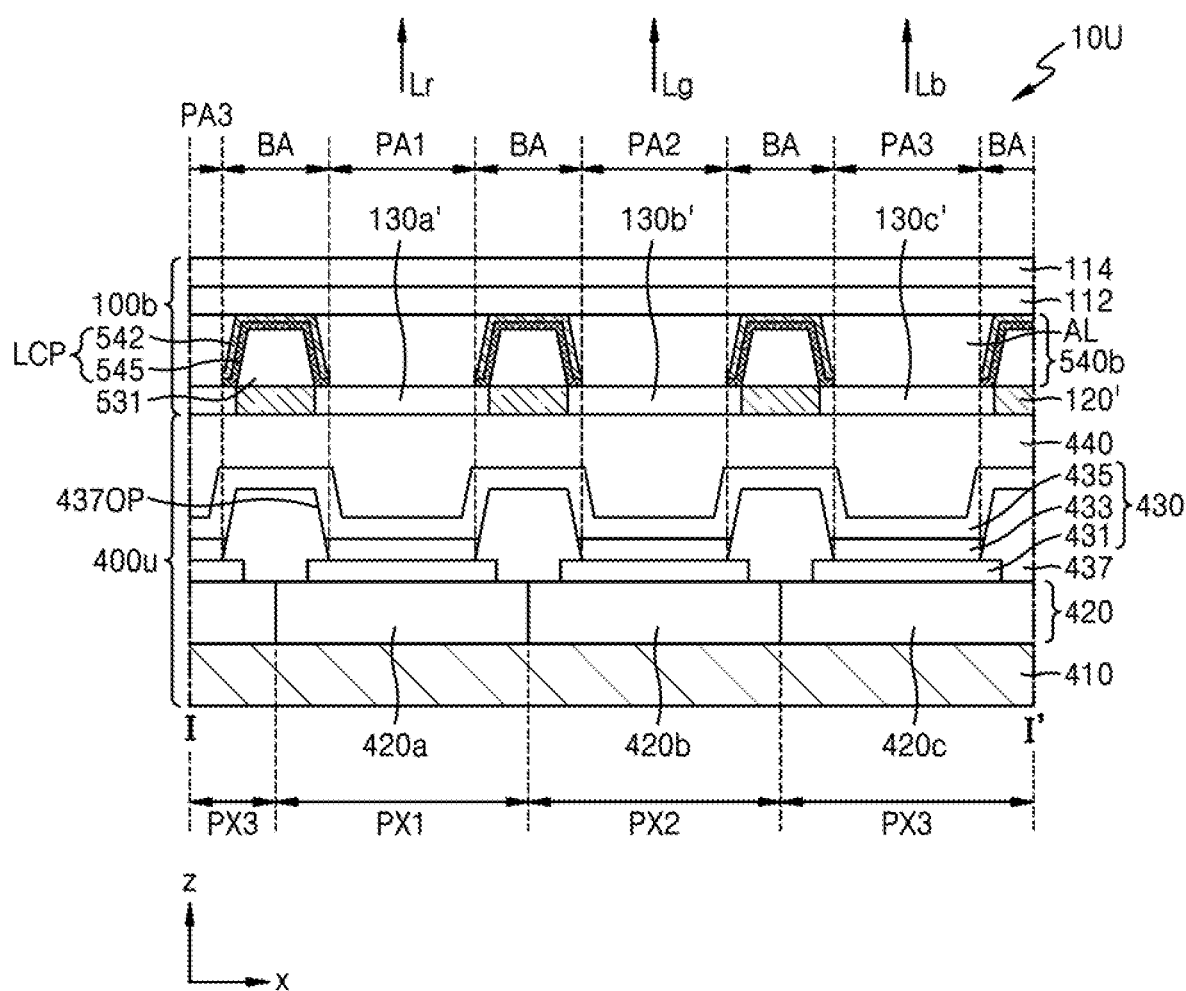
FIGS. 40 and 41 are cross-sectional views illustrating a portion of a display device, according to an exemplary embodiment of the present invention.
Figure 41:
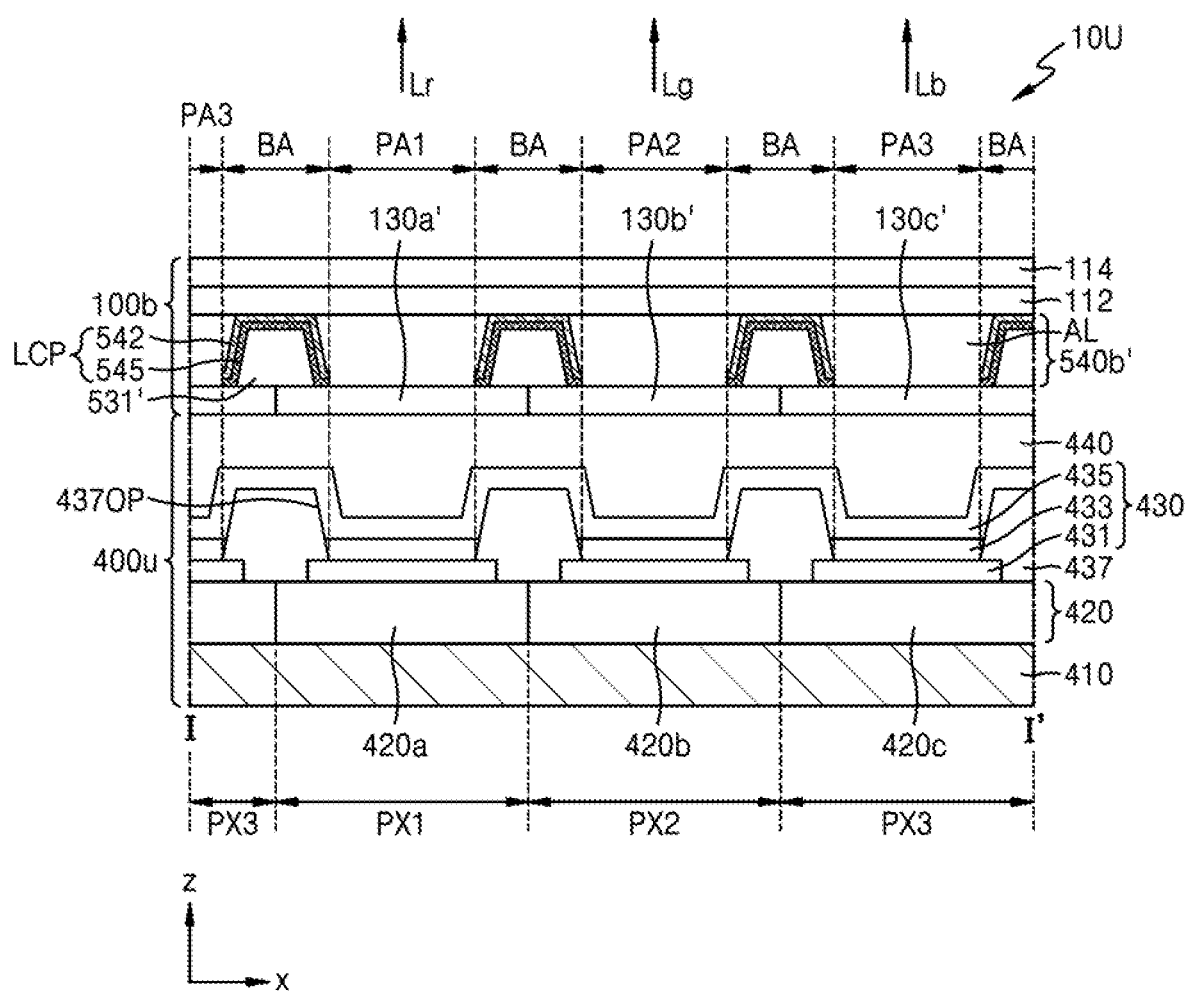

FIGS. 40 and 41 are cross-sectional views of a portion of the display device 10U according to an exemplary embodiment of the present invention.

The exemplary embodiment of FIG. 40 is different from the exemplary embodiment of FIG. 37 in that a color control member 100b of the display device 10U illustrated in FIG. 40 includes an air layer AL provided in a light control layer 540b between the light control patterns LCP and a lower surface of the inorganic layer 112 is disposed, for example, directly on an upper surface of the reflective pattern 542. The light insulating layer 540a of the color control member 100a shown in FIG. 37 includes the second insulating layer 111 as a planarization layer. Other configurations of the exemplary embodiment of FIG. 40 may be the same as those of the exemplary embodiment of FIG. 37. Although FIG. 37 includes the second insulating layer 111, the second insulating layer 111 might not be provided on a color filter layer 130', as shown in FIG. 41. In addition, although the light blocking member 120' is shown disposed in the same layer as the color filter layer 130' in FIG. 37, the light blocking member 120' may also be omitted, as shown in FIG. 41. In this case, an insulating pattern 531' provided in a light control layer 540b' may be positioned in a light-blocking area BA and may include a light blocking material.

Figure 42:
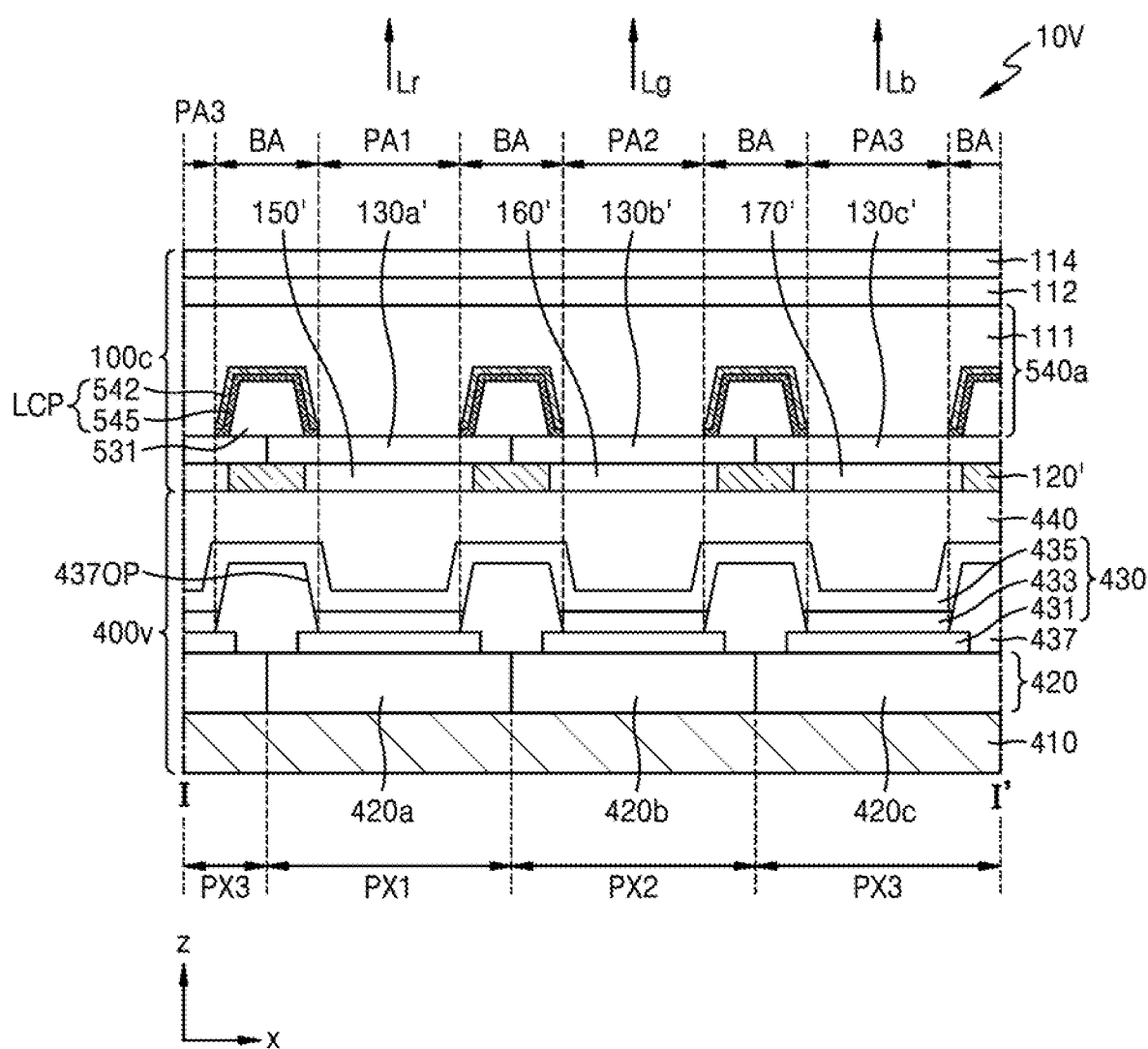
FIGS. 42 and 43 are cross-sectional views illustrating portions of display devices, according to exemplary embodiments of the present invention.
Figure 43:
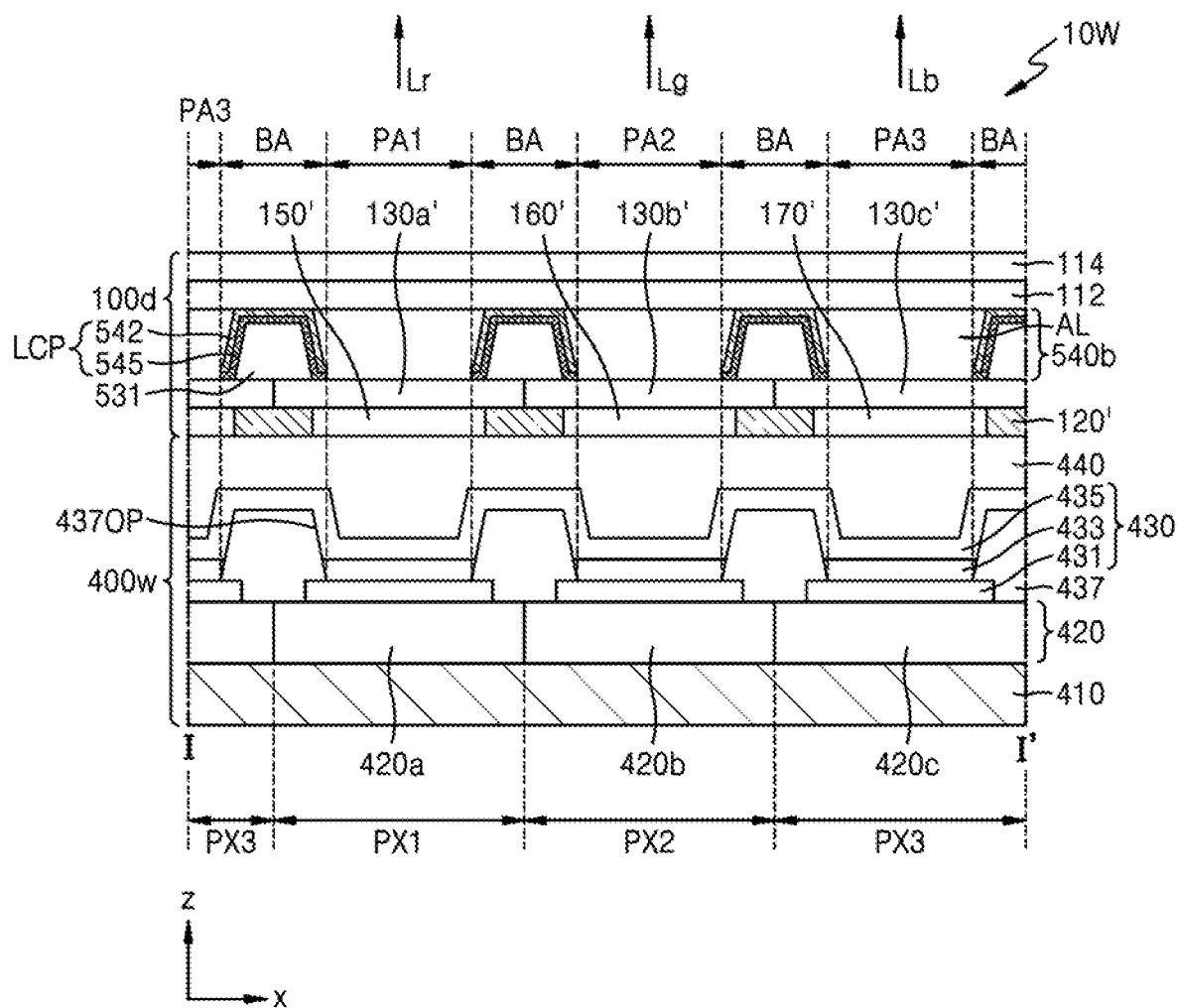

FIGS. 42 and 43 are cross-sectional views of portions of the display devices 10V and 10W according to exemplary embodiments of the present invention.

The display device 10V shown in FIG. 42 is different from the display device 10T shown in FIG. 37 in that a color control member 100c of the display device 10V further includes a first color conversion layer 150', a second color conversion layer 160', and a transmission layer 170'. Other configurations of the exemplary embodiment of FIG. 42 are the same as those of the exemplary embodiment of FIG. 37. In FIG. 42, a light-blocking member 120' is provided between the first color conversion layer 150', the second color conversion layer 160', and the transmission layer 170'. In another exemplary embodiment of the present invention, the light-blocking member 120' may be provided between a first color filter layer 130a', a second color filter layer 130b', and a third color filter layer 130c'.

The display device 10W shown in the exemplary embodiment of FIG. 43 is different from the display device 10U shown in the exemplary embodiment of FIG. 40 in that a color control member 100c of the display device 10W further includes a first color conversion layer 150', a second color conversion layer 160', and a transmission layer 170'. Other configurations of the exemplary embodiment of FIG. 43 may be the same as those of the exemplary embodiment of FIG. 40. In FIG. 43, a light-blocking member 120' is provided between the first color conversion layer 150', the second color conversion layer 160', and the transmission layer 170'. In an exemplary embodiment of the present invention, the light-blocking member 120' may be provided between a first color filter layer 130a', a second color filter layer 130b', and a third color filter layer 130c'.

The light control pattern LCP of the exemplary embodiments illustrated in FIGS. 37 to 43 may surround each of the first color filter layer 130a', the second color filter layer 130b', and the third color filter layer 130c', as shown in FIGS. 35A to 35F, and may be formed in various shapes. FIGS. 44A to 44E are cross-sectional views of display devices according to comparative examples, and FIGS. 45A to 45E are cross-sectional views of display devices according to exemplary embodiments of the present invention.

Figure 44A:
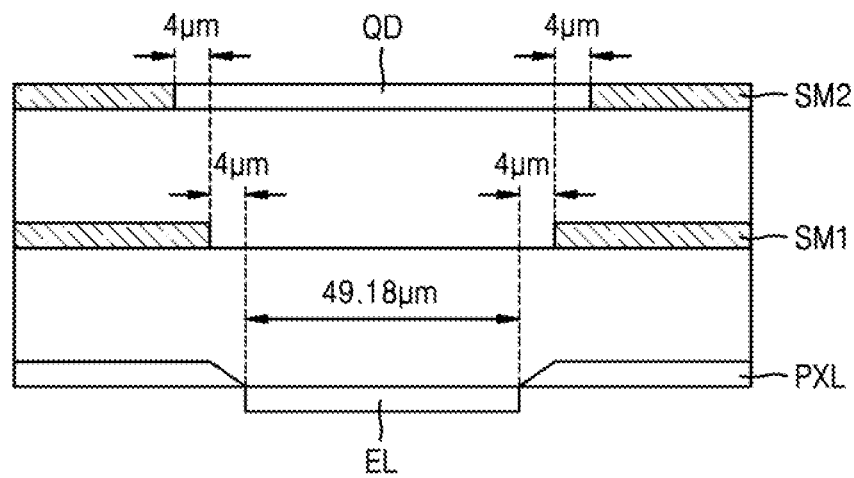
FIGS. 44A to 44E are cross-sectional views illustrating display devices, according to according to comparative examples.
Figure 44B:
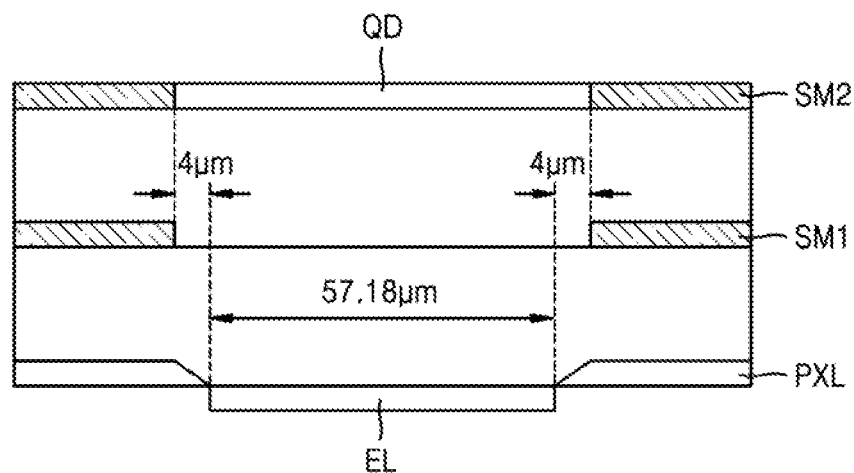
Figure 44C:
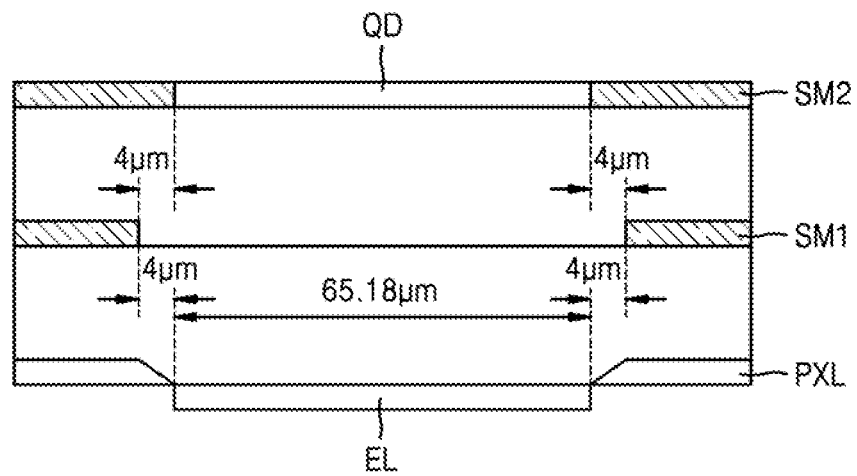
Figure 44D:
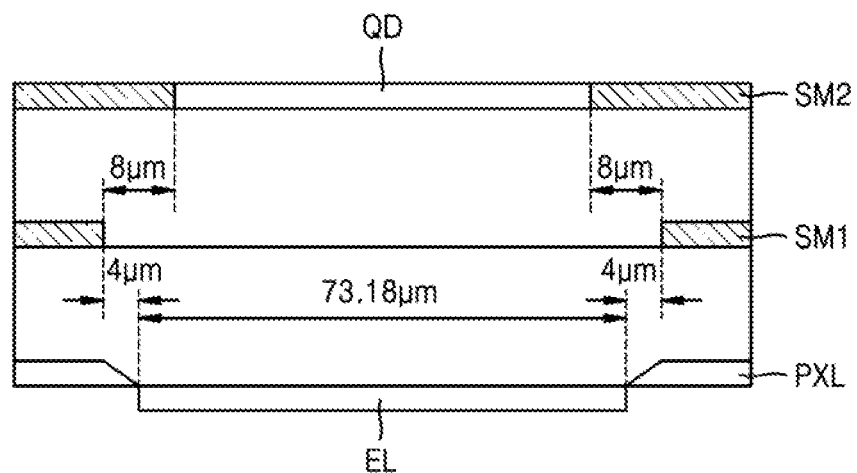
Figure 44E:
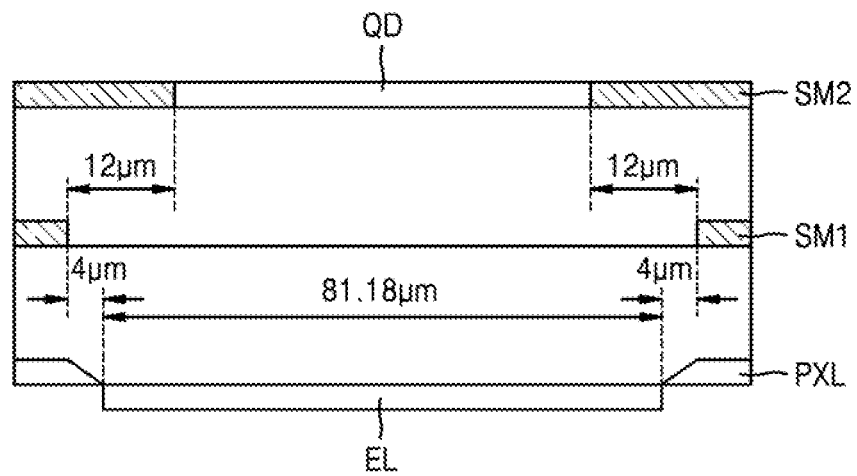

FIGS. 44A to 44E illustrate comparative examples in which a light-blocking member SM1 is provided on an encapsulation layer. For convenience of description, only an emission layer EL of a light-emitting element, a pixel-defining layer PXL, a light-blocking member SM1 on an encapsulation layer, a light-blocking member SM2 of a color control member, and a color conversion layer QD are briefly illustrated. According to a comparative example 1 of FIG. 44A to a comparative example 5 of FIG. 44E, the area of the emission layer EL increases by decreasing the width of the light-blocking member SM1 and increasing the width of the emission layer EL.

FIGS. 45A to 45E illustrate exemplary embodiments of the present invention in which a light control pattern LCP is provided on an encapsulation layer. For convenience of description, only an emission layer EL of a light-emitting element, a pixel-defining layer PXL, a light control pattern LCP on an encapsulation layer, a light-blocking member SM3 of a color control member, and a color conversion layer QD are briefly illustrated. According to an exemplary embodiment 1 of FIG. 45A to an exemplary embodiment 5 of FIG. 45E, the area of the emission layer EL increases by decreasing the width of the light control pattern LCP and increasing the width of the emission layer EL.

Figure 46:
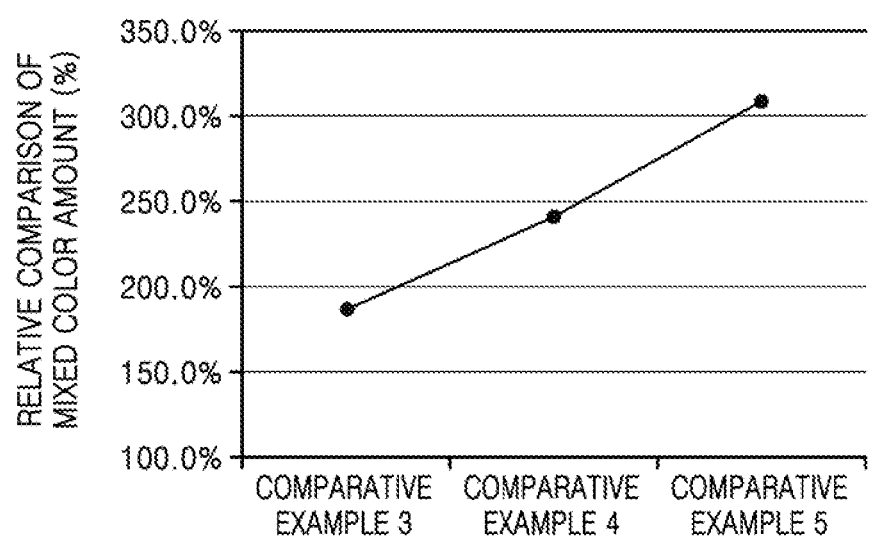
FIG. 46 is a graph illustrating mixed color evaluation results of the comparative examples of FIGS. 44A to 44E.

FIG. 46 is a graph showing a comparison of mixed color percentages in the comparative examples of FIGS. 44A to 44E. Referring to FIG. 46, when the amount of light of an adjacent pixel incident on a color conversion layer or a color control member layer of a predetermined pixel evaluated in the comparative example 1 of FIG. 44A is 100%, a color mixing percentage significantly increases from the comparative example 3 of FIG. 44C to the comparative example 5 of FIG. 44E. For example, further extending the area (e.g., the width) of the emission layer EL is difficult because it results in a concomitant decrease in the width of the light-blocking member SM1 and a corresponding increase in mixed color percentage.

Figure 47A:
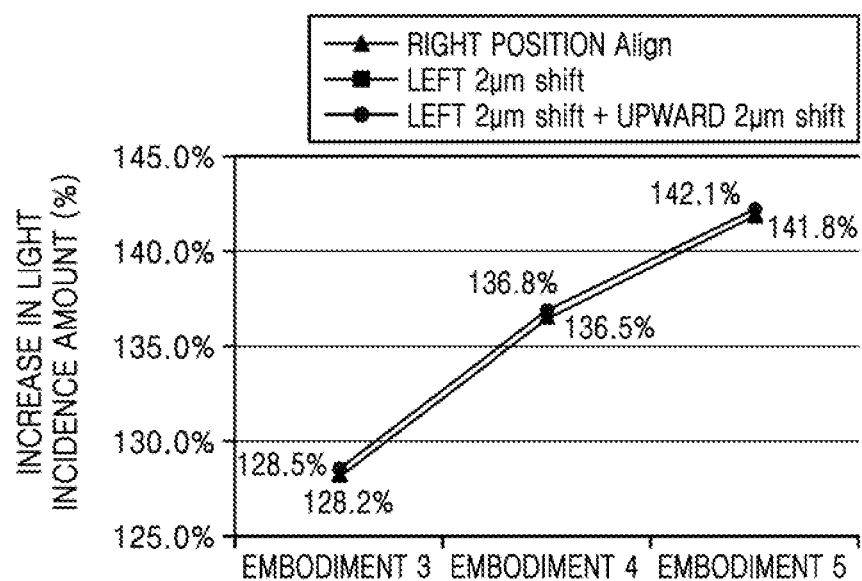
FIGS. 47A to 47C are graphs illustrating an increase in a light incidence percentage when the area of an emission layer increases, according to exemplary embodiments of the present invention.
Figure 47B:
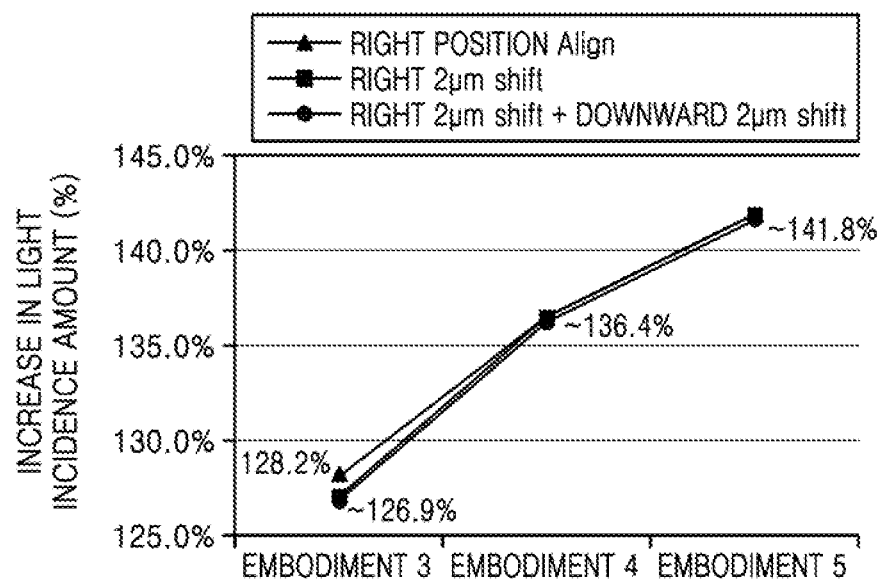
Figure 47C:
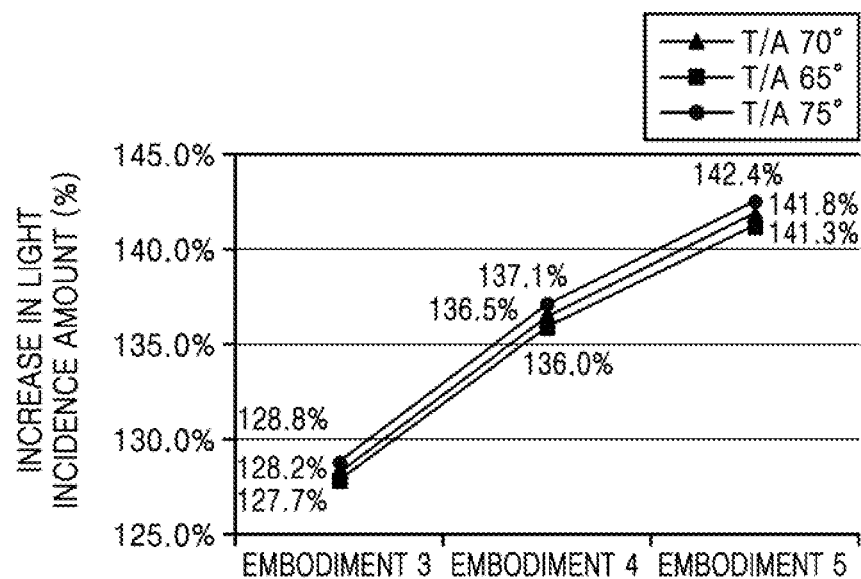

FIGS. 47A to 47C are graphs showing an increase in a percentage of light incidence when the area of the emission layer EL increases in the order of FIGS. 45A to 45E while the exemplary embodiments shown in FIGS. 5, 7, 9, 10, and 12 are applied. FIG. 47A is a graph showing an increase in the percentage amount of incident light with an increase in the area of the emission layer EL when an insulating pattern is aligned in a right position, when the insulating pattern is shifted by 2 μm to the left, when the insulating pattern is shifted by 2 μm to the left and by 2 μm upward. FIG. 47B is a graph showing an increase in a light incidence percentage amount with an increase in the area of the emission layer EL when a light control pattern LCP is aligned in a right position, when the light control pattern LCP is shifted by 2 μm to the right, when the light control pattern is shifted by 2 μm to the right and by 2 μm downward. FIG. 47C is a graph showing an increase in a light incidence amount with an increase in the area of the emission layer EL when an inner angle of the insulating pattern or the light control pattern is 70 degrees, 65 degrees, and 75 degrees.

From FIGS. 47A to 47C, it may be seen that a light incidence amount increases even if process dispersion occurs in the insulating pattern, the light control pattern, and the inner angle, and even if the width of the light control pattern LCP decreases and the width of the emission layer EL increases, as in the embodiments 3 to 5.

Figure 48A:
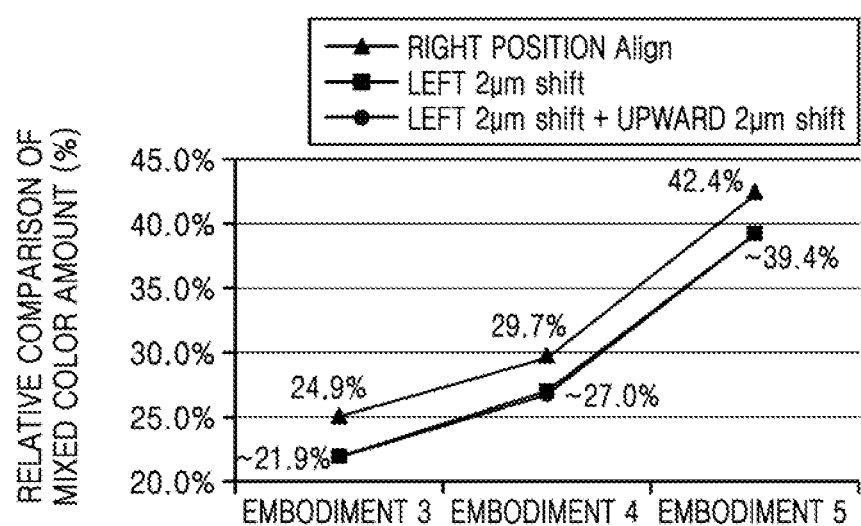
FIGS. 48A to 48C are graphs illustrating mixed color evaluation percentages when the area of an emission layer increases, according to exemplary embodiments of the present invention.
Figure 48B:
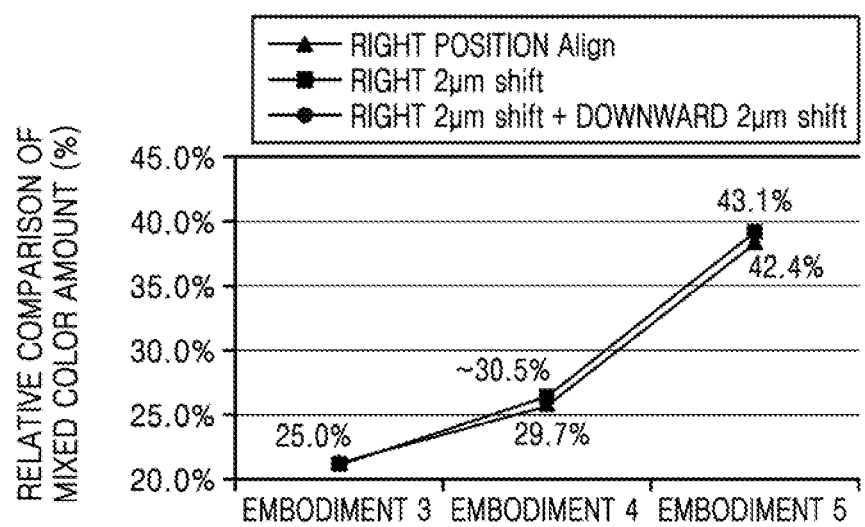
Figure 48C:
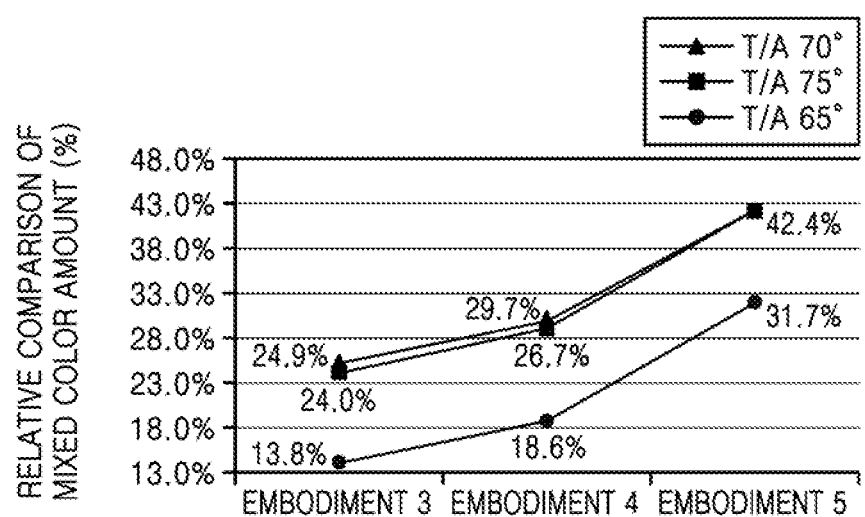

FIGS. 48A to 48C are graphs showing relative comparison of mixed color evaluation percentages when the area of the emission layer EL increases in the order of FIGS. 45A to 45E while the exemplary embodiments shown in FIGS. 5, 7, 9, 10, and 12 are applied. FIG. 48A is a graph showing the relative comparison of a mixed color percentage with an increase in the area of the emission layer EL when an insulating pattern is aligned in a right position, when the insulating pattern is shifted by 2 μm to the left, when the insulating pattern is shifted by 2 μm to the left and by 2 μm upward. FIG. 48B is a graph showing the relative comparison of a mixed color percentage with an increase in the area of the emission layer EL when a light control pattern is aligned in a right position, when the light control pattern is shifted by 2 μm to the right, when the light control pattern is shifted by 2 μm to the right and by 2 μm downward. FIG. 48C is a graph showing the relative comparison of a mixed color percentage with an increase in the area of the emission layer EL when an inner angle of the insulating pattern or the light control pattern is 70 degrees, 65 degrees, and 75 degrees.

From FIGS. 48A to 48C, it may be seen that the amount of mixed color is significantly smaller compared with that of the comparative example 1 even when process dispersion occurs in the insulating pattern, the light control pattern LCP, and the inner angle, that is, and even if the width of the light control pattern LCP decreases and the width of the emission layer EL increases, as in the embodiments 3 to 5.

Figure 49:
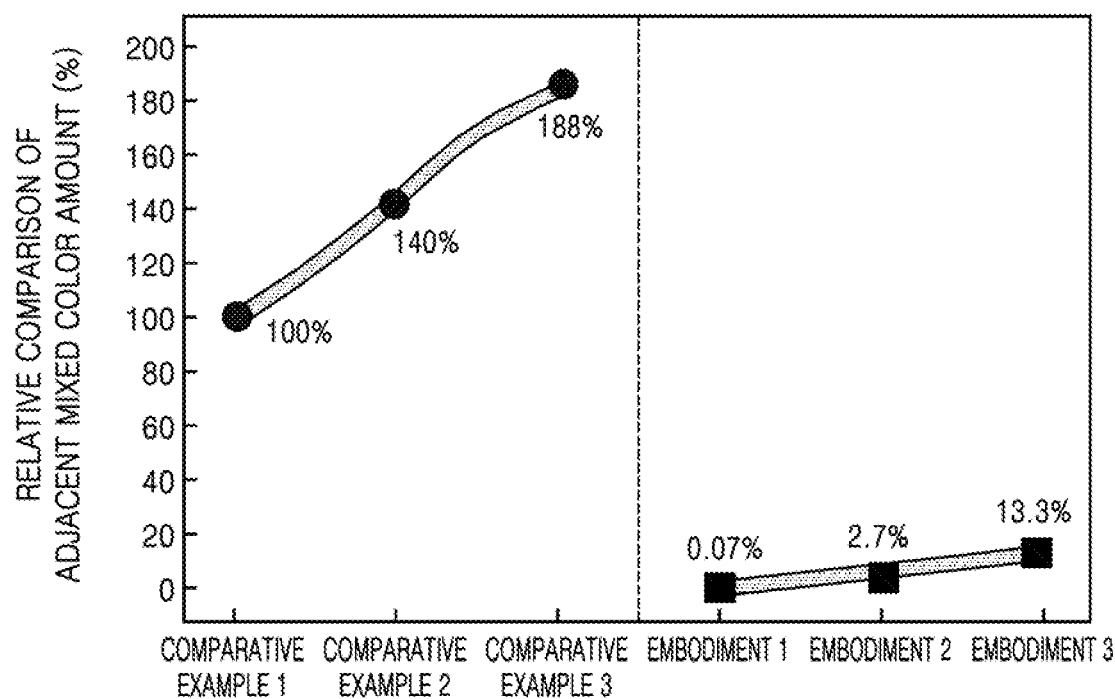
FIGS. 49 and 50 are graphs illustrating percentages of mixed color evaluation results and light incidence efficiencies when the area of an emission layer increases, according to exemplary embodiments of the present invention.
Figure 50:
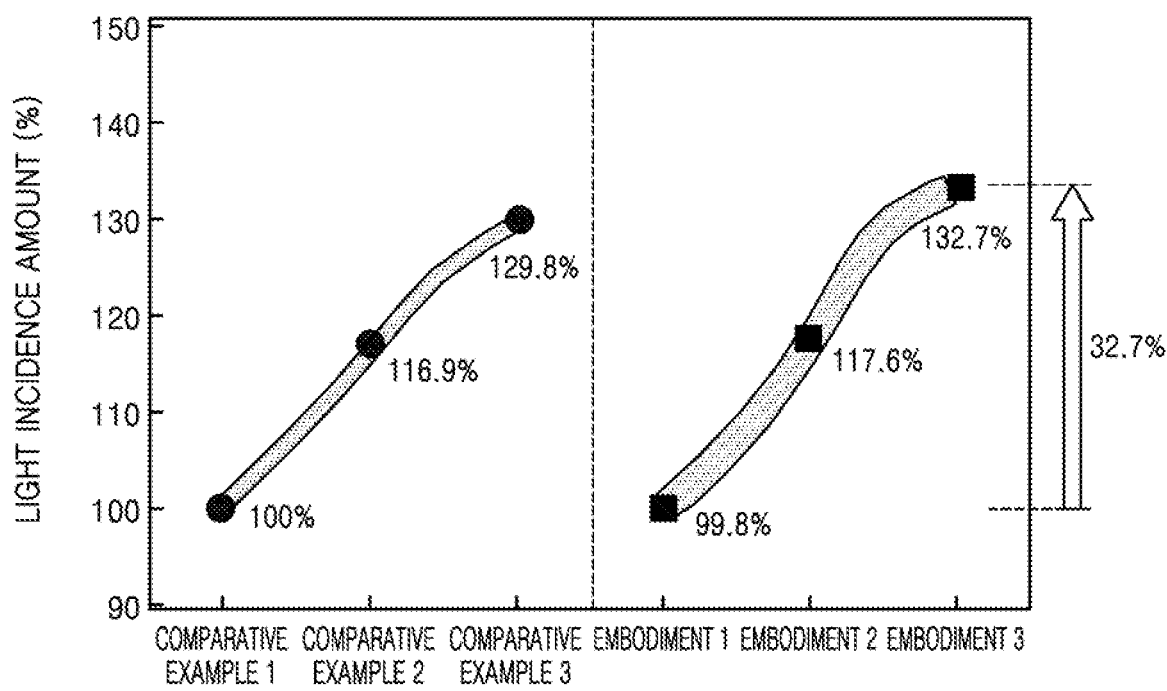

FIGS. 49 and 50 are graphs showing mixed color percentages and light incidence percentages when the area of the emission layer EL increases in the order of FIGS. 45A to 45E while the exemplary embodiments shown in FIGS. 22, 24, 25, and 27 are applied.

Figure 45A:
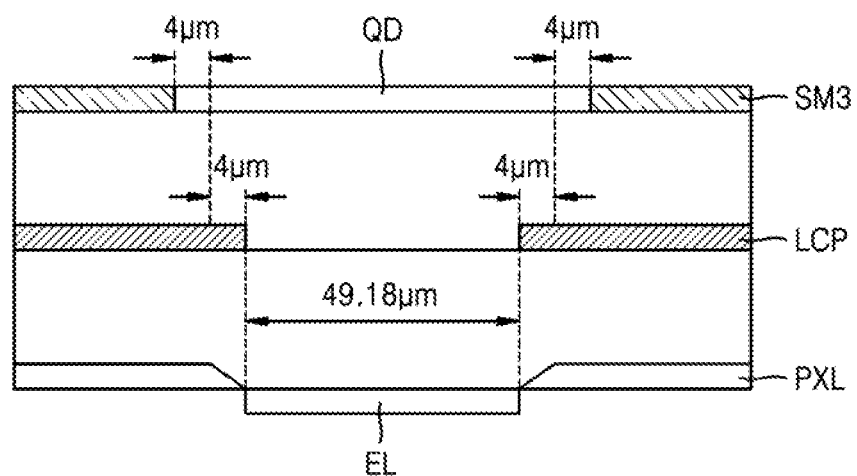
FIGS. 45A to 45E are cross-sectional views illustrating display devices according to exemplary embodiments of the present invention.
Figure 45B:
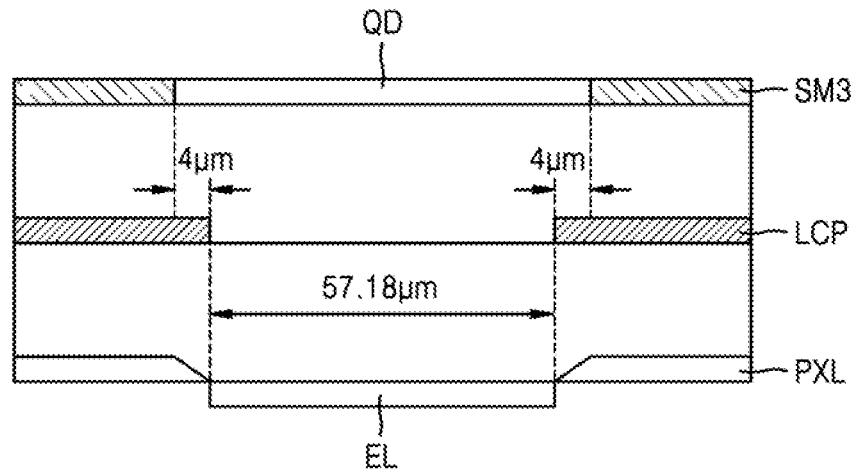
Figure 45C:
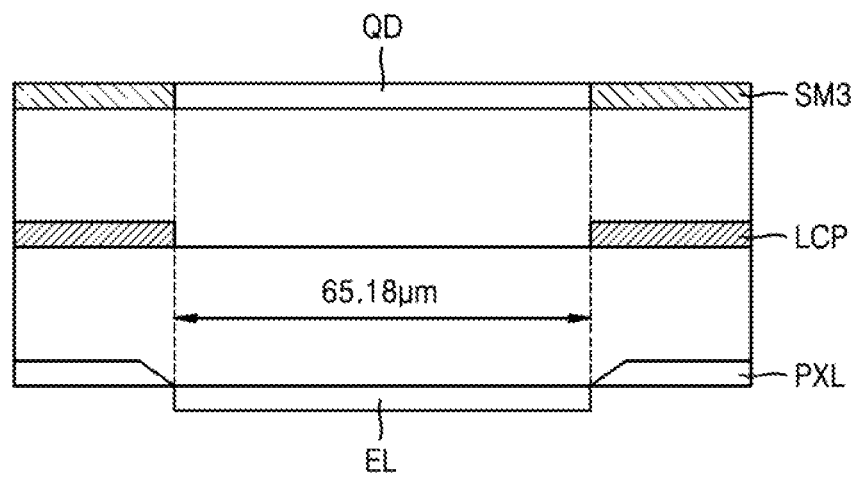
Figure 45D:
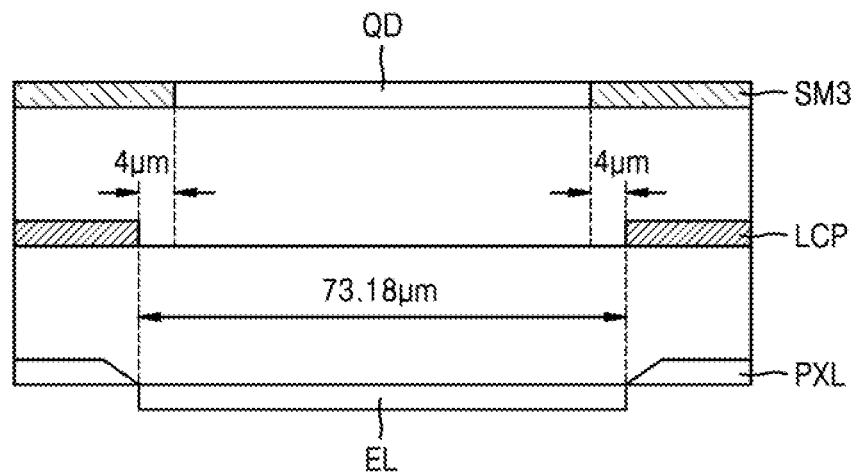
Figure 45E:
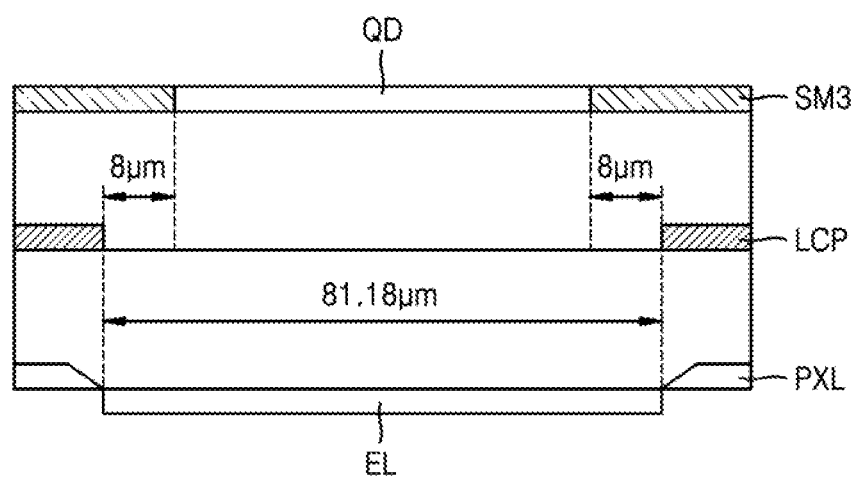

Referring to FIG. 49, in comparative examples 1 to 3 and exemplary embodiments 1 to 3, a color mixing percentage increases as the area of the emission layer EL increases. However, color mixing percentages of the exemplary embodiments 1 to 3 are significantly lower than those of the comparative examples 1-3. Referring to FIG. 50, in comparative examples 1 to 3 and embodiments 1 to 3, a light incidence percentage increases as the area of the emission layer EL increases. Light incidence percentages of the exemplary embodiments 1 to 3 of FIGS. 45A to 45C are similar to those of the comparative examples 1 to 3, but as shown in FIG. 49, the comparative examples 1 to 3 have very high color mixing percentages. The color mixing percentages of the exemplary embodiments 1 to 3 are significantly lower than those of the comparative examples 1 to 3. For example, in the comparative examples 1 to 3, an increase in the area of the emission layer EL is limited due to a high color mixing percentage. The display devices according to the exemplary embodiments 1 to 3 may have light incidence percentages which are similar to those of display devices of the comparative examples 1 to 3, but color mixing percentages are significantly lower than those of the display devices of the comparative examples 1 to 3. Thus, the exemplary embodiments 1 to 3, for example, may permit an increase in the area of the emission layer EL without compromising light incidence and without incurring color mixing.

FIGS. 51A to 51E are cross-sectional views of display devices according to comparative examples 6 to 10, and FIGS. 52A to 52E are cross-sectional views of display devices according to embodiments 6 to 10.

Figure 51A:
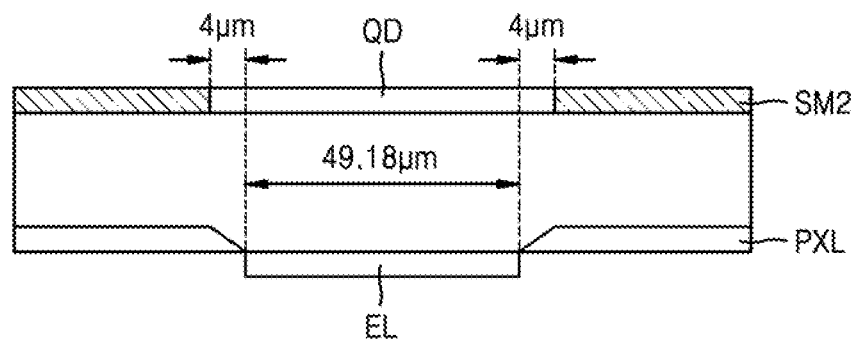
FIGS. 51A to 51E are cross-sectional views illustrating display devices, according to comparative examples.
Figure 51B:
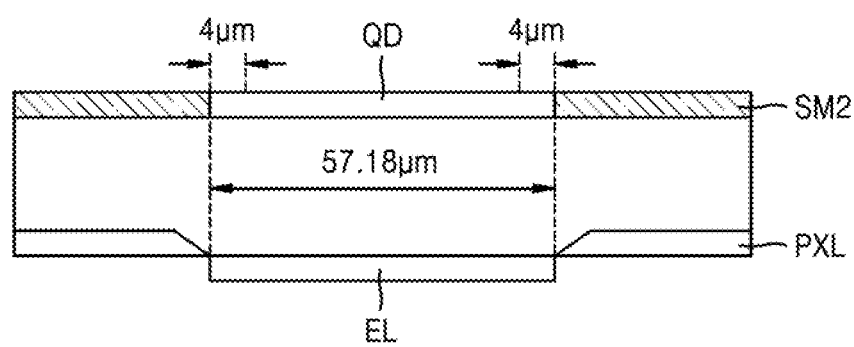
Figure 51C:
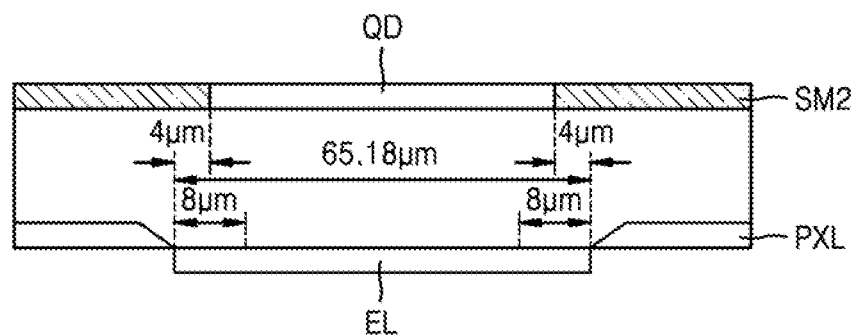
Figure 51D:
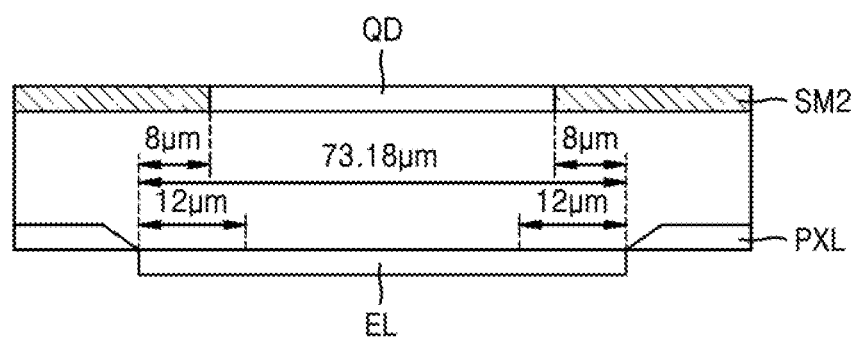
Figure 51E:
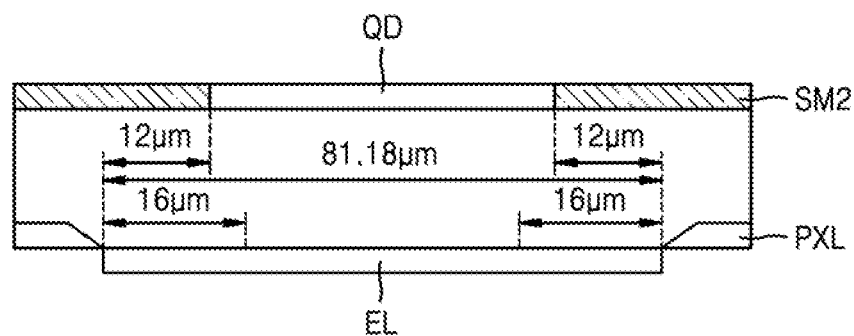
Figure 52A:
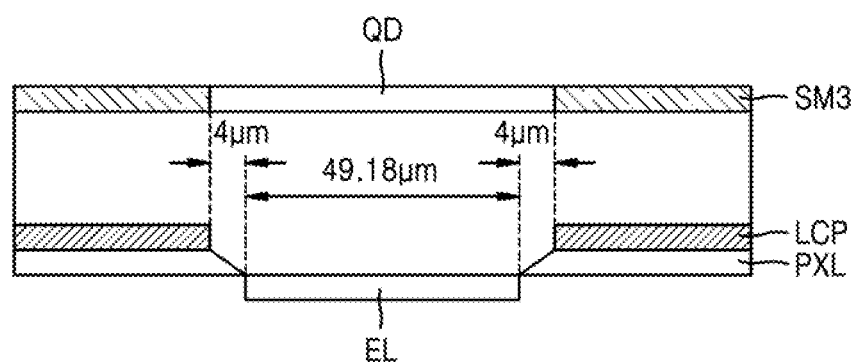
FIGS. 52A to 52E are cross-sectional views illustrating display devices according to exemplary embodiments of the present invention.
Figure 52B:
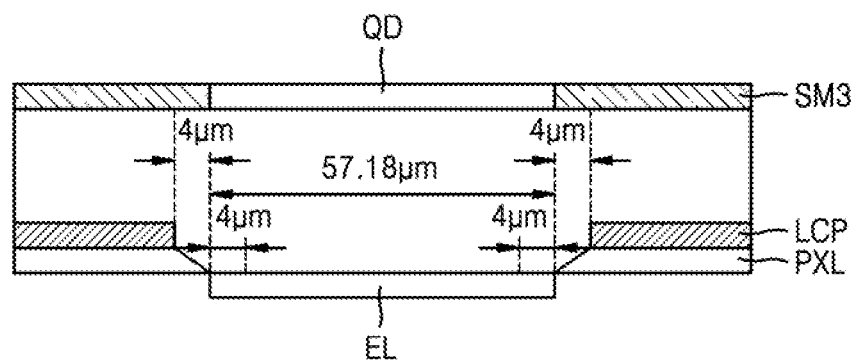
Figure 52C:
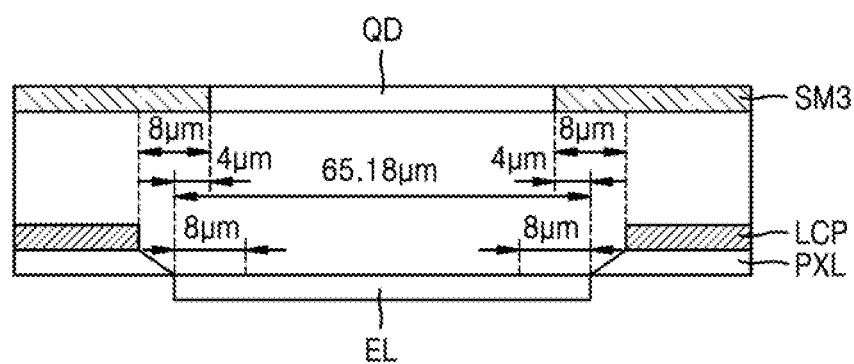
Figure 52D:
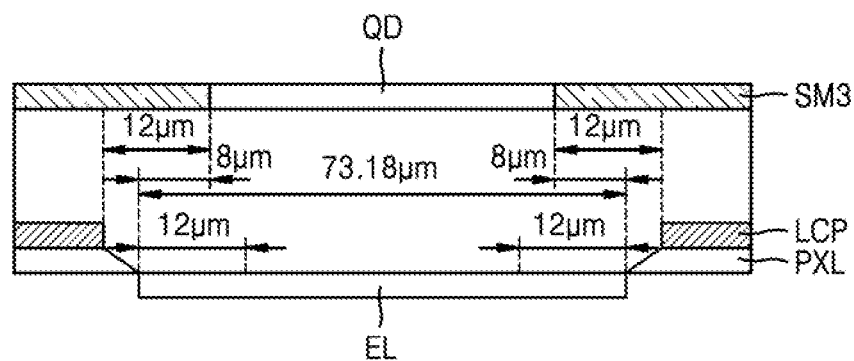
Figure 52E:
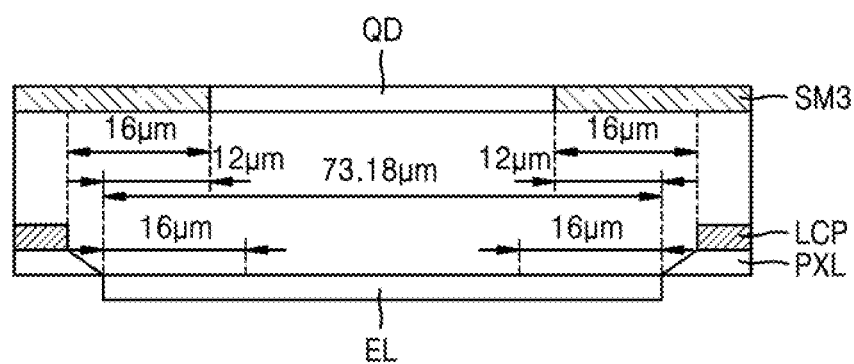

FIGS. 51A to 51E illustrate the comparative examples in which a color pattern is directly formed on a display panel without a separate substrate. For convenience of description, only an emission layer EL of a light-emitting element, a pixel-defining layer PXL, a light-blocking member SM2 of a color control member, and a color conversion layer QD are briefly illustrated. According to a comparative example 6 of FIG. 51A to a comparative example 10 of FIG. 51E, the area of the emission layer EL increases by increasing the width of the emission layer EL.

FIGS. 52A to 52E illustrate the exemplary embodiments of the present invention in which a light control pattern LCP is provided on a pixel-defining layer PXL. For convenience of description, only an emission layer EL of a light-emitting element, a pixel-defining layer PXL, a light control pattern LCP on the pixel-defining layer PXL, a light-blocking member SM3 of a color control member, and a color conversion layer QD are briefly illustrated. According to an exemplary embodiment 6 of FIG. 52A to an exemplary embodiment 10 of FIG. 52E, the area of the emission layer EL increases by decreasing the width of the light control pattern LCP and increasing the width of the emission layer EL.

Figure 53:
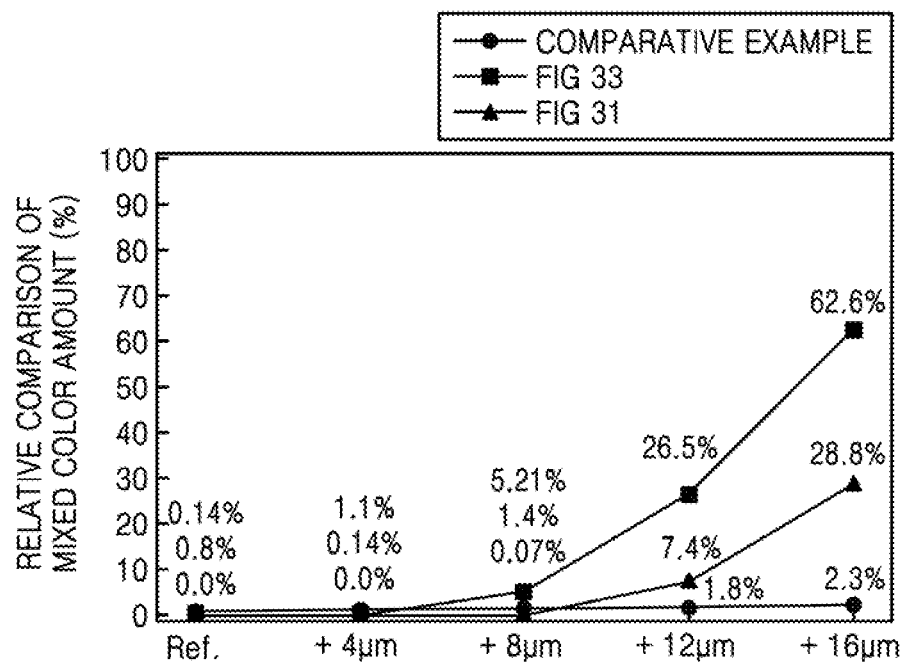
FIGS. 53 and 54 are graphs illustrating mixed color evaluation and light incidence percentages, according to the comparative examples of FIGS. 51A to 51E and the exemplary embodiments of the present invention illustrated in FIGS. 52A to 52E.
Figure 54:
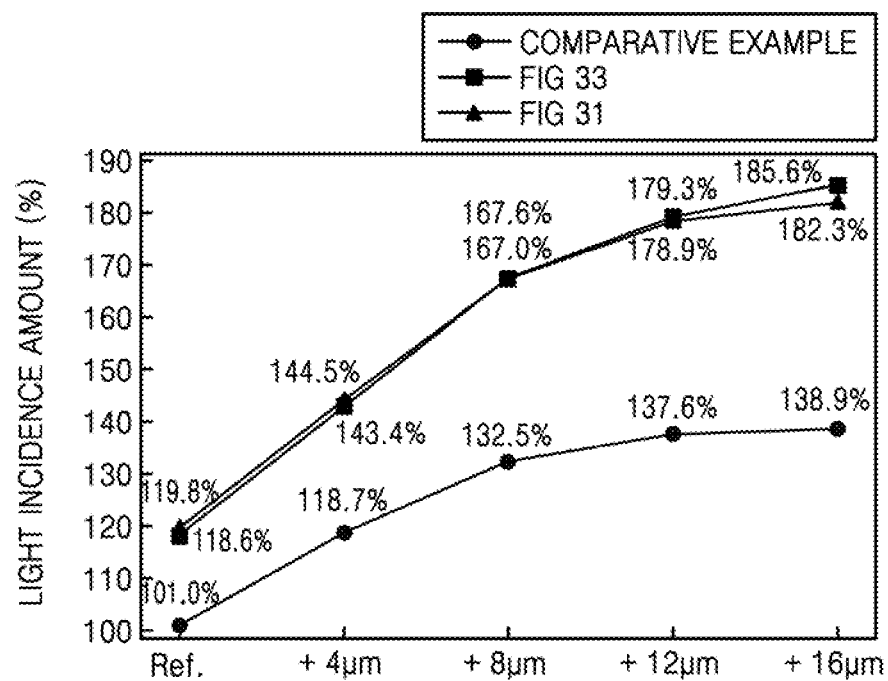

FIGS. 53 and 54 are graphs showing relative comparison of mixed color percentages and light incidence percentages in the comparative examples of FIGS. 51A to 51E and the exemplary embodiments of FIGS. 52A to 52E, as applied to FIGS. 31, 33 and the comparative example.

Referring to FIG. 53, in the comparative examples 6 to 10 of FIGS. 51A to 51E, even if the area of the emission layer EL increases, a color mixing percentage does not increase significantly, and in the exemplary embodiments 6 to 10 of FIGS. 52A to 52E, when the width of the emission layer EL increases to about 8-16 μm or more on either side, mixing color defects occur. Considering FIG. 53, in the embodiment of FIG. 31, the width of the emission layer EL may increase to about 8 μm on either side compared to that of the exemplary embodiment 6 depicted in FIG. 52A without incurring defects, and in the embodiment of FIG. 33, the width of the emission layer EL may increase to about 10 μm on either side compared to that of the exemplary embodiment 6 depicted in FIG. 52A without incurring defects.

Referring to FIG. 54, when a light incidence of the comparative example 1 of FIG. 44A is 100%, a light incidence amount of the comparative examples 6 to 10 of FIGS. 51A to 51E increases to 138.9% and a light incidence amount of the embodiments 6 to 10 of FIGS. 52A to 52E increases to 180% or more. When the embodiment of FIG. 31 is applied and the width of the emission layer EL increases, a light incidence amount increases to 182.33% compared to 138.9% exhibited by the comparative example 1. When the embodiment of FIG. 33 is applied and the width of the emission layer EL increases, a light incidence amount increases to 185.6% compared to 138.9% exhibited by the comparative example 1.

From FIGS. 53 and 54, it may be seen that, in a display device to which the light control pattern LCP according to the embodiments is applied, it is easier to increase the area of the emission layer EL in consideration of a light incidence percentage amount and a color mixing percentage rate, compared to a display device to which the light control pattern LCP is not applied.

The display devices according to the exemplary embodiments of the present invention described herein each include a light control pattern corresponding to a light-blocking area between color conversion layers and transmission layers of a color control member and thus may block light introduced from light-emitting elements of adjacent pixel areas, thereby preventing color mixing between the adjacent pixel areas. The light control pattern may be provided on an encapsulation layer, and may be provided on a pixel-defining layer under the encapsulation layer, or may be provided on a color filter layer. By adjusting the size of the light control pattern, a color matching rate, a color reproduction rate, and a light efficiency of light emitted through the display devices may be controlled.

Although a quantum dot light-emitting display device including a color conversion layer has been described as an example in the above-described exemplary embodiments of the present invention, the light control pattern LCP of the embodiments may be applied to display devices to which a color filter is applied, even without a color conversion layer, for example, various types of display devices such as an organic light-emitting display device, an inorganic electronic luminescent (EL) display device, and a liquid crystal display device.

According to various exemplary embodiments of the present invention described heretofore, color mixing between adjacent pixels may be prevented by a light control pattern of a display panel, thereby providing a display device with a simple structure and increased color reproducibility.

Although exemplary embodiments of the present invention have been described heretofore, it will be understood by those skilled in the art that various changes in form and details may be made therein without departing from the spirit and scope of the present invention as set forth in the following claims.

What is claimed is:

1. A display device, comprising:
    substrate including a pixel area and a light-blocking area;
    a light-emitting element arranged the pixel area of the Substrate;
    an insulating layer disposed on the substrate, wherein the insulating layer has an opening corresponding to the light-blocking area and an insulating pattern corresponding to the pixel area; and
    a light control pattern least partially surrounding the insulating pattern of the insulating layer and arranged in the opening corresponding to the light-blocking area, wherein the opening of the insulating layer and the tight control pattern do not overlap the light-emitting element.

2. The display device of claim 1, wherein the light control pattern includes a reflective pattern and a light-blocking pattern, wherein the reflective pattern and the light-blocking pattern are both arranged on a side and a bottom of the opening, and wherein the light-blocking pattern is arranged on the reflective pattern.

3. The display device of claim 2, further comprising: a level pattern at least partially covering the light control pattern.

4. The display device of claim 3, wherein an upper surface of the level pattern is coplanar with an upper surface of the light control pattern.

5. The display device of claim 1, wherein the light control pattern includes a reflective pattern and a light-blocking pattern, wherein the reflective pattern is arranged on a side and a bottom of the opening, wherein the light-blocking pattern is arranged on the bottom of the opening, and wherein the reflective pattern is arranged on the light-blocking pattern.

6. The display device of claim 5, further comprising: a level pattern at least partially covering the light control pattern.

7. The display device of claim 1, further comprising: an encapsulation layer disposed between the light control pattern and the light-emitting element.

8. A display device, comprising:
a substrate including a pixel area and a light-blocking area;
a light-emitting element arranged in the pixel area of the substrate;
an insulating layer disposed on the substrate, wherein the insulating layer has an opening corresponding to the light-blocking area and an insulating pattern corresponding to the pixel area; and
a light control pattern at least partially surrounding the insulating pattern of the insulating layer and arranged in the opening corresponding to the light-blocking area,
wherein the light control pattern includes a reflective pattern and a light-blocking pattern, wherein the reflective pattern is arranged on a side and a bottom of the opening, wherein the light-blocking pattern is arranged on the bottom of the opening, and wherein the reflective pattern is arranged on the light-blocking pattern,
wherein the display device further comprises a level pattern at least partially covering the light control pattern, and
wherein an upper surface of the level pattern is coplanar with the reflective pattern.

9. A display device, comprising:
a substrate including a pixel area and a light-blocking area;
a light-emitting element arranged in the pixel area of the substrate;
an insulating layer disposed on the substrate, wherein the insulating layer has opening corresponding to the light-blocking area and an insulating pattern corresponding to the pixel area, and
a light control pattern at least partially surrounding the insulating pattern of the insulating layer and arranged the opening corresponding to the light-blocking area,
wherein the light control pattern includes a reflective pattern, a support pattern, and a light-blocking pattern, wherein the reflective pattern and the support pattern are both arranged on a side and a bottom of the opening, wherein the light-blocking pattern is arranged on the bottom of the opening, wherein the support pattern is arranged under the reflective pattern, and wherein the light-blocking pattern is arranged under the support pattern.

* * * * *